US010240085B2

(12) United States Patent
Ihn et al.

(10) Patent No.: US 10,240,085 B2
(45) Date of Patent: Mar. 26, 2019

(54) THIN FILM AND ORGANIC LIGHT-EMITTING DEVICE INCLUDING THE SAME

(71) Applicants: SAMSUNG ELECTRONICS CO., LTD., Suwon-si, Gyeonggi-do (KR); Samsung SDI Co., Ltd., Yongin-si, Gyeonggi-do (KR)

(72) Inventors: Sooghang Ihn, Hwaseong-si (KR); Dalho Huh, Suwon-si (KR); Namheon Lee, Suwon-si (KR); Jhunmo Son, Yongin-si (KR); Hosuk Kang, Suwon-si (KR); Sangmo Kim, Hwaseong-si (KR); Jongsoo Kim, Suwon-si (KR); Joonghyuk Kim, Seoul (KR); Hyunjung Kim, Suwon-si (KR); Youngmok Son, Hwaseong-si (KR); Myungsun Sim, Suwon-si (KR); Yeonsook Chung, Seoul (KR); Youngseok Park, Yongin-si (KR); Yongsik Jung, Yongin-si (KR)

(73) Assignees: SAMSUNG ELECTRONICS CO., LTD., Gyeonggi-Do (KR); SAMSUNG SDI CO., LTD., Gyeonggi-Do (KR)

( * ) Notice: Subject to any disclaimer, the term of this patent is extended or adjusted under 35 U.S.C. 154(b) by 229 days.

(21) Appl. No.: 15/245,545

(22) Filed: Aug. 24, 2016

(65) Prior Publication Data

US 2017/0062752 A1 Mar. 2, 2017

(30) Foreign Application Priority Data

Aug. 27, 2015 (KR) ........................ 10-2015-0121235
Mar. 7, 2016 (KR) ........................ 10-2016-0027144

(51) Int. Cl.
*H01L 51/50* (2006.01)
*C09K 11/06* (2006.01)
(Continued)

(52) U.S. Cl.
CPC .............. *C09K 11/06* (2013.01); *C09K 11/02* (2013.01); *H05B 33/14* (2013.01);
(Continued)

(58) Field of Classification Search
None
See application file for complete search history.

(56) References Cited

U.S. PATENT DOCUMENTS 5,955,836 A 9/1999 Boerner et al.
2005/0221116 A1 10/2005 Cocchi et al.
(Continued)

FOREIGN PATENT DOCUMENTS

JP 2000-133453 A 5/2000
KR 10-2014-0092710 A 7/2014
(Continued)

OTHER PUBLICATIONS

Shin et. al., Blue Phosphorescent Organic Light-Emitting Diodes Using an Exciplex Forming Co-host with the External Quantum Efficiency of Theoretical Limit, 2014, Advanced Materials, 26, 4730-4734 (Year: 2014).*

*Primary Examiner* — Gregory D Clark
(74) *Attorney, Agent, or Firm* — Cantor Colburn LLP

(57) ABSTRACT

A thin film including a combination of a donor compound and an acceptor compound, and a phosphorescent dopant, wherein the donor compound and the acceptor compound form an exciplex having characteristics described in the specification.

22 Claims, 10 Drawing Sheets

(51) Int. Cl.
*C09K 11/02* (2006.01)
*H05B 33/14* (2006.01)
*H01L 51/00* (2006.01)

(52) U.S. Cl.
CPC ................. *C09K 2211/1007* (2013.01); *C09K 2211/1011* (2013.01); *C09K 2211/1029* (2013.01); *C09K 2211/1033* (2013.01); *C09K 2211/1037* (2013.01); *C09K 2211/1044* (2013.01); *C09K 2211/1059* (2013.01); *C09K 2211/1092* (2013.01); *C09K 2211/185* (2013.01); *H01L 51/0059* (2013.01); *H01L 51/0067* (2013.01); *H01L 51/0071* (2013.01); *H01L 51/0072* (2013.01); *H01L 51/0085* (2013.01); *H01L 51/5016* (2013.01); *H01L 2251/5384* (2013.01)

(56) References Cited

U.S. PATENT DOCUMENTS

| | | | | |
|---|---|---|---|---|
| 2008/0220287 | A1 | 9/2008 | Dotz et al. | |
| 2012/0217869 | A1 | 8/2012 | Adachi et al. | |
| 2014/0367647 | A1* | 12/2014 | Kim | H01L 51/0085 257/40 |
| 2015/0069352 | A1 | 3/2015 | Kim et al. | |
| 2017/0077421 | A1 | 3/2017 | Ihn et al. | |

FOREIGN PATENT DOCUMENTS

| | | | |
|---|---|---|---|
| KR | 10-1419810 | B1 | 7/2014 |
| KR | 2017-0032148 | A | 3/2017 |
| WO | 2015-041157 | A1 | 3/2015 |

* cited by examiner

THIN FILM AND ORGANIC LIGHT-EMITTING DEVICE INCLUDING THE SAME

CROSS-REFERENCE TO RELATED APPLICATIONS

This application claims priority to Korean Patent Application Nos. 10-2015-0121235, filed on Aug. 27, 2015 and 10-2016-0027144, filed on Mar. 7, 2016, in the Korean Intellectual Property Office, and all the benefits accruing therefrom under 35 U.S.C. § 119, the contents of which are incorporated herein in their entirety by reference.

BACKGROUND

1. Field

The present disclosure relates to a thin film and an organic light-emitting device including the same.

2. Description of the Related Art

Organic light-emitting devices (OLEDs) are self-emission devices that have wide viewing angles, high contrast ratios, and short response times. In addition, OLEDs display excellent luminescence, driving voltage, and response speed characteristics, and produce full-color images.

In an example, an organic light-emitting device includes an anode, a cathode, and an organic layer that is disposed between the anode and the cathode, wherein the organic layer includes an emission layer. A hole transport region may be disposed between the anode and the emission layer, and an electron transport region may be disposed between the emission layer and the cathode. Holes provided from the anode may move toward the emission layer through the hole transport region, and electrons provided from the cathode may move toward the emission layer through the electron transport region. Carriers, such as holes and electrons, recombine in the emission layer to produce excitons. These excitons are changed from an excited state to a ground state, thereby generating light.

Various types of organic light emitting devices are known. However, there still remains a need in OLEDs having low driving voltage, high efficiency, high brightness, and long lifespan.

SUMMARY

Provided are a thin film including a combination, which provides an exciplex satisfying a predetermined equation, and a phosphorescent dopant, and an organic light-emitting device including the thin film, which is characterized by low driving voltage, high efficiency, high luminance, and long lifespan.

Additional aspects will be set forth in part in the description which follows and, in part, will be apparent from the description, or may be learned by practice of the presented embodiments.

According to an aspect of an embodiment, a thin film includes:

i) a combination of a donor compound and an acceptor compound, and ii) a phosphorescent dopant, wherein the donor compound and the acceptor compound form an exciplex, wherein a maximum emission wavelength $\lambda_{max}$ (Ex) in a photoluminescence spectrum of the exciplex is about 390 nanometers or greater and about 490 nanometers or less, wherein a decay time $T_{decay}$(Ex) of delayed fluorescence in a time-resolved photoluminescence spectrum of the exciplex is about 100 nanoseconds or greater, wherein a ratio of a delayed fluorescence portion to the overall light-emitting portions in the time-resolved photoluminescence spectrum of the exciplex is about 10% or greater, wherein a photoluminescence stability of the exciplex is 59% or greater, wherein the photoluminescence spectrum and the time-resolved photoluminescence spectrum of the exciplex are each a spectrum measured at room temperature with respect to a film that is formed by co-deposition of the donor compound and the acceptor compound on a substrate, and wherein photoluminescence stability of the exciplex is evaluated according to Equation 10:

$$\text{PL stability } (\%)=(I_2/I_1)\times 100 \qquad \text{Equation 10}$$

wherein, in Equation 10, $I_1$ is an intensity of a light at the maximum emission wavelength $\lambda_{max}$ (Ex) in a photoluminescence spectrum of Film 1, which is obtained immediately after formation of a film by co-deposition of the donor compound and the acceptor compound on a substrate, measured at room temperature in an inert atmosphere in which external air is excluded, and $I_2$ is an intensity of a light at the maximum emission wavelength $\lambda_{max}$ (Ex) in a photoluminescence spectrum of Film 2, which is obtained after exposure of the Film 1 to pumping laser light used in the evaluation of $I_1$ in an inert atmosphere in which external air is excluded for 3 hours, measured at room temperature in an inert atmosphere in which external air is excluded.

According to an aspect of another embodiment, an organic light-emitting device includes:

a first electrode, a second electrode, and an organic layer disposed between the first electrode and the second electrode, wherein the organic layer includes the thin film.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
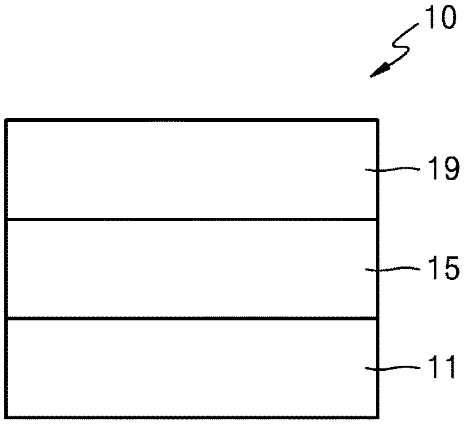
FIG. 1 is a schematic cross-section of an organic light-emitting device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. Expressions such as "at least one of," when preceding a list of elements, modify the entire list of elements and do not modify the individual elements of the list.

The present disclosure will now be described more fully with reference to exemplary embodiments. The disclosure may, however, be embodied in many different forms and should not be construed as being limited to the embodiments set forth herein; rather, these embodiments are provided so that this disclosure will be thorough and complete, and will fully convey the concept of the disclosure to those skilled in the art. Advantages, features, and how to achieve them of the present inventive concept will become apparent by reference to the embodiment that will be described later in detail, together with the accompanying drawings. This inventive concept may, however, be embodied in many different forms and should not be limited to the exemplary embodiments.

Hereinafter, embodiments are described in detail by referring to the attached drawings, and in the drawings, like reference numerals denote like elements, and a redundant explanation thereof will not be provided herein.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

As used herein, the singular forms "a," "an" and "the" are intended to include the plural forms as well, unless the context clearly indicates otherwise.

The term "or" means "and/or." It will be further understood that the terms "comprises" and/or "comprising" or "includes" and/or "including" used herein specify the presence of stated features, regions, integers, steps, operations, elements, and/or components, but do not preclude the presence or addition of one or more other features, regions, integers, steps, operations, elements, and/or components.

It will be understood that when a layer, region, or component is referred to as being "on" or "onto" another layer, region, or component, it may be directly or indirectly formed on the other layer, region, or component. That is, for example, intervening layers, regions, or components may be present.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

According to an aspect of the present disclosure, a thin film includes a combination (which can be a mixture) of a donor compound and an acceptor compound. The donor compound and the acceptor compound in the combination form an exciplex.

The donor compound may be an electron-donor compound having better electron-donating properties than its electron-withdrawing properties, and the acceptor compound may be an electron-acceptor compound having better electron-withdrawing properties than its electron-donating properties. In this regard, the donor compound may be a hole transport compound, and the acceptor compound may be an electron transport compound.

The exciplex may be an excited state complex that is formed between the donor compound and the acceptor compound.

A maximum emission wavelength ($\lambda_{max}$ (Ex)) in a photoluminescence (PL) spectrum of the exciplex in the combination may be about 390 nanometers (nm) or greater to about 490 nm or less, for example, about 390 nm or greater to about 450 nm or less, or about 390 nm or greater and less than about 440 nm. In various embodiments, the maximum emission wavelength $\lambda_{max}$ (Ex) in the PL spectrum of the exciplex in the combination may be about 390 nm or greater to about 427 nm or less, or about 412 nm or greater to about 427 nm or less. In this regard, the combination may emit blue light. For example, the combination may emit blue light having a CIE x-coordinate in a range of about 0.182 to about 0.307 and a CIE y-coordinate in a range of about 0.092 to about 0.523.

A decay time ($T_{decay}$ (Ex)) of delayed fluorescence in a time-resolved photoluminescence (TRPL) spectrum of the exciplex in the combination may be about 100 nanoseconds (ns) or greater, for example, about 100 ns or greater to about 10 milliseconds (ms). In addition, a percentage of a delayed fluorescent component to the overall light-emitting components in the TRPL spectrum of the exciplex may be about 10% or greater. In this regard, the exciplex may exhibit up-conversion in an efficient manner from a triplet state ($T_1$) to a singlet state ($S_1$), thereby emitting delayed fluorescence with high efficiency. Thus, when the combination is used, an electronic device, such as an organic light-emitting device, may be implemented with high efficiency.

The PL spectrum and the TRPL spectrum of the exciplex may each be a spectrum measured at room temperature with respect to a film that is formed by co-deposition of the donor compound and the acceptor compound on a substrate (for example, a quartz substrate), and the measurement may be understood by referring to Examples described below.

The decay time $T_{decay}$ (Ex) may be evaluated by using known methods in the art based on the TRPL spectrum of the exciplex. For example, the decay time $T_{decay}$ (Ex) may be evaluated by using a method described in Evaluation Example 1, but embodiments are not limited thereto.

The ratio of a delayed fluorescence portion (referred to as a DF portion) may be evaluated by using methods in the art based on the TRPL spectrum of the exciplex. For example, the ratio of the DF portion may be evaluated by using a method described in Evaluation Example 1, but embodiments are not limited thereto.

The exciplex in the combination may have PL stability of about 59% or greater, for example, about 60% or greater, for example, about 70% or greater. In various embodiments, the exciplex in the combination may have PL stability of about 80% or greater, for example, about 90% or greater. While not wishing to be bound by theory, it is understood that when the exciplex in the combination has PL stability within these ranges, an organic light-emitting device including the combination may have long lifespan.

The PL stability of the exciplex may be evaluated according to Equation 10:

$$\text{PL stability }(\%)=(I_2/I_1)\times 100 \qquad \text{Equation 10}$$

wherein, in Equation 10, $I_1$ is an intensity (arbitrary units, a.u.) of a light at the maximum emission wavelength ($\lambda_{max}$ (Ex)) in a PL spectrum of Film 1, which is obtained immediately after formation of a film by co-deposition of the donor compound and the acceptor compound on a substrate, measured at room temperature in an inert atmosphere in which external air is excluded, and $I_2$ is an intensity (arbitrary units, a.u.) of a light at the maximum emission wavelength ($\lambda_{max}$ (Ex)) in a PL spectrum of Film 2, which is obtained after exposure of the Film 1 to pumping laser light used in the evaluation of $I_1$ in an inert atmosphere in which external air is excluded for 3 hours, measured at room temperature in an inert atmosphere in which external air is excluded.

The evaluation of PL stability according to an embodiment may be understood by referring to Examples and Evaluation Examples below.

In various embodiments, an absolute value of a highest occupied molecular orbital (HOMO) energy level for the donor compound (|HOMO (D)|) may be about 5.78 electron volts (eV) or less, for example, about 4.84 eV or greater to about 5.78 eV or less. In addition, an absolute value of the lowest unoccupied molecular orbital (LUMO) energy level for the acceptor compound (|LUMO (A)|) may be about 1.76 eV or greater, for example, about 1.76 eV or greater to about 2.43 eV or less. In this regard, the formation of exciplex in the combination may be increased, thereby an electronic device, for example, an organic light-emitting device, including the combination may have improved efficiency and lifespan.

The HOMO energy level for the donor compound HOMO (D) may be calculated by cyclic voltammetry (CV), and the LUMO energy level for the acceptor compound LUMO (A) may be calculated based on an UV absorption spectrum measured at room temperature. The calculations may be understood by referring to Examples below.

In various embodiments, an absolute value of a difference between the HOMO energy level for the acceptor compound and the HOMO energy level for the donor compound (|HOMO (A)–HOMO (D)|) may be 0 about 0.037 eV or greater to about 1.1 eV or less, for example, about 0.04 eV or greater to about 0.9 eV or less. In addition, an absolute value of a difference between a LUMO energy level for the acceptor compound and a LUMO energy level for the donor compound (|LUMO (A)–LUMO (D)|) may be about 0.001 eV or greater to about 1.1 eV or less, for example, about 0.01 eV or greater to about 0.9 eV or less. In this regard, the donor compound may facilitate movement of holes while the acceptor compound may facilitate movement of electrons, thereby forming an exciplex at an interface between the donor compound and the acceptor compound efficiently. Thus, an electronic device, for example, an organic light-emitting device, including the combination may have high efficiency and long lifespan.

The donor compound may include at least one selected from a carbazole-containing ring, a dibenzofuran-containing ring, a dibenzothiophene-containing ring, an indenocarbazole-containing ring, an indolocarbazole-containing ring, a benzofurocarbazole-containing ring, a benzothienocarbazole-containing ring, an acridine-containing ring, a dihydroacridine-containing ring, and a tri-indolobenzene-containing ring, and the acceptor compound may include at least one selected from a carbazole-containing ring, a dibenzofuran-containing ring, a dibenzothiophene-containing ring, an indenocarbazole-containing ring, an indolocarbazole-containing ring, a benzofurocarbazole-containing ring, a benzothienocarbazole-containing ring, a pyridine-containing ring, a pyrimidine-containing ring, and a triazine-containing ring.

For example, the acceptor compound may include at least one electron-withdrawing group, and the electron-withdrawing group may be selected from:

—F, $—CFH_2$, $—CF_2H$, $—CF_3$, —CN, and $—NO_2$;

a $C_1$-$C_{60}$ alkyl group substituted with at least one selected from —F, $—CFH_2$, $—CF_2H$, $—CF_3$, —CN, and $—NO_2$;

a $C_1$-$C_{60}$ heteroaryl group and a divalent non-aromatic condensed polycyclic heterocyclic group, each including *═N—*' as a ring-forming moiety; and a $C_1$-$C_{60}$ heteroaryl group and a divalent non-aromatic condensed polycyclic heterocyclic group, each including *═N—*' as a ring-forming moiety and each substituted with at least one selected from deuterium, —F, $—CFH_2$, $—CF_2H$, $—CF_3$, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, and a substituted or unsubstituted monovalent non-aromatic condensed heteropolycyclic group.

In various embodiments, the donor compound may be selected from a compound represented by Formula D-1, and the acceptor compound may be selected from compounds represented by Formulae A-1 and A-2:

Formula D-1

$$Ar_1—(L_1)_{a1}—Ar_2$$

Formula A-1

$$Ar_{11}—(L_{11})_{a11}—Ar_{12}$$

Formula A-2

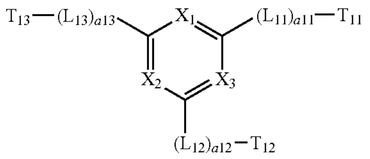

Formula 11

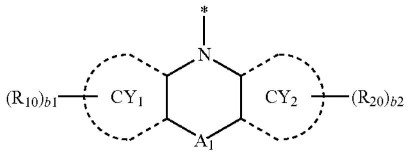

Formula 12

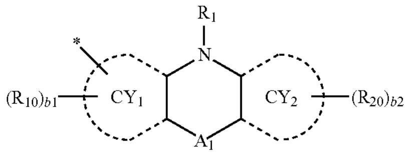

Formula 13

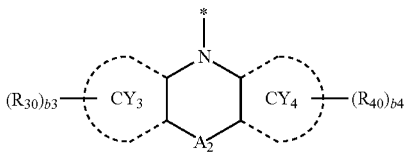

Formula 14

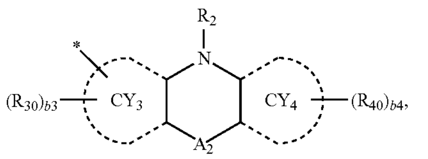

wherein, in Formulae D-1, A-1, A-2, and 11 to 14, $Ar_1$ may be selected from groups represented by Formulae 11 and 12, $Ar_2$ may be selected from:

groups represented by Formulae 11 and 12, a phenyl group, a naphthyl group, and a benzimidazolyl group; and a phenyl group, a naphthyl group, and a benzimidazolyl group, each substituted with at least one selected from deuterium, a hydroxyl group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a carbazolyl group, a dibenzofuranyl group, and a dibenzothiophenyl group, $Ar_{11}$ and $Ar_{12}$ may each independently be selected from groups represented by Formulae 13 and 14, $X_1$ may be N or $C(T_{14})$, $X_2$ may be N or $C(T_{15})$, and $X_3$ may be N or $C(T_{16})$, wherein at least one selected from $X_1$ to $X_3$ may be N, $L_1$ may be selected from:

a single bond, a phenylene group, a naphthylene group, a fluorenylene group, a carbazolylene group, a dibenzofuranylene group, and a dibenzothiophenylene group; and a phenylene group, a naphthylene group, a fluorenylene group, a carbazolylene group, a dibenzofuranylene group, and a dibenzothiophenylene group, each substituted with at least one selected from deuterium, a $C_1$-$C_{10}$ alkyl group, a $C_1$-$C_{10}$ alkoxy group, a phenyl group, a naphthyl group, a fluorenyl group, a carbazolyl group, a dibenzofuranyl group, a dibenzothiophenyl group, and $—Si(Q_{11})(Q_{12})(Q_{13})$, $L_{11}$ to $L_{13}$ may each independently be selected from:

a single bond, a phenylene group, a pyridinylene group, a pyrimidinylene group, a pyrazinylene group, a pyridazinylene group, a triazinylene group, a naphthylene group, a fluorenylene group, a carbazolylene group, a dibenzofuranylene group, and a dibenzothiophenylene group; and a phenylene group, a pyridinylene group, a pyrimidinylene group, a pyrazinylene group, a pyridazinylene group, a triazinylene group, a naphthylene group, a fluorenylene group, a carbazolylene group, a dibenzofuranylene group, and a dibenzothiophenylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, $—CF_3$, $—CF_2H$, $—CFH_2$, a phenyl group, a phenyl group substituted with a cyano group, a naphthyl group, a pyridinyl group, a pyrimidinyl group, a pyrazinyl group, a pyridazinyl group, a triazinyl group, a fluorenyl group, a carbazolyl group, a dibenzofuranyl group, a dibenzothiophenyl group, and $—Si(Q_{11})(Q_{12})(Q_{13})$, a1 and a11 to a13 are each independently an integer selected from 0 to 5, and when a1 is 2 or greater, groups $L_1$ are identical to or different from each other, when a11 is 2 or greater, groups $L_{11}$ are identical to or different from each other, when a12 is 2 or greater, groups $L_{12}$ are identical to or different from each other, and when a13 is 2 or greater, groups $L_{13}$ are identical to or different from each other, $CY_1$ to $CY_4$ may each independently be selected from a benzene group, a naphthalene group, a fluorene group, a carbazole group, a benzocarbazole group, an indolocarbazole group, a dibenzofuran group, and a dibenzothiophene group, $A_1$ may be selected from:

a single bond, a $C_1$-$C_4$ alkylene group, and a $C_2$-$C_4$ alkenylene group; and a $C_1$-$C_4$ alkylene group and a $C_2$-$C_4$ alkenylene group, each substituted with at least one selected from deuterium, a $C_1$-$C_{10}$ alkyl group, a $C_1$-$C_{10}$ alkoxy group, a phenyl group, a naphthyl group, a fluorenyl group, a carbazolyl group, a dibenzofuranyl group, a dibenzothiophenyl group, and $—Si(Q_{21})(Q_{22})(Q_{23})$, $A_2$ may be selected from:

a single bond, a $C_1$-$C_4$ alkylene group, and a $C_2$-$C_4$ alkenylene group; and a $C_1$-$C_4$ alkylene group and a $C_2$-$C_4$ alkenylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, a phenyl group, a naphthyl group, a pyridinyl group, a pyrimidinyl group, a pyrazinyl group, a pyridazinyl group, a triazinyl group, a fluorenyl group, a carbazolyl group, a dibenzofuranyl group, a dibenzothiophenyl group, and —$Si(Q_{21})(Q_{22})(Q_{23})$, $R_1$, $R_{10}$, and $R_{20}$ may each independently be selected from:

hydrogen, deuterium, a hydroxyl group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, a hydroxyl group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a fluorenyl group, a carbazolyl group, a dibenzofuranyl group, and a dibenzothiophenyl group;

a phenyl group, a naphthyl group, a fluorenyl group, a carbazolyl group, a dibenzofuranyl group, and a dibenzothiophenyl group;

a phenyl group, a naphthyl group, a fluorenyl group, a carbazolyl group, a dibenzofuranyl group, and a dibenzothiophenyl group, each substituted with at least one selected from deuterium, a hydroxyl group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a carbazolyl group, a dibenzofuranyl group, and a dibenzothiophenyl group; and —$Si(Q_1)(Q_2)(Q_3)$, $T_{11}$ to $T_{16}$, $R_2$, $R_{30}$, and $R_{40}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, and —$Si(Q_1)(Q_2)(Q_3)$, b1 to b4 may each independently be an integer selected from 0 to 10, at least one of substituent(s) of the substituted $C_1$-$C_{60}$ alkyl group, the substituted $C_2$-$C_{60}$ alkenyl group, the substituted $C_2$-$C_{60}$ alkynyl group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_2$-$C_{60}$ heteroarylalkyl group, the substituted monovalent non-aromatic condensed polycyclic group, and the substituted monovalent non-aromatic condensed heteropolycyclic group may be selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, and —$Si(Q_{31})(Q_{32})(Q_{33})$, and $Q_1$ to $Q_3$, $Q_{11}$ to $Q_{13}$, $Q_{21}$ to $Q_{23}$, and $Q_{31}$ to $Q_{33}$ may each independently be selected from hydrogen, deuterium, a $C_1$-$C_{60}$ alkyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

For example, $Ar_1$ in Formula D-1 may be selected from groups represented by Formulae 11-1 to 11-8 and 12-1 to 12-8, $Ar_2$ in Formula D-1 may be selected from groups represented by Formulae 11-1 to 11-8 and 12-1 to 12-8, a phenyl group, a naphthyl group, and a benzimidazolyl group substituted with a phenyl group, $Ar_{11}$ and $Ar_{12}$ in Formula A-1 may each independently be selected from groups represented by Formulae 13-1 to 13-8 and 14-1 to 14-8:

Formula 11-1

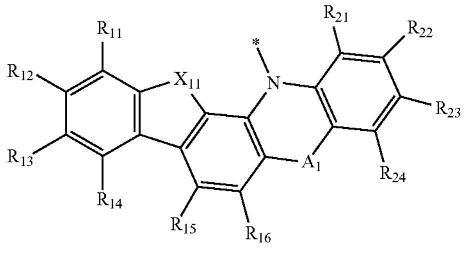

-continued
Formula 11-2
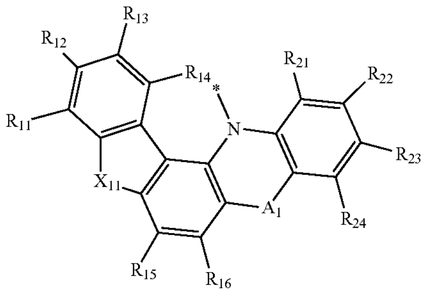
Formula 11-3
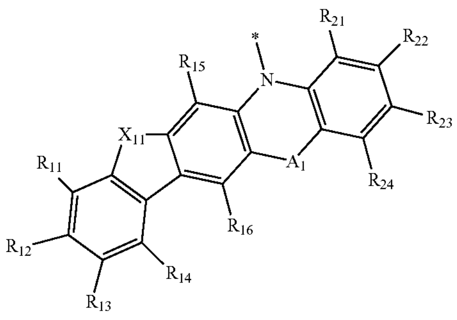
Formula 11-4
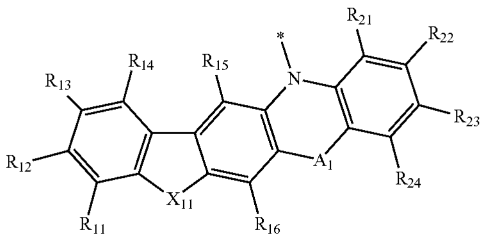
Formula 11-5
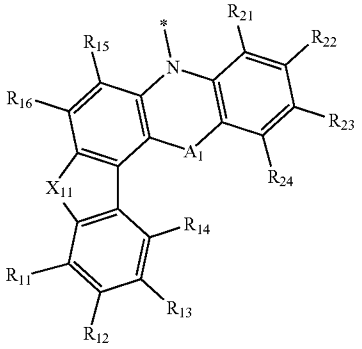
Formula 11-6
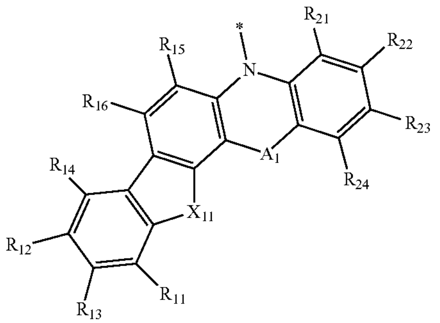
-continued
Formula 11-7
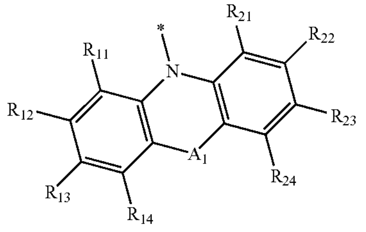
Formula 11-8
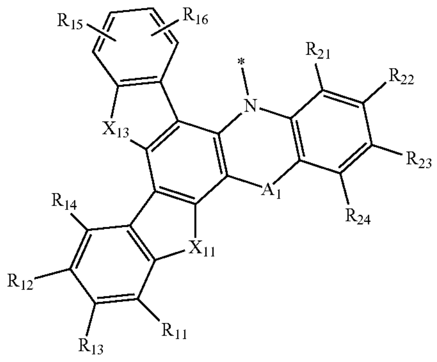
Formula 12-1
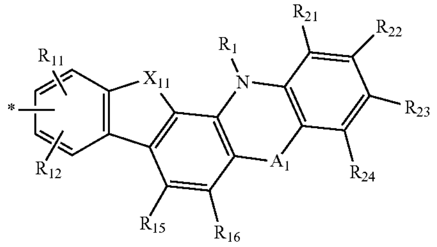
Formula 12-2
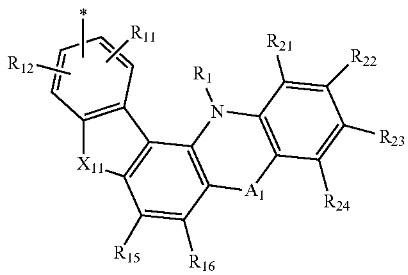
Formula 12-3
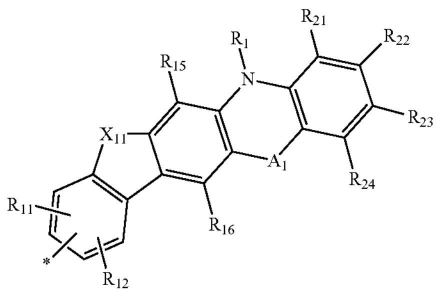

-continued
Formula 12-4
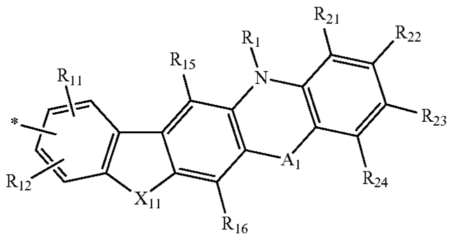
Formula 12-5
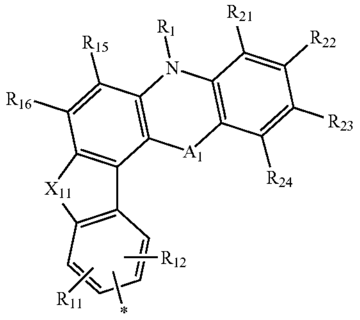
Formula 12-6
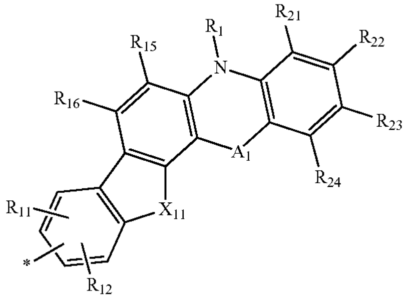
Formula 12-7
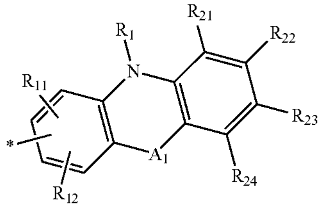
Formula 12-8
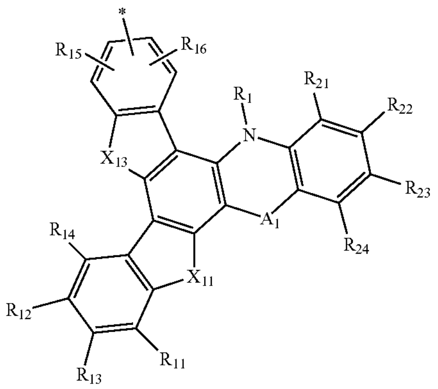
-continued
Formula 13-1
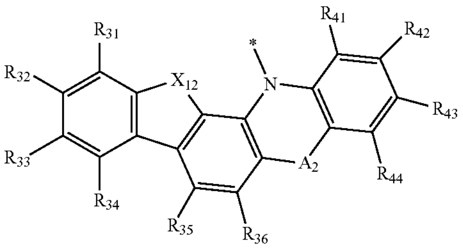
Formula 13-2
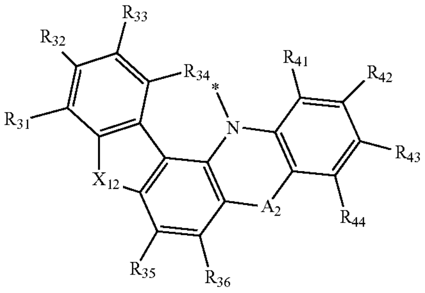
Formula 13-3
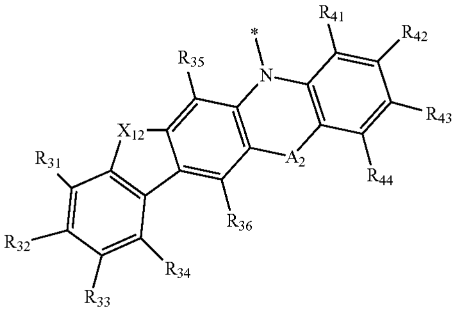
Formula 13-4
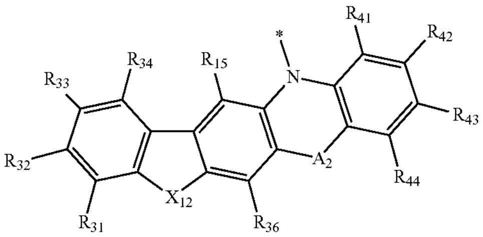
Formula 13-5
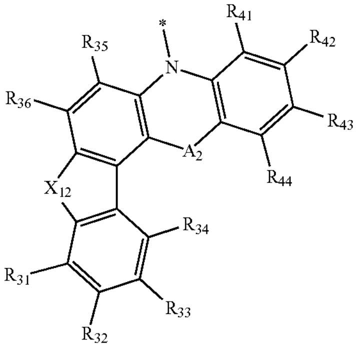

-continued
Formula 13-6
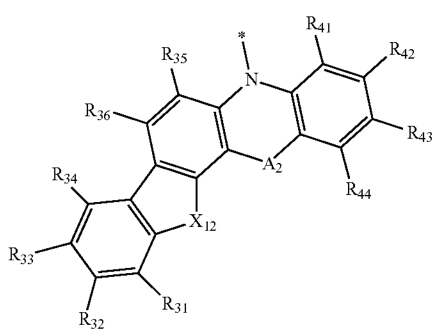
Formula 13-7
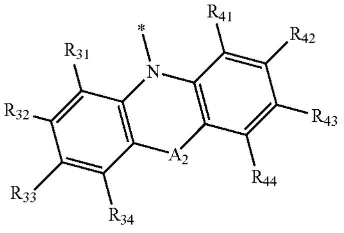
Formula 13-8
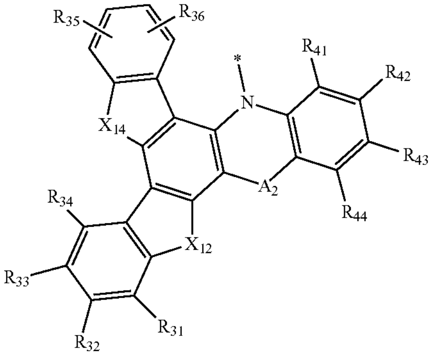
Formula 14-1
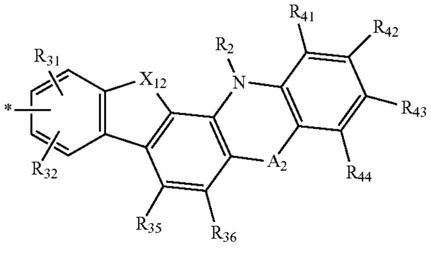
Formula 14-2
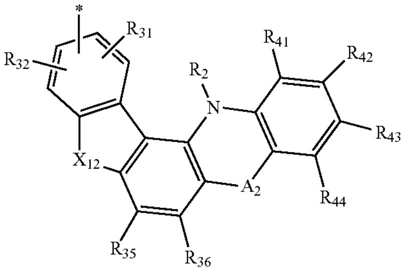
-continued
Formula 14-3
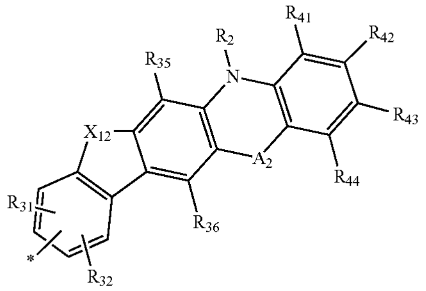
Formula 14-4
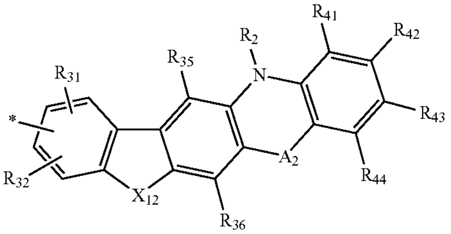
Formula 14-5
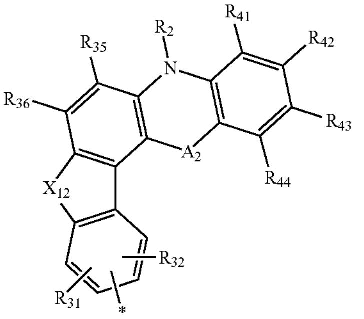
Formula 14-6
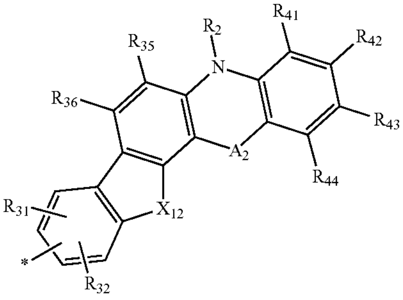
Formula 14-7
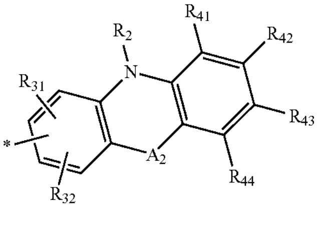

-continued

Formula 14-8

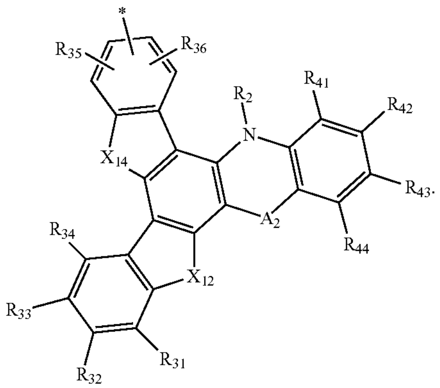

In Formulae 11-1 to 11-8, 12-1 to 12-8, 13-1 to 13-8, and 14-1 to 14-8, $X_{11}$ and $X_{13}$ may each independently be $C(R_{17})(R_{18})$, $N(R_{19})$, O or S, $X_{12}$ and $X_{14}$ may each independently be $C(R_{37})(R_{38})$, $N(R_{39})$, O or S, $R_1$, $R_2$, $A_1$, and $A_2$ may each independently be the same as described in the present specification, $R_{11}$ to $R_{19}$ may each independently be the same as described in connection with $R_{10}$ in the present specification, $R_{21}$ to $R_{24}$ may each independently be the same as described in connection with $R_{20}$ in the present specification, $R_{31}$ to $R_{39}$ may each independently be the same as described in connection with $R_{30}$ in the present specification, $R_{41}$ to $R_{44}$ may each independently be the same as described in connection with $R_{40}$ in the present specification, and

* indicates a binding site to a neighboring atom.

For example, $A_1$ in Formulae 11, 12, 11-1 to 11-8, and 12-1 to 12-8 may be selected from:

a single bond, a $C_1$-$C_2$ alkylene group, and a $C_2$ alkenylene group; and a $C_1$-$C_2$ alkylene group and a $C_2$ alkenylene group, each substituted with at least one selected from deuterium, a $C_1$-$C_{10}$ alkyl group, a $C_1$-$C_{10}$ alkoxy group, a phenyl group, a naphthyl group, a fluorenyl group, a carbazolyl group, a dibenzofuranyl group, a dibenzothiophenyl group, and —$Si(Q_{21})(Q_{22})(Q_{23})$, $A_2$ in Formulae 13, 14, 13-1 to 13-8, and 14-1 to 14-8 may be selected from:

a single bond, a $C_1$-$C_2$ alkylene group, and a $C_2$ alkenylene group; and a $C_1$-$C_2$ alkylene group and a $C_2$ alkenylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, a phenyl group, a naphthyl group, a pyridinyl group, a pyrimidinyl group, a pyrazinyl group, a pyridazinyl group, a triazinyl group, a fluorenyl group, a carbazolyl group, a dibenzofuranyl group, a dibenzothiophenyl group, and —$Si(Q_{21})(Q_{22})(Q_{23})$, $R_2$, $R_{30}$ to $R_{39}$, and $R_{40}$ to $R_{44}$ in Formulae 13, 14, 13-1 to 13-8, and 14-1 to 14-8 may each independently be selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a fluorenyl group, a carbazolyl group, a dibenzofuranyl group, and a dibenzothiophenyl group;

a phenyl group, a pyridinyl group, a pyrimidinyl group, a pyrazinyl group, a pyridazinyl group, a triazinyl group, a naphthyl group, a fluorenyl group, a carbazolyl group, a dibenzofuranyl group, and a dibenzothiophenyl group;

a phenyl group, a pyridinyl group, a pyrimidinyl group, a pyrazinyl group, a pyridazinyl group, a triazinyl group, a naphthyl group, a fluorenyl group, a carbazolyl group, a dibenzofuranyl group, and a dibenzothiophenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a pyridinyl group, a pyrimidinyl group, a pyrazinyl group, a pyridazinyl group, a triazinyl group, a naphthyl group, a fluorenyl group, a carbazolyl group, a dibenzofuranyl group, and a dibenzothiophenyl group; and —$Si(Q_1)(Q_2)(Q_3)$, and $Q_1$ to $Q_3$ and $Q_{21}$ to $Q_{23}$ may each independently be selected from hydrogen, a $C_1$-$C_{10}$ alkyl group, a $C_1$-$C_{10}$ alkoxy group, a phenyl group, and a naphthyl group, but embodiments are not limited thereto.

In various embodiments, $Ar_1$ in Formula D-1 may be selected from groups represented by Formulae 15-1 to 15-17 and 16-1 to 16-8, $Ar_2$ in Formula D-1 may be selected from groups represented by Formulae 15-1 to 15-17 and 16-1 to 16-8, a phenyl group, a naphthyl group, and an imidazolyl group substituted with a phenyl group, and $Ar_{11}$ and $Ar_{12}$ in Formula A-1 may each independently be selected from groups represented by Formulae 17-1 to 17-3, but embodiments are not limited thereto:

Formula 15-1

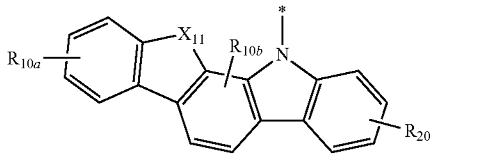

Formula 15-2

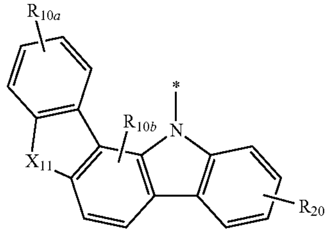

-continued
Formula 15-3
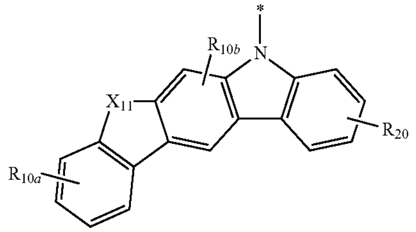
Formula 15-4
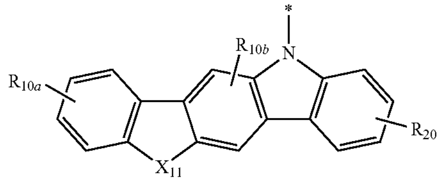
Formula 15-5
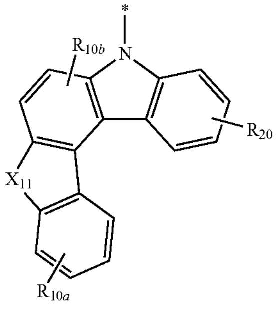
Formula 15-6
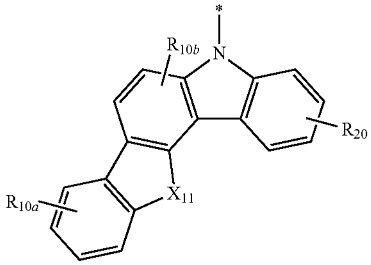
Formula 15-7
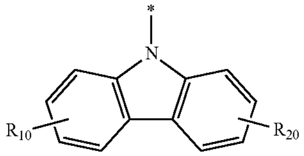
Formula 15-8
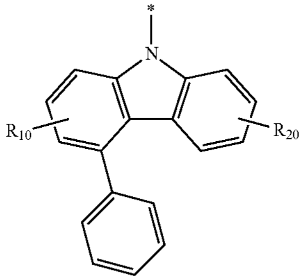
-continued
Formula 15-9
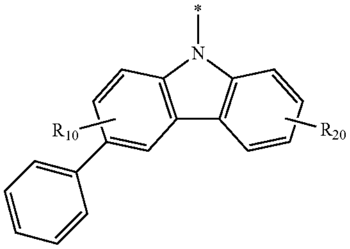
Formula 15-10
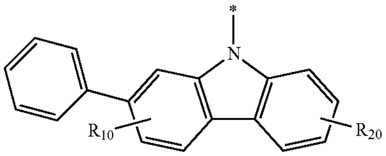
Formula 15-11
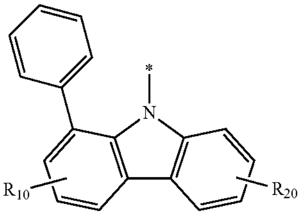
Formula 15-12
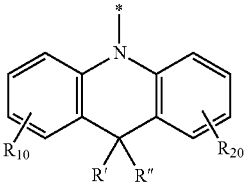
Formula 15-13
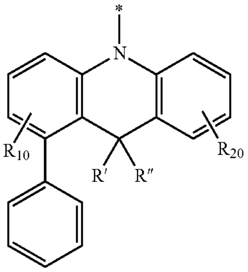
Formula 15-14
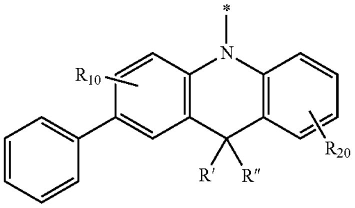
Formula 15-15
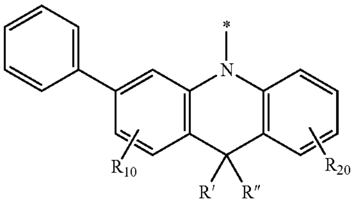

-continued

Formula 15-16

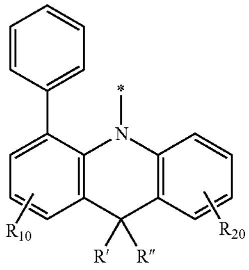

Formula 15-17

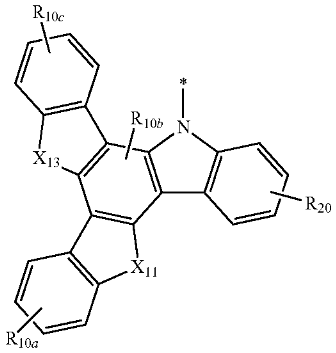

Formula 16-1

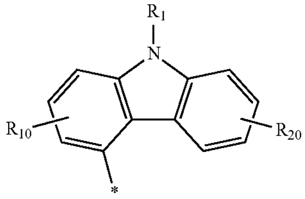

Formula 16-2

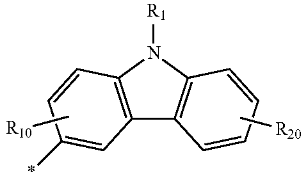

Formula 16-3

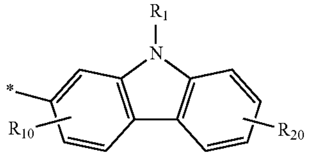

Formula 16-4

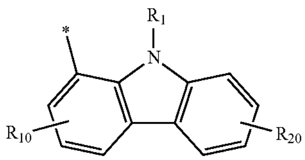

Formula 16-5

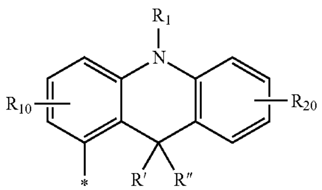

-continued

Formula 16-6

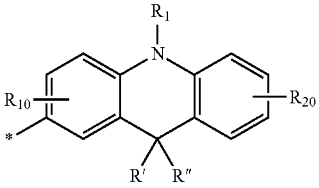

Formula 16-7

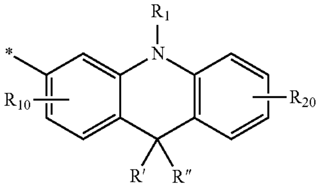

Formula 16-8

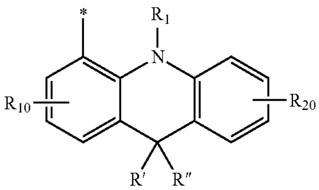

Formula 17-1

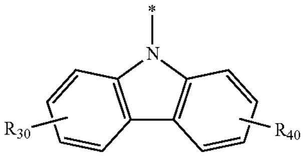

Formula 17-2

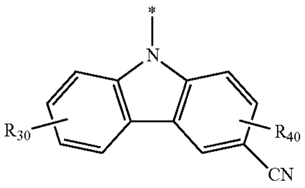

Formula 17-3

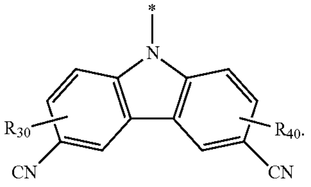

In Formulae 15-1 to 15-17, 16-1 to 16-8, and 17-1 to 17-3, $X_{11}$ and $X_{13}$ may each independently be $C(R_{17})(R_{18})$, $N(R_{19})$, O, or S, R' and R" may each independently be selected from hydrogen, deuterium, a $C_1$-$C_{10}$ alkyl group, a $C_1$-$C_{10}$ alkoxy group, a phenyl group, a naphthyl group, a fluorenyl group, a carbazolyl group, a dibenzofuranyl group, and a dibenzothiophenyl group, $R_1$, $R_{10}$, $R_{20}$, $R_{30}$, and $R_{40}$ may each independently be the same as described in the present specification, and $R_{10a}$ to $R_{10c}$ may each independently be the same as described in connection with $R_{10}$ in the present specification.

For example, in Formulae 15-1 to 15-17, 16-1 to 16-8, and 17-1 to 17-3, $R_1$, $R_{10}$, $R_{10a}$ to $R_{10c}$, and $R_{20}$ may each independently be selected from hydrogen, deuterium, a $C_1$-$C_{10}$ alkyl group, a $C_1$-$C_{10}$ alkoxy group, a phenyl group, a naphthyl group, a fluorenyl group, a carbazolyl group, a dibenzofuranyl group, a dibenzothiophenyl group, and $—Si(Q_1)(Q_2)(Q_3)$, $R_{30}$ and $R_{40}$ may each independently be selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, —$CF_3$, —$CF_2H$, and —$CFH_2$;

a phenyl group, a pyridinyl group, a pyrimidinyl group, a pyrazinyl group, a pyridazinyl group, a triazinyl group, a naphthyl group, a fluorenyl group, a carbazolyl group, a dibenzofuranyl group, and a dibenzothiophenyl group;

a phenyl group, a pyridinyl group, a pyrimidinyl group, a pyrazinyl group, a pyridazinyl group, a triazinyl group, a naphthyl group, a fluorenyl group, a carbazolyl group, a dibenzofuranyl group, and a dibenzothiophenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, —$CF_3$, —$CF_2H$ and —$CFH_2$, a phenyl group, a pyridinyl group, a pyrimidinyl group, a pyrazinyl group, a pyridazinyl group, a triazinyl group, a naphthyl group, a fluorenyl group, a carbazolyl group, a dibenzofuranyl group, and a dibenzothiophenyl group; and —$Si(Q_1)(Q_2)(Q_3)$, and $Q_1$ to $Q_3$ may each independently be selected from hydrogen, a $C_1$-$C_{10}$ alkyl group, a $C_1$-$C_{10}$ alkoxy group, a phenyl group, and a naphthyl group, but embodiments are not limited thereto.

In various embodiments, i) the donor compound is represented by Formula D-1, provided that the donor compound is selected from compounds in which $L_1$ in Formula D-1 is a single bond; or ii) the donor compound is selected from compounds represented by Formulae D-1(1) to D-1(52):

Formula D-1(1)

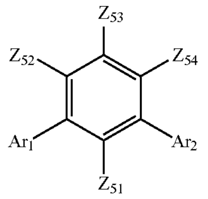

Formula D-1(2)

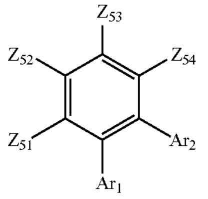

Formula D-1(3)

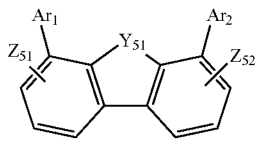

-continued

Formula D-1(4)

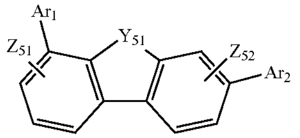

Formula D-1(5)

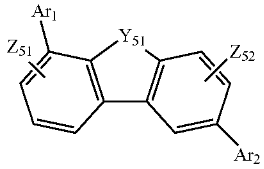

Formula D-1(6)

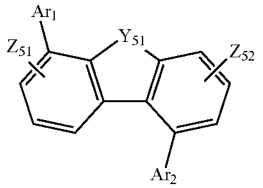

Formula D-1(7)

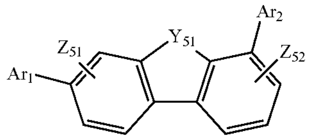

Formula D-1(8)

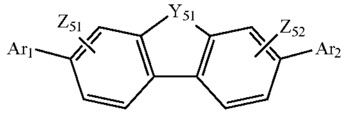

Formula D-1(9)

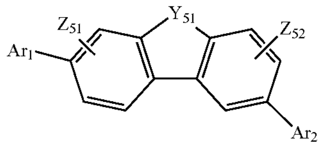

Formula D-1(10)

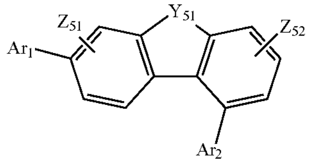

Formula D-1(11)

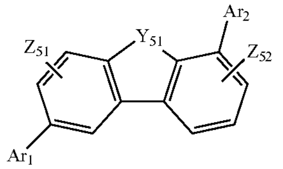

Formula D-1(12)

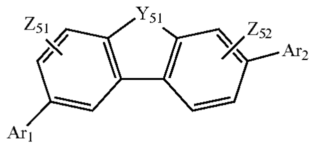

Formula D-1(13)

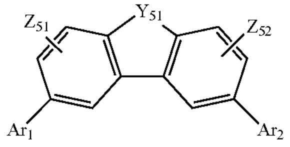

-continued
Formula D-1(14)
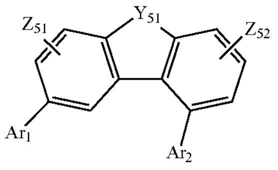
Formula D-1(15)
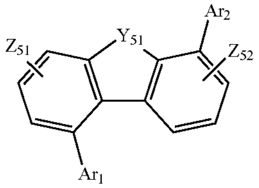
Formula D-1(16)
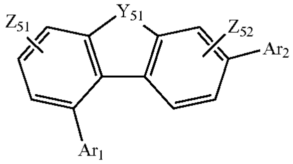
Formula D-1(17)
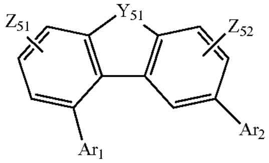
Formula D-1(18)
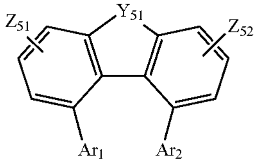
Formula D-1(19)
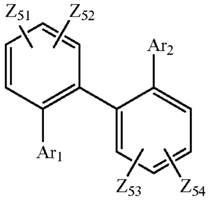
Formula D-1(20)
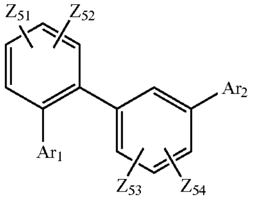
Formula D-1(21)
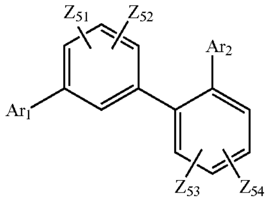
-continued
Formula D-1(22)
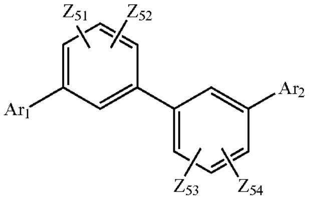
Formula D-1(23)
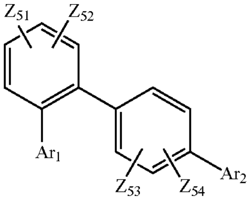
Formula D-1(24)
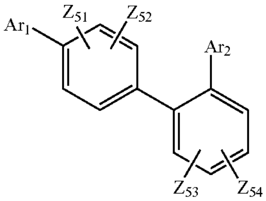
Formula D-1(25)
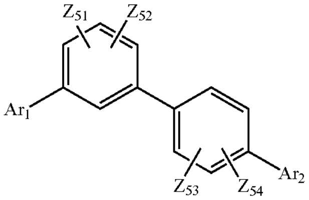
Formula D-1(26)
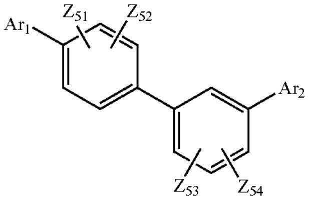
Formula D-1(27)
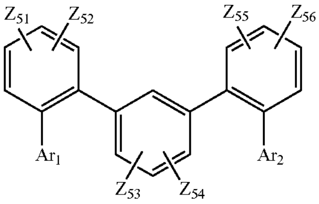
Formula D-1(28)
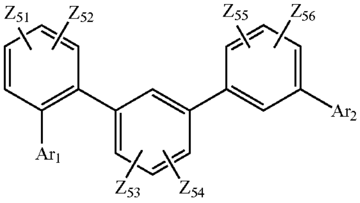

-continued
Formula D-1(29)
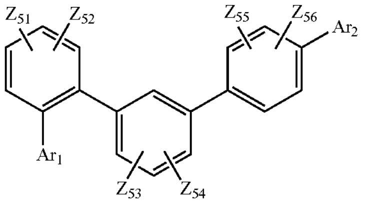
Formula D-1(30)
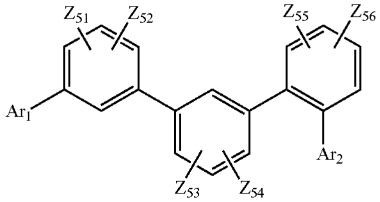
Formula D-1(31)
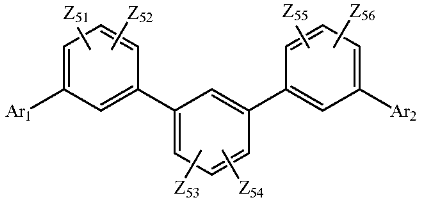
Formula D-1(32)
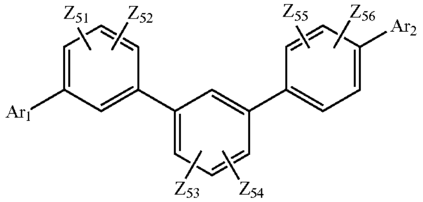
Formula D-1(33)
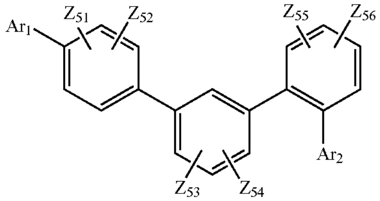
Formula D-1(34)
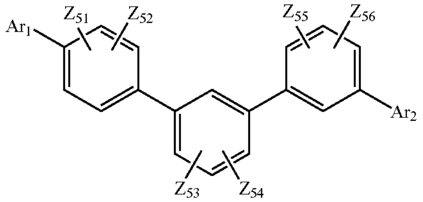
Formula D-1(35)
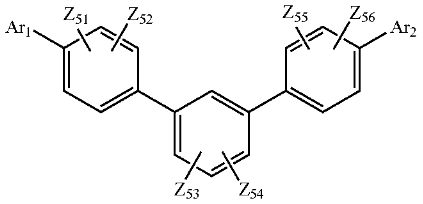
-continued
Formula D-1(36)
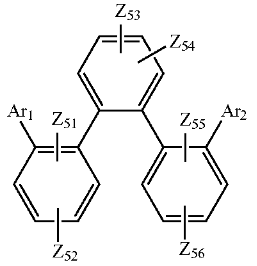
Formula D-1(37)
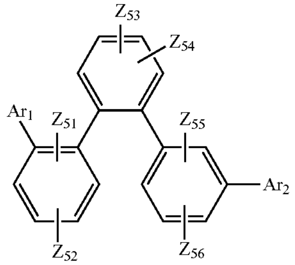
Formula D-1(38)
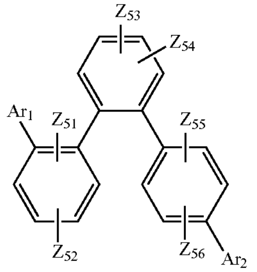
Formula D-1(39)
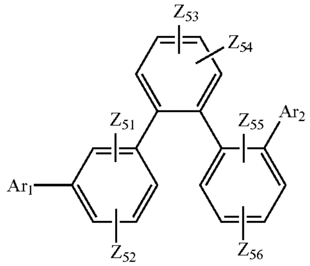
Formula D-1(40)
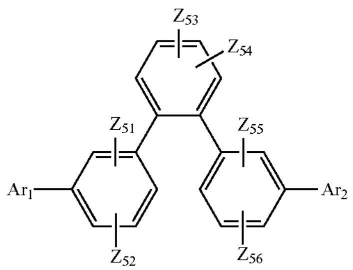

-continued
Formula D-1(41)
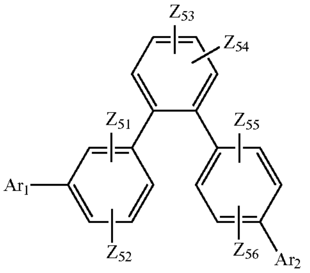
Formula D-1(42)
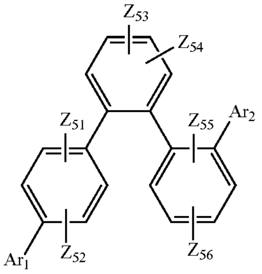
Formula D-1(43)
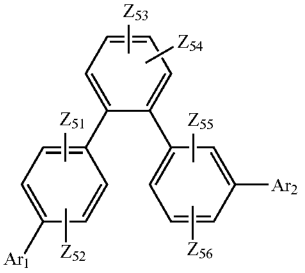
Formula D-1(44)
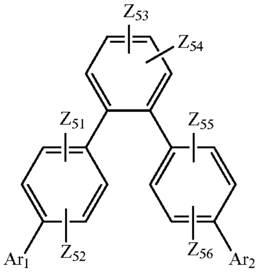
Formula D-1(45)
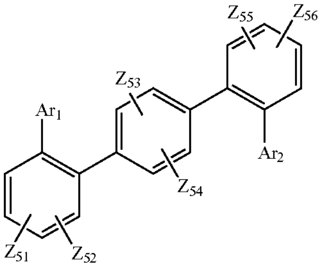
-continued
Formula D-1(46)
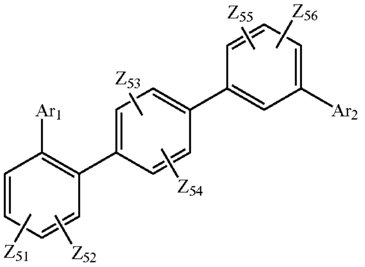
Formula D-1(47)
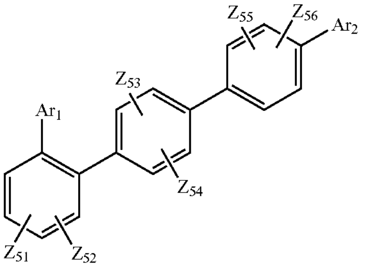
Formula D-1(48)
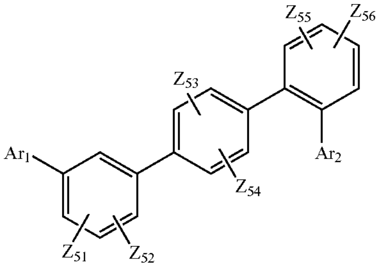
Formula D-1(49)
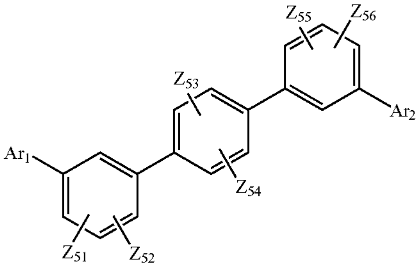
Formula D-1(50)
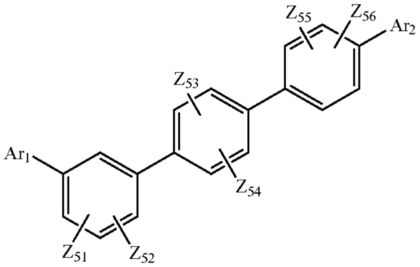

-continued

Formula D-1(51)

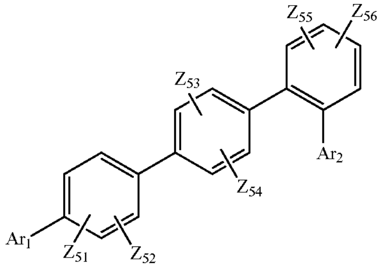

Formula D-1(52)

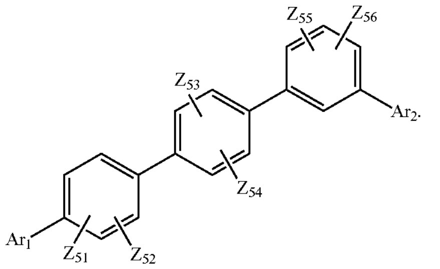

In Formulae D-1(1) to D-1(52), $Ar_1$ and $Ar_2$ may be the same as described in the present specification, $Y_{51}$ may be $C(Z_{53})(Z_{54})$, $N(Z_{55})$, O, or S, $Z_{51}$ to $Z_{56}$ may each independently be selected from hydrogen, deuterium, a $C_1$-$C_{10}$ alkyl group, a $C_1$-$C_{10}$ alkoxy group, a phenyl group, a naphthyl group, a fluorenyl group, a carbazolyl group, a dibenzofuranyl group, a dibenzothiophenyl group, and $—Si(Q_{11})(Q_{12})(Q_{13})$, and $Q_{11}$ to $Q_{13}$ may each independently be selected from hydrogen, a $C_1$-$C_{10}$ alkyl group, a $C_1$-$C_{10}$ alkoxy group, a phenyl group, and a naphthyl group.

For example, in Formulae D-1(1) to D-1(52), $Ar_1$ may be selected from groups represented by Formulae 11 and 12, and $Ar_2$ may be selected from:

groups represented by Formulae 11 and 12, a phenyl group, a naphthyl group, and a benzimidazolyl group; and a phenyl group, a naphthyl group, and a benzimidazolyl group, each substituted with at least one selected from deuterium, a hydroxyl group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a carbazolyl group, a dibenzofuranyl group, and a dibenzothiophenyl group.

In various embodiments, in Formulae D-1(1) to D-1(52), $Ar_1$ may be selected from groups represented by Formulae 11-1 to 11-8 and 12-1 to 12-8, and $Ar_2$ may be selected from groups represented by Formulae 11-1 to 11-8 and 12-1 to 12-8, a phenyl group, a naphthyl group, and a benzimidazolyl group substituted with a phenyl group, but embodiments are not limited thereto.

In various embodiments, in Formulae A-1 and A-2, $L_{11}$ to $L_{13}$ may each independently be selected from groups represented by Formulae 3-1 to 3-56, wherein i) at least one $L_{11}$ in the number of a11, ii) at least one $L_{12}$ in the number of a12, and iii) at least one $L_{13}$ in the number of a13 may each independently be selected from groups represented by Formulae 3-15 to 3-56:

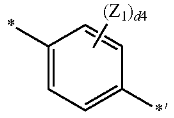

Formula 3-1

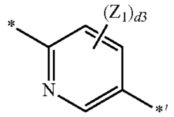

Formula 3-2

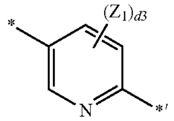

Formula 3-3

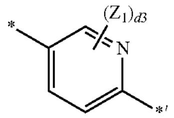

Formula 3-4

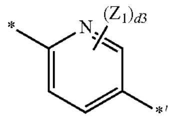

Formula 3-5

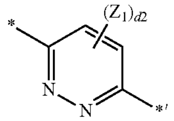

Formula 3-6

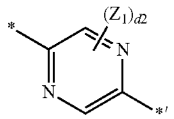

Formula 3-7

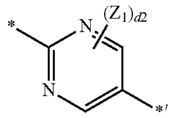

Formula 3-8

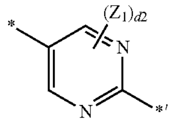

Formula 3-9

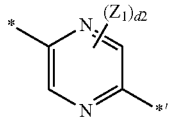

Formula 3-10

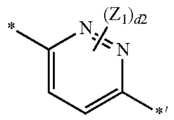

Formula 3-11

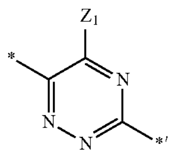

Formula 3-12

-continued
Formula 3-13
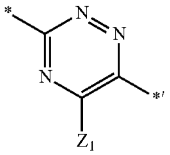
Formula 3-14
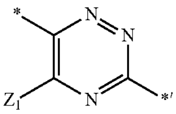
Formula 3-15
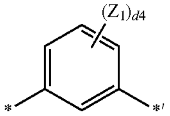
Formula 3-16
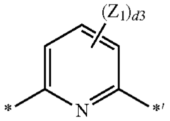
Formula 3-17
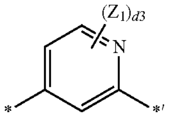
Formula 3-18
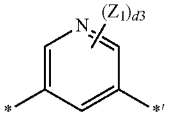
Formula 3-19
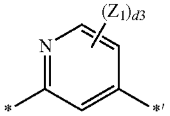
Formula 3-20
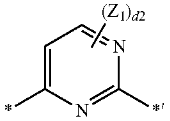
Formula 3-21
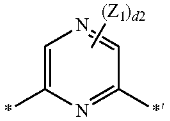
Formula 3-22
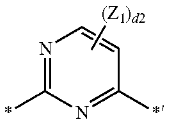
Formula 3-23
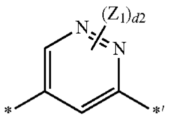
Formula 3-24
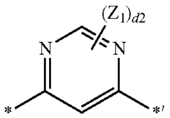
-continued
Formula 3-25
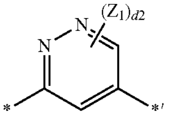
Formula 3-26
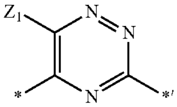
Formula 3-27
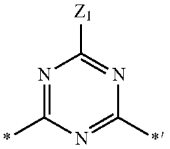
Formula 3-28
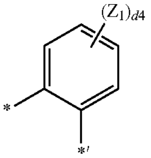
Formula 3-29
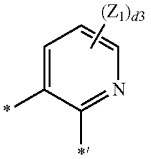
Formula 3-30
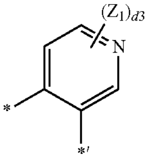
Formula 3-31
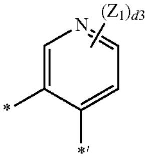
Formula 3-32
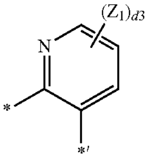
Formula 3-33
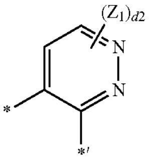
Formula 3-34
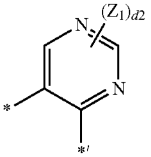

-continued
Formula 3-35
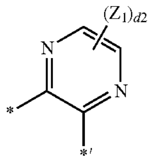
Formula 3-36
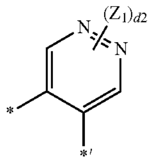
Formula 3-37
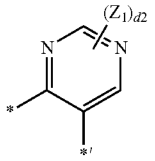
Formula 3-38
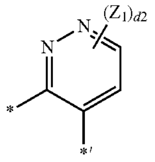
Formula 3-39
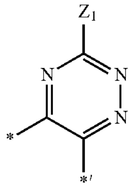
Formula 3-40
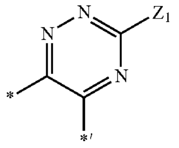
Formula 3-41
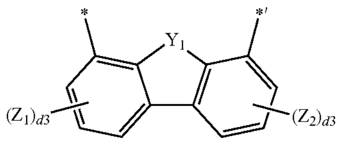
Formula 3-42
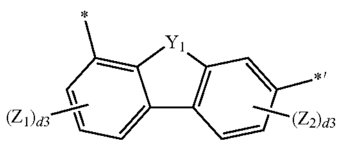
Formula 3-43
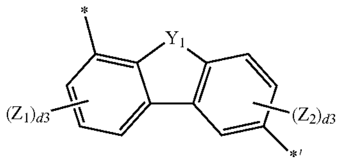
-continued
Formula 3-44
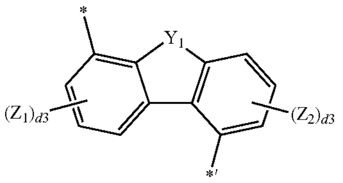
Formula 3-45
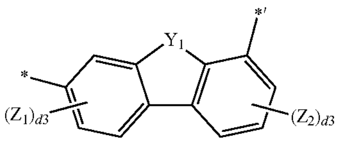
Formula 3-46
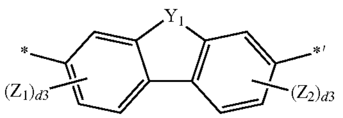
Formula 3-47
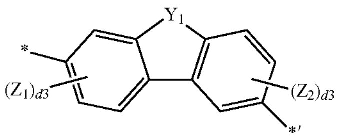
Formula 3-48
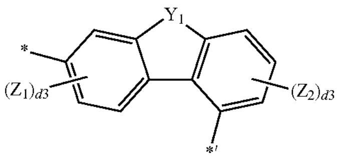
Formula 3-49
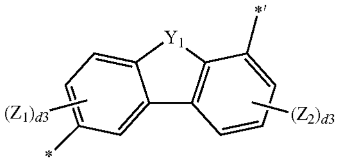
Formula 3-50
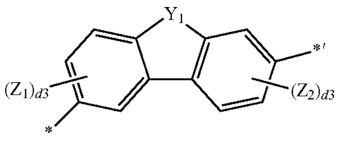
Formula 3-51
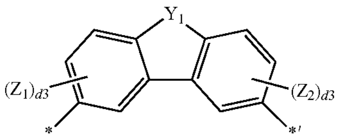
Formula 3-52
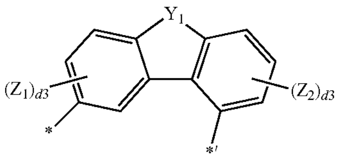
Formula 3-53
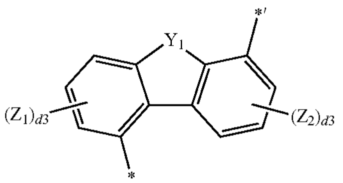

-continued

Formula 3-54

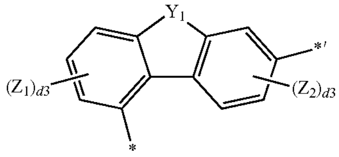

Formula 3-55

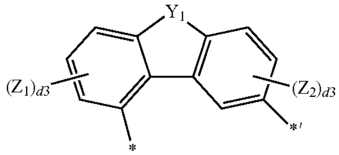

Formula 3-56

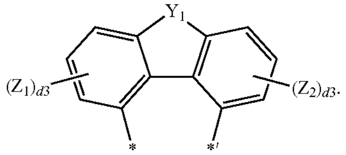

In Formulae 3-1 to 3-56, $Y_1$ may be selected from O, S, $C(Z_3)(Z_4)$, and $N(Z_5)$, $Z_1$ to $Z_5$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, —$CF_3$, —$CF_2H$, —$CFH_2$, a phenyl group, a phenyl group substituted with a cyano group, a naphthyl group, a pyridinyl group, a pyrimidinyl group, a pyrazinyl group, a pyridazinyl group, a triazinyl group, a fluorenyl group, a carbazolyl group, a dibenzofuranyl group, a dibenzothiophenyl group, and —$Si(Q_{11})(Q_{12})(Q_{13})$, $Q_{11}$ to $Q_{13}$ may each independently be selected from hydrogen, a $C_1$-$C_{10}$ alkyl group, a $C_1$-$C_{10}$ alkoxy group, a phenyl group, a naphthyl group, a pyridinyl group, a pyrimidinyl group, a pyrazinyl group, a pyridazinyl group, a triazinyl group, a fluorenyl group, a carbazolyl group, a dibenzofuranyl group, and a dibenzothiophenyl group, d4 may be an integer selected from 0 to 4, d3 may be an integer selected from 0 to 3, d2 may be an integer selected from 0 to 2, and

* and *' each indicate a binding site to a neighboring atom.

In various embodiments, in Formulae A-1 and A-2, the groups represented by $*\text{-}(L_{11})_{a11}\text{-}*'$, $*\text{-}(L_{12})_{a12}\text{-}*'$, and $*\text{-}(L_{13})_{a13}\text{-}*'$ may each independently be selected from groups represented by Formulae 4-1 to 4-39:

Formula 4-1

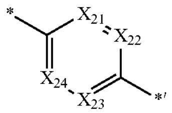

Formula 4-2

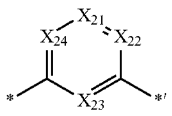

-continued

Formula 4-3

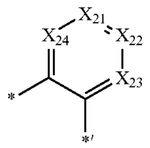

Formula 4-4

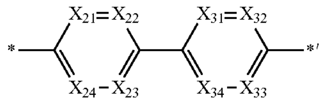

Formula 4-5

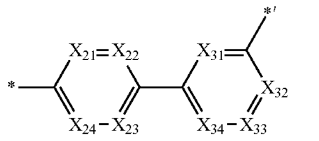

Formula 4-6

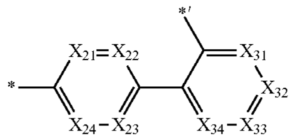

Formula 4-7

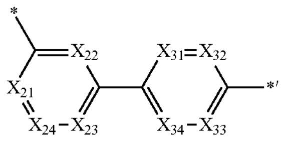

Formula 4-8

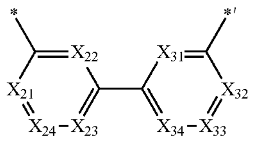

Formula 4-9

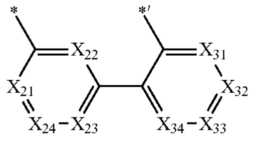

Formula 4-10

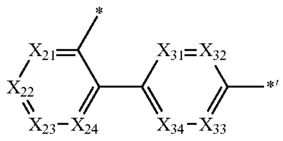

Formula 4-11

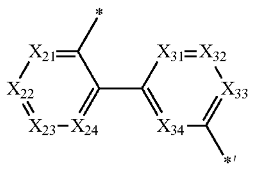

Formula 4-12

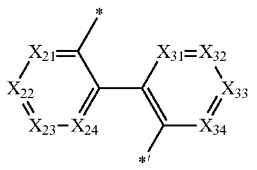

-continued
Formula 4-13
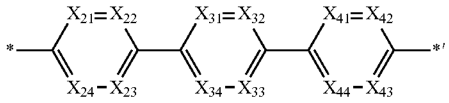
Formula 4-14
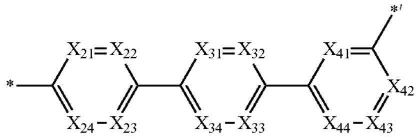
Formula 4-15
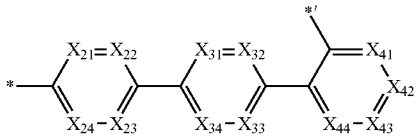
Formula 4-16
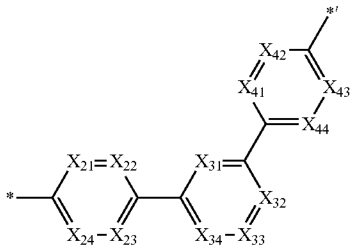
Formula 4-17
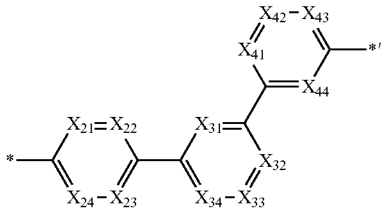
Formula 4-18
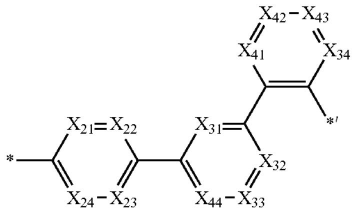
Formula 4-19
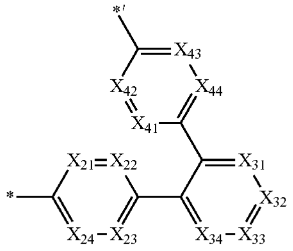
-continued
Formula 4-20
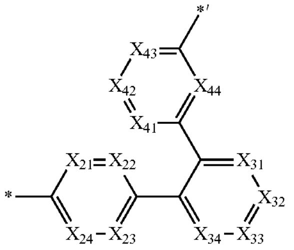
Formula 4-21
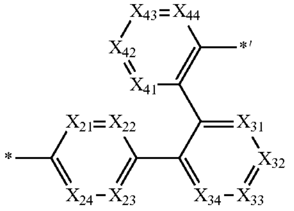
Formula 4-22
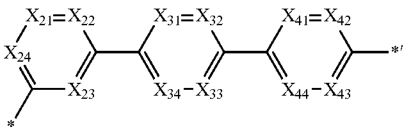
Formula 4-23
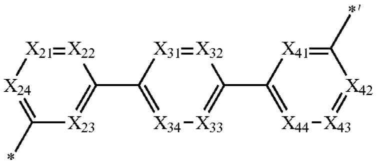
Formula 4-24
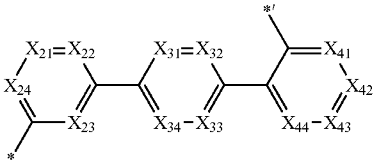
Formula 4-25
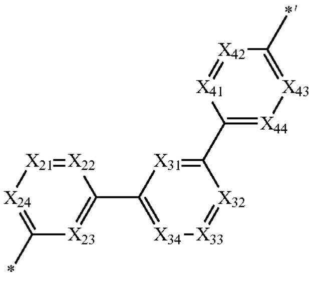
Formula 4-26
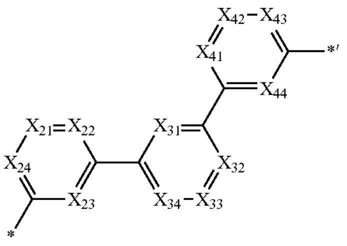

-continued
Formula 4-27
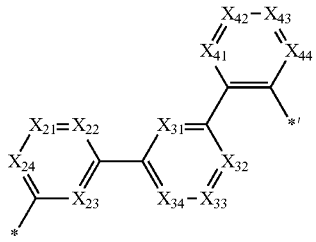
Formula 4-28
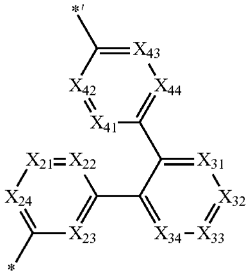
Formula 4-29
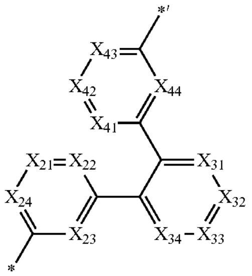
Formula 4-30
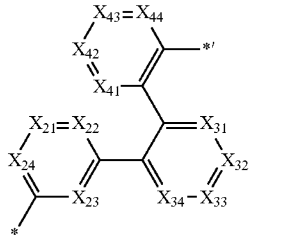
Formula 4-31
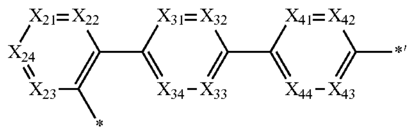
Formula 4-32
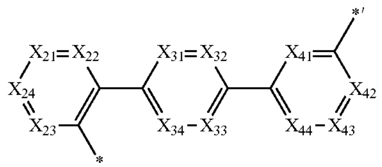
Formula 4-33
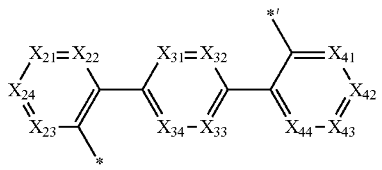
-continued
Formula 4-34
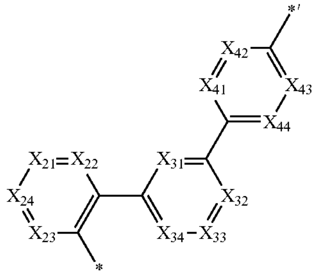
Formula 4-35
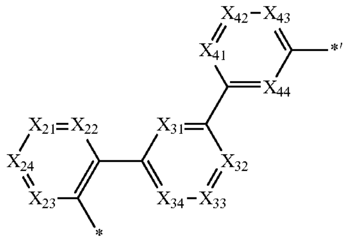
Formula 4-36
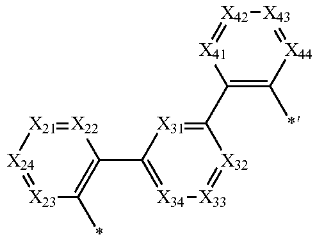
Formula 4-37
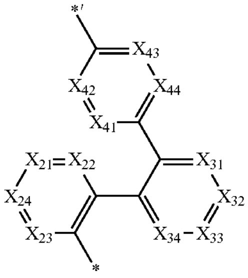
Formula 4-38
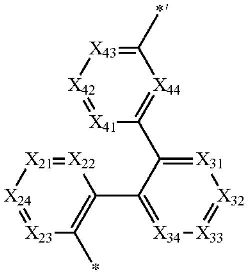
Formula 4-39
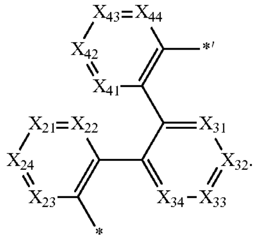

In Formulae 4-1 to 4-39, $X_{21}$ may be N or $C(Z_{21})$, $X_{22}$ may be N or $C(Z_{22})$, $X_{23}$ may be N or $C(Z_{23})$, $X_{24}$ may be N or $C(Z_{24})$, $X_{31}$ may be N or $C(Z_{31})$, $X_{32}$ may be N or $C(Z_{32})$, $X_{33}$ may be N or $C(Z_{33})$, $X_{34}$ may be N or $C(Z_{34})$, $X_{41}$ may be N or $C(Z_{41})$, $X_{42}$ may be N or $C(Z_{42})$, $X_{43}$ may be N or $C(Z_{43})$, and $X_{44}$ may be N or $C(Z_{44})$, provided that at least one of $X_{21}$ to $X_{24}$ are not N, at least one of $X_{31}$ to $X_{34}$ are not N, and at least one of $X_{41}$ to $X_{44}$ are not N, $Z_{21}$ to $Z_{24}$, $Z_{31}$ to $Z_{34}$, and $Z_{41}$ to $Z_{44}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, —$CF_3$, —$CF_2H$, —$CFH_2$, a phenyl group, a phenyl group substituted with a cyano group, a naphthyl group, a pyridinyl group, a pyrimidinyl group, a pyrazinyl group, a pyridazinyl group, a triazinyl group, a fluorenyl group, a carbazolyl group, a dibenzofuranyl group, a dibenzothiophenyl group, and —$Si(Q_{11})(Q_{12})(Q_{13})$, $Q_{11}$ to $Q_{13}$ may each independently be selected from hydrogen, a $C_1$-$C_{10}$ alkyl group, a $C_1$-$C_{10}$ alkoxy group, a phenyl group, a naphthyl group, a pyridinyl group, a pyrimidinyl group, a pyrazinyl group, a pyridazinyl group, a triazinyl group, a fluorenyl group, a carbazolyl group, a dibenzofuranyl group, and a dibenzothiophenyl group, and

* and *' each indicate a binding site to a neighboring atom.

In various embodiments, in Formula A-2, $T_{11}$ to $T_{15}$ may each independently be selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, —$CF_3$, —$CF_2H$, and —$CFH_2$, a $C_1$-$C_{10}$ alkyl group and a $C_1$-$C_{10}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$CF_3$, —$CF_2H$, and —$CFH_2$, a phenyl group, a naphthyl group, a pyridinyl group, a pyrimidinyl group, a pyrazinyl group, a pyridazinyl group, a triazinyl group, a fluorenyl group, a carbazolyl group, a dibenzofuranyl group, and a dibenzothiophenyl group;

a phenyl group, a naphthyl group, a pyridinyl group, a pyrimidinyl group, a pyrazinyl group, a pyridazinyl group, a triazinyl group, a fluorenyl group, a carbazolyl group, a dibenzofuranyl group, and a dibenzothiophenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, —$CF_3$, —$CF_2H$, —$CFH_2$, a phenyl group, a naphthyl group, a pyridinyl group, a pyrimidinyl group, a pyrazinyl group, a pyridazinyl group, a triazinyl group, a fluorenyl group, a carbazolyl group, a dibenzofuranyl group, and a dibenzothiophenyl group; and —$Si(Q_1)(Q_2)(Q_3)$, and $Q_1$ to $Q_3$ may each independently be selected from hydrogen, a $C_1$-$C_{10}$ alkyl group, a $C_1$-$C_{10}$ alkoxy group, a phenyl group, a naphthyl group, a pyridinyl group, a pyrimidinyl group, a pyrazinyl group, a pyridazinyl group, a triazinyl group, a fluorenyl group, a carbazolyl group, a dibenzofuranyl group, and a dibenzothiophenyl group.

For example, in Formula A-2, $T_{11}$ to $T_{16}$ may each independently be selected from:

hydrogen, deuterium, —F, a cyano group, a $C_1$-$C_{10}$ alkyl group, a $C_1$-$C_{10}$ alkoxy group —$CF_3$, —$CF_2H$, and —$CFH_2$, a $C_1$-$C_{10}$ alkyl group and a $C_1$-$C_{10}$ alkoxy group, each substituted with at least one selected from deuterium, —F, a cyano group —$CF_3$, —$CF_2H$, and —$CFH_2$, a phenyl group, a pyridinyl group, a pyrimidinyl group, a triazinyl group, a carbazolyl group, a dibenzofuranyl group, and a dibenzothiophenyl group;

a phenyl group, a pyridinyl group, a pyrimidinyl group, a triazinyl group, a carbazolyl group, a dibenzofuranyl group, and a dibenzothiophenyl group, each substituted with at least one selected from deuterium, —F, a cyano group, a $C_1$-$C_{10}$ alkyl group, a $C_1$-$C_{10}$ alkoxy group, —$CF_3$, —$CF_2H$, —$CFH_2$, a phenyl group, a pyridinyl group, a pyrimidinyl group, a triazinyl group, a carbazolyl group, a dibenzofuranyl group, and a dibenzothiophenyl group; and —$Si(Q_1)(Q_2)(Q_3)$, and $Q_1$ to $Q_3$ may each independently be selected from hydrogen, a $C_1$-$C_{10}$ alkyl group, a $C_1$-$C_{10}$ alkoxy group, a phenyl group, a pyridinyl group, a pyrimidinyl group, a triazinyl group, a carbazolyl group, a dibenzofuranyl group, and a dibenzothiophenyl group.

In various embodiments, i) the acceptor compound is represented by Formula A-1, provided that the acceptor compound is selected from compounds in which $Ar_{11}$ and $Ar_{12}$ in Formula A-1 are each independently selected from groups represented by Formulae 17-1 to 17-3, and at least one of $Ar_{11}$ and $Ar_{12}$ is selected from groups represented by Formulae 17-2 and 17-3;

ii) the acceptor compound is represented by Formula A-1, provided that the acceptor compound is selected from compounds in which $L_{11}$ in Formula A-1 is selected from groups represented by Formulae 3-15 and 3-28, and at least one $L_{11}$ in the number of a11 is selected from groups represented by Formulae 6-1 to 6-4; or iii) the acceptor compound is represented by Formula A-2, provided that the acceptor compound is selected from compounds in which $X_1$ to $X_3$ in Formula A-2 are all N, but embodiments are not limited thereto.

In various embodiments, the donor compound may be selected from Compounds D1 to D17, and the acceptor compound may be selected from Compounds A1 to A11, but embodiments are not limited thereto:

-continued
D1
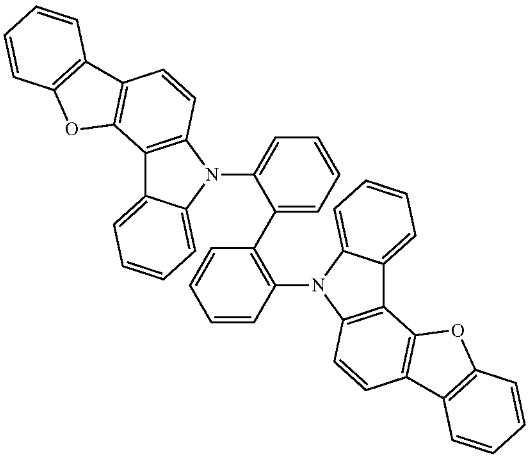 [SMILES: c1ccc(-n2c3ccccc3c3c4oc5ccccc5c4ccc32)c(-c2ccccc2-n2c3ccccc3c3c4oc5ccccc5c4ccc32)c1]
D2
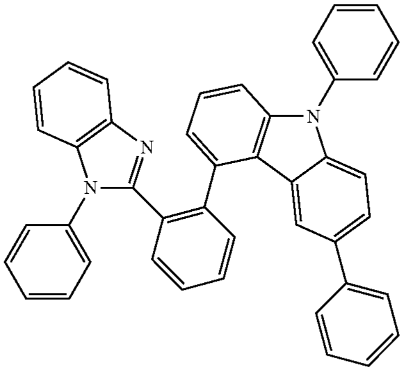
D3
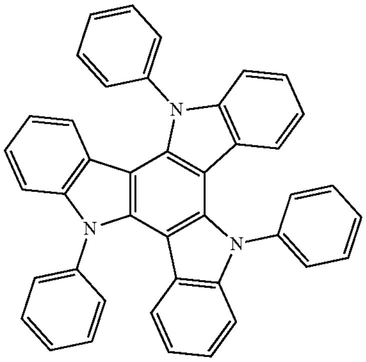
D4
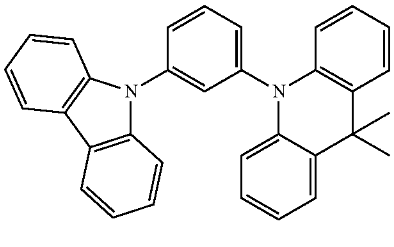
D5
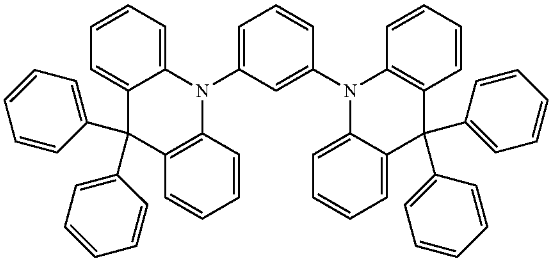
D6
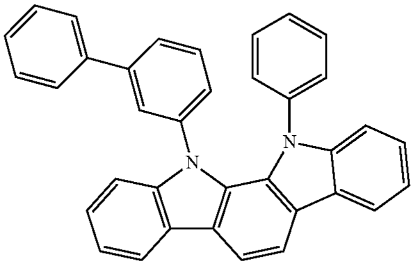
D7
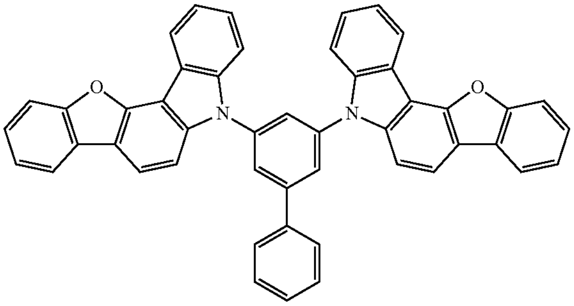
D8
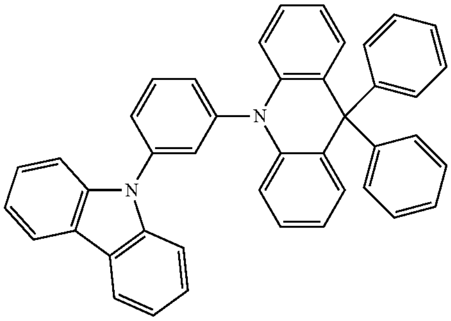
D9
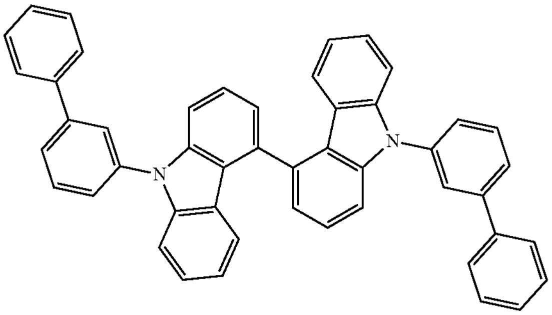

-continued
D10
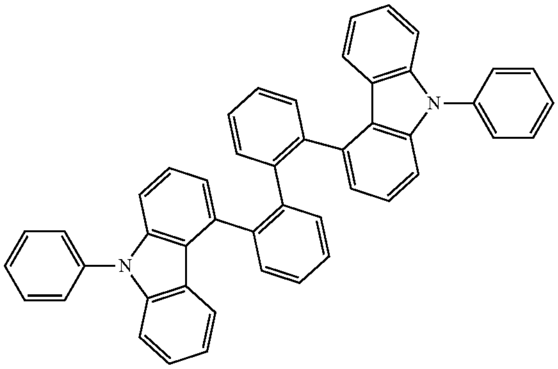
D11
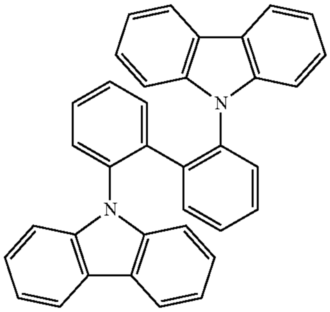
D12
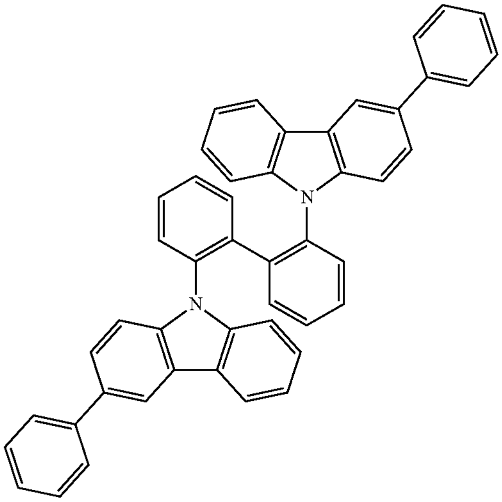
D13
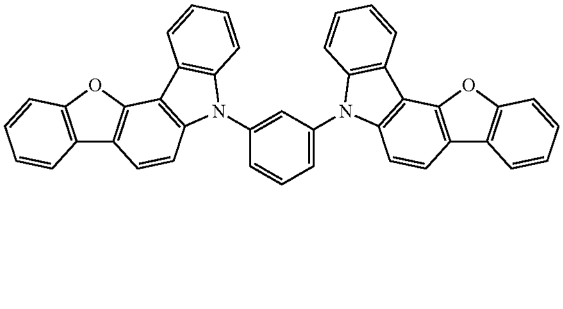
-continued
D14
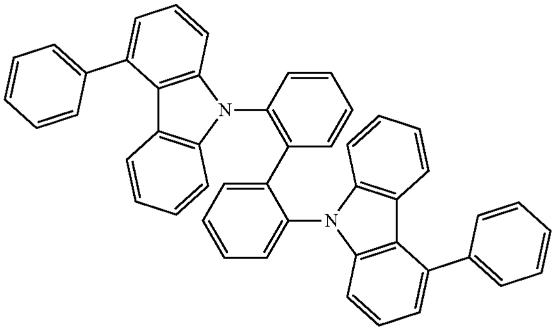
D15
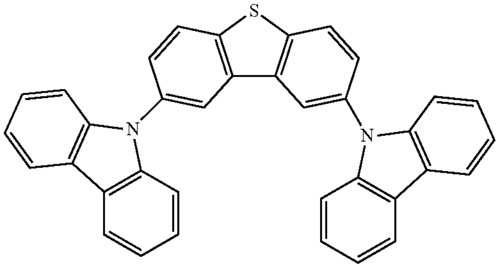
D16
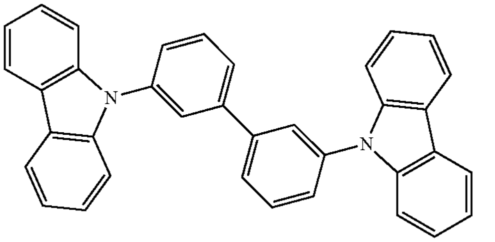
D17
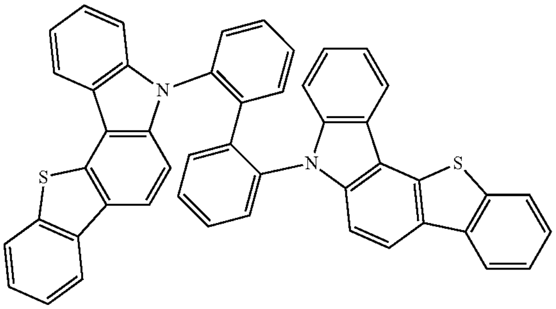
A1
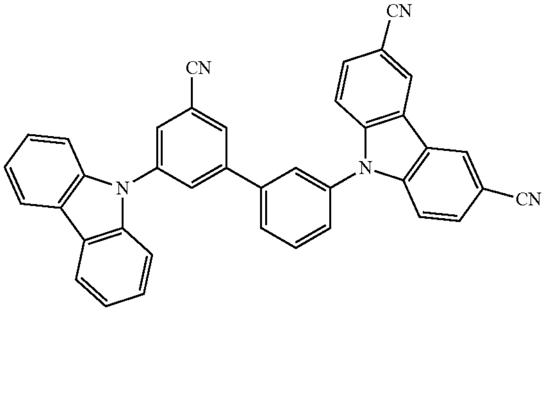

-continued
A2
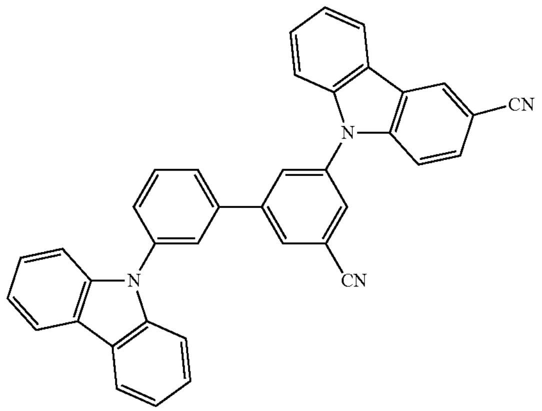
A3
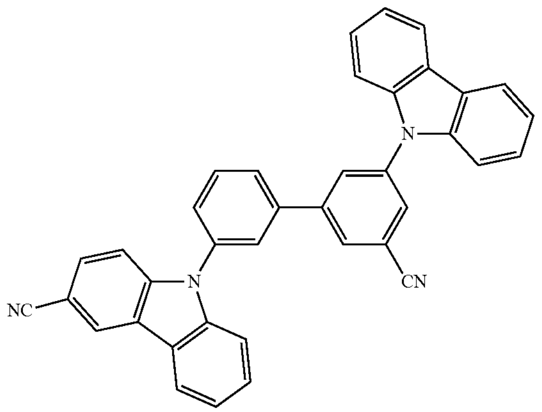
A4
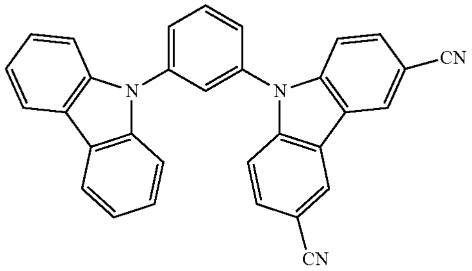
A5
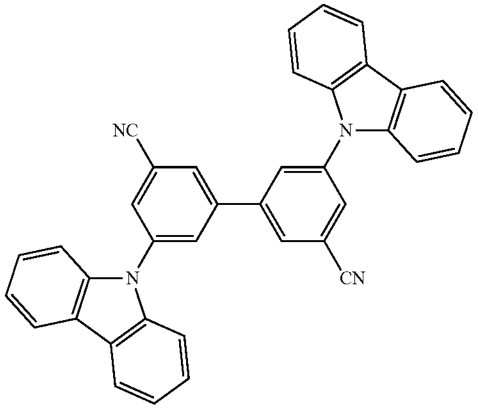
-continued
A6
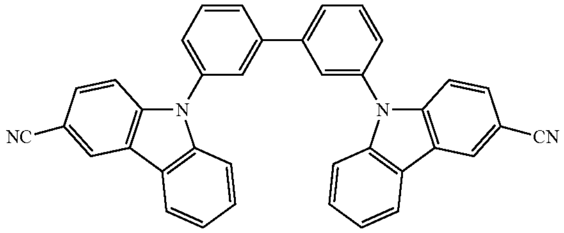
A7
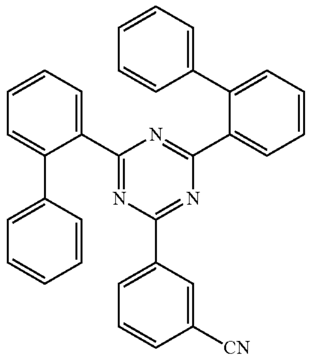
A8
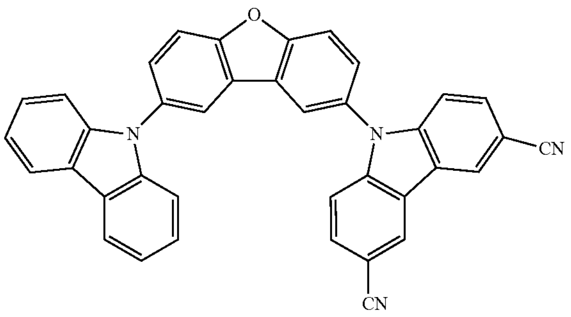
A9
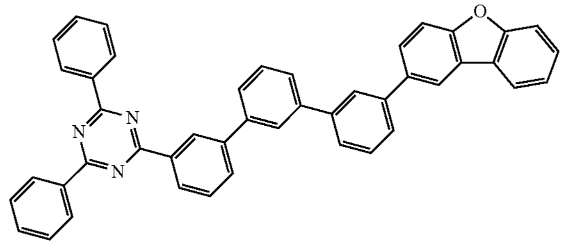
A10
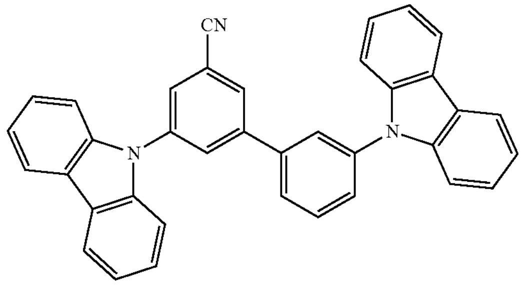

-continued

A11

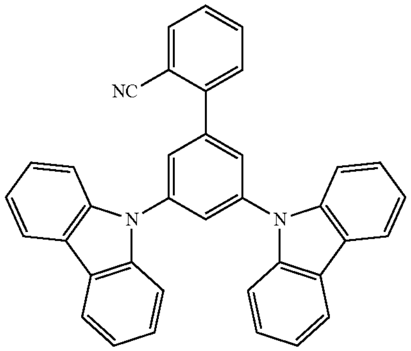

The thin film may further include, in addition to the combination, a phosphorescent dopant.

The phosphorescent dopant may include a dopant that can emit light according to a phosphorescent emission mechanism.

The phosphorescent dopant may be selected from a red phosphorescent dopant, a green phosphorescent dopant, and a blue phosphorescent dopant.

In various embodiments, the phosphorescent dopant may be a green phosphorescent dopant or a blue phosphorescent dopant, but embodiments are not limited thereto.

For example, the phosphorescent dopant may include an organometallic compound represented by Formula 81:

Formula 81

$M(L_{81})_{n81}(L_{82})_{n82}$

Formula 81A

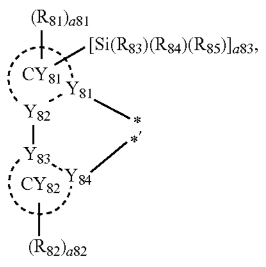

wherein, in Formulae 81 and 81A,

M may be selected from iridium (Ir), platinum (Pt), osmium (Os), titanium (Ti), zirconium (Zr), hafnium (Hf), europium (Eu), terbium (Tb), thulium (Tm), and rhodium (Rh), $L_{81}$ may be a ligand represented by Formula 81A and n81 may be an integer selected from 1 to 3, and when n81 is 2 or greater, groups $L_{81}$ may be identical to or different from each other, $L_{82}$ may be an organic ligand and n82 may be an integer selected from 0 to 4, and when n82 is 2 or greater, groups $L_{82}$ may be identical to or different from each other, $Y_{81}$ to $Y_{84}$ may each independently be C or N, $Y_{81}$ and $Y_{82}$ may be connected through a single bond or a double bond, and $Y_{83}$ and $Y_{84}$ may be connected through a single bond or a double bond, $Y_{81}$ and $CY_{82}$ may each independently be selected from a $C_5$-$C_{30}$ carbocyclic group and a $C_1$-$C_{30}$ heterocarbocyclic group, $CY_{81}$ and $CY_{82}$ may be optionally further bonded to each other through an organic linking group, $R_{81}$ to $R_{85}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, —$Si(Q_{81})(Q_{82})(Q_{83})$, —$N(Q_{84})(Q_{85})$, —$B(Q_{86})(Q_{87})$, and —$P(=O)(Q_{88})(Q_{89})$, a81 to a83 may each independently be an integer selected from 0 to 5, and when a81 is 2 or greater, groups $R_{81}$ may be identical to or different from each other, when a8 is 2 or greater, groups $R_{82}$ may be identical to or different from each other, when a8 is 2 or greater, neighboring groups $R_{81}$ may be optionally bonded to each other to form a saturated or unsaturated ring, and when a82 is 2 or greater, neighboring groups $R_{82}$ may be optionally bonded to each other to form a saturated or unsaturated ring,

* and *' in Formula 81A each indicate a binding site to M in Formula 81, at least one of substituent(s) of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_2$-$C_{60}$ heteroarylalkyl group, the substituted monovalent non-aromatic condensed polycyclic group, and the substituted monovalent non-aromatic condensed heteropolycyclic group may be selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, and —$Si(Q_{91})(Q_{92})(Q_{93})$, and $Q_{81}$ to $Q_{89}$ and $Q_{91}$ to $Q_{93}$ may each independently be selected from hydrogen, deuterium, a $C_1$-$C_{60}$ alkyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

In various embodiments, in Formula 81A, a83 may be 1 or 2, and $R_{83}$ to $R_{85}$ may each independently be selected from:

$-CH_3$, $-CD_3$, $-CD_2H$, $-CDH_2$, $-CH_2CH_3$, $-CH_2CD_3$, $-CH_2CD_2H$, $-CH_2CDH_2$, $-CHDCH_3$, $-CHDCD_2H$, $-CHDCDH_2$, $-CHDCD_3$, $-CD_2CD_3$, $-CD_2CD_2H$, and $-CD_2CDH_2$, an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group, each substituted with at least one selected from deuterium, a $C_1$-$C_{10}$ alkyl group, and a phenyl group, but embodiments are not limited thereto.

In various embodiments, in Formula 81A, $Y_{81}$ may be N, $Y_{82}$ and $Y_{83}$ may each independently be C, $Y_{84}$ may be N or C, $CY_{81}$ and $CY_{82}$ may each independently be selected from a cyclopentadiene group, a benzene group, a heptalene group, an indene group, a naphthalene group, an azulene group, a heptalene group, an indacene group, an acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentaphene group, a rubicene group, a corozene group, an ovalene group, a pyrrole group, an iso-indole group, an indole group, an indazole group, a pyrazole group, an imidazole group, a triazole group, an oxazole group, an isoxazole group, an oxadiazole group, a thiazole group, an isothiazole group, a thiadiazole group, a purine group, a furan group, a thiophene group, a pyridine group, a pyrimidine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, a benzofuran group, a benzothiophene group, an iso-benzothiazole group, a benzoxazole group, an isobenzoxazole group, a benzocarbazole group, a dibenzocarbazole group, an imidazopyridine group, an imidazopyrimidine group, a dibenzofuran group, a dibenzothiophene group, a dibenzothiophene sulfone group, a carbazole group, a dibenzosilol group, and a 2,3-dihydro-1H-imidazole group.

In various embodiments, in Formula 81A, $Y_{81}$ may be N, $Y_{82}$ to $Y_{84}$ may each independently be C, $CY_{81}$ may be selected from a 5-membered ring including, as a ring-forming atom, two nitrogen atoms, and $CY_{82}$ may be selected from a benzene group, a naphthalene group, a fluorene group, a dibenzofuran group, and a dibenzothiophene group, but embodiments are not limited thereto.

In various embodiments, in Formula 81A, $Y_{81}$ may be N, $Y_{82}$ to $Y_{84}$ may each independently be C, $CY_{81}$ may be an imidazole group or a 2,3-dihydro-1H-imidazole group, and $CY_{82}$ may be selected from a benzene group, a naphthalene group, a fluorene group, a dibenzofuran group, and a dibenzothiophene group, but embodiments are not limited thereto.

In various embodiments, in Formula 81A, $Y_{81}$ may be N, $Y_{82}$ to $Y_{84}$ may each independently be C, $CY_{81}$ may be selected from a pyrrole group, a pyrazole group, an imidazole group, a triazole group, an oxazole group, an isoxazole group, an oxadiazole group, a thiazole group, an isothiazole group, a thiadiazole group, a pyridine group, a pyrimidine group, a quinoline group, an isoquinoline group, a benzoquinoline group, a phthalazine group, a naphthyridine group, a quinoxaline group, a quinazoline group, a cinnoline group, a benzimidazole group, an isobenzothiazole group, a benzoxazole group, and an isobenzoxazole group, and $CY_{82}$ may be selected from a cyclopentadiene group, a benzene group, a naphthalene group, a fluorene group, a benzofluorene group, a dibenzofluorene group, a phenanthrene group, an anthracene group, a triphenylene group, a pyrene group, a chrysene group, a perylene group, a benzofuran group, a benzothiophene group, a benzocarbazole group, a dibenzocarbazole group, a dibenzofuran group, a dibenzothiophene group, a dibenzothiophene sulfone group, a carbazole group, and a dibenzosilol group.

In various embodiments, in Formula 81A, $R_{81}$ and $R_{82}$ may each independently be selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, $-SF_5$, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, $-CD_3$, $-CD_2H$, $-CDH_2$, $-CF_3$, $-CF_2H$, $-CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, each substituted with at least one selected from deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group; and $—B(Q_{86})(Q_{87})$ and $—P(=O)(Q_{88})(Q_{89})$ and $Q_{86}$ to $Q_{89}$ may each independently be selected from:

$—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, and $—CD_2CDH_2$;

an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group, each substituted with at least one selected from deuterium, a $C_1$-$C_{10}$ alkyl group, and a phenyl group.

In various embodiments, in Formula 81A, $R_{81}$ and $R_{82}$ may each independently be selected from:

hydrogen, deuterium, —F, a cyano group, a nitro group, $—SF_5$, a methyl group, an ethyl group, an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group;

a methyl group, an ethyl group, an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group, each substituted with at least one selected from deuterium, —F, $—CD_3$, $—CD_2H$, $—CDH_2$, $—CF_3$, $—CF_2H$, $—CFH_2$, a cyano group, a nitro group, a $C_1$-$C_{10}$ alkyl group, a $C_1$-$C_{10}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group; and $—B(Q_{86})(Q_{87})$ and $—P(=O)(Q_{88})(Q_{89})$, and $Q_{86}$ to $Q_{89}$ may each independently be selected from:

$—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, and $—CD_2CDH_2$;

an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group, each substituted with at least one selected from deuterium, a $C_1$-$C_{10}$ alkyl group, and a phenyl group.

In various embodiments, in Formula 81A, $R_{81}$ and $R_{82}$ may each independently be selected from hydrogen, deuterium, —F, a cyano group, a nitro group, $—SF_5$, $—CH_3$, $—CD_3$, $—CD_2H$, $—CDH_2$, $—CF_3$, $—CF_2H$, $—CFH_2$, groups represented by Formulae 9-1 to 9-19, and groups represented by Formulae 10-1 to 10-30, but embodiments are not limited thereto:

Formula 9-1

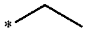

Formula 9-2

Formula 9-3

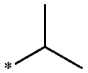

Formula 9-4

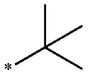

Formula 9-5

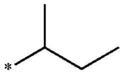

Formula 9-6

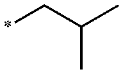

Formula 9-7

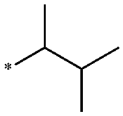

Formula 9-8

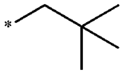

Formula 9-9

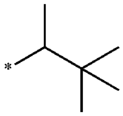

Formula 9-10

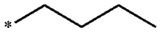

Formula 9-11

Formula 9-12

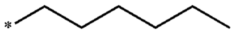

Formula 9-13

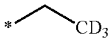

Formula 9-14

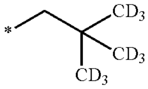

Formula 9-15

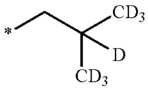

Formula 9-16

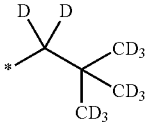

-continued

Formula 9-17

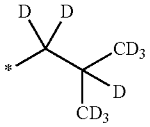

Formula 9-18

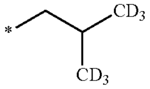

Formula 9-19

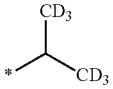

Formula 10-1

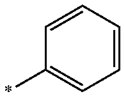

Formula 10-2

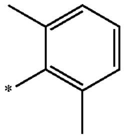

Formula 10-3

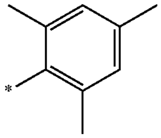

Formula 10-4

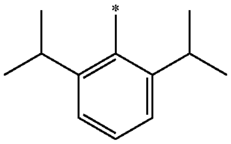

Formula 10-5

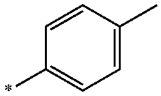

Formula 10-6

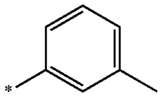

Formula 10-7

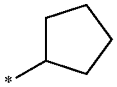

Formula 10-8

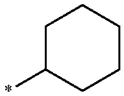

Formula 10-9

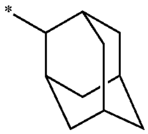

Formula 10-10

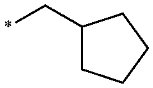

-continued

Formula 10-11

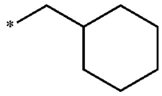

Formula 10-12

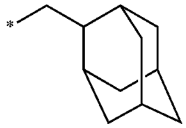

Formula 10-13

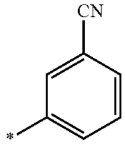

Formula 10-14

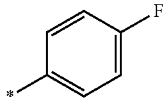

Formula 10-15

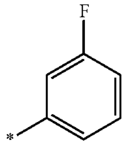

Formula 10-16

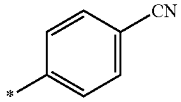

Formula 10-17

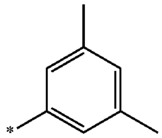

Formula 10-18

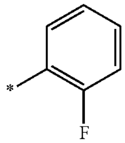

Formula 10-19

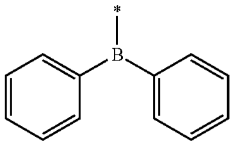

Formula 10-20

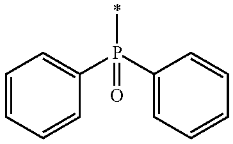

Formula 10-21

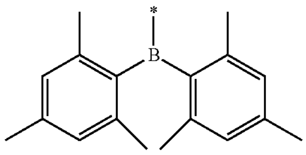

-continued

Formula 10-22

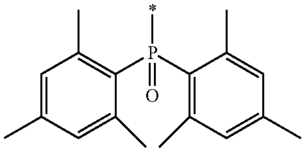

Formula 10-23

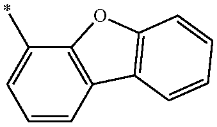

Formula 10-24

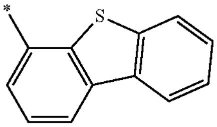

Formula 10-25

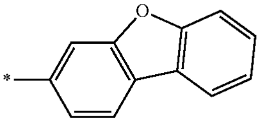

Formula 10-26

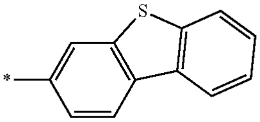

Formula 10-27

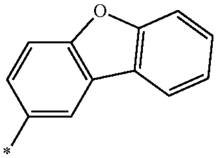

Formula 10-28

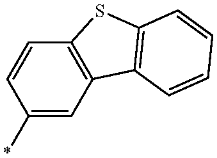

Formula 10-29

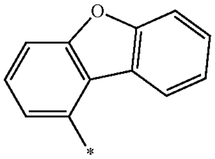

Formula 10-30

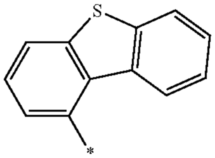

In Formulae 9-1 to 9-17 and 10-1 to 10-30, * indicates a binding site to a neighboring atom.

In various embodiments, in Formula 81A, at least one selected from $R_{81}$ in the number of a81 and $R_{82}$ in the number of a82 may be a cyano group.

In various embodiments, in Formula 81A, at least one $R_{82}$ in the number of a82 may be a cyano group.

In various embodiments, in Formula 81A, at least one selected from $R_{81}$ in the number of a81 and $R_{82}$ in the number of a82 may be deuterium.
In various embodiments, in Formula 81, $L_{82}$ may be selected from ligands represented by Formulae 3-1(1) to 3-1(60), 3-1(61) to 3-1(69), 3-1(71) to 3-1(79), 3-1(81) to 3-1(88), 3-1(91) to 3-1(98), and 3-1(101) to 3-1(114):
Formula 3-1(1)
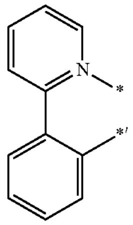
Formula 3-1(2)
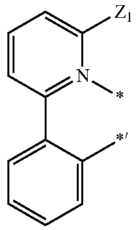
Formula 3-1(3)
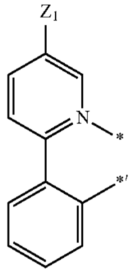
Formula 3-1(4)
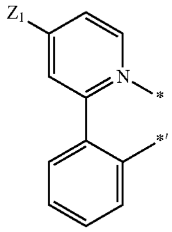
Formula 3-1(5)
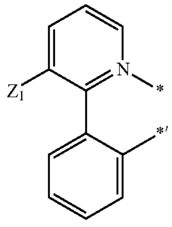
Formula 3-1(6)
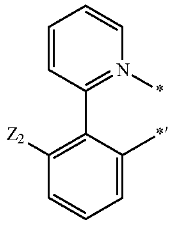
-continued
Formula 3-1(7)
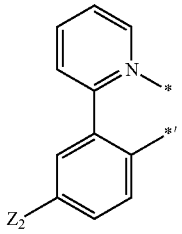
Formula 3-1(8)
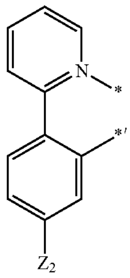
Formula 3-1(9)
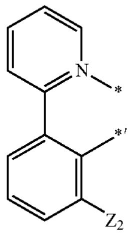
Formula 3-1(10)
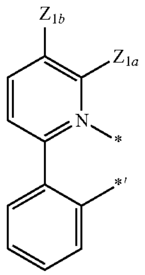
Formula 3-1(11)
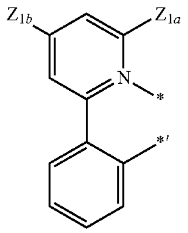
Formula 3-1(12)
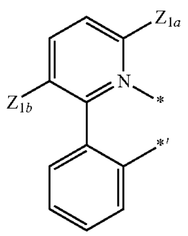

-continued
Formula 3-1(13)
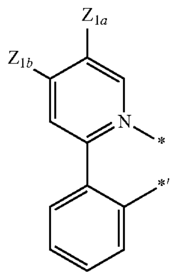
Formula 3-1(14)
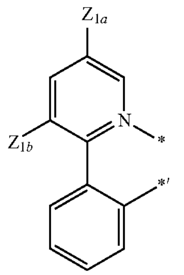
Formula 3-1(15)
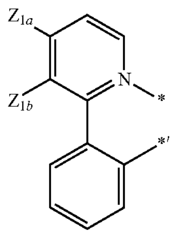
Formula 3-1(16)
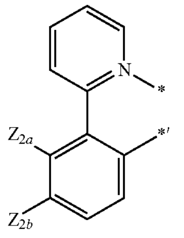
Formula 3-1(17)
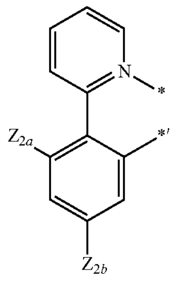
Formula 3-1(18)
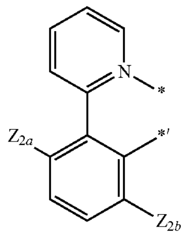
-continued
Formula 3-1(19)
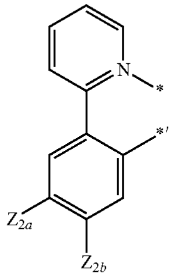
Formula 3-1(20)
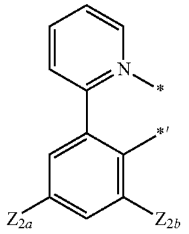
Formula 3-1(21)
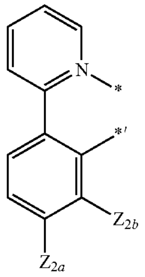
Formula 3-1(22)
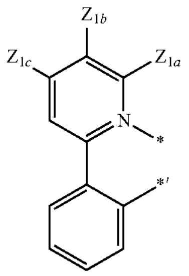
Formula 3-1(23)
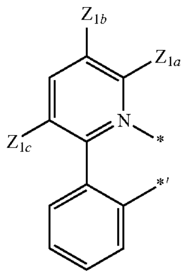
Formula 3-1(24)
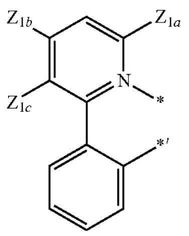

-continued
Formula 3-1(25)
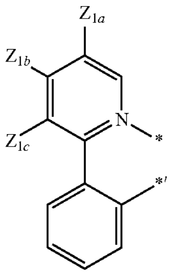
Formula 3-1(26)
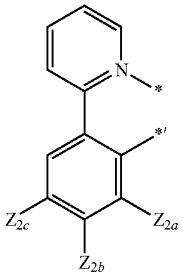
Formula 3-1(27)
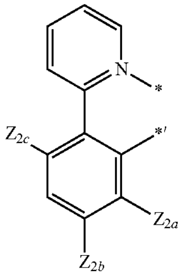
Formula 3-1(28)
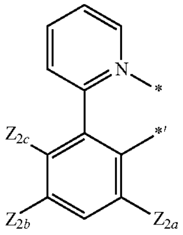
Formula 3-1(29)
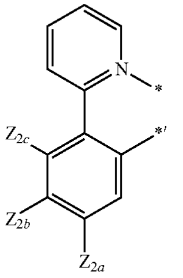
-continued
Formula 3-1(30)
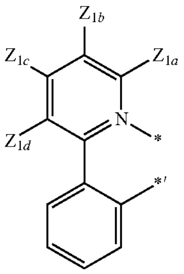
Formula 3-1(31)
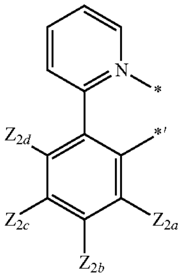
Formula 3-1(32)
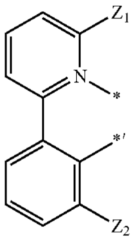
Formula 3-1(33)
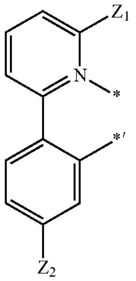
Formula 3-1(34)
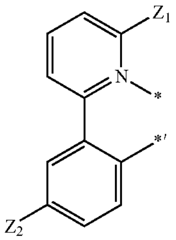
Formula 3-1(35)
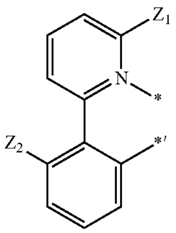

-continued
Formula 3-1(36)
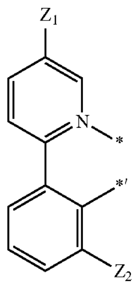
Formula 3-1(37)
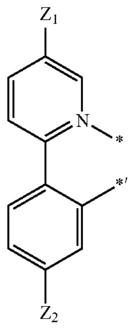
Formula 3-1(38)
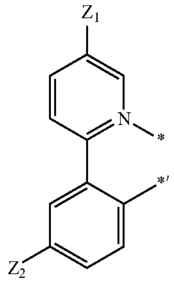
Formula 3-1(39)
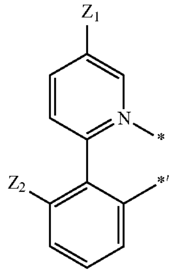
Formula 3-1(40)
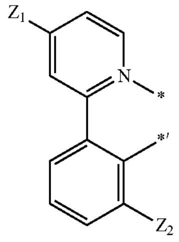
-continued
Formula 3-1(41)
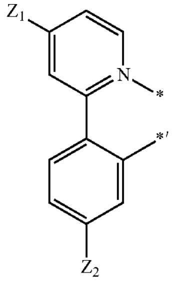
Formula 3-1(42)
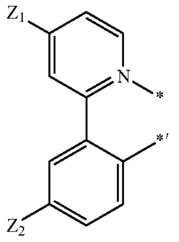
Formula 3-1(43)
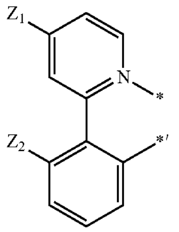
Formula 3-1(44)
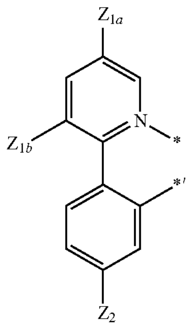
Formula 3-1(45)
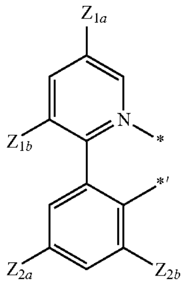

-continued
Formula 3-1(46)
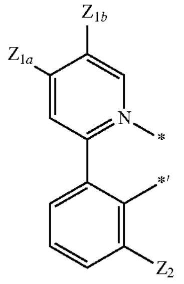
Formula 3-1(47)
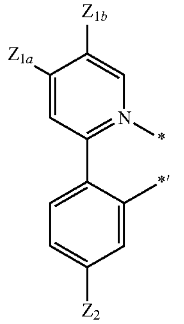
Formula 3-1(48)
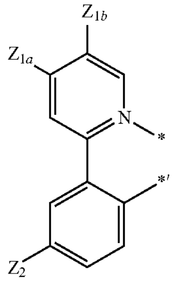
Formula 3-1(49)
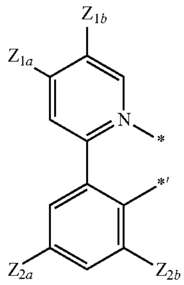
Formula 3-1(50)
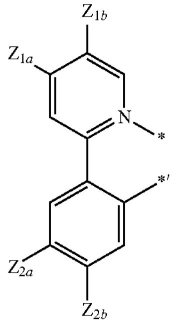
-continued
Formula 3-1(51)
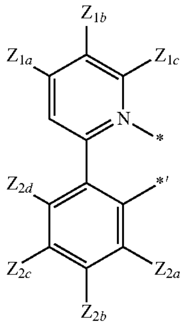
Formula 3-1(52)
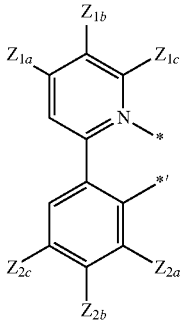
Formula 3-1(53)
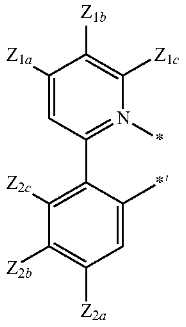
Formula 3-1(54)
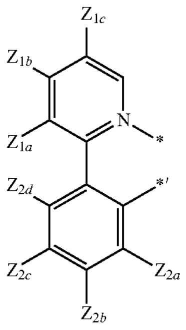
Formula 3-1(55)
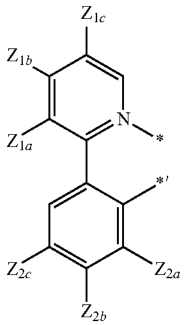

-continued
Formula 3-1(56)
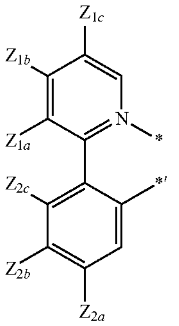
Formula 3-1(57)
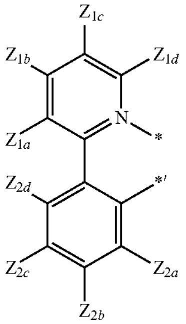
Formula 3-1(58)
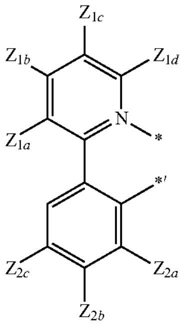
Formula 3-1(59)
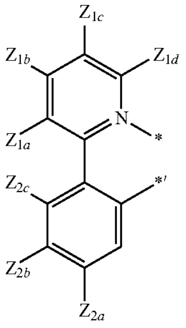
Formula 3-1(60)
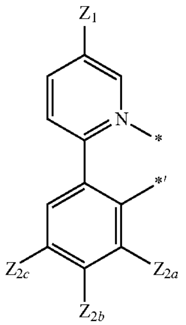
-continued
Formula 3-1(61)
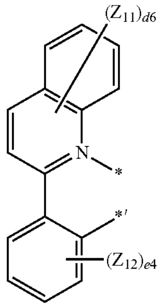
Formula 3-1(62)
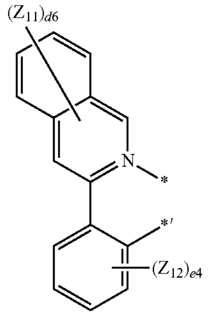
Formula 3-1(63)
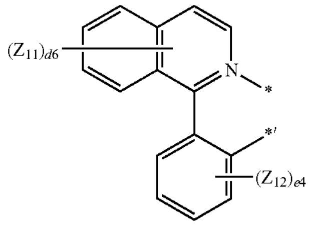
Formula 3-1(64)
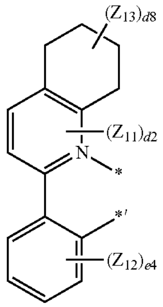
Formula 3-1(65)
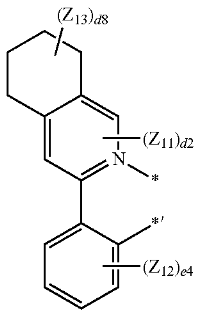

-continued
Formula 3-1(66)
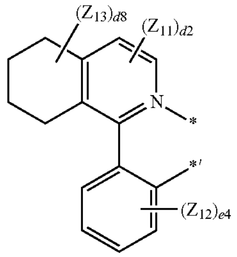
Formula 3-1(67)
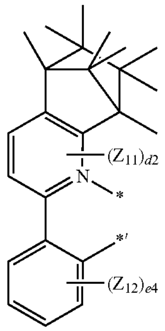
Formula 3-1(68)
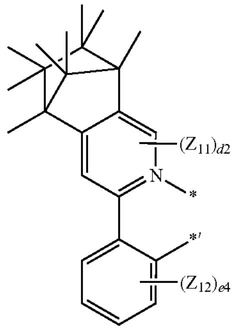
Formula 3-1(69)
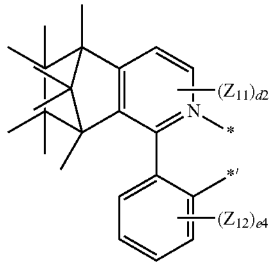
Formula 3-1(71)
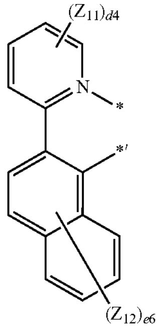
-continued
Formula 3-1(72)
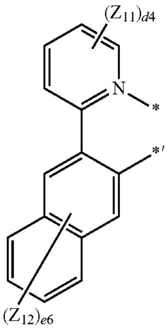
Formula 3-1(73)
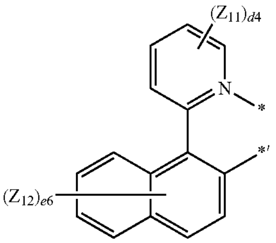
Formula 3-1(74)
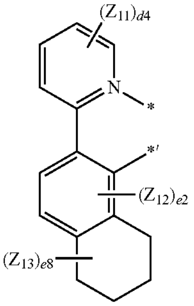
Formula 3-1(75)
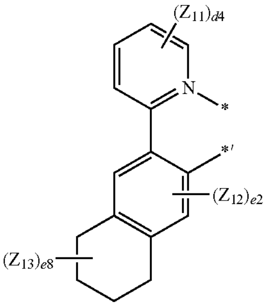
Formula 3-1(76)
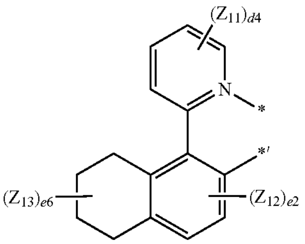

-continued
Formula 3-1(77)
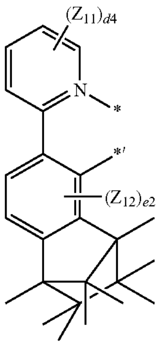
Formula 3-1(78)
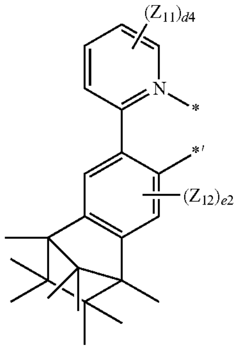
Formula 3-1(79)
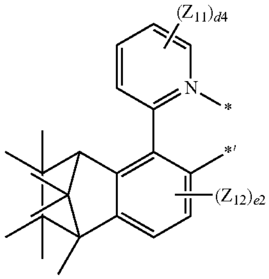
Formula 3-1(81)
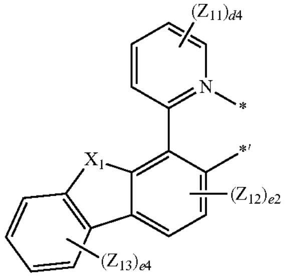
Formula 3-1(82)
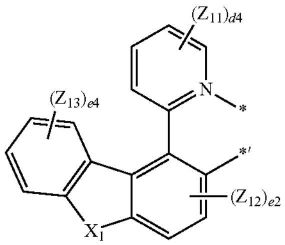
-continued
Formula 3-1(83)
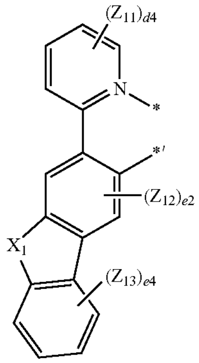
Formula 3-1(84)
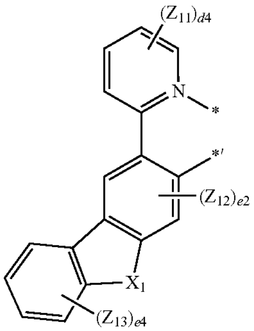
Formula 3-1(85)
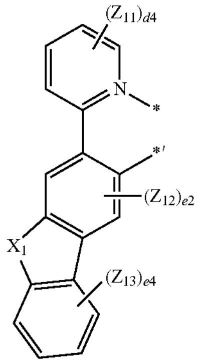
Formula 3-1(86)
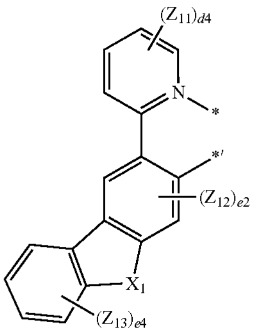

-continued
Formula 3-1(87)
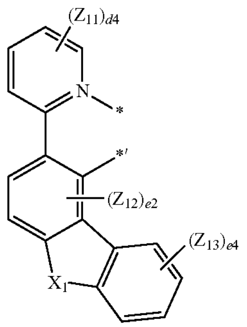
Formula 3-1(88)
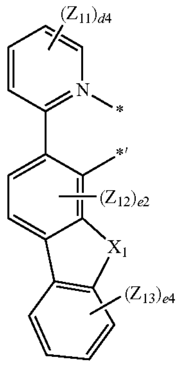
Formula 3-1(91)
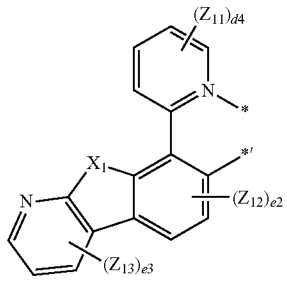
Formula 3-1(92)
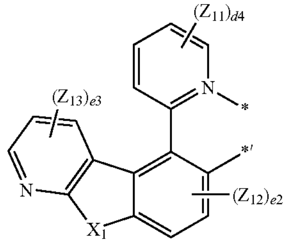
Formula 3-1(93)
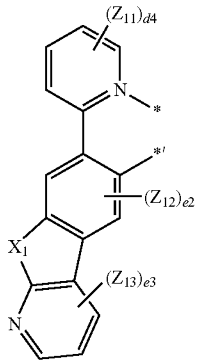
-continued
Formula 3-1(94)
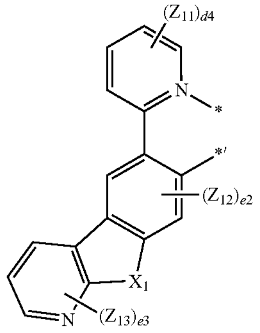
Formula 3-1(95)
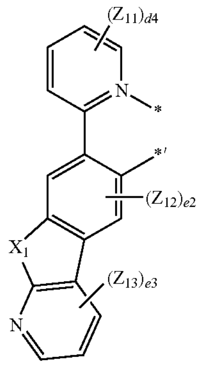
Formula 3-1(96)
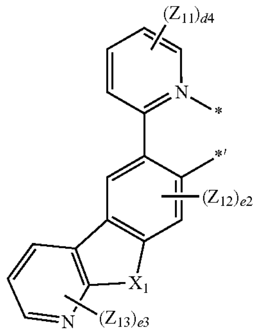
Formula 3-1(97)
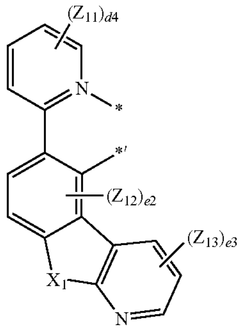

-continued
Formula 3-1(98)
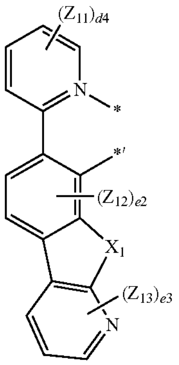
Formula 3-1(101)
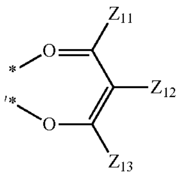
Formula 3-1(102)
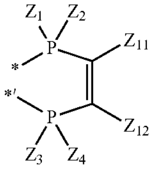
Formula 3-1(103)
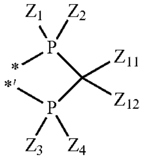
Formula 3-1(104)
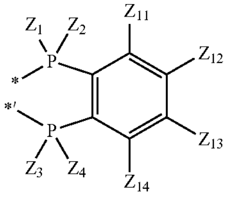
Formula 3-1(105)
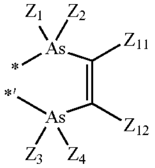
Formula 3-1(106)
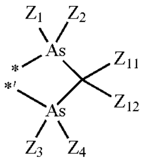
-continued
Formula 3-1(107)
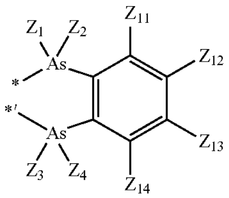
Formula 3-1(108)
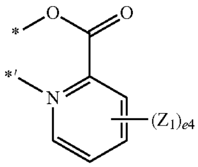
Formula 3-1(109)
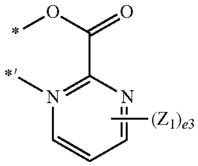
Formula 3-1(110)
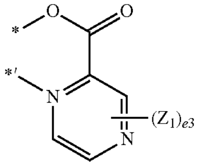
Formula 3-1(111)
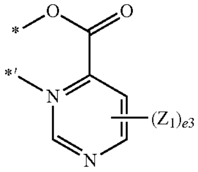
Formula 3-1(112)
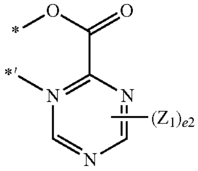
Formula 3-1(113)
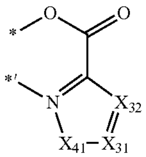
Formula 3-1(114)
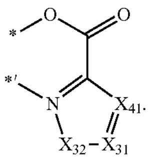
In Formulae 3-1(1) to 3-1(60), 3-1(61) to 3-1(69), 3-1(71) to 3-1(79), 3-1(81) to 3-1(88), 3-1(91) to 3-1(98), and 3-1(101) to 3-1(114),
$X_1$ may be O, S, $C(Z_{21})(Z_{22})$, or $N(Z_{23})$,
$X_{31}$ may be N or $C(Z_{1a})$,
$X_{32}$ may be N or $C(Z_{1b})$,
$X_{41}$ may be O, S, $N(Z_{1a})$, or $C(Z_{1a})(Z_{1b})$, $Z_1$ to $Z_4$, $Z_{1a}$, $Z_{1b}$, $Z_{1c}$, $Z_{1d}$, $Z_{2a}$, $Z_{2b}$, $Z_{2c}$, $Z_{2d}$, $Z_{11}$ to $Z_{14}$, and $Z_{21}$ to $Z_{23}$ may each independently be selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group; and —$B(Q_{86})(Q_{87})$ and —$P(=O)(Q_{88})(Q_{89})$, $Q_{86}$ to $Q_{89}$ may each independently be selected from:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, and —$CD_2CDH_2$;

an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group, each substituted with at least one selected from deuterium, a $C_1$-$C_{10}$ alkyl group, and a phenyl group, d2 and e2 may each independently be 0 or 2, e3 may be an integer selected from 0 to 3, d4 and e4 may each independently be an integer selected from 0 to 4, d6 and e6 may each independently be an integer selected from 0 to 6, d8 and e8 may each independently be an integer selected from 0 to 8, and

* and *' each indicate a binding site to M in Formula 1.

For example, $Z_1$ to $Z_4$, $Z_{1a}$, $Z_{1b}$, $Z_{1c}$, $Z_{1d}$, $Z_{2a}$, $Z_{2b}$, $Z_{2c}$, $Z_{2d}$, $Z_{11}$ to $Z_{14}$, and $Z_{21}$ to $Z_{23}$ may each independently be selected from hydrogen, deuterium, —F, a cyano group, a nitro group, —$SF_5$, —$CH_3$, —$CD_3$, —$CD_2H$, —$CDH_2$, —$CF_3$, —$CF_2H$, —$CFH_2$, groups represented by Formulae 9-1 to 9-19, and groups represented by Formulae 10-1 to 10-30, but embodiments are not limited thereto.

In various embodiments, in Formula 81, M may be Ir and the sum of n81 and n82 may be 3; or M may be Pt and the sum of n81 and n82 may be 2.

In various embodiments, the organometallic compound represented by Formula 81 may be an electrically neutral compound, rather than a salt consisting of a pair of a cation and an anion.

In various embodiments, the phosphorescent dopant in the film may include at least one selected from Compounds PD1 to PD79 and $FIr_6$, but embodiments are not limited thereto:

PD1

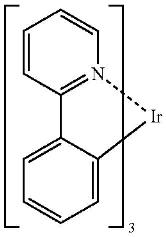

PD2

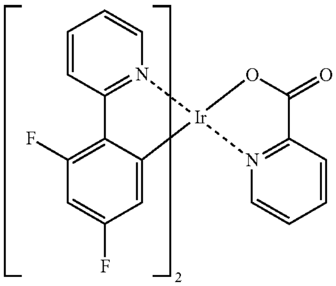

PD3

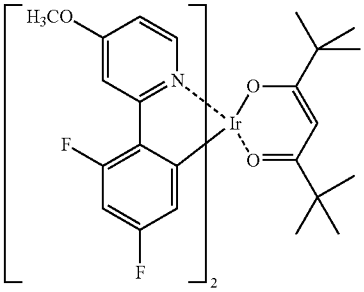

PD4

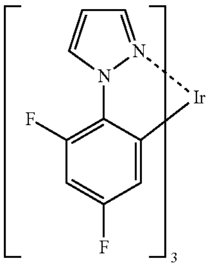

PD5

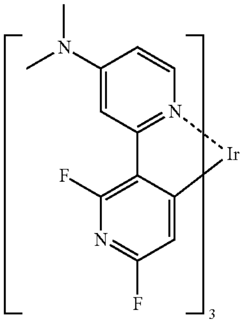

-continued

PD6

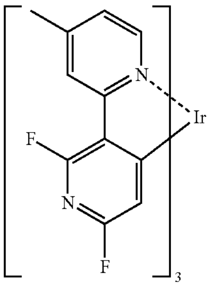

PD7

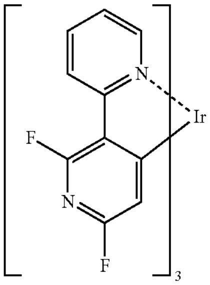

PD8

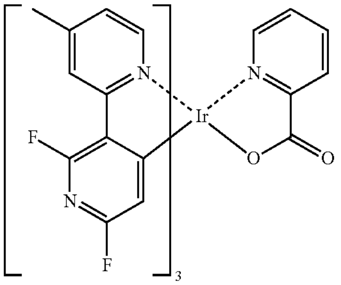

PD9

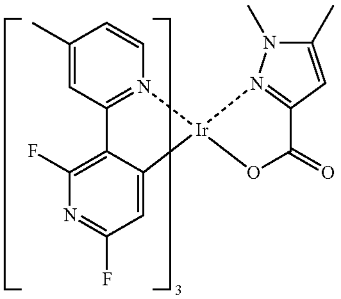

PD10

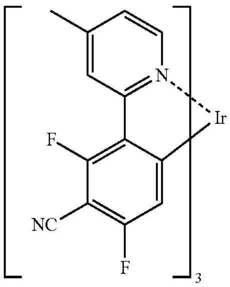

-continued
PD11
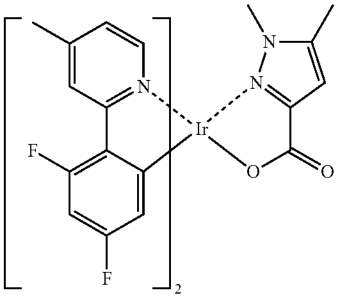
PD12
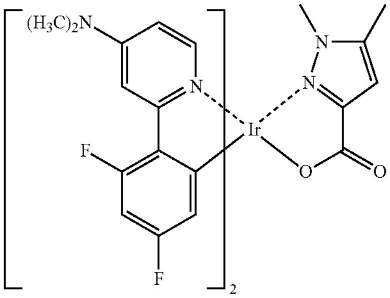
PD13
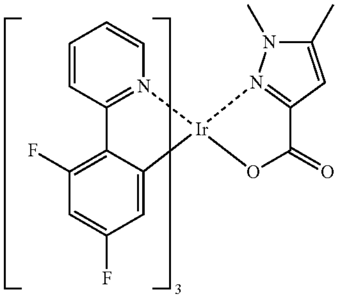
PD14
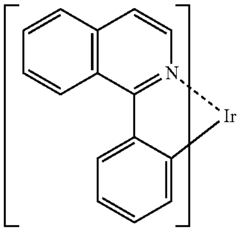
PD15
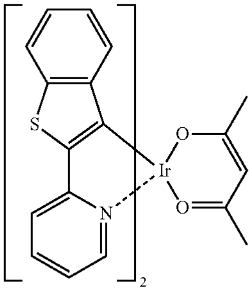
-continued
PD16
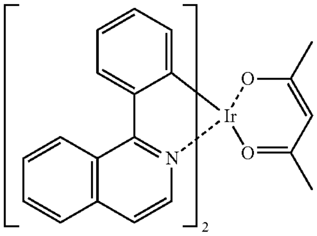
PD17
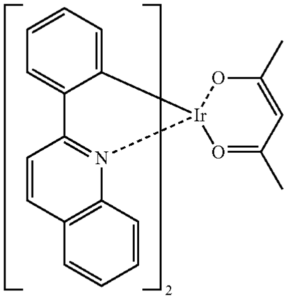
PD18
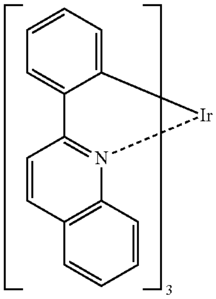
PD19
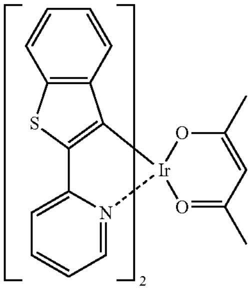
PD20
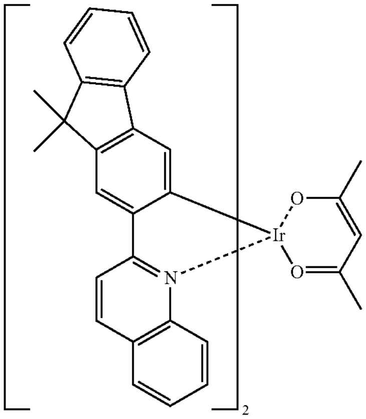

-continued
PD21
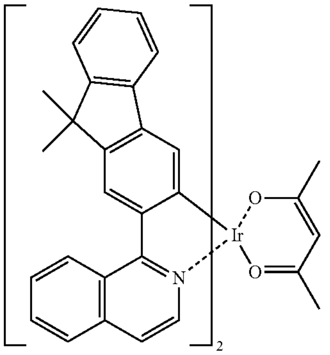
PD22
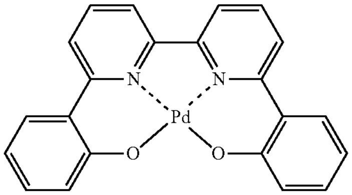
PD23
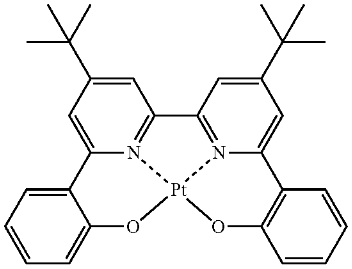
PD24
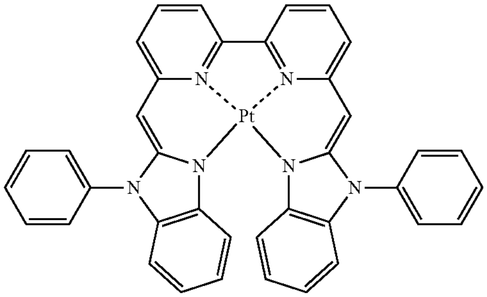
PD25
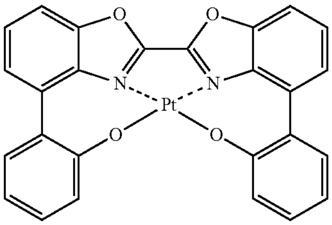
PD26
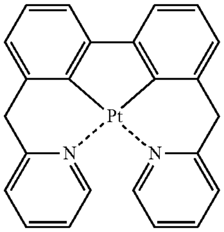
-continued
PD27
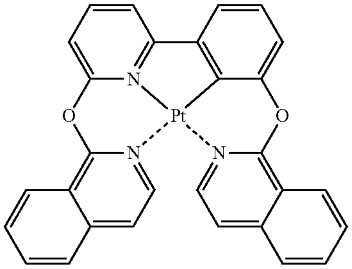
PD28
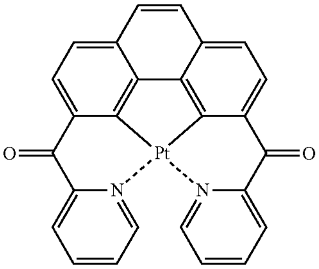
PD29
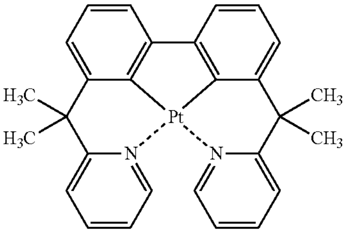
PD30
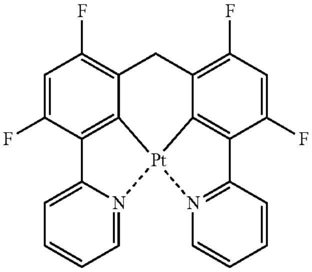
PD31
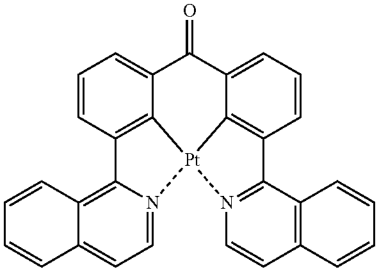
PD32
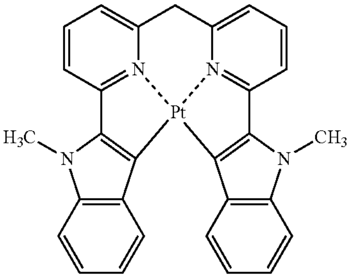

-continued
PD33
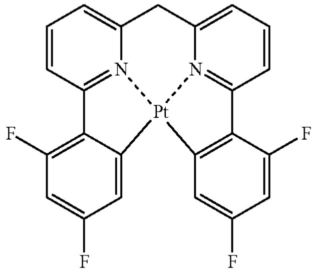
PD34
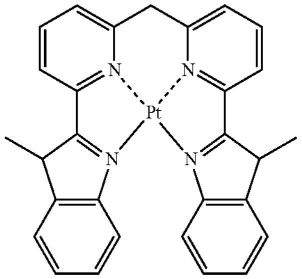
PD35
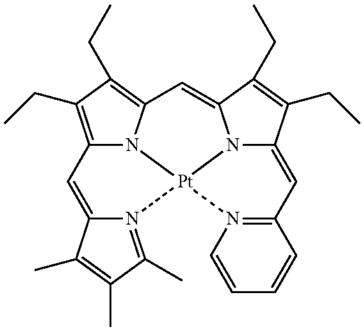
PD36
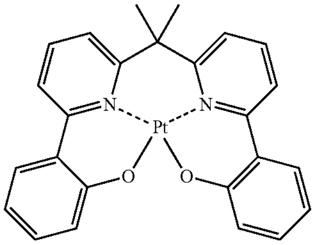
PD37
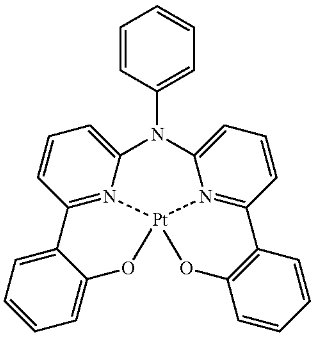
-continued
PD38
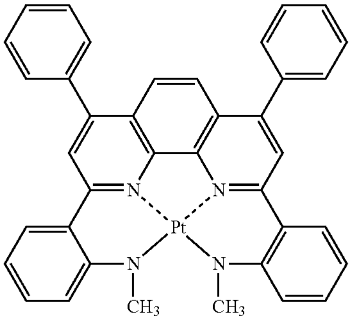
PD39
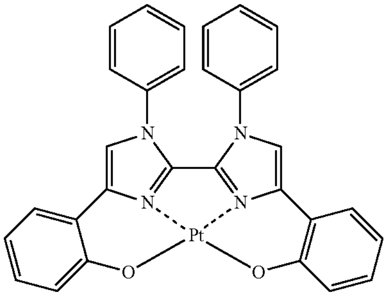
PD40
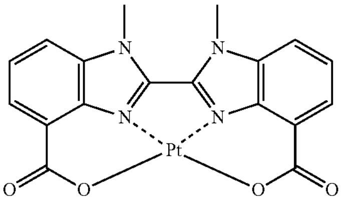
PD41
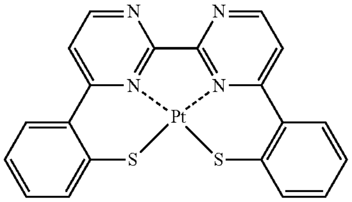
PD42
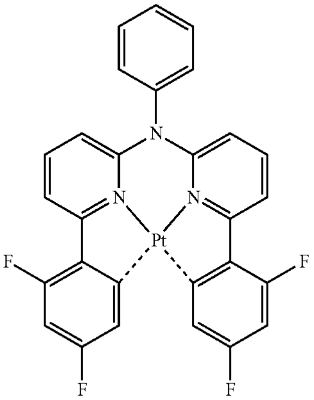

-continued
PD43
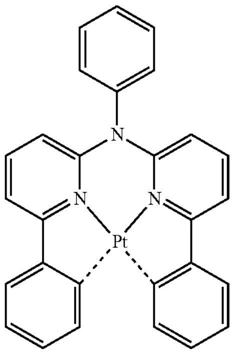
PD44
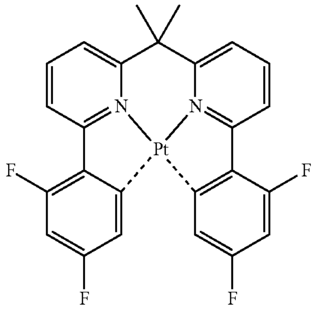
PD45
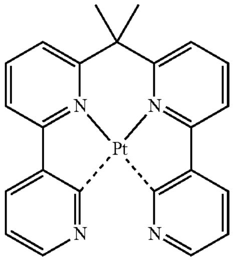
PD46
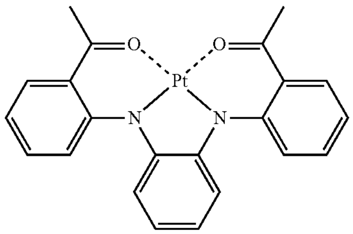
PD47
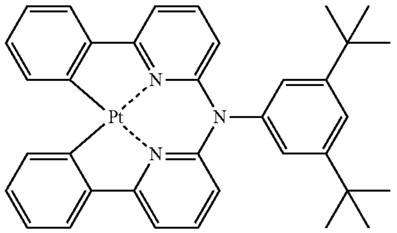
-continued
PD48
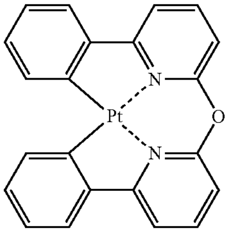
PD49
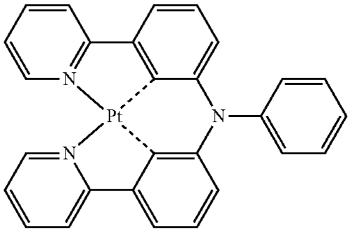
PD50
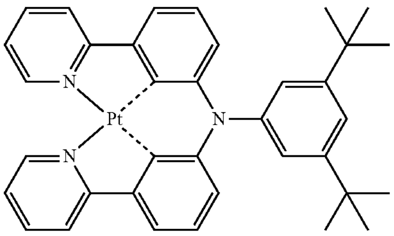
PD51
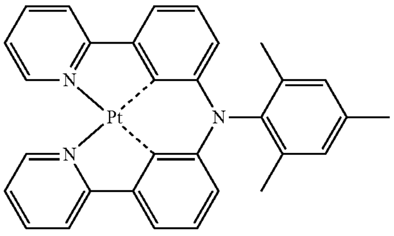
PD52
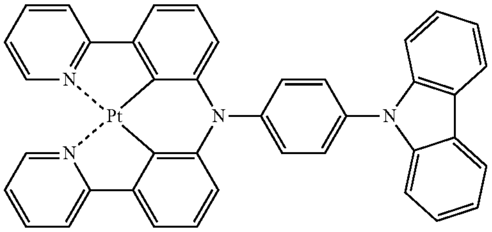
PD53
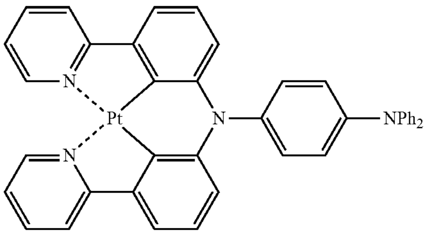

PD54
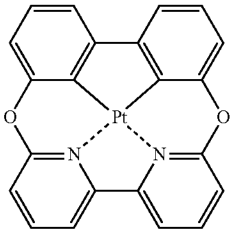
PD55
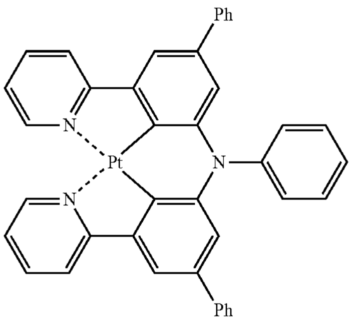
PD56
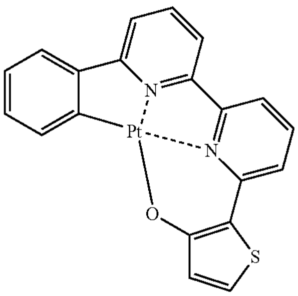
PD57
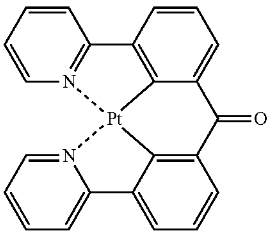
PD58
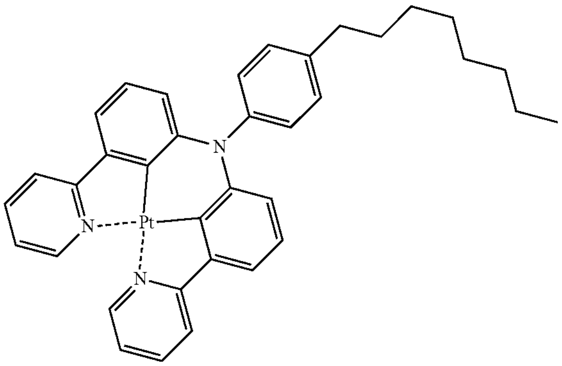
PD59
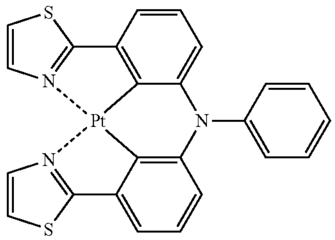
PD60
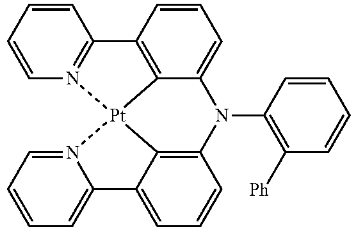
PD61
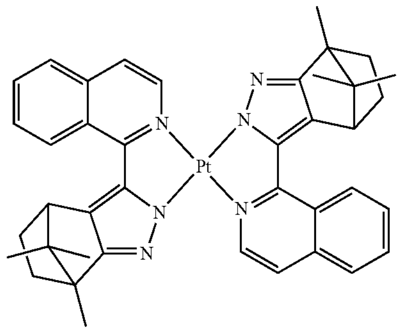
PD62
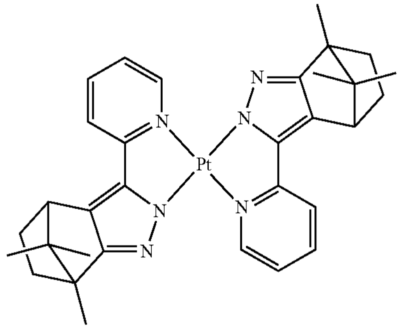
PD63
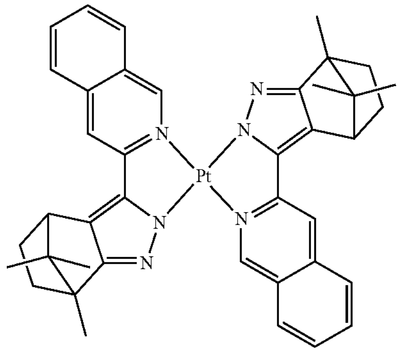

-continued
PD64
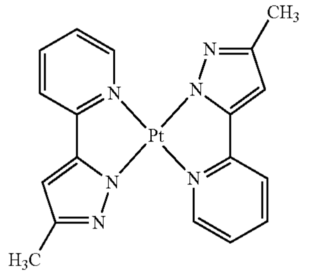
PD65
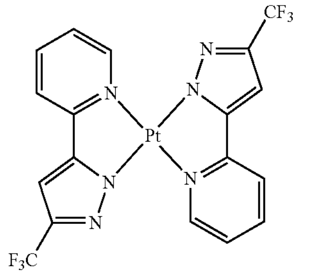
PD66
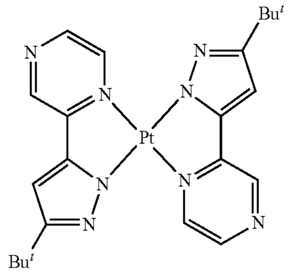
PD67
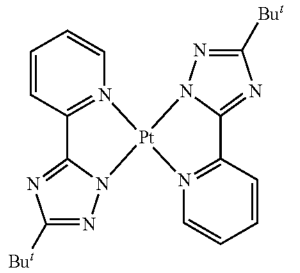
PD68
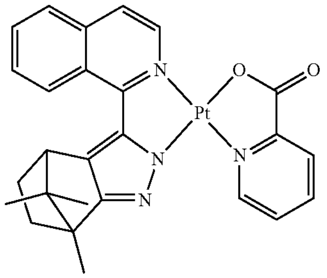
-continued
PD69
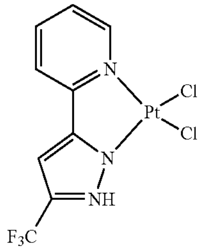
PD70
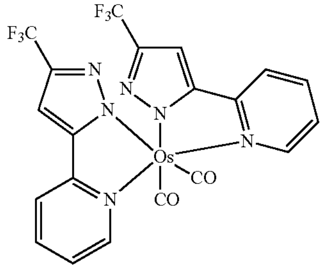
PD71
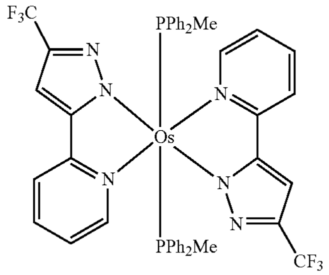
PD72
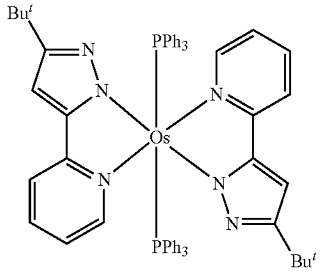
PD73
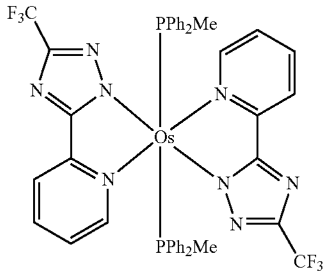

-continued

PD74

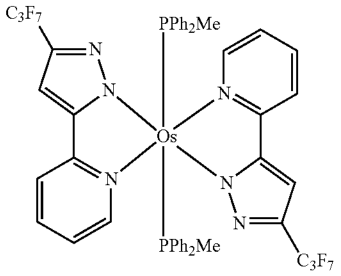

PD75

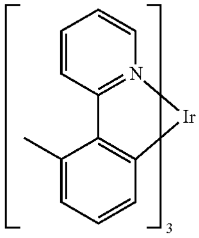

PD76

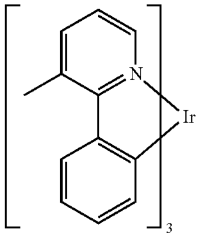

PD77

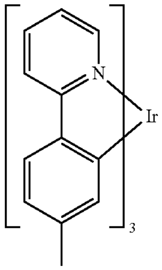

PD78

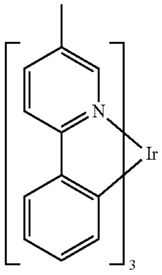

PD79

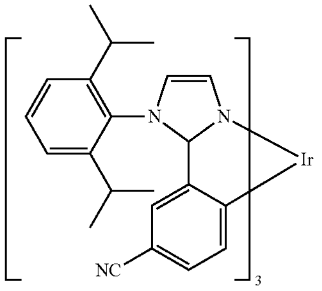

-continued

FIr6

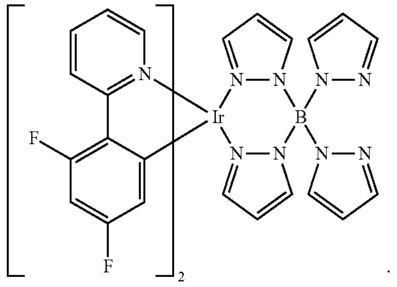

An amount of the phosphorescent dopant in the thin film may be generally in a range of about 0.01 to about 20 parts by weight based on 100 parts by weight of the combination, but embodiments are not limited thereto. While not wishing to be bound by theory, it is understood that when the amount of the phosphorescent dopant is within this range, light emission without a quenching phenomenon may be implemented.

The thin film may be applied to an organic film of an electronic device, for example, an organic light-emitting device. Thus, according to another aspect of the present disclosure, an organic light-emitting device includes:

a first electrode, a second electrode, and an organic layer disposed between the first electrode and the second electrode, wherein the organic layer includes the thin film.

In various embodiments, the thin film applied to the organic layer may be an emission layer. Here, the combination included in the emission layer may serve as a host. An amount of the phosphorescent dopant in the emission layer may be smaller than that of the combination in the emission layer.

In the thin film, the donor compound and the acceptor compound described in the expression "the combination of the donor compound and the acceptor compound" may form an exciplex, wherein a maximum emission wavelength of the exciplex and a decay time of delayed fluorescence are satisfied within the ranges described in the present specification. That is, the combination may have a relatively high triplet state $T_1$ energy level and a relatively low singlet state $S_1$ energy level at the same time. In this regard, a difference between the triplet state $T_1$ energy level singlet state $S_1$ energy level of the exciplex in the combination and the triplet state $T_1$ energy level of the phosphorescent dopant in the combination may become relatively small, and thus the energy may be efficiently transferred to the phosphorescent dopant in the combination of the film (for example, the combination having a role of a host). Accordingly, an electronic device, for example, an organic light-emitting device, including the thin film may have low driving voltage, high efficiency, and long lifespan at the same time.

FIG. 1 is a schematic cross-section of an organic light-emitting device 10 according to an embodiment. Hereinafter, the structure of the organic light-emitting device 10 according to an embodiment and a method of manufacturing the organic light-emitting device 10, according to an embodiment, will be described in connection with FIG. 1. The organic light-emitting device 10 includes a first electrode 11, an organic layer 15, and a second electrode 19 that are sequentially stacked in the stated order.

A substrate may be additionally disposed under the first electrode 11 or above the second electrode 19. For use as the substrate, any substrate that is used in general organic light-emitting devices may be used, and the substrate may be a glass substrate or a transparent plastic substrate, each having excellent mechanical strength, thermal stability, transparency, surface smoothness, ease of handling, and water-resistance.

The first electrode 11 may be formed by, for example, depositing or sputtering a material for forming the first electrode 11 on the substrate. The first electrode 11 may be an anode. The material for forming the first electrode 11 may be selected from materials with a high work function to facilitate hole injection. The first electrode 11 may be a reflective electrode, a semi-transmissive electrode, or a transmissive electrode. The material for forming the first electrode 11 may include indium tin oxide (ITO), indium zinc oxide (IZO), tin oxide ($SnO_2$), or zinc oxide (ZnO). In various embodiments, metals, such as magnesium (Mg), aluminum (Al), aluminum-lithium (Al—Li), calcium (Ca), magnesium-indium (Mg—In), or magnesium-silver (Mg—Ag) may be used as the material for forming the first electrode 11.

The first electrode 11 may have a single-layered structure, or a multi-layered structure including two or more layers. For example, the first electrode 11 may have a three-layered structure of ITO/Ag/ITO, but the structure of the first electrode 11 is not limited thereto.

The organic layer 15 is disposed on the first electrode 11.

The organic layer 15 may include a hole transport region, an emission layer, and an electron transport region.

The hole transport region may be disposed between the first electrode 11 and the emission layer.

The hole transport region may include at least one selected from a hole injection layer, a hole transport layer, an electron blocking layer, and a buffer layer.

The hole transport region may include only either a hole injection layer or a hole transport layer. In various embodiments, the hole transport region may have a structure of hole injection layer/hole transport layer or a structure of hole injection layer/hole transport layer/electron blocking layer, wherein, for each structure, constituting layers are sequentially stacked from the first electrode 11 in the stated order.

When the hole transport region includes a hole injection layer, the hole injection layer may be formed on the first electrode 11 by using one or more suitable methods, such as vacuum deposition, spin coating, casting, or Langmuir-Blodgett (LB) deposition.

When the hole injection layer is formed by vacuum deposition, the deposition conditions may vary according to a compound that is a material used to form the hole injection layer, and a structure and thermal characteristics of the hole injection layer to be formed. For example, the deposition conditions may be selected from a deposition temperature range of about 100 to about 500° C., a vacuum degree range of about $10^{-8}$ to about $10^{-3}$ torr, and a deposition rate range of about 0.01 to about 100 Angstroms per second (Å/sec). However, the deposition conditions are not limited thereto.

When the hole injection layer is formed by spin coating, the coating conditions may vary according to a compound used as a material to form the hole injection layer, and a structure and thermal characteristics of the hole injection layer to be formed. For example, the coating conditions may be selected from a coating rate range of about 2,000 to about 5,000 revolutions per minute (rpm), and a temperature at which a heat treatment is performed to remove a solvent after coating may be selected from a range of about 80° C. to 200° C. However, the spin coating conditions are not limited thereto.

Conditions for forming a hole transport layer and an electron blocking layer may be understood by referring to conditions for forming the hole injection layer.

The hole transport region may, for example, at least one selected from m-MTDATA, TDATA, 2-TNATA, NPB, β-NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzene sulfonic acid (Pani/DBSA), poly(3,4-ethylenedioxythiophene)/poly(4-styrene sulfonate) (PEDOT/PSS), polyaniline/camphor sulfonic acid (Pani/CSA), polyaniline/poly(4-styrene sulfonate) (Pani/PSS), a compound represented by Formula 201, and a compound represented by Formula 202:

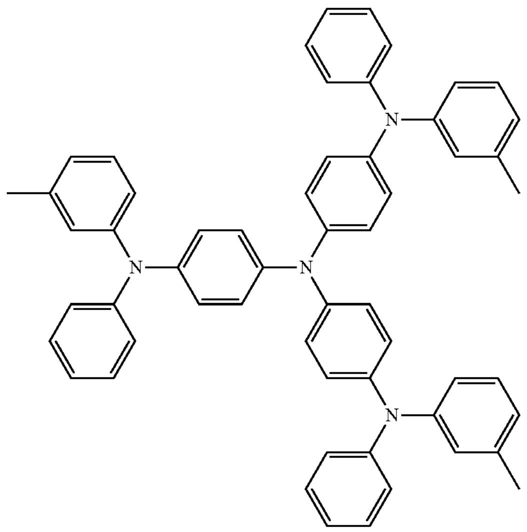

m-MTDATA

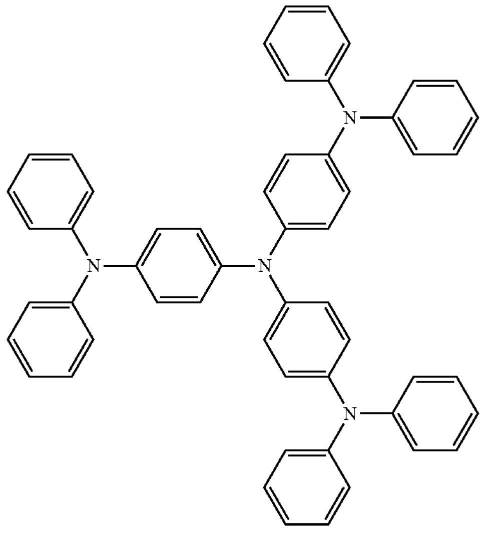

TDATA

-continued
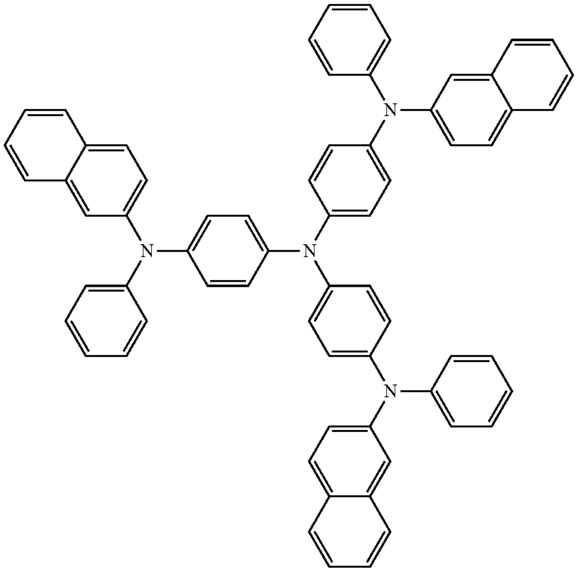
2-TNATA
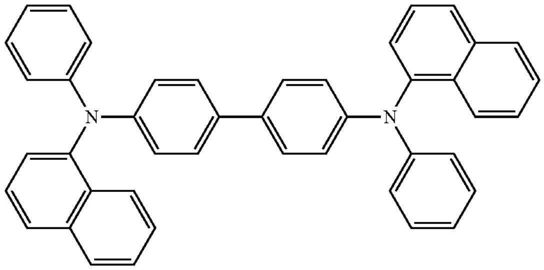
NPB
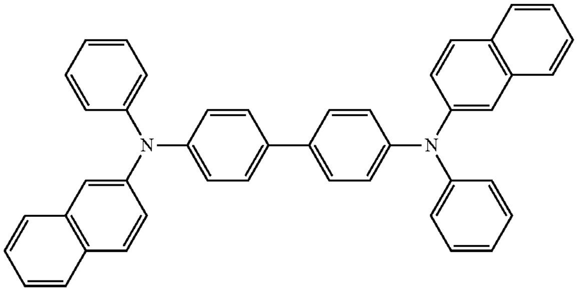
β-NPB
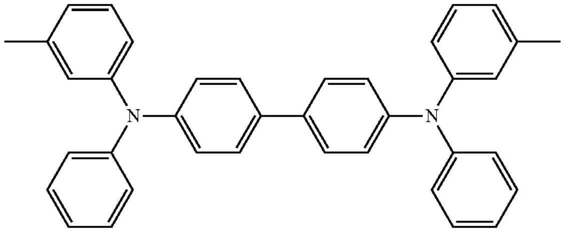
TPD
-continued
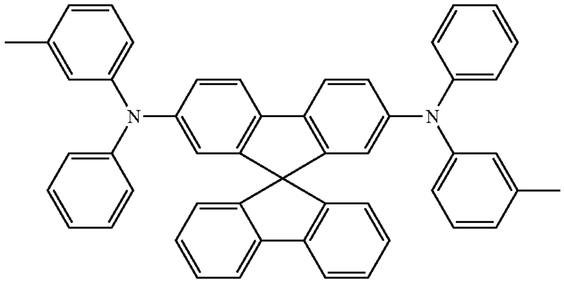
Spiro-TPB
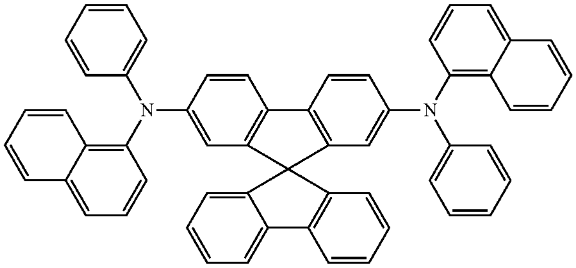
Spiro-NPB
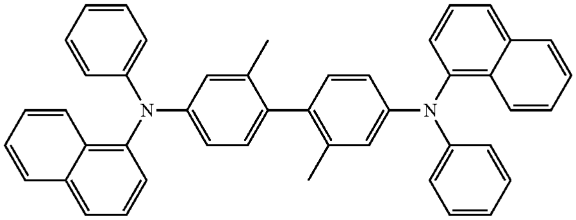
methylated-NPB
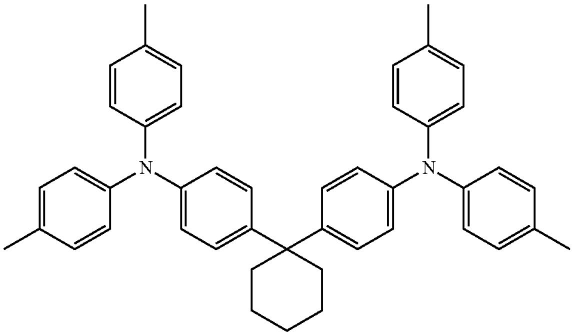
TAPC
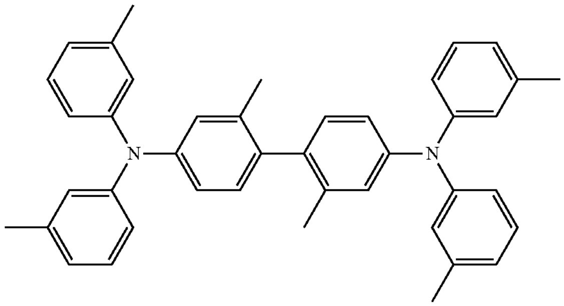
HMTPD -continued Formula 201

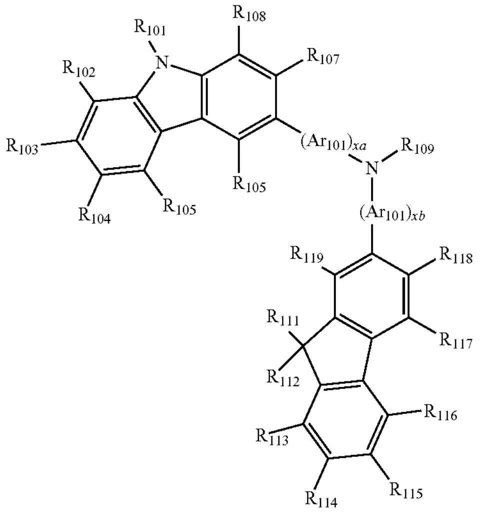

Formula 202

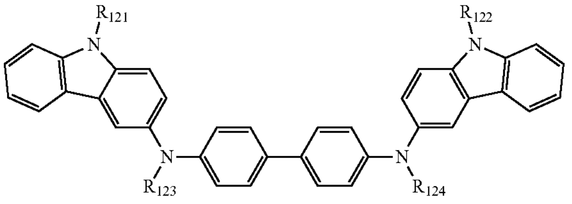

In Formula 201, $Ar_{101}$ and $Ar_{102}$ may each independently be selected from:

a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group; and a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group.

In Formula 201, xa and xb may each independently be an integer selected from 0 to 5, or may each independently be 0, 1, or 2. For example, in Formula 201, xa may be 1 and xb may be 0, but embodiments are not limited thereto.

In Formulae 201 and 202, $R_{101}$ to $R_{108}$, $R_{111}$ to $R_{119}$, and $R_{121}$ to $R_{124}$ may each independently be selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, a pentyl group, or a hexyl group), and a $C_1$-$C_{10}$ alkoxy group (for example, a methoxy group, an ethoxy group, a propoxy group, a butoxy group, or a pentoxy group);

a $C_1$-$C_{10}$ alkyl group and a $C_1$-$C_{10}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof;

a phenyl group, a naphthyl group, an anthracenyl group, a fluorenyl group, and a pyrenyl group; and a phenyl group, a naphthyl group, an anthracenyl group, a fluorenyl group, and a pyrenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, and a $C_1$-$C_{10}$ alkoxy group, but embodiments are not limited thereto.

In Formula 201, $R_{109}$ may be selected from:

a phenyl group, a naphthyl group, an anthracenyl group, and a pyridinyl group; and a phenyl group, a naphthyl group, an anthracenyl group, and a pyridinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, and a pyridinyl group.

In various embodiments, the compound represented by Formula 201 may be represented by Formula 201A, but embodiments are not limited thereto:

Formula 201A
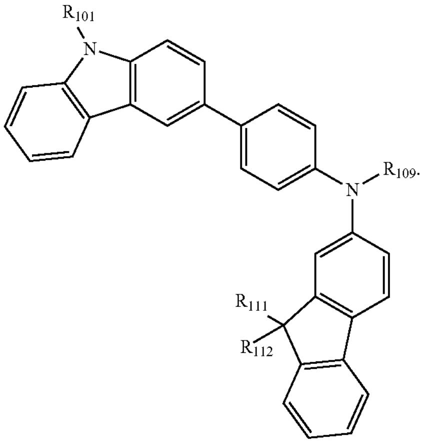
In Formula 201A, $R_{101}$, $R_{111}$, $R_{112}$, and $R_{109}$ may be the same as described in the present specification.
For example, the compound represented by Formula 201 and the compound represented by Formula 202 may each independently include Compounds HT1 to HT20, but embodiments are not limited thereto:
HT1
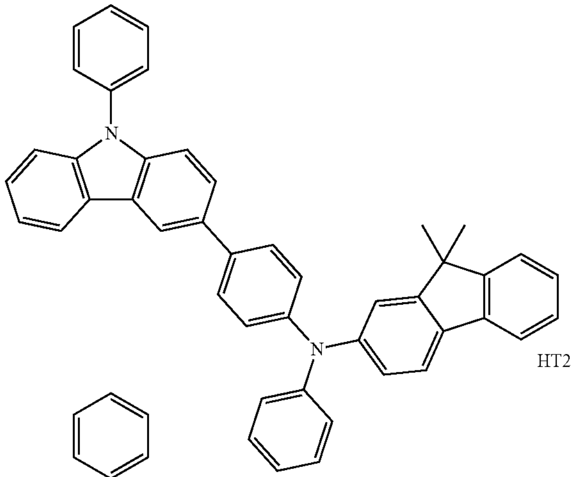
HT2
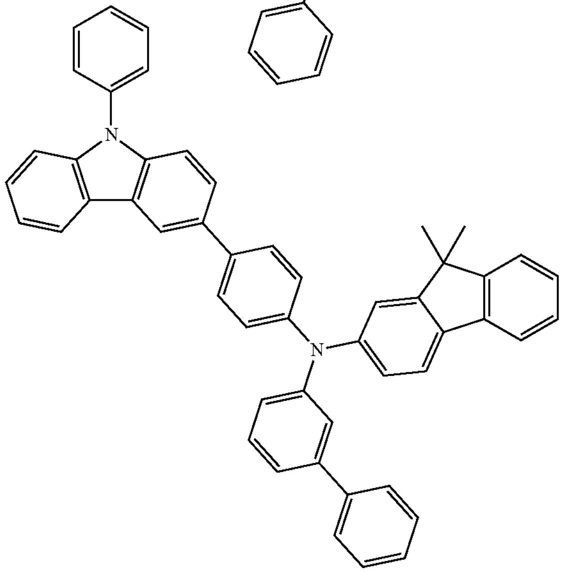
-continued
HT3
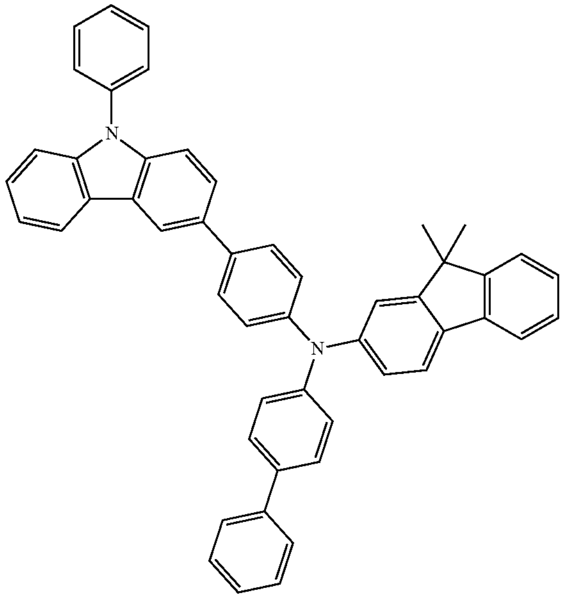
HT4
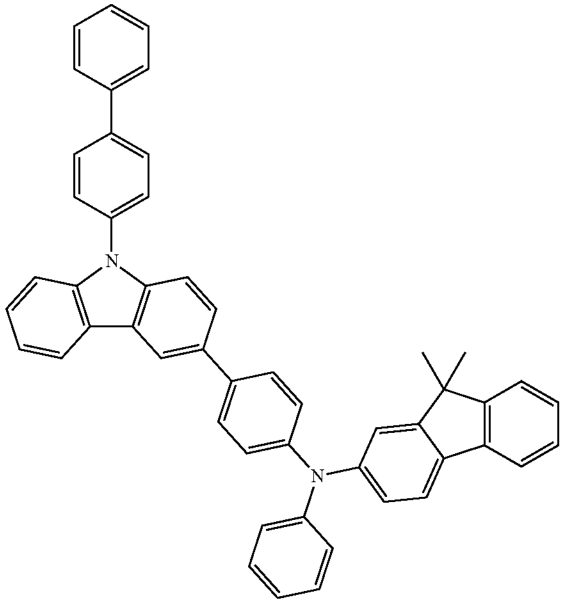

-continued
HT5
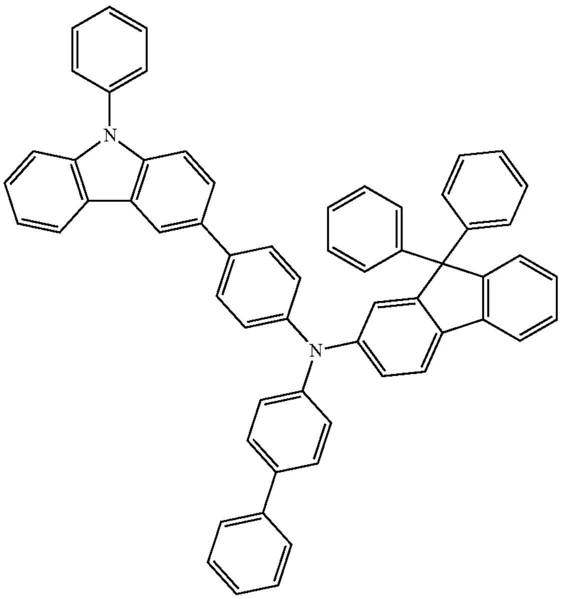
HT6
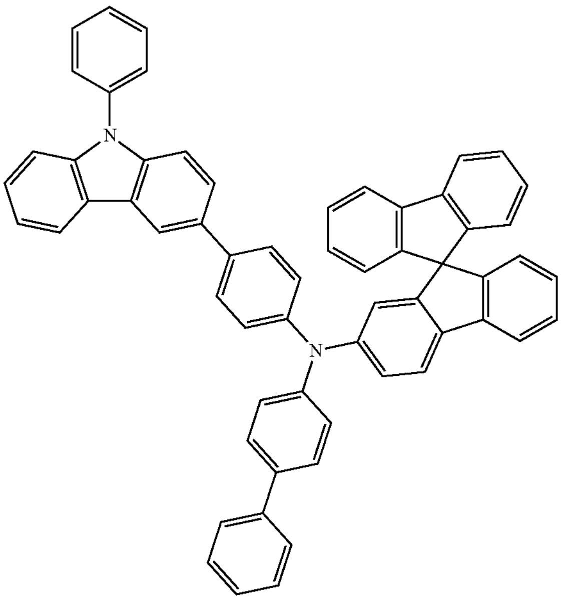
-continued
HT7
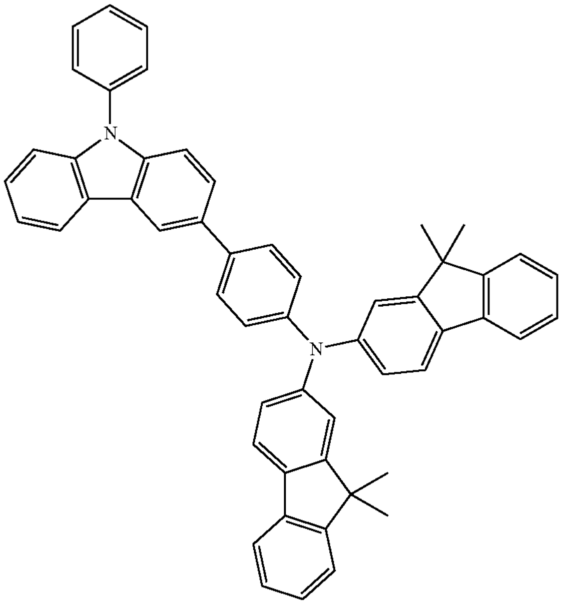
HT8
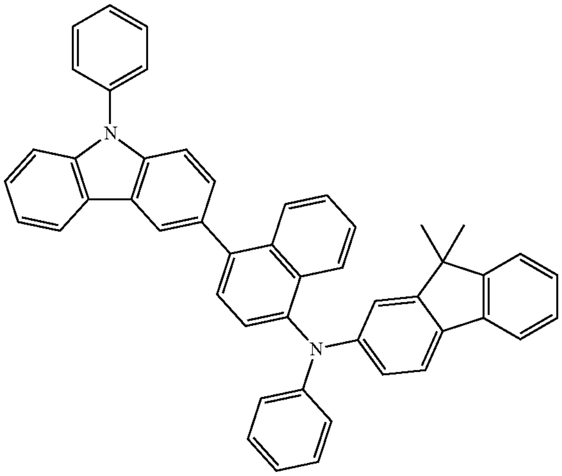
HT9
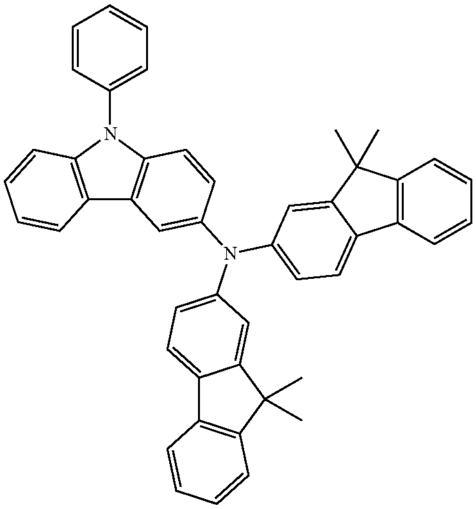

-continued
HT10
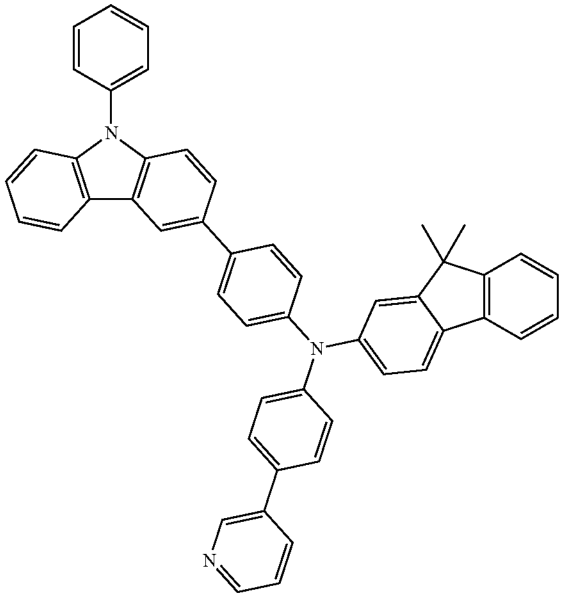
HT11
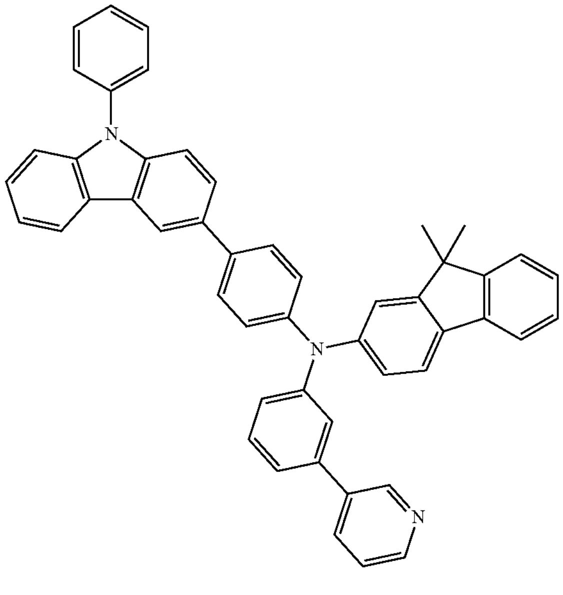
-continued
HT12
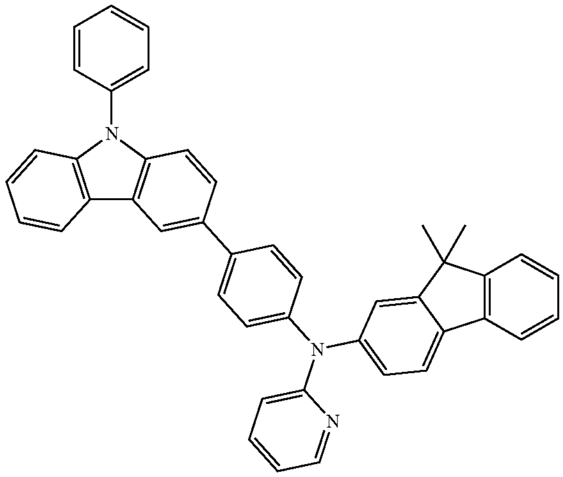
HT13
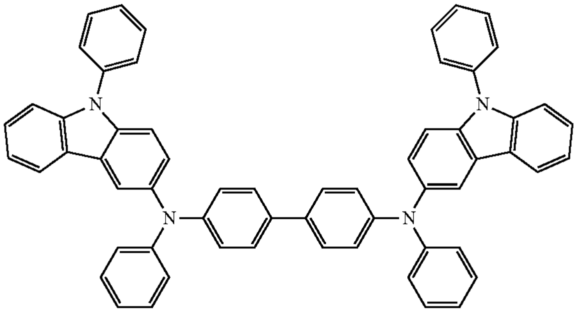
HT14
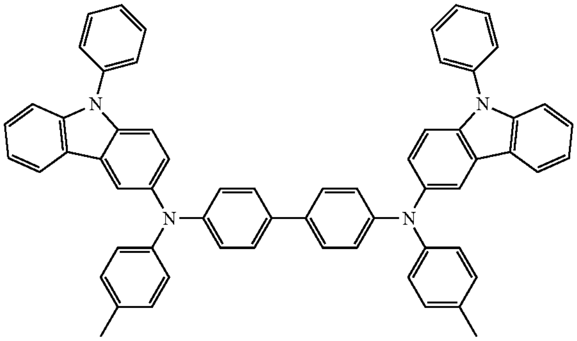
HT15
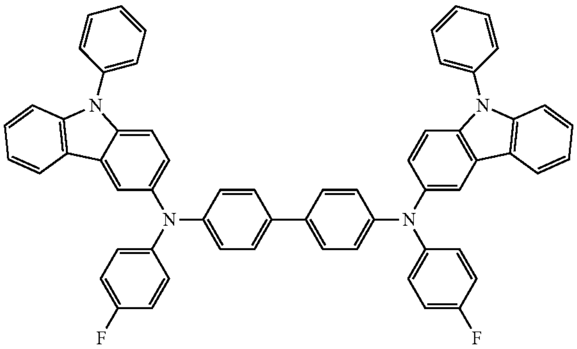

-continued

HT16

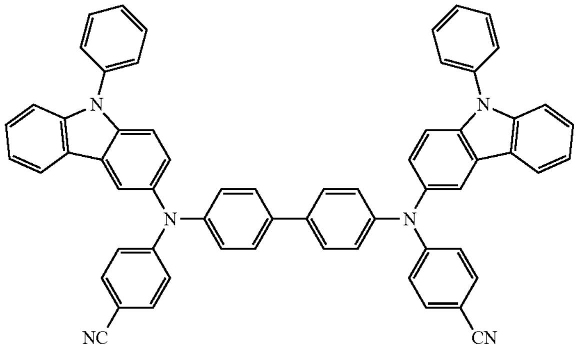

HT17

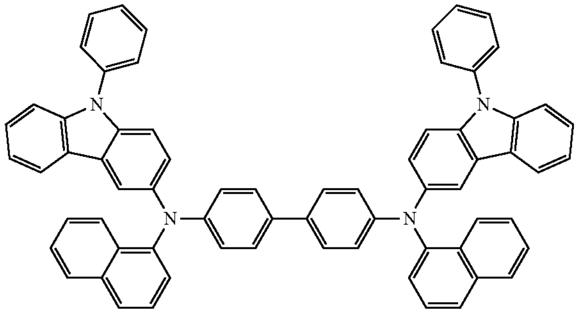

HT18

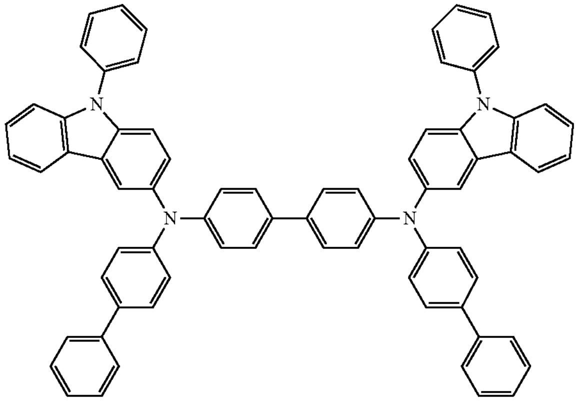

HT19

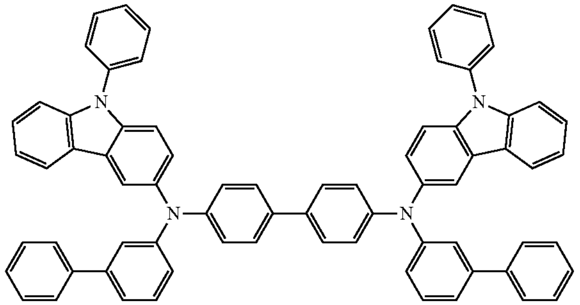

-continued

HT20

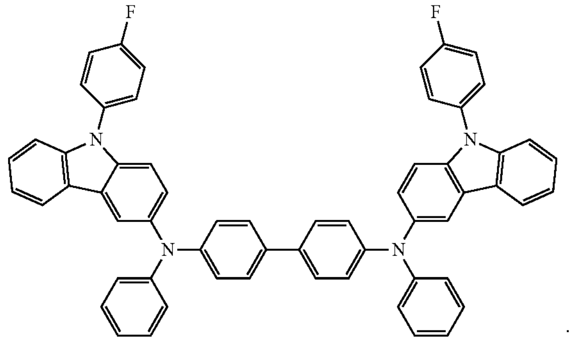

A thickness of the hole transport region may be in a range of about 100 Angstroms (Å) to about 10,000 Å, for example, about 100 Å to about 1,000 Å. When the hole transport region includes at least one of a hole injection layer and a hole transport layer, the thickness of the hole injection layer may be in a range of about 100 Å to about 10,000 Å, and for example, about 100 Å to about 1,000 Å, and the thickness of the hole transport layer may be in a range of about 50 Å to about 2,000 Å, and for example, about 100 Å to about 1,500 Å. While not wishing to be bound by theory, it is understood that when the thicknesses of the hole transport region, the hole injection layer, and the hole transport layer are within these ranges, satisfactory hole transporting characteristics may be obtained without a substantial increase in driving voltage.

The hole transport region may further include, in addition to materials described above, a charge-generating material for the improvement of conductive properties. The charge-generating material may be homogeneously or non-homogeneously dispersed in the hole transport region.

The charge-generating material may be, for example, a p-dopant. The p-dopant may be one selected from a quinone derivative, a metal oxide, and a cyano group-containing compound, but embodiments are not limited thereto. Examples of the p-dopant include quinone derivatives, such as tetracyanoquinonedimethane (TCNQ) and 2,3,5,6-tetrafluoro-tetracyano-1,4-benzoquinonedimethane (F4-TCNQ); metal oxides, such as tungsten oxide and molybdenum oxide; and cyano group-containing compounds, such as Compounds HT-D1 and HP-1, but embodiments are not limited thereto:

Compound HT-D1

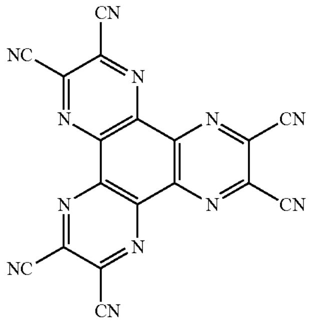

-continued

F4-TCNQ

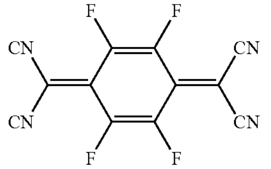

HP-1

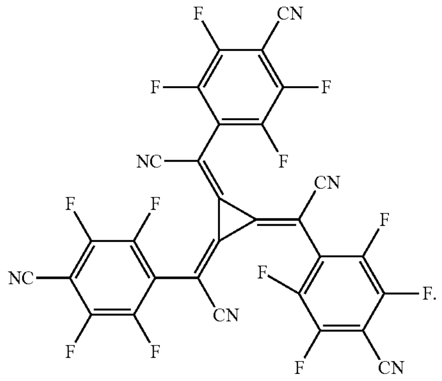

The hole transport region may further include a buffer layer.

The buffer layer may compensate for an optical resonance distance according to a wavelength of light emitted from the emission layer, and thus a light-emission efficiency of the formed organic light-emitting device may be improved.

The hole transport region may further include an electron blocking layer. The electron blocking layer may include a material known in the art, for example, mCP, but embodiments are not limited thereto:

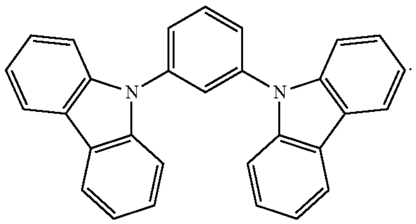

mCP

In various embodiments, the donor compound included in the emission layer may be used as a material for the electron blocking layer.

The emission layer may be disposed on the hole transport region by using one or more suitable methods, such as vacuum deposition, spin coating, casting, or LB deposition. When the emission layer is formed by vacuum deposition and spin coating, the deposition and coating conditions may vary according to a compound that is used to form the emission layer, but generally, may be determined by referring to the deposition and coating conditions for the hole injection layer.

When the organic light-emitting device 10 is a full-color organic light-emitting device, the emission layer may be patterned into a red emission layer, a green emission layer, and a blue emission layer. In various embodiments, the emission layer may have a structure in which a red emission layer, a green emission layer, and/or a blue emission layer are stacked on each other, to thereby emit white light.

The emission layer may include the thin film.

For example, the emission layer may have a single-layered structure including the thin film, or a multi-layered structure including other additional emission layers known in the art.

A thickness of the emission layer may be in a range of about 100 Å to about 1,000 Å, for example, about 200 Å to about 600 Å. While not wishing to be bound by theory, it is understood that when the thickness of the emission layer is within these ranges, the emission layer may have excellent light-emitting characteristics without a substantial increase in driving voltage.

Next, the electron transport region is disposed on the emission layer.

The electron transport region may include at least one selected from a hole blocking layer, an electron transport layer, and an electron injection layer.

For example, the electron transport region may have a structure of hole blocking layer/electron transport layer/electron injection layer or a structure of electron transport layer/electron injection layer, but embodiments are not limited thereto. The electron transport layer may have a single-layered structure, or a multi-layered structure including two or more materials.

Conditions for forming a hole blocking layer, an electron transport layer, and an electron injection layer in the electron transport region may be understood by referring to conditions for forming the hole injection layer.

When the electron transport region includes a hole blocking layer, the hole blocking layer may include, for example, at least one of BCP and Bphen, but embodiments are not limited thereto:

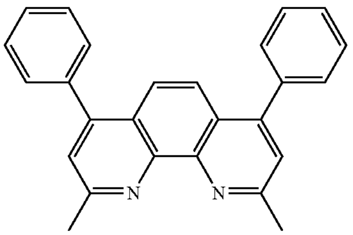

BCP

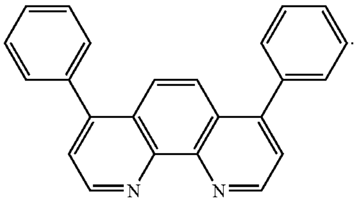

Bphen

In various embodiments, as a material for the hole blocking layer, a compound that is same as the acceptor compound used for the emission layer may be used.

A thickness of the hole blocking layer may be in a range of about 20 Å to about 1,000 Å, for example, about 30 Å to about 300 Å. While not wishing to be bound by theory, it is understood that when the thickness of the hole blocking layer is within these ranges, satisfactory hole blocking characteristics may be obtained without a substantial increase in driving voltage.

The electron transport layer may further include at least one selected from BCP, Bphen, $Alq_3$, BAlq, TAZ, and NTAZ:

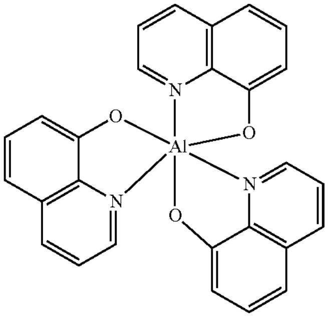

Alq3

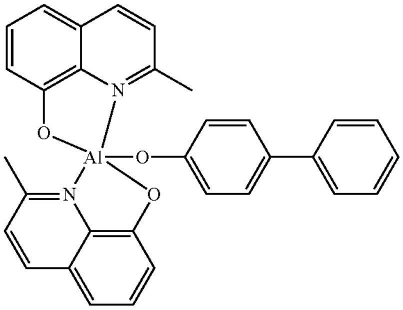

BAlq

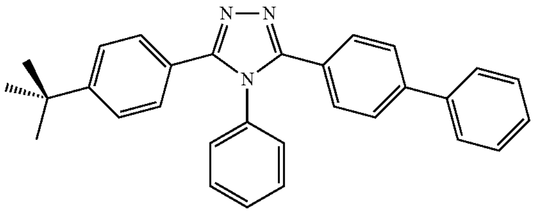

TAZ

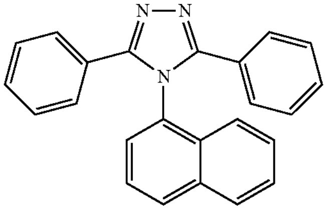

NTAZ

In various embodiments, a compound represented by Formula 40 or Formula 41 may be used as an electron transporting material in the electron transport layer:

Formula 40

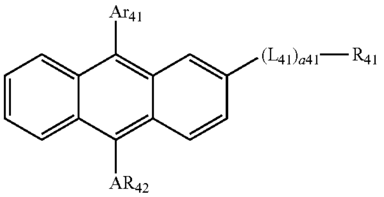

-continued

Formula 41

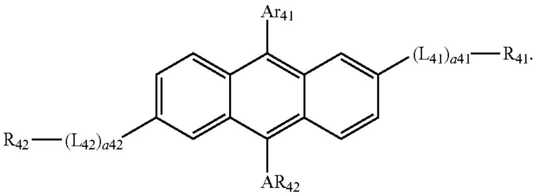

In Formulae 40 and 41, $L_{41}$ and $L_{42}$ may each independently be selected from:

a $C_6$-$C_{60}$ arylene group, a $C_1$-$C_{60}$ heteroarylene group, a divalent non-aromatic condensed polycyclic group, and a divalent non-aromatic condensed heteropolycyclic group; and a $C_6$-$C_{60}$ arylene group, a $C_1$-$C_{60}$ heteroarylene group, a divalent non-aromatic condensed polycyclic group, and a divalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a pyrenyl group, a chrysenyl group, a phenanthrenyl group, a pyridinyl group, a pyrimidinyl group, and a triazinyl group, a41 and a42 may each independently be an integer selected from 0 to 5, $Ar_{41}$ and $Ar_{42}$ may each independently be selected from:

a $C_6$-$C_{60}$ aryl group, a $C_1$-$C_{60}$ heteroaryl group, a monovalent non-aromatic condensed polycyclic group, and a monovalent non-aromatic condensed heteropolycyclic group; and a $C_6$-$C_{60}$ aryl group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a pyrenyl group, a chrysenyl group, a phenanthrenyl group, a pyridinyl group, a pyrimidinyl group, and a triazinyl group, and $R_{41}$ and $R_{42}$ may each independently be selected from:

a benzimidazolyl group, a benzoxazolyl group, a benzothiazolyl group, a benzopyrimidinyl group, an imidazopyridinyl group, a quinolinyl group, an isoquinolinyl group, a quinazolinyl group, a pyridinyl group, a pyrimidinyl group, a pyrazinyl group, a phenyl group, a naphthyl group, a pyrenyl group, a chrysenyl group, a fluorenyl group, and a phenanthrenyl group; and a benzimidazolyl group, a benzoxazolyl group, a benzothiazolyl group, a benzopyrimidinyl group, an imidazopyridinyl group, a quinolinyl group, an isoquinolinyl group, a quinazolinyl group, a pyridinyl group, a pyrimidinyl group, a pyrazinyl group, a phenyl group, a naphthyl group, a pyrenyl group, a chrysenyl group, a fluorenyl group, and a phenanthrenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a benzimidazolyl group, a benzoxazolyl group, a benzothiazolyl group, a benzopyrimidinyl group, an imidazopyridinyl group, a quinolinyl group, an isoquinolinyl group, a quinazolinyl group, a pyridinyl group, a pyrimidinyl group, a pyrazinyl group, a phenyl group, a naphthyl group, a pyrenyl group, a chrysenyl group, a fluorenyl group, and a phenanthrenyl group.

In Formulae 40 and 41, $L_{41}$ and $L_{42}$ may each independently be the same as described in connection with $L_{11}$ in the present specification.

In various embodiments, a compound represented by Formula 42 may be used as an electron transporting material in the electron transport layer:

Formula 42

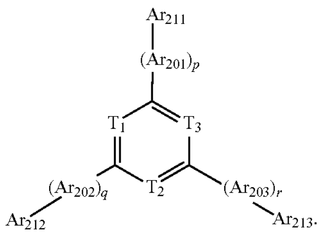

In Formula 42, $T_1$ may be N or $C(R_{201})$, $T_2$ may be N or $C(R_{202})$, and $T_3$ may be N or $C(R_{203})$, wherein at least one selected from $T_1$ to $T_3$ may be N, $R_{201}$ to $R_{203}$ may each independently be selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group; and a $C_6$-$C_{60}$ aryl group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a pyrenyl group, a chrysenyl group, a phenanthrenyl group, a pyridinyl group, a pyrimidinyl group, and a triazinyl group, $Ar_{201}$ to $Ar_{203}$ may each independently be selected from:

a $C_6$-$C_{60}$ arylene group, a $C_1$-$C_{60}$ heteroarylene group, a divalent non-aromatic condensed polycyclic group, and a divalent non-aromatic condensed heteropolycyclic group; and a $C_6$-$C_{60}$ arylene group, a $C_1$-$C_{60}$ heteroarylene group, a divalent non-aromatic condensed polycyclic group, and a divalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a pyrenyl group, a chrysenyl group, a phenanthrenyl group, a pyridinyl group, a pyrimidinyl group, and a triazinyl group, p, q, and r may each independently be 0, 1, or 2, and $Ar_{211}$ and $Ar_{213}$ may each independently be selected from:

a $C_6$-$C_{60}$ aryl group, a $C_1$-$C_{60}$ heteroaryl group, a monovalent non-aromatic condensed polycyclic group, and a monovalent non-aromatic condensed heteropolycyclic group; and a $C_6$-$C_{60}$ aryl group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a pyrenyl group, a chrysenyl group, a phenanthrenyl group, a pyridinyl group, a pyrimidinyl group, and a triazinyl group.

In various embodiments, in Formula 42, at least two selected from $T_1$ to $T_3$ may be N.

In various embodiments, in Formula 42, all of $T_1$ to $T_3$ may be N.

In Formula 42, $Ar_{201}$ to $Ar_{203}$ may each independently be selected from:

a phenylene group, a naphthylene group, an anthrylene group, a pyrenylene group, a fluorenylene group, a triphenylenyl group, a pyridinylene group, and a pyrimidinylene group; and a phenylene group, a naphthylene group, an anthrylene group, a pyrenylene group, a fluorenylene group, a triphenylenyl group, a pyridinylene group, and a pyrimidinylene group, each substituted with at least one selected from a phenyl group, a naphthyl group, an anthryl group, a pyrenyl group, a fluorenyl group, a triphenylenyl group, a pyridinyl group, and a pyrimidinyl group, but embodiments are not limited thereto.

In Formula 42, p, q, and r may each independently be 0, 1, or 2. For example, in Formula 42, p, q, and r may each independently be 0 or 1, but embodiments are not limited thereto.

In Formula 42, $Ar_{211}$ to $Ar_{213}$ may each independently be selected from:

a phenyl group, a naphthyl group, a pyrenyl group, a chrysenyl group, a fluorenyl group, a phenanthrenyl group, a benzimidazolyl group, a benzoxazolyl group, a benzothiazolyl group, a benzopyrimidinyl group, an imidazopyrimidinyl group, a quinolinyl group, an isoquinolinyl group, a quinazolinyl group, a pyridinyl group, a pyrimidinyl group, a pyrazinyl group, and a triazinyl group; and a phenyl group, a naphthyl group, a pyrenyl group, a chrysenyl group, a fluorenyl group, a phenanthrenyl group, a benzimidazolyl group, a benzoxazolyl group, a benzothiazolyl group, a benzopyrimidinyl group, an imidazopyrimidinyl group, a quinolinyl group, an isoquinolinyl group, a quinazolinyl group, a pyridinyl group, a pyrimidinyl group, a pyrazinyl group, and a triazinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a pyrenyl group, a chrysenyl group, a phenanthrenyl group, a pyridinyl group, a pyrimidinyl group, and a triazinyl group, but embodiments are not limited thereto.

In various embodiments, in Formula 42, at least one selected from $Ar_{211}$ to $Ar_{213}$ may be selected from:

a benzimidazolyl group, a benzoxazolyl group, a benzothiazolyl group, a benzopyrimidinyl group, an imidazopyrimidinyl group, a quinolinyl group, an isoquinolinyl group, a quinazolinyl group, a pyridinyl group, a pyrimidinyl group, a pyrazinyl group, and a triazinyl group; and a benzimidazolyl group, a benzoxazolyl group, a benzothiazolyl group, a benzopyrimidinyl group, an imidazopyrimidinyl group, a quinolinyl group, an isoquinolinyl group, a quinazolinyl group, a pyridinyl group, a pyrimidinyl group, a pyrazinyl group, and a triazinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a pyrenyl group, a chrysenyl group, a phenanthrenyl group, a pyridinyl group, a pyrimidinyl group, and a triazinyl group, but embodiments are not limited thereto.

In various embodiments, in Formula 20A, at least one selected from $Ar_{211}$ to $Ar_{213}$ may be a substituted or unsubstituted phenanthrenyl group.

For example, the electron transport layer may include at least one selected from Compounds ET1 to ET17, but embodiments are not limited thereto:

Compound ET1

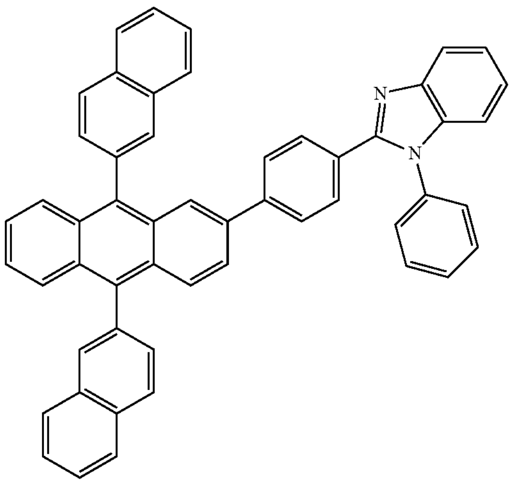

-continued

Compound ET2

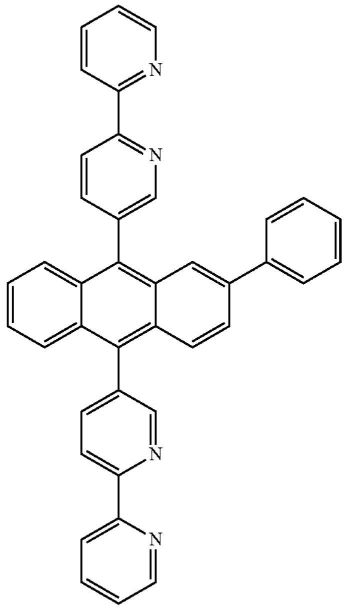

Compound ET3

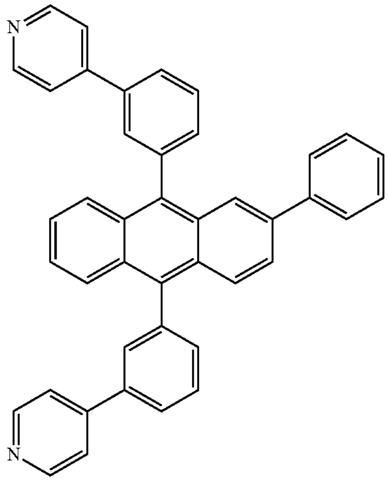

Compound ET4

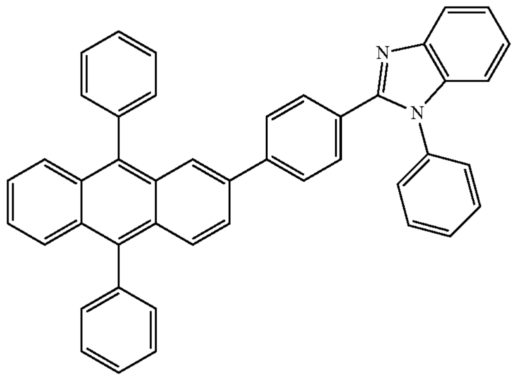

Compound ET5
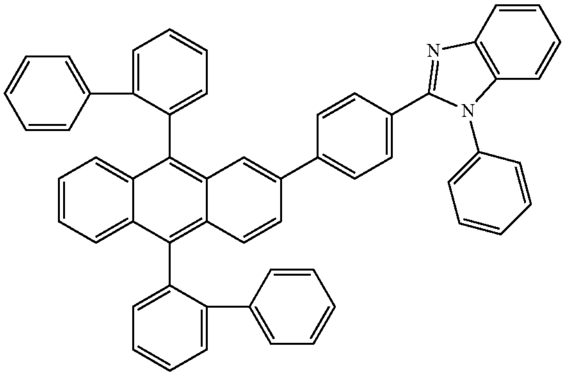
Compound ET6
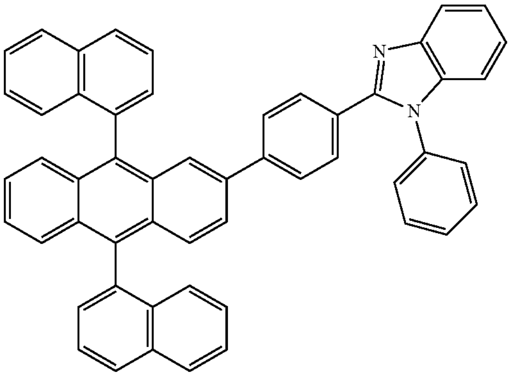
Compound ET7
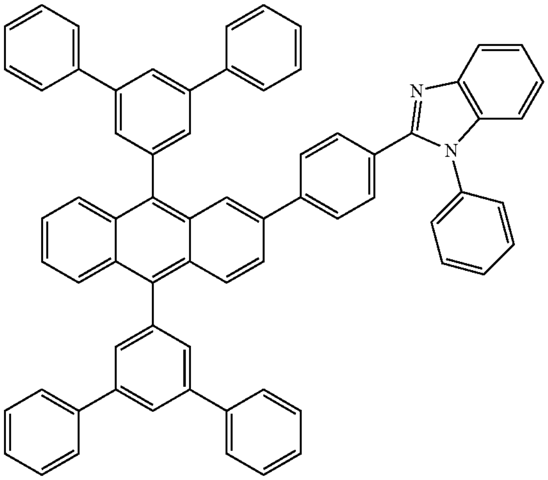
Compound ET8
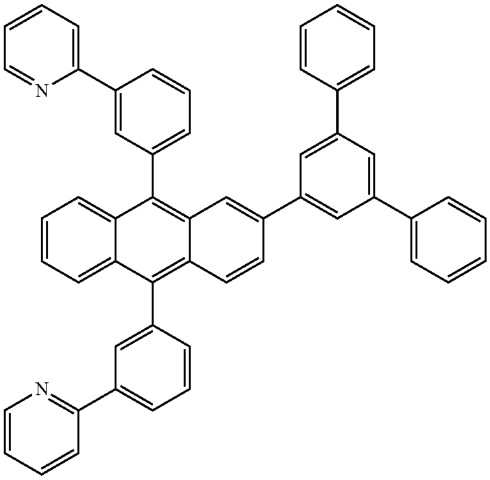
Compound ET8
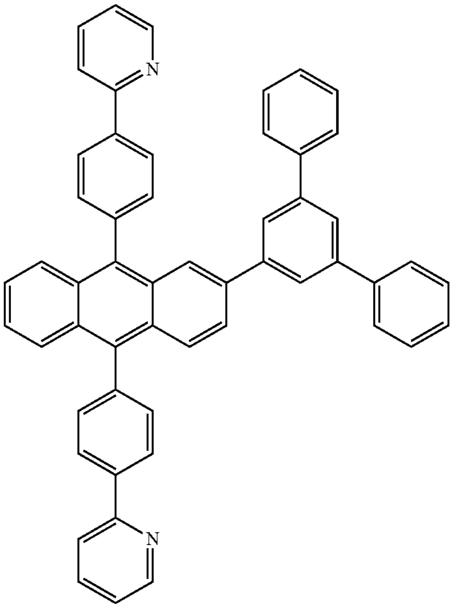

-continued
Compound ET10
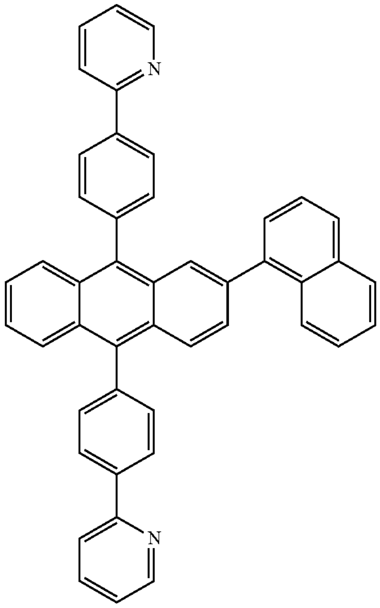
Compound ET11
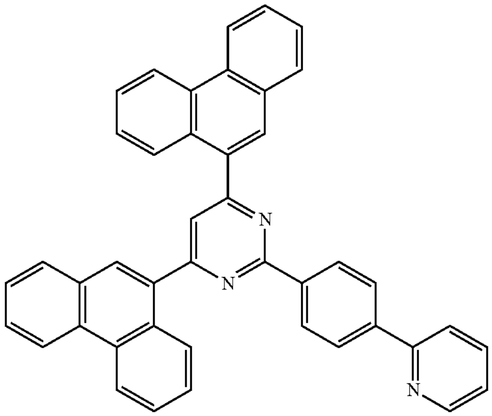
Compound ET12
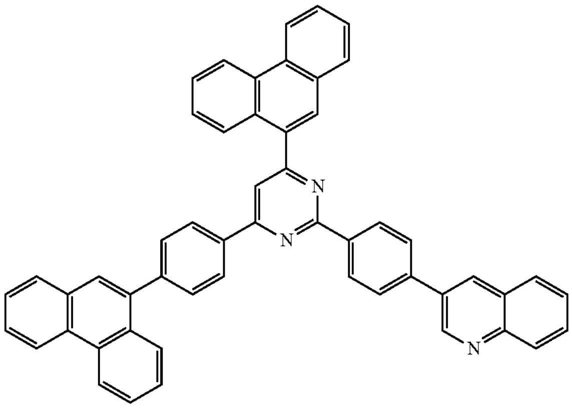
-continued
Compound ET13
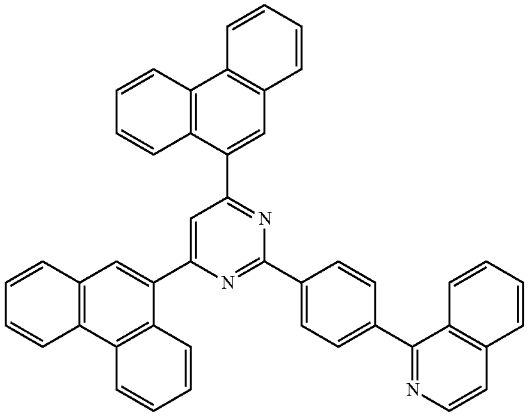
Compound ET14
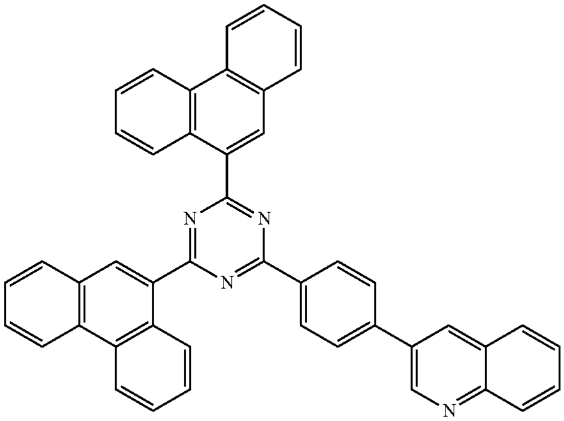
Compound ET15
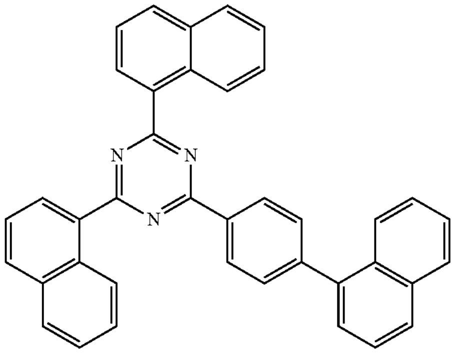

-continued

Compound ET16

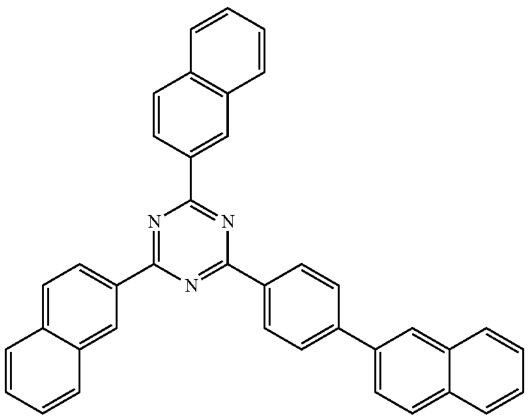

Compound ET17

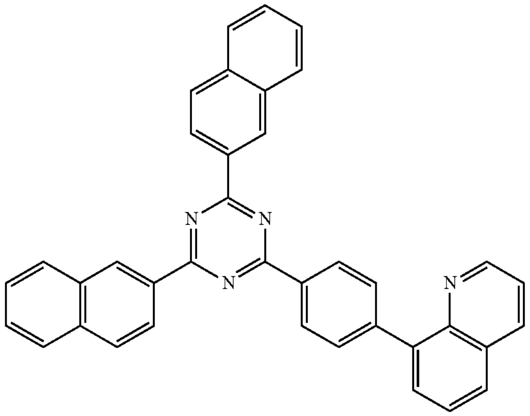

A thickness of the electron transport layer may be in a range of about 100 Å to about 1,000 Å, for example, about 150 Å to about 500 Å. While not wishing to be bound by theory, it is understood that when the thickness of the electron transport layer is within these ranges, satisfactory electron transport characteristics may be obtained without a substantial increase in driving voltage.

The electron transport layer may further include, in addition to the materials described above, a metal-containing material.

The metal-containing material may include a lithium (Li) complex. The Li complex may include, for example, Compound ET-D1 (lithium quinolate (LiQ)) or Compound ET-D2:

ET-D1

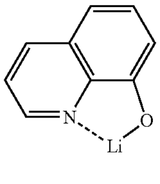

-continued

ET-D2

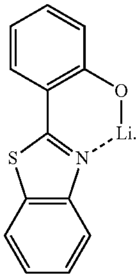

In addition, the electron transport region may include an electron injection layer that facilitates electron injection from the second electrode 19.

The electron injection layer may include at least one selected from LiF, NaCl, CsF, $Li_2O$, and BaO.

A thickness of the electron injection layer may be in a range of about 1 Å to about 10 0 Å, for example, about 3 Å to about 90 Å. While not wishing to be bound by theory, it is understood that when the thickness of the electron injection layer is within the ranges, satisfactory electron injection characteristics may be obtained without a substantial increase in driving voltage.

The second electrode 19 is disposed on the organic layer 15. The second electrode 19 may be a cathode. A material for forming the second electrode 19 may be selected from metal, an alloy, an electrically conductive compound, and a combination thereof, which have a relatively low work function. For example, Li, Mg, Al, Al—Li, Ca, Mg—In, or Mg—Ag may be used as a material for forming the second electrode 19. In various embodiments, to manufacture a top emission-type light-emitting device, a transmissive electrode formed using ITO or IZO may be used as the second electrode 19.

Hereinbefore, the organic light-emitting device 10 has been described with reference to FIG. 1, but is not limited thereto.

A $C_1$-$C_{60}$ alkyl group as used herein refers to a linear or branched aliphatic saturated hydrocarbon monovalent group having 1 to 60 carbon atoms. Examples thereof include a methyl group, an ethyl group, a propyl group, an iso-butyl group, a sec-butyl group, a tert-butyl group, a pentyl group, an iso-amyl group, and a hexyl group. A $C_1$-$C_{60}$ alkylene group as used herein refers to a divalent group having the same structure as the $C_1$-$C_{60}$ alkyl group.

A $C_1$-$C_{60}$ alkoxy group as used herein refers to a monovalent group represented by —$OA_{101}$ (wherein $A_{101}$ is the $C_1$-$C_{60}$ alkyl group), and examples thereof include a methoxy group, an ethoxy group, and an iso-propyloxy (iso-propoxy) group.

A $C_2$-$C_{60}$ alkenyl group as used herein refers to a hydrocarbon group formed by including at least one carbon-carbon double bond in the middle or at either terminal end of the $C_2$-$C_{60}$ alkyl group. Examples thereof include an ethenyl group, a propenyl group, and a butenyl group. A $C_2$-$C_{60}$ alkenylene group as used herein refers to a divalent group having the same structure as the $C_2$-$C_{60}$ alkenyl group.

A $C_2$-$C_{60}$ alkynyl group as used herein refers to a hydrocarbon group formed by including at least one carbon-carbon triple bond in the middle or at either terminal end of the $C_2$-$C_{60}$ alkyl group. Examples thereof include an ethynyl group and a propynyl group. A $C_2$-$C_{60}$ alkynylene group as used herein refers to a divalent group having the same structure as the $C_2$-$C_{60}$ alkynyl group.

A $C_3$-$C_{10}$ cycloalkyl group as used herein refers to a monovalent saturated hydrocarbon monocyclic group having 3 to 10 carbon atoms. Examples thereof include a cyclopropyl group, a cyclobutyl group, a cyclopentyl group, a cyclohexyl group, and a cycloheptyl group. A $C_3$-$C_{10}$ cycloalkylene group as used herein refers to a divalent group having the same structure as the $C_3$-$C_{10}$ cycloalkyl group.

A $C_1$-$C_{10}$ heterocycloalkyl group as used herein refers to a monovalent saturated monocyclic group having at least one heteroatom selected from N, O, P, Si, and S as a ring-forming atom and 1 to 10 carbon atoms. Examples thereof include a tetrahydrofuranyl group and a tetrahydrothiophenyl group. A $C_1$-$C_{10}$ heterocycloalkylene group as used herein refers to a divalent group having the same structure as the $C_1$-$C_{10}$ heterocycloalkyl group.

A $C_3$-$C_{10}$ cycloalkenyl group carbon as used herein refers to a monovalent monocyclic group that has 3 to 10 carbon atoms and at least one carbon-carbon double bond in the ring thereof, and which is not aromatic. Examples thereof include a cyclopentenyl group, a cyclohexenyl group, and a cycloheptenyl group. A $C_3$-$C_{10}$ cycloalkenylene group as used herein refers to a divalent group having the same structure as the $C_3$-$C_{10}$ cycloalkenyl group.

A $C_1$-$C_{10}$ heterocycloalkenyl group as used herein refers to a monovalent monocyclic group that has at least one heteroatom selected from N, O, P, and S as a ring-forming atom, 1 to 10 carbon atoms, and at least one carbon-carbon double bond in the ring. Examples of the $C_1$-$C_{10}$ heterocycloalkenyl group include a 2,3-dihydrofuranyl group and a 2,3-dihydrothiophenyl group. A $C_1$-$C_{10}$ heterocycloalkenylene group as used herein refers to a divalent group having the same structure as the $C_1$-$C_{10}$ heterocycloalkenyl group.

A $C_6$-$C_{60}$ aryl group as used herein refers to a monovalent group having a carbocyclic aromatic system having 6 to 60 carbon atoms, and a $C_6$-$C_{60}$ arylene group as used herein refers to a divalent group having a carbocyclic aromatic system having 6 to 60 carbon atoms. Examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the respective rings may be fused to each other.

A $C_1$-$C_{60}$ heteroaryl group as used herein refers to a monovalent group having a heterocyclic aromatic system that has at least one heteroatom selected from N, O, P, and S as a ring-forming atom, and 1 to 60 carbon atoms. A $C_1$-$C_{60}$ heteroarylene group as used herein refers to a divalent group having a carbocyclic aromatic system that has at least one heteroatom selected from N, O, P, and S as a ring-forming atom and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the respective rings may be fused to each other.

A $C_6$-$C_{60}$ aryloxy group as used herein indicates —$OA_{102}$ (wherein $A_{102}$ is the $C_6$-$C_{60}$ aryl group a $C_6$-$C_{60}$ arylthio group as used herein indicates —$SA_{103}$ (wherein $A_{103}$ is the $C_6$-$C_{60}$ aryl group), and a $C_7$-$C_{60}$ arylalkyl group as used herein indicates -$A_{104}A_{105}$ (wherein $A_{104}$ is the $C_6$-$C_{59}$ aryl group and $A_{105}$ is the $C_1$-$C_{53}$ alkyl group).

A $C_2$-$C_{60}$ heteroaryloxy group as used herein indicates —$OA_{106}$ (wherein $A_{106}$ is the $C_2$-$C_{60}$ heteroaryl group), a $C_2$-$C_{60}$ heteroarylthio group as used herein indicates —$SA_{107}$ (wherein $A_{107}$ is the $C_2$-$C_{60}$ heteroaryl group), and a $C_3$-$C_{60}$ heteroarylalkyl group as used herein indicates -$A_{108}A_{109}$ (wherein $A_{108}$ is the $C_2$-$C_{59}$ heteroaryl group and $A_{109}$ is the $C_1$-$C_{58}$ alkyl group).

A monovalent non-aromatic condensed polycyclic group as used herein refers to a monovalent group (for example, a group having 8 to 60 carbon atoms) that has two or more rings condensed to each other, only carbon atoms as a ring forming atom, and which is non-aromatic in the entire molecular structure. An example of the non-aromatic condensed polycyclic group includes a fluorenyl group. A divalent non-aromatic condensed polycyclic group as used herein refers to a divalent group having the same structure as the monovalent non-aromatic condensed polycyclic group.

A monovalent non-aromatic condensed heteropolycyclic group as used herein refers to a monovalent group (for example, a group having 2 to 60 carbon atoms) that has two or more rings condensed to each other, has a heteroatom selected from N, O, P and S, other than carbon atoms, as a ring-forming atom, and which is non-aromatic in the entire molecular structure. An example of the monovalent non-aromatic condensed heteropolycyclic group includes a carbazolyl group. A divalent non-aromatic condensed heteropolycyclic group as used herein refers to a divalent group having the same structure as the monovalent non-aromatic condensed heteropolycyclic group.

At least one of substituent(s) of the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_2$-$C_{60}$ heteroarylalkyl group, the substituted monovalent non-aromatic condensed polycyclic group, and the substituted monovalent non-aromatic condensed heteropolycyclic group may be selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), and —B($Q_{16}$)($Q_{17}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), and —B($Q_{26}$)($Q_{27}$); and —N($Q_{31}$)($Q_{32}$), —Si($Q_{33}$)($Q_{34}$)($Q_{35}$), and —B($Q_{36}$)($Q_{37}$), and $Q_1$ to $Q_7$, $Q_{11}$ to $Q_{17}$, $Q_{21}$ to $Q_{27}$, and $Q_{31}$ to $Q_{37}$ may each independently be selected from hydrogen, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group.

When a group containing a specified number of carbon atoms is substituted with any of the groups listed in the preceding paragraphs, the number of carbon atoms in the resulting "substituted" group is defined as the sum of the carbon atoms contained in the original (unsubstituted) group and the carbon atoms (if any) contained in the substituent. For example, when the term "substituted $C_1$-$C_{60}$ alkyl" refers to a $C_1$-$C_{60}$ alkyl group substituted with $C_6$-$C_{60}$ aryl group, the total number of carbon atoms in the resulting aryl substituted alkyl group is $C_7$-$C_{120}$.

The term "room temperature" as used herein refers to a temperature of about 25° C.

Hereinafter, a compound according to embodiments and an organic light-emitting device according to embodiments will be described in detail with reference to Synthesis Examples and Examples below, but the present inventive concept is not limited to Synthesis Examples and Examples below. The expression "'B' was used instead of 'A'" used in describing Synthesis Examples below means that the number of molar equivalents of 'B' used was identical to the number of molar equivalents of 'A'.

EXAMPLES

Evaluation Example 1: Evaluation of PL Spectrum and TRPL Spectrum

A quartz substrate cleaned by chloroform and pure water was prepared, and then, the predetermined materials listed on Table 1 were vacuum-(co)deposited at a vacuum degree of about $10^{-7}$ torr to prepare Films D1, A1, D1:A1, A2, D1:A2, A3, D1:A3, D11, D11:A2, TCTA, BmPyPb, TCTA:BmPyPb, CBP, B3PYMPM, CBP:B3PYMPM, and TCTA:3TPYMB, each having a thickness of about 50 nanometers (nm).

TABLE 1

| Name of films | Compound used in film preparation |
|---|---|
| Film D1 | Compound D1 |
| Film A1 | Compound A1 |
| Film D1:A1 | Compound D1:Compound A1 (at a volume ratio of 1:1) |
| Film A2 | Compound A2 |
| Film D1:A2 | Compound D1:Compound A2 (at a volume ratio of 1:1) |
| Film A3 | Compound A3 |
| Film D1:A3 | Compound D1:Compound A3 (at a volume ratio of 1:1) |
| Film D11 | Compound D11 |
| Film D11:A2 | Compound D11:Compound A2 (at a volume ratio of 1:1) |
| Film TCTA | TCTA |
| Film BmPyPb | BmPyPb |
| Film TCTA:BmPyPb | TCTA:BmPyPb (at a volume ratio of 1:1) |
| Film CBP | CBP |
| Film B3PYMPM | B3PYMPM |
| Film CBP:B3PYMPM | CBP:B3PYMPM (at a volume ratio of 1:1) |
| Film TCTA:3TPYMB | TCTA:3TPYMB (at a volume ratio of 1:1) |

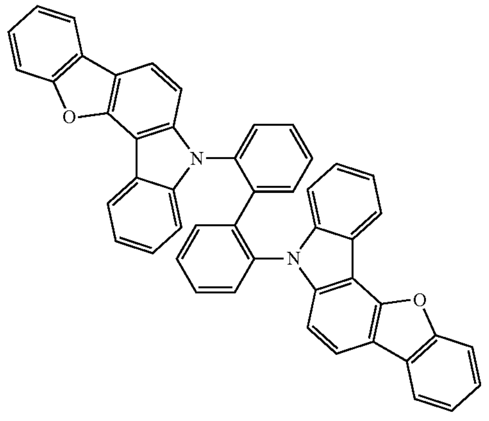

D1

TABLE 1-continued
A1
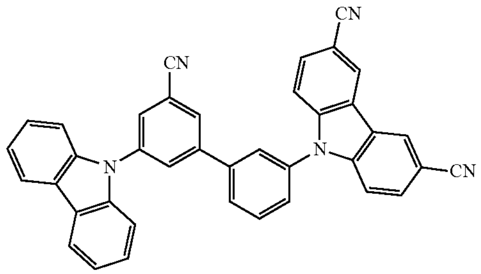 [SMILES: N#Cc1cc(-c2cccc(-n3c4ccc(C#N)cc4c4cc(C#N)ccc43)c2)cc(-n2c3ccccc3c3ccccc32)c1]
A2
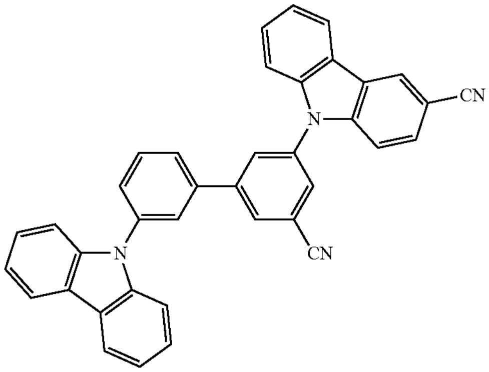 [SMILES: N#Cc1cc(-c2cccc(-n3c4ccccc4c4ccccc43)c2)cc(-n2c3ccccc3c3cc(C#N)ccc32)c1]
A3
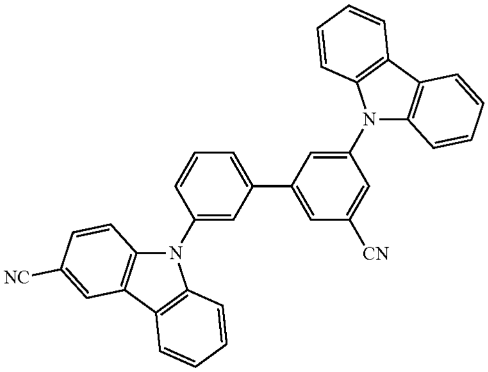 [SMILES: N#Cc1cc(-c2cccc(-n3c4ccccc4c4cc(C#N)ccc43)c2)cc(-n2c3ccccc3c3ccccc32)c1]
D11
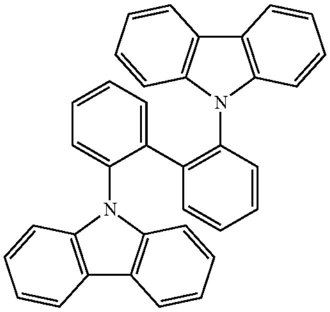 [SMILES: c1ccc(-n2c3ccccc3c3ccccc32)c(-c2ccccc2-n2c3ccccc3c3ccccc32)c1]
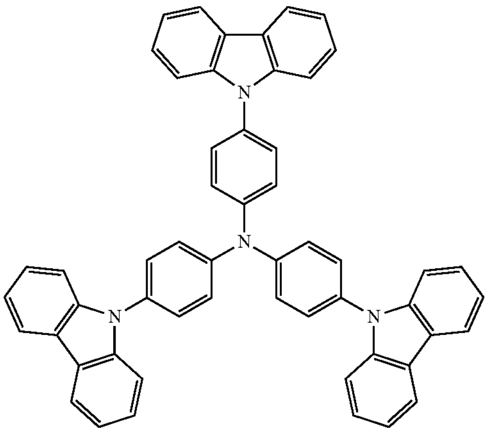 [SMILES: c1ccc2c(c1)c1ccccc1n2-c1ccc(N(c2ccc(-n3c4ccccc4c4ccccc43)cc2)c2ccc(-n3c4ccccc4c4ccccc43)cc2)cc1]
TCTA
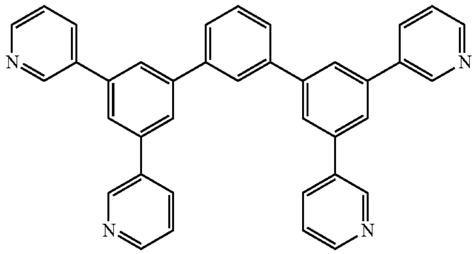 [SMILES: c1cncc(-c2cc(-c3cccnc3)cc(-c3cccc(-c4cc(-c5cccnc5)cc(-c5cccnc5)c4)c3)c2)c1]
BmPyPb
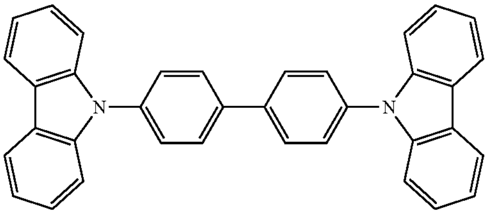 [SMILES: c1ccc2c(c1)c1ccccc1n2-c1ccc(-c2ccc(-n3c4ccccc4c4ccccc43)cc2)cc1]
CBP
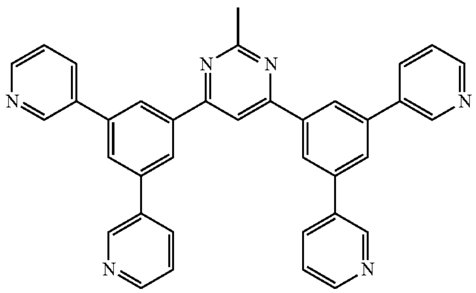 [SMILES: Cc1nc(-c2cc(-c3cccnc3)cc(-c3cccnc3)c2)cc(-c2cc(-c3cccnc3)cc(-c3cccnc3)c2)n1]
B3PYMPM TABLE 1-continued

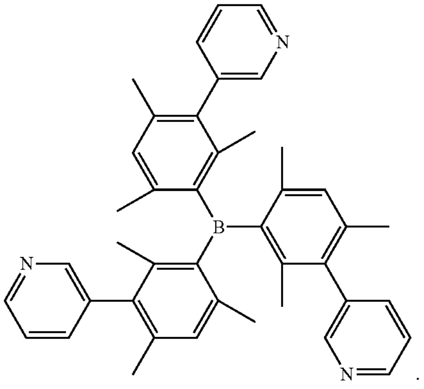 [SMILES: Cc1cc(C)c(-c2cccnc2)c(C)c1B(c1c(C)cc(C)c(-c2cccnc2)c1C)c1c(C)cc(C)c(-c2cccnc2)c1C]

3TPYMB

Subsequently, a PL spectrum for each of Films D1, A1, D1:A1, A2, D1:A2, A3, D1:A3, BmPyPb, TCTA, TCTA: BmPyPb, CBP, B3PYMPM, CBP:B3PYMPM, D11, and D11:A2 was evaluated at room temperature by using an absolute PL quantum yield measurement system, Quantaurus-QY (manufactured by Hamamatus), and the respective results are shown in FIGS. 2A to 2F.

Figure 2A:
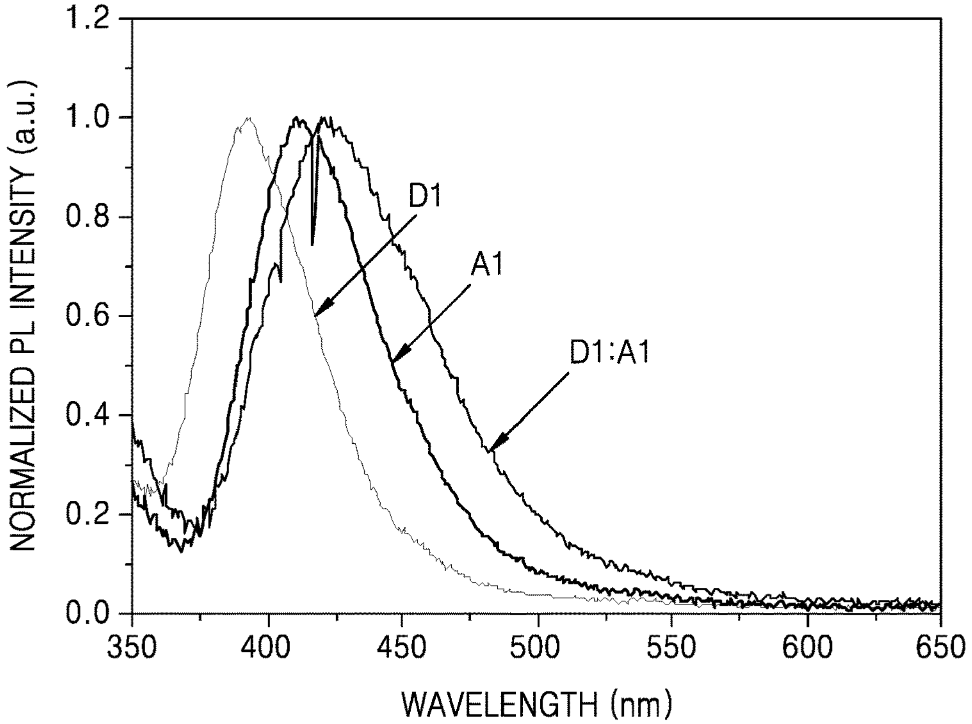
FIGS. 2A to 2F are each a graph of normalized photoluminescence (PL) intensity (arbitrary units, a.u.) versus wavelength (nanometers, nm) showing a photoluminescence (PL) spectrum for a film, wherein the PL spectrum is measured according to Evaluation Example 1.
Figure 2B:
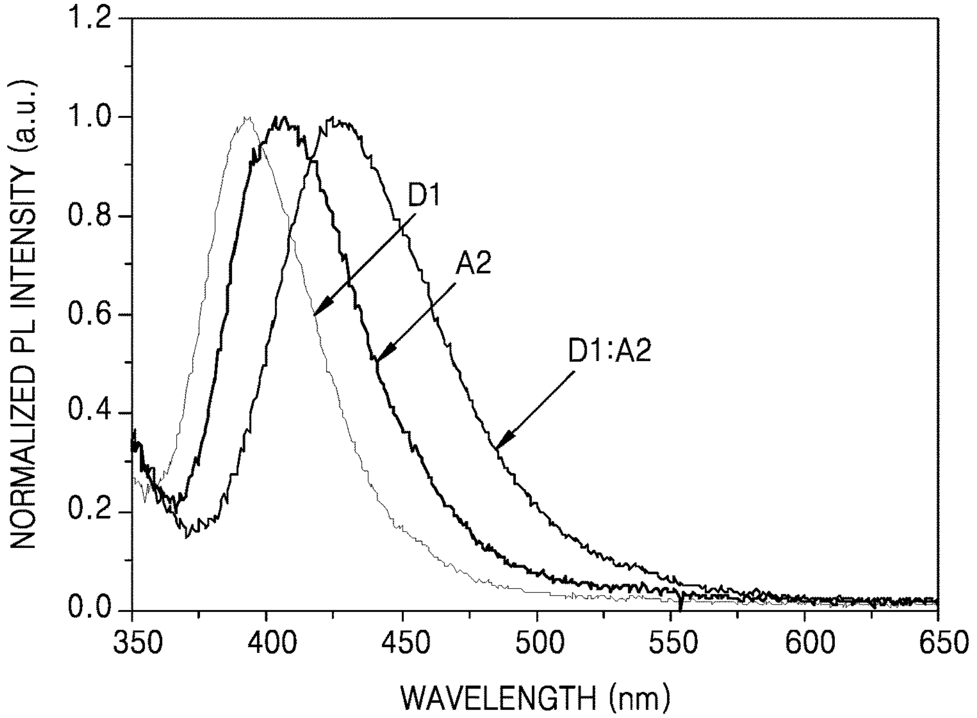
Figure 2C:
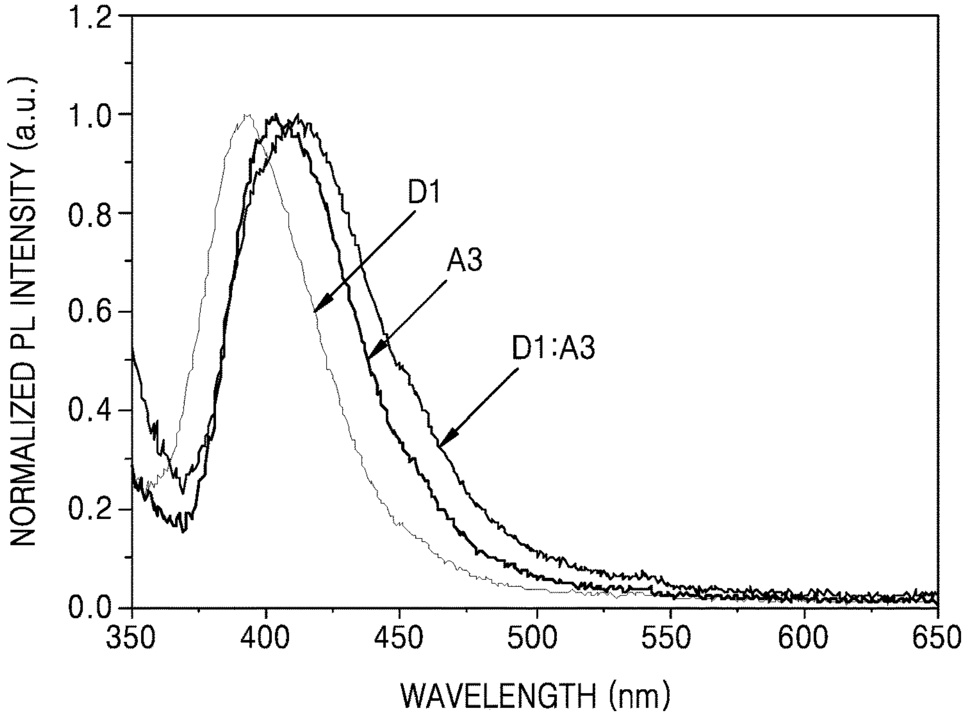
Figure 2D:
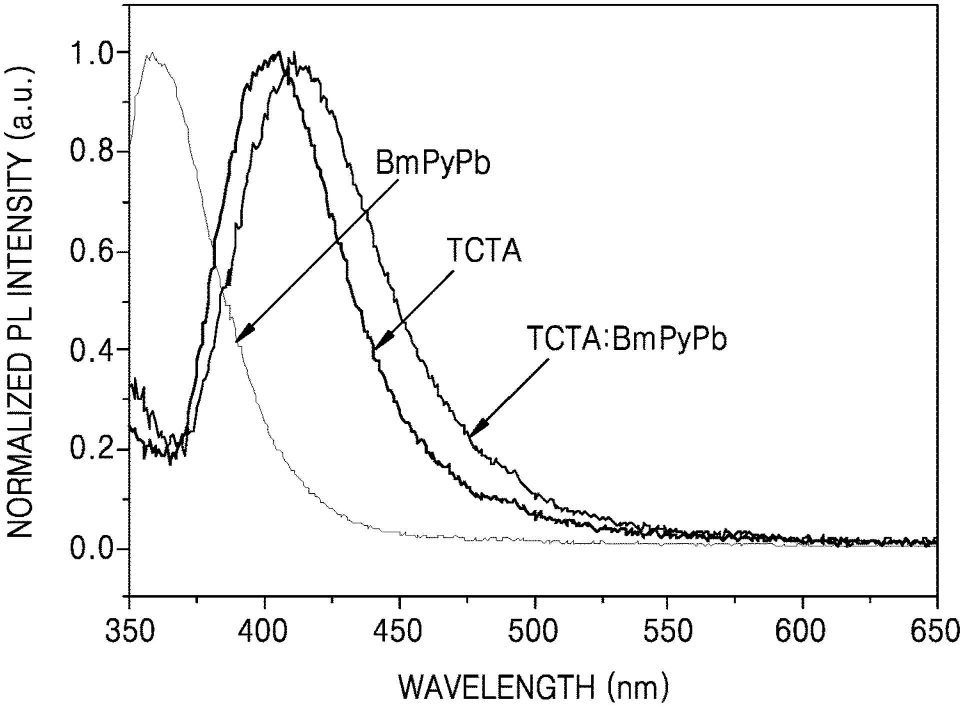
Figure 2E:
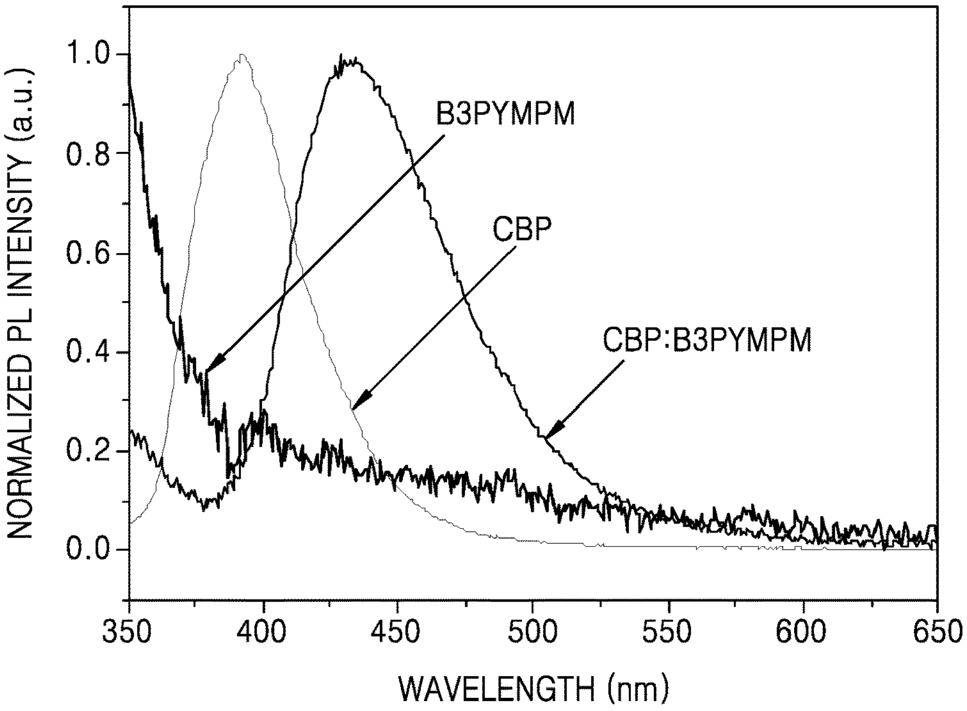
Figure 2F:
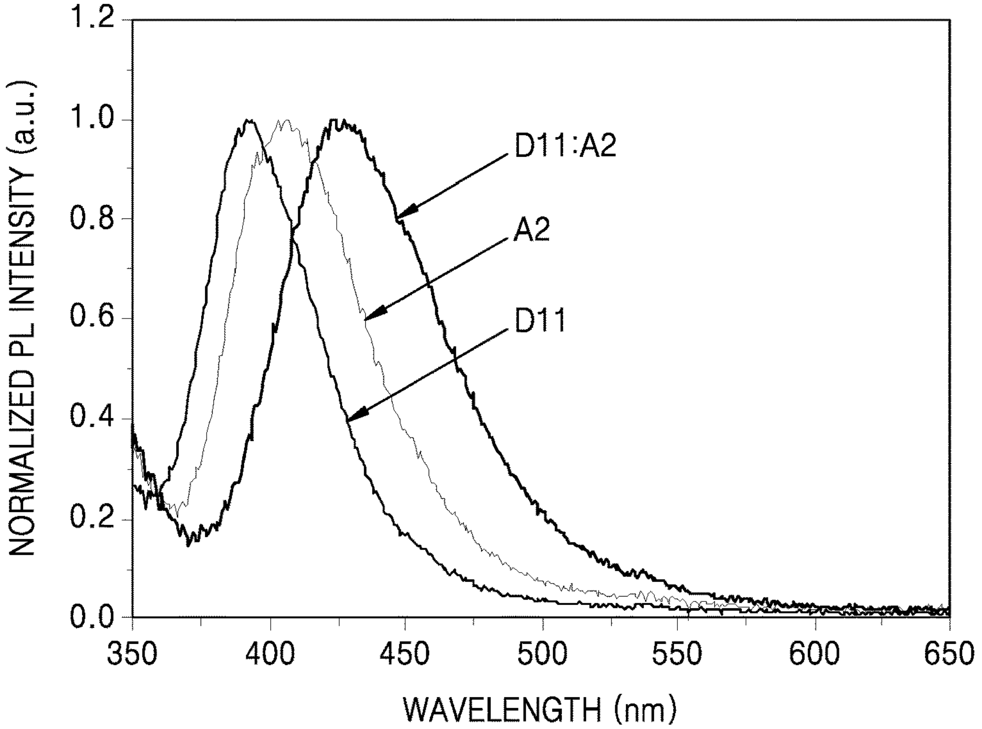
Figure 3A:
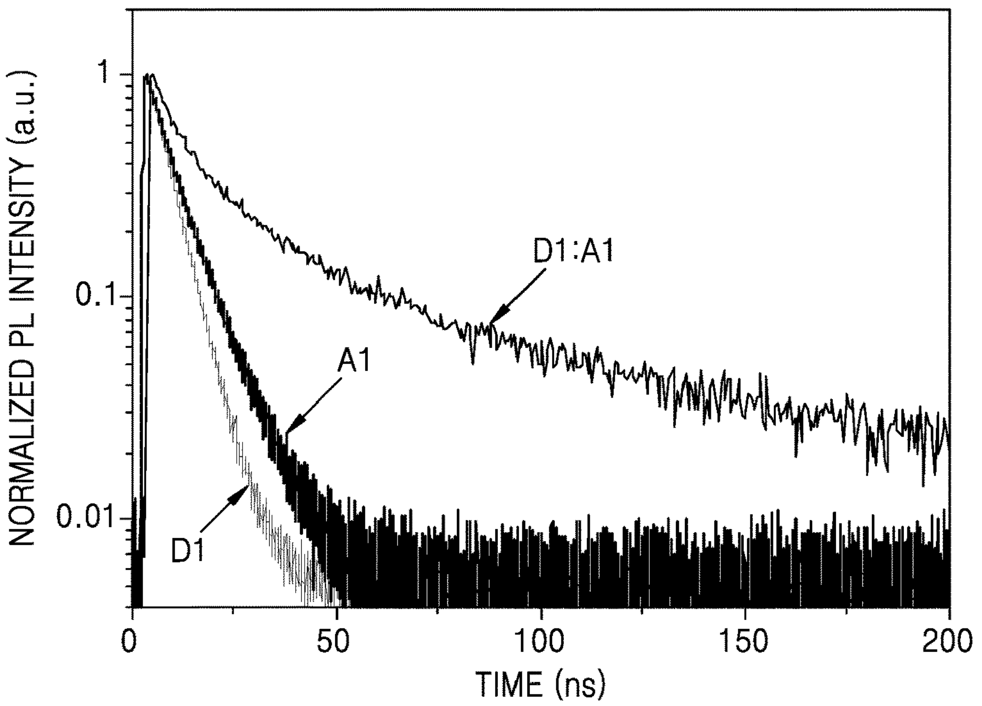
FIGS. 3A to 3F are each a graph of normalized photoluminescence intensity (arbitrary units, a.u.) versus time (nanoseconds, ns) showing a time-resolved photoluminescence (TRPL) spectrum for a film, wherein the TRPL spectrum is measured according to Evaluation Example 1.
Figure 3B:
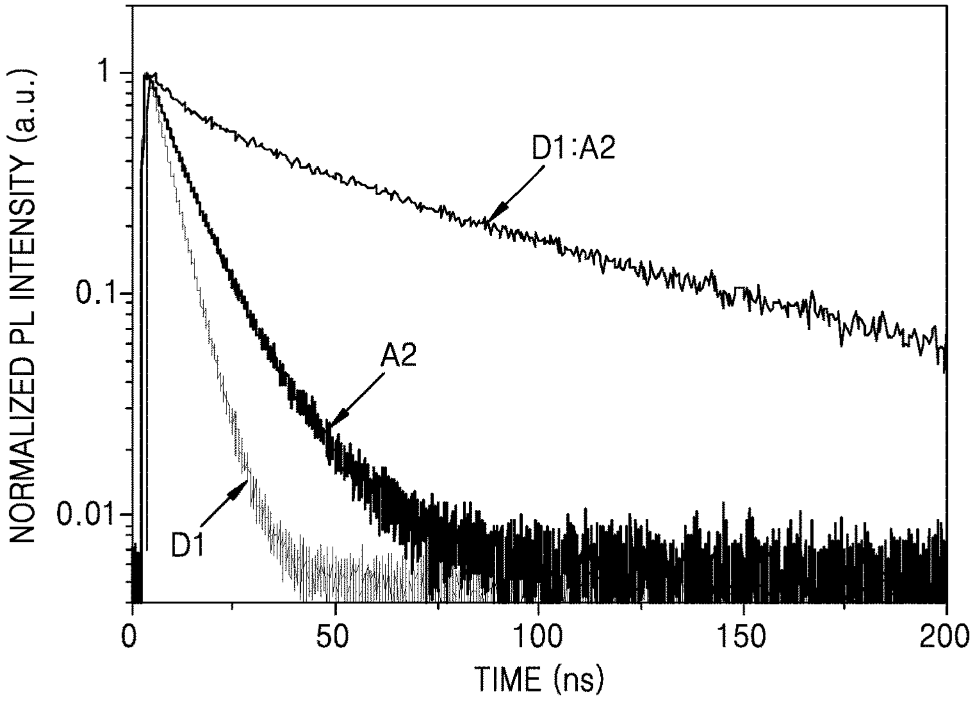
Figure 3C:
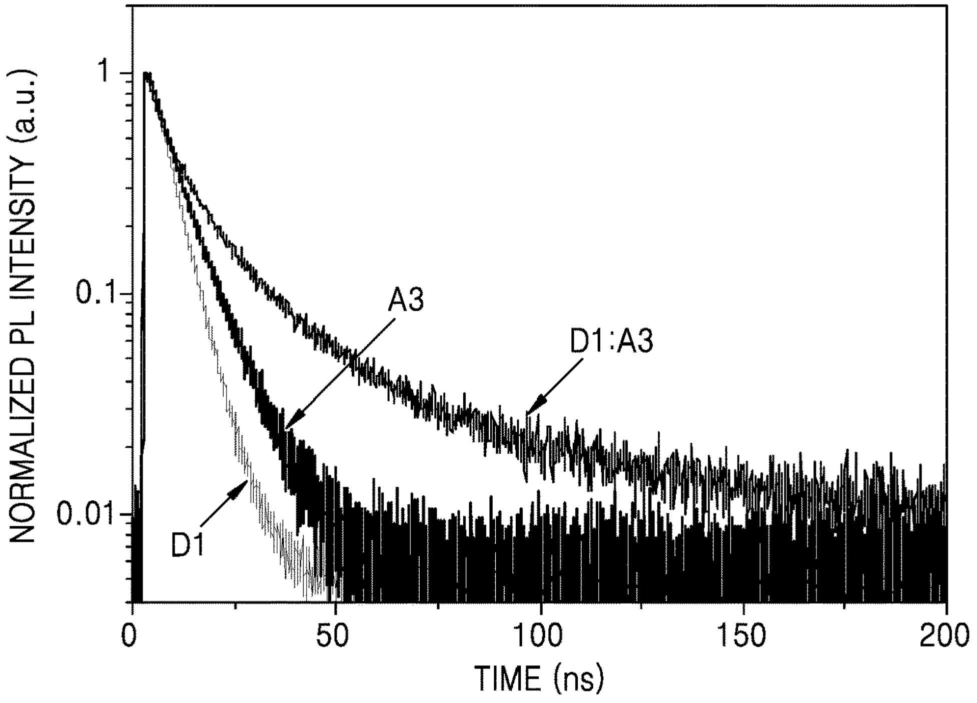
Figure 3D:
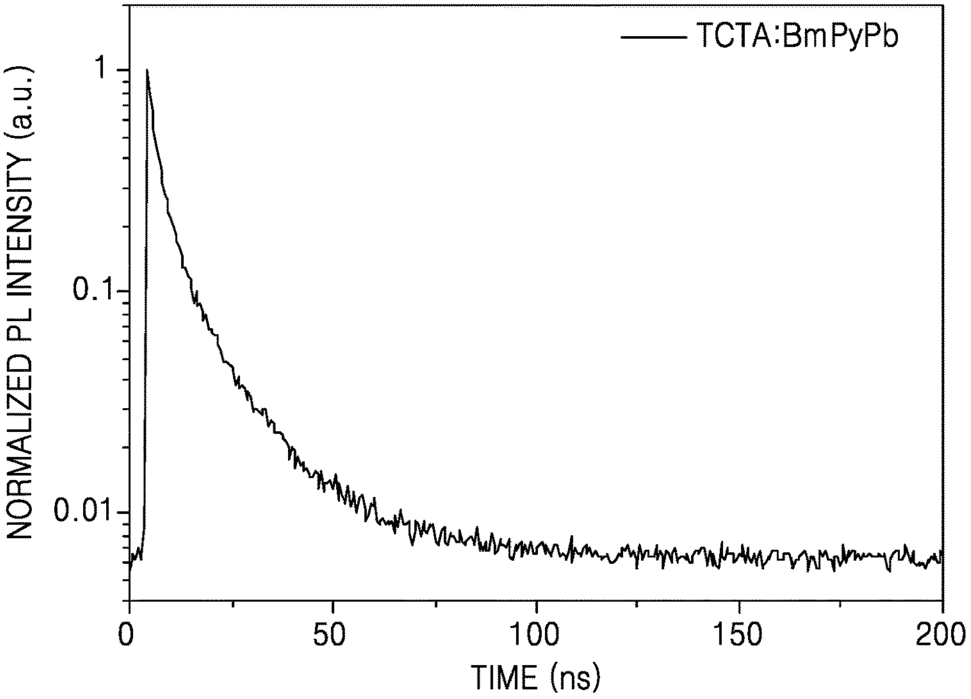
Figure 3E:
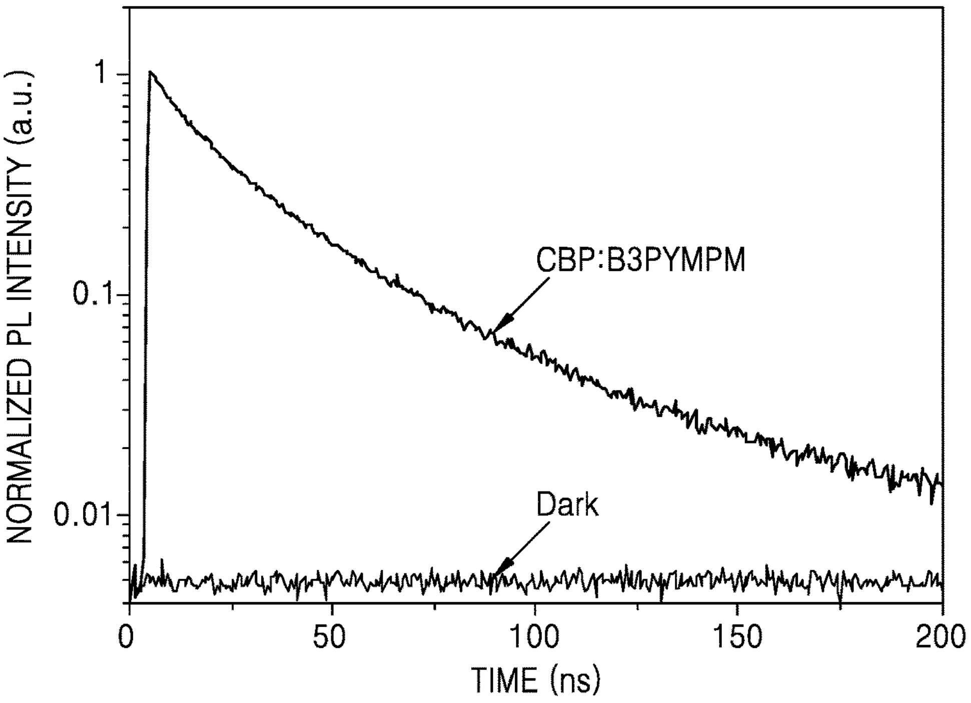
Figure 3F:
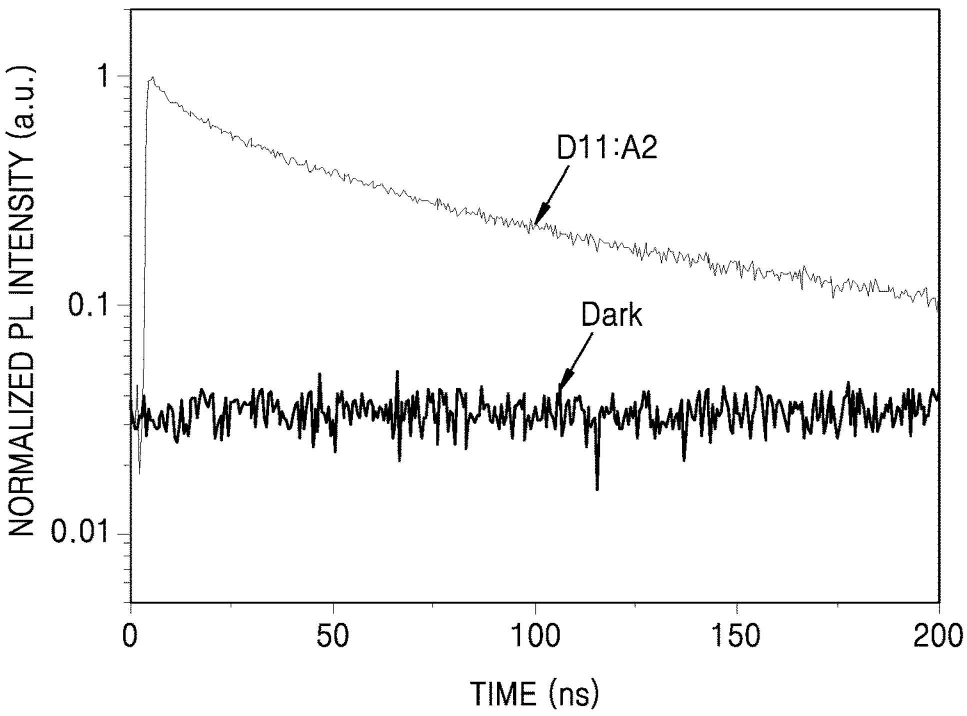
Figure 4A:
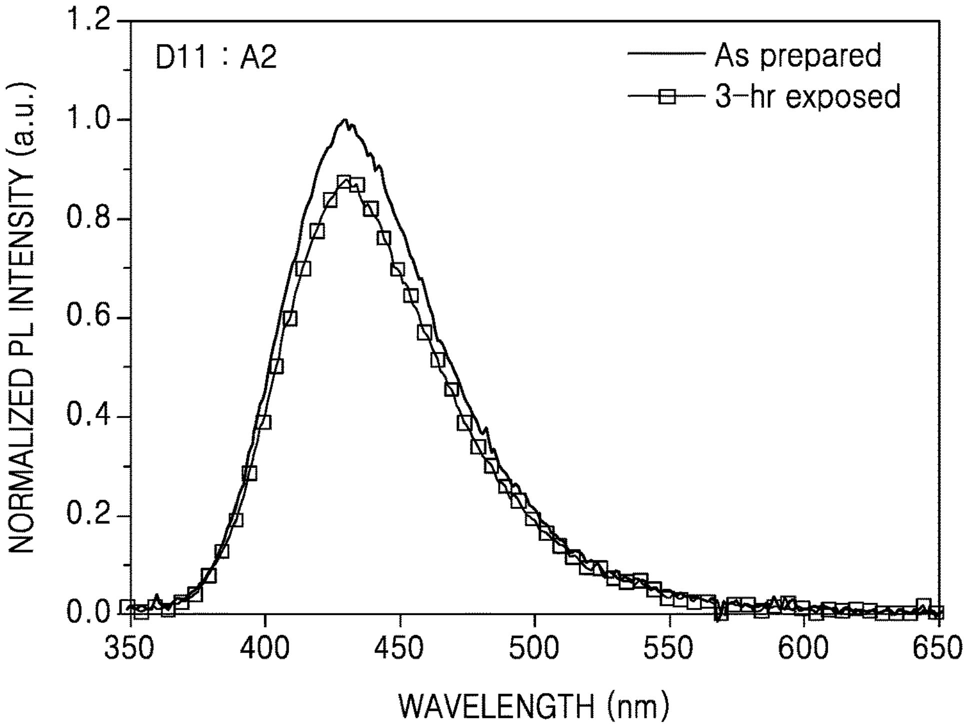
FIGS. 4A to 4D are each a graph of normalized photoluminescence (PL) intensity (arbitrary units, a.u.) versus wavelength (nanometers, nm) showing a PL spectrum (denoted as As prepared) measured for each of Films D11:A2, TCTA:BmPyPb, CBP:B3PYMPM, and TCTA:3TPYMB immediately after the formation of these films and a PL spectrum (denoted as 3-hr exposed) measured for the same films after the exposure of the films to light from a laser for 3 hours.
Figure 4B:
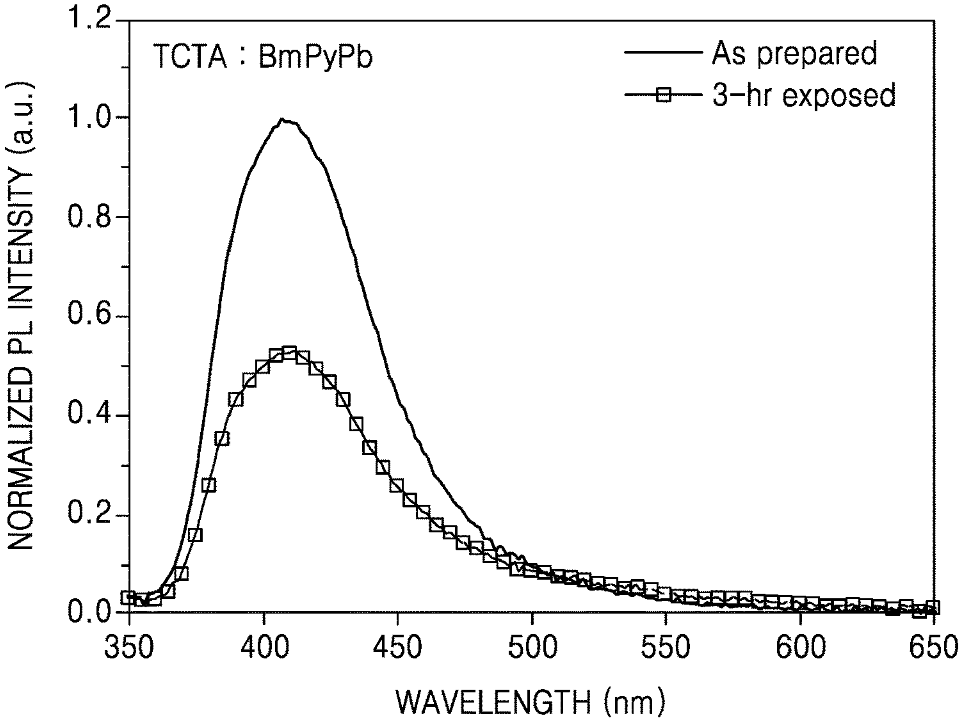
Figure 4C:
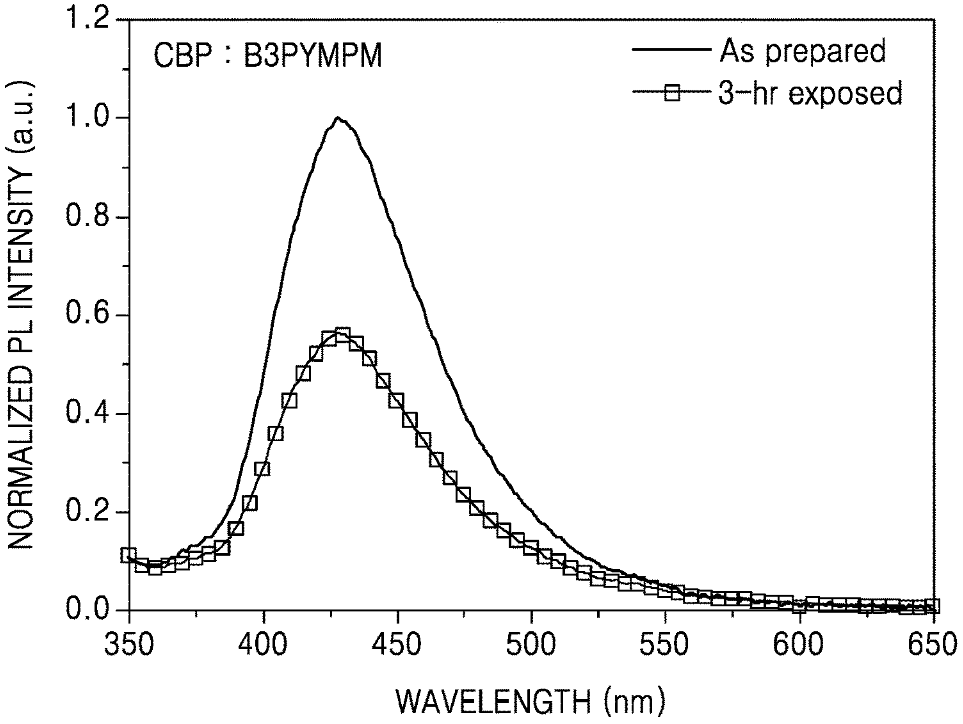
Figure 4D:
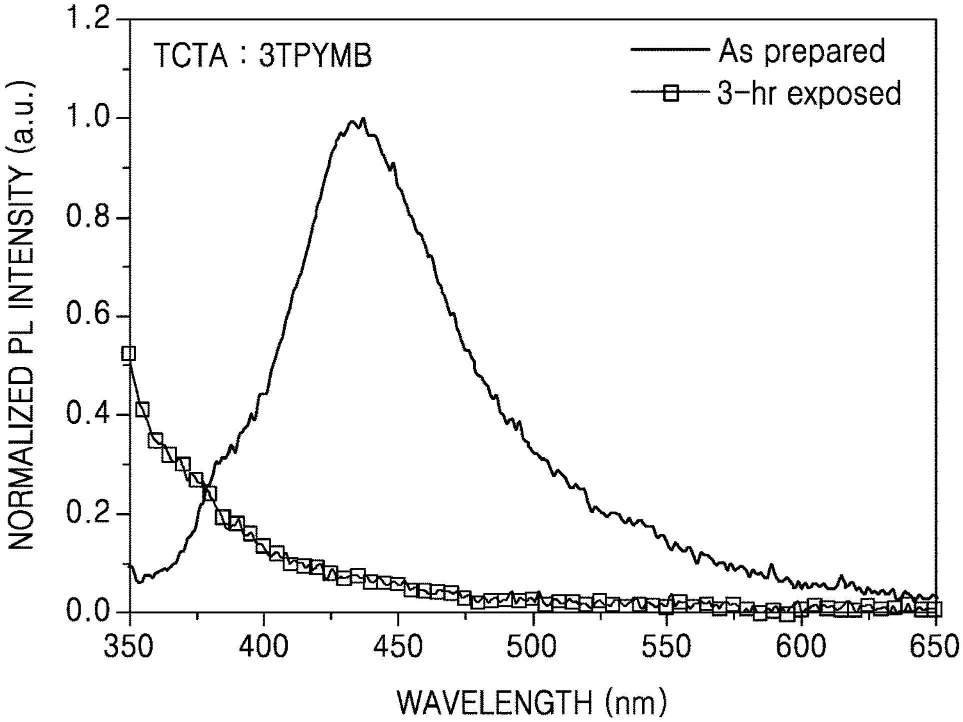

It was determined that a wavelength of the PL spectrum for Film D1:A1 in FIG. 2A was shifted toward longer wavelengths, compared to the PL spectra for Films D1 and A1, a wavelength of the PL spectrum for Film D1:A2 in FIG. 2B was shifted toward longer wavelengths, compared to the PL spectra for Films D1 and A2, a wavelength of the PL spectrum for Film D1:A3 in FIG. 2C was shifted toward longer wavelengths, compared to the PL spectra for Films D1 and A, and a wavelength of the PL spectrum for Film D11:A2 in FIG. 2F was shifted toward longer wavelengths, compared to the PL spectra for Films D11 and A2. In this regard, it was determined that each combination of compounds used to prepare Films D1:A1, D1:A2, D1:A3, and D11:A2 led to formation of an exciplex.

In addition, it was determined that Film D1:A1 in FIG. 2A had a maximum emission wavelength $\lambda_{max}$ of about 423 nm, Film D1:A2 in FIG. 2B had a maximum emission wavelength $\lambda_{max}$ of about 427 nm, Film D1:A3 in FIG. 2C had a maximum emission wavelength $\lambda_{max}$ of about 430 nm, and Film D11:A2 in FIG. 2F had a maximum emission wavelength $\lambda_{max}$ of about 430 nm. In this regard, it was determined that the exciplex formed by Compounds D1 and A1, the exciplex formed by Compounds D1 and A2, the exciplex formed by Compounds D1 and A3, and the exciplex formed by Compounds D11 and A2 each emitted blue light within a wavelength band (460±10 nm) available for energy transfer to all of blue illuminants for display.

In addition, it was determined that a wavelength of the PL spectrum for Film TCTA:BmPyPb in FIG. 2D was shifted toward longer wavelengths, compared to the PL spectra for Films TCTA and BmPyPb, and a wavelength of the PL spectrum for Film CBP:B3PYMPM in FIG. 2E was shifted toward longer wavelengths, compared to the PL spectra for Films CBP and B3PYMPM. In this regard, it was determined that each combination of compounds used to prepare Films TCTA:BmPyPb and CBP:B3PYMPM led to formation of an exciplex.

Subsequently, PL spectra for each of Films D1, A1, D1:A1, A2, D1:A2, A3, D1:A3, TCTA:BmPyPb, CBP: B3PYMPM, and D11:A2 were evaluated at room temperature by using a TRPL measurement system, FluoTime 300 (manufactured by PicoQuant), and a pumping laser, PLS340 (manufactured by PicoQuant, excitation wavelength=340 nm, spectral width=20 nm). Then, a wavelength of main peaks in the PL spectra was determined, and upon photon pulses (pulse width=500 picoseconds) applied to the films by PLS340, the number of photons emitted at a wavelength of main peaks for each of the films was repeatedly measured with time by time-correlated single photon counting (TC-SPC), thereby obtaining TRPL curves available for the sufficient fitting. Based on the results obtained therefrom, two or more exponential decay functions were set forth for the fitting, thereby obtaining a decay time $T_{decay}$ (Ex) for each of Films D1:A1, D1:A2, D1:A3, TCTA:BmPyPb, CBP:B3PYMPM, and D11:A2. The functions used for the fitting are the same as described in Equation 1, and a decay time $T_{decay}$ having the largest value among values for each of the exponential decay functions used for the fitting was taken as a decay time $T_{decay}$ (Ex). The remaining decay time $T_{decay}$ values were used to determine the lifetime of typical fluorescence to be decayed. Here, during the same measurement time as the measurement time for obtaining TRPL curves, the same measurement was repeated once more at the dark state (i.e., a state where a pumping signal incident on a predetermined film was blocked), thereby obtaining a baseline or a background signal curve available as a baseline for the fitting.

Subsequently, the exponential decay curve (=changes in intensity over time), which was to be determined as the decay time $T_{decay}$ (Ex), was measured with respect to an integrated value of time-dependent intensity of the overall emission, and accordingly, a ratio of the integrated value over time was calculated, thereby evaluating the ratio of delayed fluorescent portion to the overall light-emitting portions:

$$(t)=\Sigma_{i=1}^{n}A_i\exp(-t/T_{decay,i} \quad \text{Equation 1}$$

In graphs of Films D1:A1, D1:A2, D1:A3, TCTA: BmPyPb, CBP:B3PYMPM, and D11:A2 shown in FIGS. 3A to 3F, the decay time $T_{decay}$ (Ex) of delayed fluorescence and the ratio of a delayed fluorescence portion to the overall light-emitting portions are each summarized in Table 2:

TABLE 2

| Name of films | $T_{decay}$ (Ex) | Ratio of a delayed fluorescence portion to the overall light-emitting portions |
|---|---|---|
| Film D1:A1 | 158 ns | 42% |
| Film D1:A2 | 230 ns | 65% |
| Film D1:A3 | 315 ns | 10% |
| Film TCTA:BmPyPb | 75 ns | 4% |
| Film CBP:B3PYMPM | 173 ns | 8% |
| Film D11:A2 | 193 ns | 53.53% |

TABLE 2-continued

D1

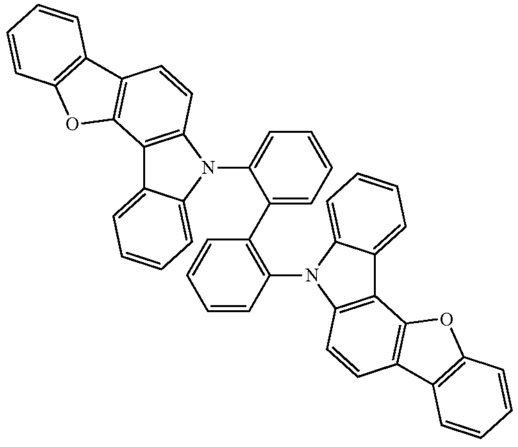 [SMILES: c1ccc(-n2c3ccccc3c3c4oc5ccccc5c4ccc32)c(-c2ccccc2-n2c3ccccc3c3c4oc5ccccc5c4ccc32)c1]

A1

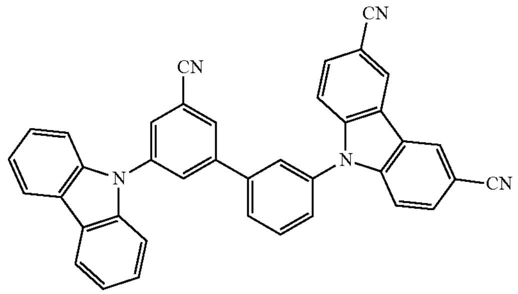 [SMILES: N#Cc1cc(-c2cccc(-n3c4ccc(C#N)cc4c4cc(C#N)ccc43)c2)cc(-n2c3ccccc3c3ccccc32)c1]

A2

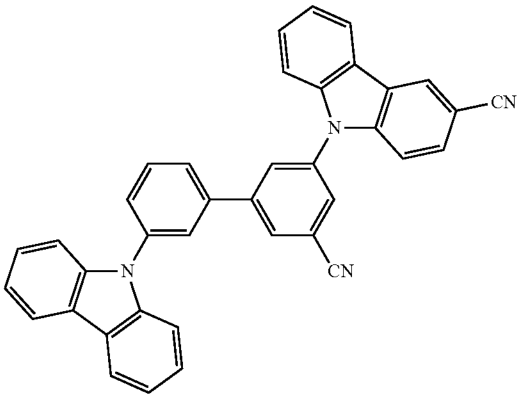 [SMILES: N#Cc1cc(-c2cccc(-n3c4ccccc4c4ccccc43)c2)cc(-n2c3ccccc3c3cc(C#N)ccc32)c1]

A3

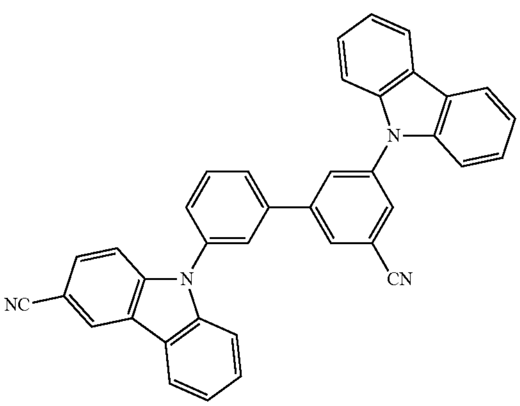 [SMILES: N#Cc1cc(-c2cccc(-n3c4ccccc4c4cc(C#N)ccc43)c2)cc(-n2c3ccccc3c3ccccc32)c1]

TABLE 2-continued

D11

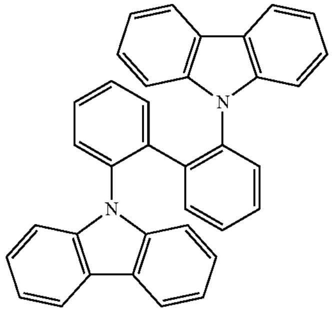 [SMILES: c1ccc(-n2c3ccccc3c3ccccc32)c(-c2ccccc2-n2c3ccccc3c3ccccc32)c1]

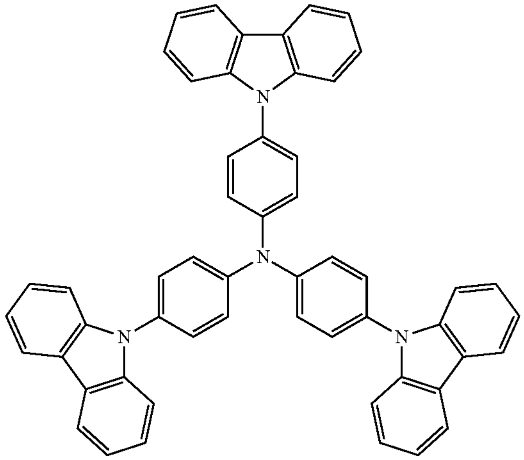 [SMILES: c1ccc2c(c1)c1ccccc1n2-c1ccc(N(c2ccc(-n3c4ccccc4c4ccccc43)cc2)c2ccc(-n3c4ccccc4c4ccccc43)cc2)cc1]

TCTA

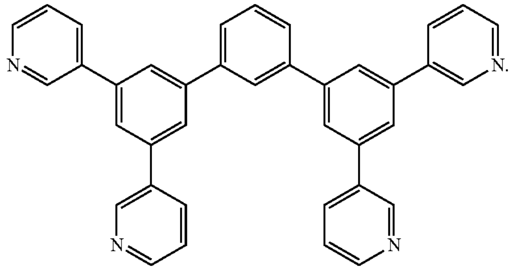 [SMILES: c1cncc(-c2cc(-c3cccnc3)cc(-c3cccc(-c4cc(-c5cccnc5)cc(-c5cccnc5)c4)c3)c2)c1]

BmPyPb

Referring to Table 2, it was determined that:

i) the exciplex formed by Compounds D1 and A1, ii) the exciplex formed by Compounds D1 and A2, iii) the exciplex formed by Compounds D1 and A3, and iv) the exciplex formed by Compounds 11 and A2 "simultaneously" had a $T_{decay}$ (Ex) of about 100 ns or more and 10% or more of the ratio of a delayed fluorescence portion to the overall light-emitting portions.

Although the formation of exciplex was identified in Films TCTA:BmPyPb and CBP:B3PYMPM, the ratio of a delayed fluorescence portion to the overall light-emitting portions in these films was less than about 10%. That is, it was determined that the contribution of delayed fluorescence associated with the exciplex formed in these films to the overall fluorescence was relatively small.

Evaluation Example 2: Evaluation of HOMO and LUMO Energy Levels

According to methods described in Table 3, the HOMO and the LUMO energy levels of Compounds D1, A1, A2, and A3 were evaluated, and the results are shown in Table 4. In addition, a difference between the HOMO and the LUMO energy levels was calculated and shown in Table 5.

TABLE 3

| | |
|---|---|
| HOMO energy level evaluation | Cyclic voltammetry (CV) (electrolyte: 0.1M $Bu_4NPF_6$/ solvent: $CH_2Cl_2$/electrode: 3-electrode system (operation electrode: Pt disc (1 mm diameter), standard electrode: Pt wire, auxiliary electrode: Pt wire)) was used to obtain a potential (V)-current (A) graph for each compound, to thereby calculate HOMO energy levels for each compound based on an oxidation onset on the graph. |
| LUMO energy level evaluation | Each compound was diluted with $CHCl_3$ at a concentration of $1 \times 10^{-5}$ molar (M), and a Shimadzu UV-350 spectrometer was used to measure a UV absorption spectrum for each compound at room temperature, to thereby calculate the LUMO energy levels for each compound based on optical band gap (Eg) at edges of the absorption spectrum and the HOMO energy levels for each compound. |

TABLE 4

| Compound No. | HOMO energy level (eV) (measured) | LUMO energy level (eV) (measured) |
|---|---|---|
| D1 | −5.489 | −2.025 |
| A1 | −5.677 | −2.108 |
| A2 | −5.753 | −2.236 |
| A3 | −5.747 | −2.221 |

TABLE 5

| Item | Calculated value (eV) |
|---|---|
| \|HOMO (A1)-HOMO (D1)\| | 0.188 |
| \|HOMO (A2)-HOMO (D1)\| | 0.264 |
| \|HOMO (A3)-HOMO (D1)\| | 0.258 |
| \|LUMO (A1)-LUMO (D1)\| | 0.083 |
| \|LUMO (A2)-LUMO (D1)\| | 0.211 |
| \|LUMO (A3)-LUMO (D1)\| | 0.196 |

Referring to Tables 4 and 5, it was determined that Compounds D1, A1, A2, and A3 had appropriate electric characteristics for the formation of the exciplex that can emit delay fluorescence.

Evaluation Example 3: Evaluation of PL Stability

Immediately after the formation of Films D11:A2, TCTA: BmPyPb, CBP:B3PYMPM, and TCTA:3TPYMB, a He—Cd laser (manufactured by KIMMON-KOHA, excitation wavelength=325 nm) was used to evaluate a PL spectrum for each of the formed films at room temperature under an argon (Ar) atmosphere from which ambient air was blocked. Then, intensity $I_1$ (arbitrary units, a.u.) of light at a maximum emission wavelength in the PL spectrum was measured for each of the formed films, and the results are summarized in Table 6.

Subsequently, under an Ar atmosphere from which ambient air was blocked, each of Films D11:A2, TCTA:BmPyPb, CBP:B3PYMPM, and TCTA:3TPYMB was exposed to light for 3 hours, the light being emitted from a pumping laser, the He—Cd laser (manufactured by KIMMON-KOHA, excitation wavelength=325 nm), used in the evaluation of the intensity $I_1$. Then, the He—Cd laser (manufactured by KIMMON-KOHA, excitation wavelength=325 nm) was used to evaluate PL spectra for the films, which underwent the exposure, at room temperature. Then, intensity $I_2$ (a.u.) of light at a maximum emission wavelength in the PL spectrum was measured for each of the formed films, and the results are summarized in Table 6.

The PL spectra (denoted as As prepared) for Films D11: A2, TCTA:BmPyPb, CBP:B3PYMPM, and TCTA:3TPYMB measured immediately after the formation of each of the films and the PL spectra (denoted as 3-hr exposed) for the same films measured after 3 hour-irradiation to light emitted from the laser are separately shown in FIGS. 4A to 4D.

Based on the intensities $I_1$ and $I_2$ measured as described above, the equation $(I_2/I_1)\times100(\%)$ was calculated to represent PL stability of each of the formed films. The results are shown in Table 6.

TABLE 6

| Name of films | $I_1$ (a.u.) | $I_2$ (a.u.) | $(I_2/I_1) \times 100$ (%) (PL stability) |
|---|---|---|---|
| Film D11:A2 | 0.045 | 0.039 | 87 |
| Film TCTA:BmPyPb | 0.067 | 0.039 | 58 |
| Film CBP:B3PYMPM | 0.078 | 0.044 | 56 |
| Film TCTA:3TPYMB | 0.028 | 0.008 | 29 |

Referring to Table 6, it was determined that Film D11:A2 had better PL stability than Films TCTA:BmPyPb, CBP: B3PYMPM, and TCTA:3TPYMB.

Example 1: Manufacture of Organic Light-Emitting Device (OLED)

An anode was prepared by cutting a glass substrate, on which an ITO electrode was formed, to a size of 50 mm×50 mm×0.5 mm (mm=millimeters), ultrasonically cleaning the glass substrate by using acetone iso-propyl alcohol and pure water for 15 minutes each, and then, irradiating UV light for 30 minutes thereto and exposing the glass substrate to ozone to clean the glass substrate.

Compounds HT3 and HP-1 (HP-1 at a concentration of 3 percent by weight, wt %) were co-deposited on the anode to form a hole injection layer having a thickness of 100 Angstroms, A, Compound HT3 was deposited on the hole injection layer to form a hole transport layer having a thickness of 1,700 Å, and Compound D1 was deposited on the hole transport layer to form an electron blocking layer having a thickness of 100 Å.

Compounds D1, A1, and PD79 were co-deposited on the electron blocking layer to form an emission layer having a thickness of 400 Å.

Compound A4 was deposited on the emission layer to form a hole blocking layer having a thickness of 100 Å, Compound ET17 and LiQ were co-deposited at a weight ratio of 5:5 on the hole blocking layer to form an electron transport layer having a thickness of 360 Å, LiQ was deposited on the electron transport layer to form an electron injection layer having a thickness of 5 Å, and A1 was deposited on the electron injection layer to a thickness of 120 Å, thereby completing the manufacture of an organic light-emitting device (OLED). Donor compounds, acceptor compounds, and phosphorescent dopants used in the formation of emission layers of OLEDs 1 to 3, 10, A, and B manufactured herein and volume ratios of these materials are shown in Table 7.

TABLE 7

| OLED No. | Donor compound | Acceptor compound | Phospho-rescent dopant | Volume ratio |
|---|---|---|---|---|
| 1 | Compound D1 | Compound A1 | PD79 | 27:63:10 |
| 2 | Compound D1 | Compound A2 | PD79 | 27:63:10 |
| 3 | Compound D1 | Compound A3 | PD79 | 27:63:10 |
| 10 | Compound D11 | Compound A2 | PD79 | 27:63:10 |
| A | TCTA | BmPyPb | PD79 | 27:63:10 |
| B | CBP | B3PYMPM | PD79 | 27:63:10 |

Evaluation Example 4

The driving voltage, efficiency, current efficiency, color purity (CIEx, CIEy), roll off ratios, and lifespan ($T_{95}$) characteristics of the OLEDs 1, 2, 3, 10, A, and B prepared herein were measured by using a Keithley 2400 current-voltage meter and a Minolta Cs-1000A luminance meter, and the results are shown in Table 8. In Table 8, the lifespan $T_{95}$ (at 500 nit) results are data obtained by measuring the time at which the luminance of an OLED was 95% of the initial luminance (100%). The roll-off ratios were calculated according to Equation 20:

Roll off={1−(efficiency(at 9,000 nit)/maximum emission efficiency)}×100% Equation 20

TABLE 8

| OLED No. | Donor compound | Acceptor compound | Phosphorescent dopant | Driving voltage (V) | Efficiency (cd/A) | CIE_x | CIE_y | Lifespan ($T_{95}$) (hr) |
|---|---|---|---|---|---|---|---|---|
| 1 | Compound D1 | Compound A1 | PD79 | 3.54 | 37.23 | 0.176 | 0.298 | 12.4 |
| 2 | Compound D1 | Compound A2 | PD79 | 3.62 | 40.32 | 0.172 | 0.272 | 32.4 |
| 3 | Compound D1 | Compound A3 | PD79 | 3.72 | 40.99 | 0.171 | 0.291 | 13.7 |
| 10 | Compound D11 | Compound A2 | PD79 | 3.61 | 40.00 | 0.168 | 0.246 | 46.3 |
| A | TCTA | BmPyPB | PD79 | 4.48 | 24.53 | 0.171 | 0.290 | 0.5 |
| B | CBP | B3PYMPM | PD79 | 5.95 | 19.66 | 0.172 | 0.293 | 1 |

D1

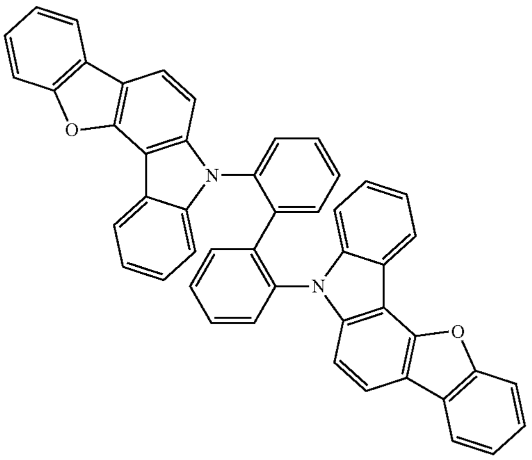 [SMILES: c1ccc(-n2c3ccccc3c3c4oc5ccccc5c4ccc32)c(-c2ccccc2-n2c3ccccc3c3c4oc5ccccc5c4ccc32)c1]

A1

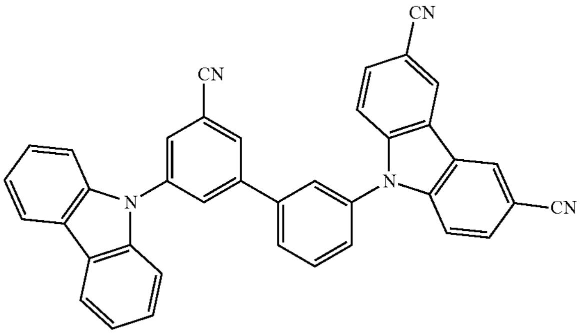 [SMILES: N#Cc1cc(-c2cccc(-n3c4ccc(C#N)cc4c4cc(C#N)ccc43)c2)cc(-n2c3ccccc3c3ccccc32)c1]

TABLE 8-continued
A2
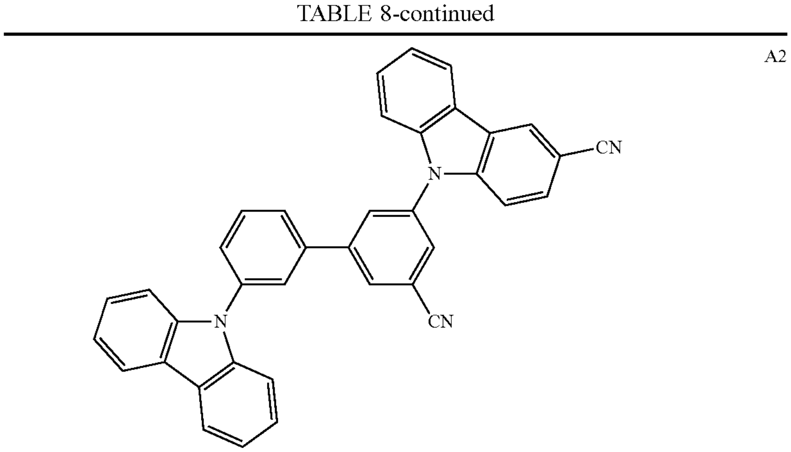
A3
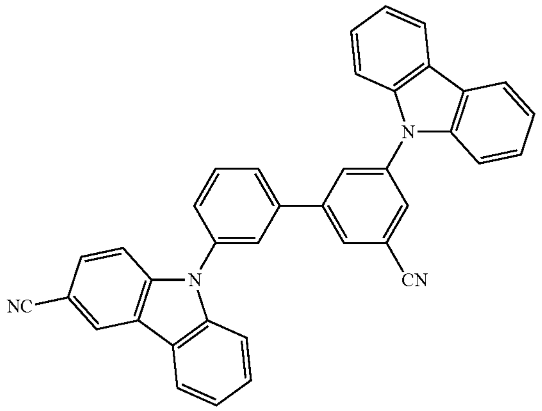 [SMILES: N#Cc1cc(-c2cccc(-n3c4ccccc4c4cc(C#N)ccc43)c2)cc(-n2c3ccccc3c3ccccc32)c1]
D11
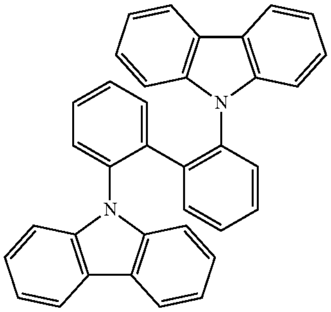 [SMILES: c1ccc(-n2c3ccccc3c3ccccc32)c(-c2ccccc2-n2c3ccccc3c3ccccc32)c1]
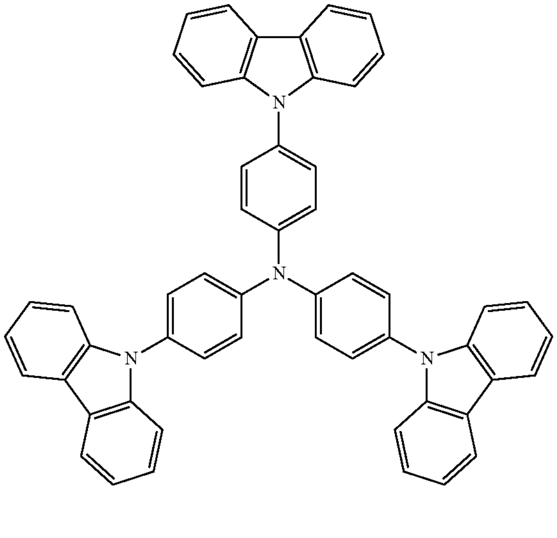 [SMILES: c1ccc2c(c1)c1ccccc1n2-c1ccc(N(c2ccc(-n3c4ccccc4c4ccccc43)cc2)c2ccc(-n3c4ccccc4c4ccccc43)cc2)cc1]

TABLE 8-continued

TCTA

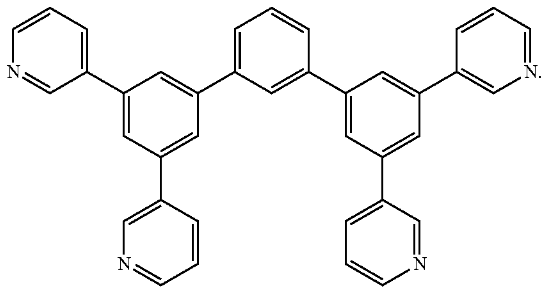 [SMILES: c1cncc(-c2cc(-c3cccnc3)cc(-c3cccc(-c4cc(-c5cccnc5)cc(-c5cccnc5)c4)c3)c2)c1]

BmPyPb

Referring to Table 8, it was determined that OLEDs 1, 2, 3, and 10 had low driving voltage, high efficiency, and long lifespan, compared to those of OLEDs A and B.

Example 2: Preparation of Top Emission-Type OLED

A silver (Ag) reflector was formed, and an anode was prepared on the Ag reflector by cutting a glass substrate, on which an ITO electrode was formed, to a size of 50 mm×50 mm×0.5 mm, ultrasonically cleaning the glass substrate by using acetone iso-propyl alcohol and pure water for 15 minutes each, and then irradiating UV light for 30 minutes thereto and exposing the glass substrate to ozone to clean the glass substrate.

Compounds HT3 and HP-1 (HP-1 at a concentration of 3 wt %) were co-deposited on the anode to form a hole injection layer having a thickness of 100 Å, Compound HT3 was deposited on the hole injection layer to form a hole transport layer having a thickness of 1,700 Å, and Compound D1 was deposited on the hole transport layer to form an electron blocking layer having a thickness of 100 Å.

Compound D1, Compound A2, and a phosphorescent dopant (PD79) were co-deposited on the electron blocking layer to form an emission layer having a thickness of 400 Å.

Compound ET17 and LiQ were co-deposited at a weight ratio of 5:5 on the emission layer to form an electron transport layer having a thickness of 360 Å, LiQ was deposited on the electron transport layer to form an electron injection layer having a thickness of 5 Å, a Mg—Ag electrode (Ag in an amount of 10 wt %) was deposited on the electron injection layer to a thickness of 120 Å, and Compound HT13 was formed on the Mg—Ag electrode to form a capping layer having a thickness of 600 Å, thereby completing the manufacture of a top-emission OLED, which is referred to as OLED 4.

Evaluation Example 5

Figure 5A:
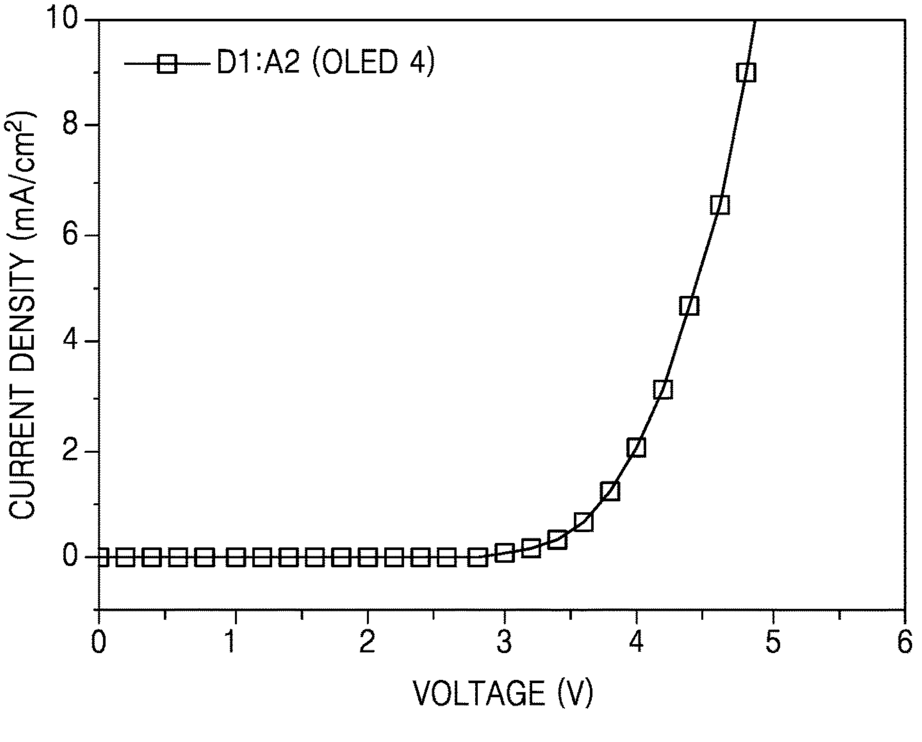
FIG. 5A is a graph of current density (milliamperes per square centimeter, $mA/cm^2$) versus voltage (volts, V), which is a voltage-current density graph of an organic light-emitting device (OLED), wherein the OLED is prepared according to Example 2 and referred to as OLED 4.
Figure 5B:
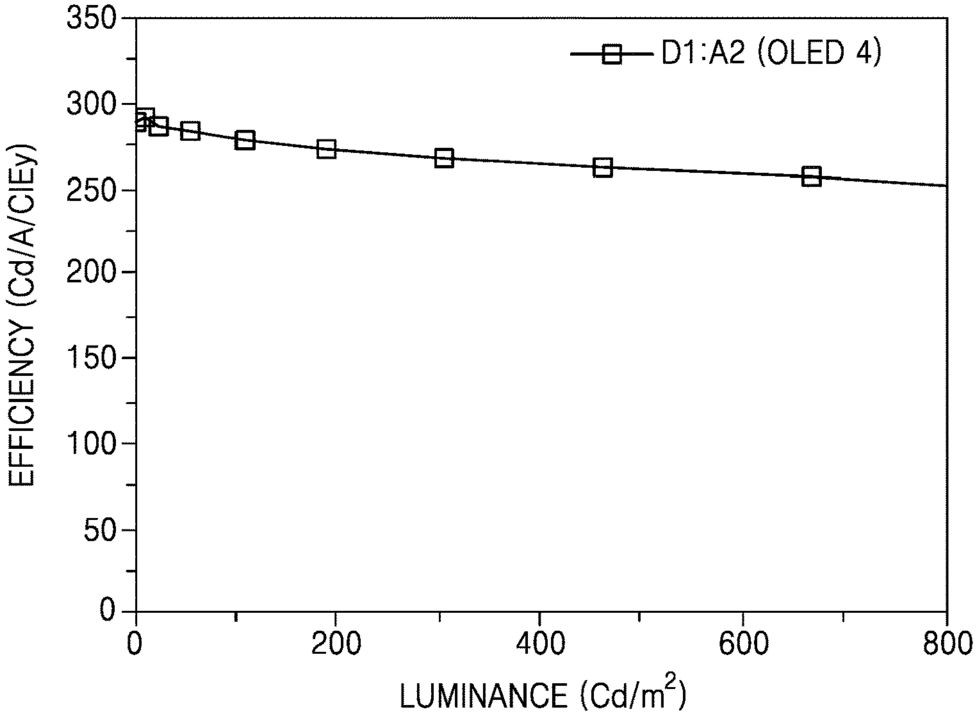
FIG. 5B is a graph of efficiency (candelas per ampere, CIE y coordinate, Cd/A/CIEy) versus luminance (candelas per square meter, $Cd/m^2$), which is a luminance-efficiency graph of an organic light-emitting device (OLED), wherein the OLED is prepared according to Example 2 and referred to as OLED 4.
Figure 5C:
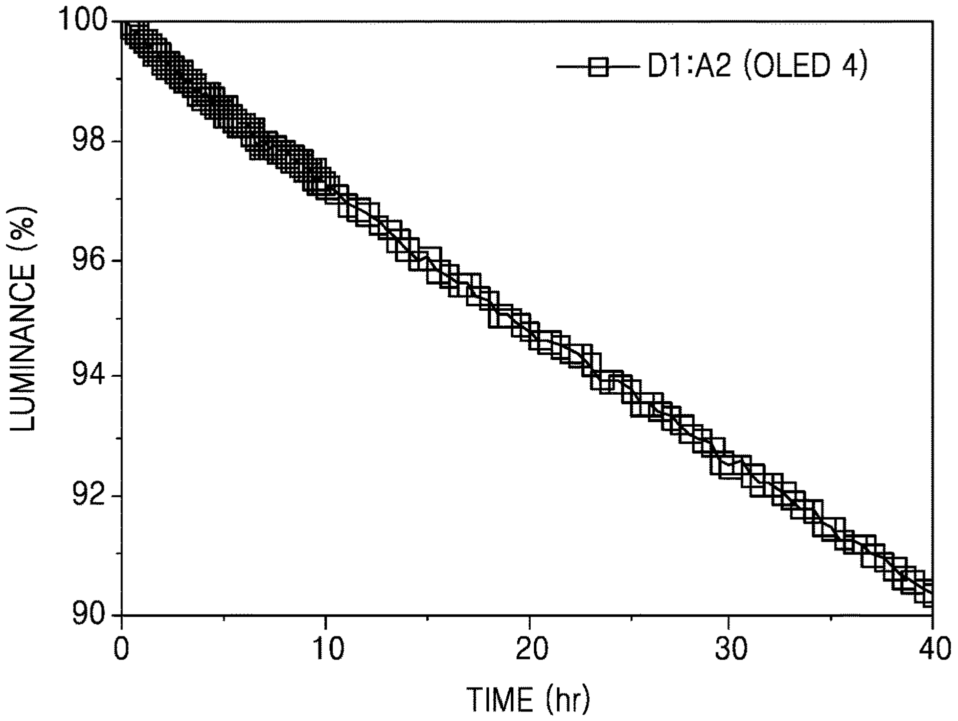
FIG. 5C is a graph of luminance (percent, %) versus time (hours, h), which is a time-luminance graph of an organic light-emitting device (OLED), wherein the OLED is prepared according to Example 2 and referred to as OLED 4.

The driving voltage, efficiency, color purity (CIEy), and lifespan characteristics of OLED 4 were measured by using a Keithley 2400 current-voltage meter and a Minolta Cs-1000A luminance meter, and the results are shown in FIGS. 5A to 5C and Table 9. In Table 9, the lifespan $T_{95}$ (at 500 nit) results are data obtained by measuring the time at which the luminance of an OLED was 95% of the initial luminance (100%).

TABLE 9

| OLED No. | Donor compound | Acceptor compound | Phosphorescent dopant | Driving voltage (V) | Efficiency (cd/A) | CIE_y | Lifespan ($L_{95}$) (hr) |
|---|---|---|---|---|---|---|---|
| 4 | Compound D1 | Compound A2 | Compound PD79 | 4.44 | 14.00 | 0.056 | 3.6 |

Referring to Table 9, it was determined that OLED 4 has low driving voltage, high efficiency, and long lifespan.

As described above, an exciplex in a mixture has a relatively high triplet state $T_1$ energy level and a relatively low singlet state $S_1$ energy level at the same time, and an OLED including a thin film including the mixture and a phosphorescent dopant has low driving voltage, high efficiency, high luminance, and long lifespan characteristics at the same time.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the present disclosure as defined by the following claims.

What is claimed is:

1. A thin film comprising:

i) a combination of a donor compound and an acceptor compound, and ii) a phosphorescent dopant, wherein the donor compound and the acceptor compound form an exciplex, wherein a maximum emission wavelength $\lambda_{max}$ (Ex) in a photoluminescence spectrum of the exciplex is about 390 nanometers or greater and about 490 nanometers or less, wherein a decay time $T_{decay}$(Ex) of delayed fluorescence in a time-resolved photoluminescence spectrum of the exciplex is about 100 nanoseconds or greater, wherein a ratio of a delayed fluorescence portion to the overall light-emitting portions in the time-resolved photoluminescence spectrum of the exciplex is about 10% or greater, wherein a photoluminescence stability of the exciplex is 60% or greater, wherein the photoluminescence spectrum and the time-resolved photoluminescence spectrum of the exciplex are each a spectrum measured at room temperature with respect to a film that is formed by co-deposition of the donor compound and the acceptor compound on a substrate, and wherein photoluminescence stability of the exciplex is evaluated according to Equation 10:

$$\text{PL stability (\%)}=(I_2/I_1)\times 100 \qquad \text{Equation 10}$$

wherein, in Equation 10, $I_1$ is an intensity of a light at the maximum emission wavelength $\lambda_{max}$ (Ex) in a photoluminescence spectrum of Film 1, which is obtained immediately after formation of a film by co-deposition of the donor compound and the acceptor compound on a substrate, measured at room temperature in an inert atmosphere in which external air is excluded, and $I_2$ is an intensity of a light at the maximum emission wavelength $\lambda_{max}$ (Ex) in a photoluminescence spectrum of Film 2, which is obtained after exposure of the Film 1 to pumping laser light used in the evaluation of $I_1$ in an inert atmosphere in which external air is excluded for 3 hours, measured at room temperature in an inert atmosphere in which external air is excluded.

2. The thin film of claim 1, wherein the maximum emission wavelength $\lambda_{max}$ (Ex) is about 390 nanometers or greater and about 440 nanometers or less.

3. The thin film of claim 1, wherein an absolute value of the highest occupied molecular orbital energy level of the donor compound |HOMO (D)| is about 5.78 electron volts or less, an absolute value of the lowest unoccupied molecular orbital energy level of the acceptor compound |LUMO (A)| is about 1.76 electron volts or greater, the highest occupied molecular orbital energy level of the donor compound is calculated by using cyclic voltammetry, and the lowest unoccupied molecular orbital energy level of the acceptor compound is calculated by using an ultraviolet absorption spectrum measured at room temperature.

4. The thin film of claim 1, wherein an absolute value of the highest occupied molecular orbital energy level difference between the acceptor compound and the donor compound |HOMO (A)−HOMO (D)| is about 0.037 electron volts or greater and about 1.1 electron volts or less, an absolute value of the lowest unoccupied molecular orbital energy level difference between the acceptor compound and the donor compound |LUMO (A)−LUMO (D)| is about 0.001 electron volts or greater and about 1.1 electron volts or less, the highest occupied molecular orbital energy level of the donor compound is calculated by using cyclic voltammetry, and the lowest unoccupied molecular orbital energy level of the acceptor compound is calculated by using an ultraviolet absorption spectrum measured at room temperature.

5. The thin film of claim 1, wherein the acceptor compound comprises at least one electron-withdrawing group, and wherein the electron-withdrawing group is selected from:

—F, —$CFH_2$, —$CF_2H$, —$CF_3$, —CN, and —$NO_2$;

a $C_1$-$C_{60}$ alkyl group substituted with at least one selected from —F, —$CFH_2$, —$CF_2H$, —$CF_3$, —CN, and —$NO_2$;

a $C_1$-$C_{60}$ heteroaryl group and a divalent non-aromatic condensed polycyclic heterocyclic group, each comprising *═N—*' as a ring-forming moiety; and a $C_1$-$C_{60}$ heteroaryl group and a divalent non-aromatic condensed polycyclic heterocyclic group, each comprising *═N—*' as a ring-forming moiety and each substituted with at least one selected from deuterium, —F, —$CFH_2$, —$CF_2H$, —$CF_3$, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, and a substituted or unsubstituted monovalent non-aromatic condensed heteropolycyclic group.

6. The thin film of claim 5, wherein the donor compound is selected from a compound represented by Formula D-1, and the acceptor compound is selected from compounds represented by Formulae A-1 and A-2:

Formula D-1

$$Ar_1—(L_1)_{a1}—Ar_2$$

Formula A-1

$$Ar_{11}—(L_{11})_{a11}—Ar_{12}$$

Formula A-2

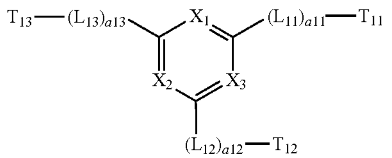

Formula 11

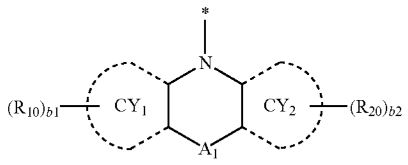

Formula 12

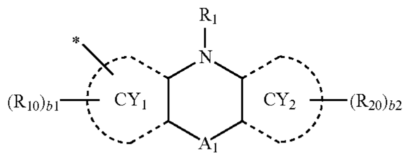

-continued

Formula 13

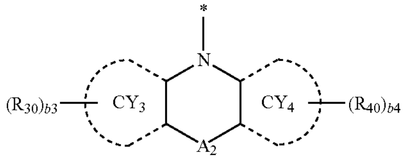

Formula 14

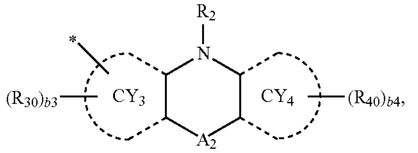

wherein, in Formulae D-1, A-1, A-2, and 11 to 14, $Ar_1$ is selected from groups represented by Formulae 11 and 12, $Ar_2$ is selected from:

groups represented by Formulae 11 and 12, a phenyl group, a naphthyl group, and a benzimidazolyl group; and a phenyl group, a naphthyl group, and a benzimidazolyl group, each substituted with at least one selected from deuterium, a hydroxyl group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a carbazolyl group, a dibenzofuranyl group, and a dibenzothiophenyl group, $Ar_{11}$ and $Ar_{12}$ are each independently selected from groups represented by Formulae 13 and 14, $X_1$ is N or $C(T_{14})$, $X_2$ is N or $C(T_{15})$, and $X_3$ is N or $C(T_{16})$, wherein at least one selected from $X_1$ to $X_3$ is N, $L_1$ is selected from:

a single bond, a phenylene group, a naphthylene group, a fluorenylene group, a carbazolylene group, a dibenzofuranylene group, and a dibenzothiophenylene group; and a phenylene group, a naphthylene group, a fluorenylene group, a carbazolylene group, a dibenzofuranylene group, and a dibenzothiophenylene group, each substituted with at least one selected from deuterium, a $C_1$-$C_{10}$ alkyl group, a $C_1$-$C_{10}$ alkoxy group, a phenyl group, a naphthyl group, a fluorenyl group, a carbazolyl group, a dibenzofuranyl group, a dibenzothiophenyl group, and —$Si(Q_{11})(Q_{12})(Q_{13})$, $L_{11}$ to $L_{13}$ are each independently selected from:

a single bond, a phenylene group, a pyridinylene group, a pyrimidinylene group, a pyrazinylene group, a pyridazinylene group, a triazinylene group, a naphthylene group, a fluorenylene group, a carbazolylene group, a dibenzofuranylene group, and a dibenzothiophenylene group; and a phenylene group, a pyridinylene group, a pyrimidinylene group, a pyrazinylene group, a pyridazinylene group, a triazinylene group, a naphthylene group, a fluorenylene group, a carbazolylene group, a dibenzofuranylene group, and a dibenzothiophenylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, —$CF_3$, —$CF_2H$, —$CFH_2$, a phenyl group, a phenyl group substituted with a cyano group, a naphthyl group, a pyridinyl group, a pyrimidinyl group, a pyrazinyl group, a pyridazinyl group, a triazinyl group, a fluorenyl group, a carbazolyl group, a dibenzofuranyl group, a dibenzothiophenyl group, and —$Si(Q_{11})(Q_{12})(Q_{13})$, a1 and a11 to a13 are each independently an integer selected from 0 to 5, and when a1 is 2 or greater, groups $L_1$ are identical to or different from each other, when a11 is 2 or greater, groups $L_{11}$ are identical to or different from each other, when a12 is 2 or greater, groups $L_{12}$ are identical to or different from each other, and when a13 is 2 or greater, groups $L_{13}$ are identical to or different from each other, $CY_1$ to $CY_4$ are each independently selected from a benzene group, a naphthalene group, a fluorene group, a carbazole group, a benzocarbazole group, an indolocarbazole group, a dibenzofuran group, and a dibenzothiophene group, $A_1$ is selected from:

a single bond, a $C_1$-$C_4$ alkylene group, and a $C_2$-$C_4$ alkenylene group; and a $C_1$-$C_4$ alkylene group and a $C_2$-$C_4$ alkenylene group, each substituted with at least one selected from deuterium, a $C_1$-$C_{10}$ alkyl group, a $C_1$-$C_{10}$ alkoxy group, a phenyl group, a naphthyl group, a fluorenyl group, a carbazolyl group, a dibenzofuranyl group, a dibenzothiophenyl group, and —$Si(Q_{21})(Q_{22})(Q_{23})$, $A_2$ is selected from:

a single bond, a $C_1$-$C_4$ alkylene group, and a $C_2$-$C_4$ alkenylene group; and a $C_1$-$C_4$ alkylene group and a $C_2$-$C_4$ alkenylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, a phenyl group, a naphthyl group, a pyridinyl group, a pyrimidinyl group, a pyrazinyl group, a pyridazinyl group, a triazinyl group, a fluorenyl group, a carbazolyl group, a dibenzofuranyl group, a dibenzothiophenyl group, and —$Si(Q_{21})(Q_{22})(Q_{23})$, $R_1$, $R_{10}$, and $R_{20}$ are each independently selected from:

hydrogen, deuterium, a hydroxyl group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, a hydroxyl group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a fluorenyl group, a carbazolyl group, a dibenzofuranyl group, and a dibenzothiophenyl group;

a phenyl group, a naphthyl group, a fluorenyl group, a carbazolyl group, a dibenzofuranyl group, and a dibenzothiophenyl group;

a phenyl group, a naphthyl group, a fluorenyl group, a carbazolyl group, a dibenzofuranyl group, and a dibenzothiophenyl group, each substituted with at least one selected from deuterium, a hydroxyl group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a carbazolyl group, a dibenzofuranyl group, and a dibenzothiophenyl group; and —$Si(Q_1)(Q_2)(Q_3)$, $T_{11}$ to $T_{16}$, $R_2$, $R_{30}$, and $R_{40}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, and —$Si(Q_1)(Q_2)(Q_3)$, b1 to b4 are each independently an integer selected from 0 to 10, at least one of substituent(s) of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_2$-$C_{60}$ heteroarylalkyl group, the substituted monovalent non-aromatic condensed polycyclic group, and the substituted monovalent non-aromatic condensed heteropolycyclic group is selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, and —$Si(Q_{31})(Q_{32})(Q_{33})$, and $Q_1$ to $Q_3$, $Q_{11}$ to $Q_{13}$, $Q_{21}$ to $Q_{23}$, and $Q_{31}$ to $Q_{33}$ are each independently selected from hydrogen, deuterium, a $C_1$-$C_{60}$ alkyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

7. The thin film of claim 6, wherein $Ar_1$ is selected from groups represented by Formulae 11-1 to 11-8 and 12-1 to 12-8, $Ar_2$ is selected from groups represented by Formulae 11-1 to 11-8 and 12-1 to 12-8, a phenyl group, a naphthyl group, and a benzimidazolyl group substituted with a phenyl group, and $Ar_{11}$ and $Ar_{12}$ are each independently selected from groups represented by Formulae 13-1 to 13-8 and 14-1 to 14-8:

Formula 11-1

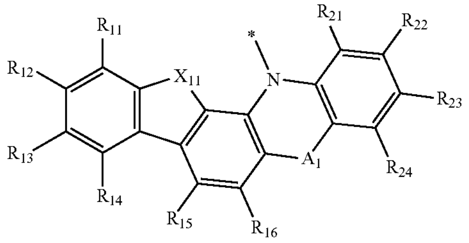

Formula 11-2

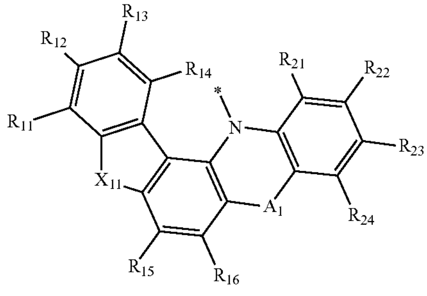

Formula 11-3

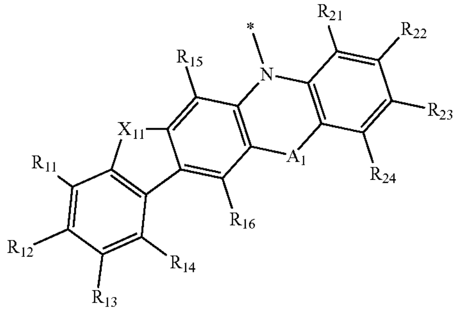

-continued
Formula 11-4
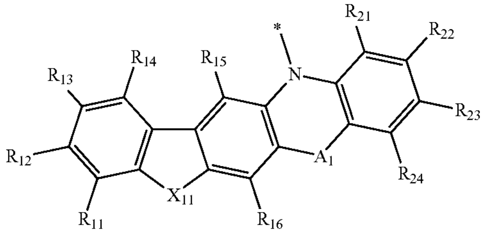
Formula 11-5
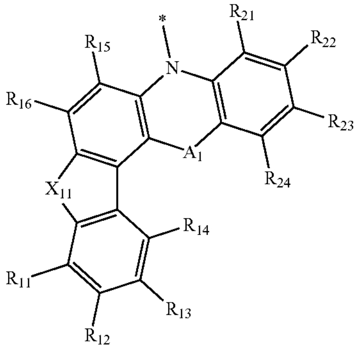
Formula 11-6
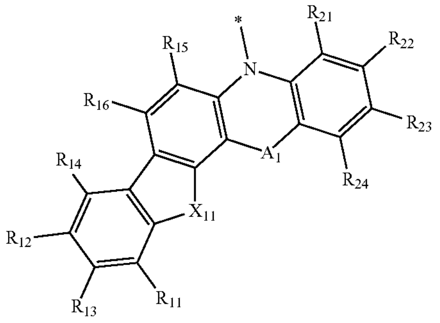
Formula 11-7
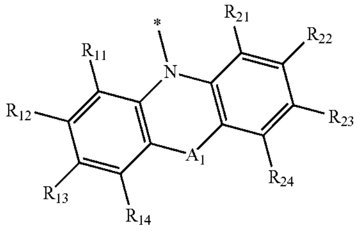
Formula 11-8
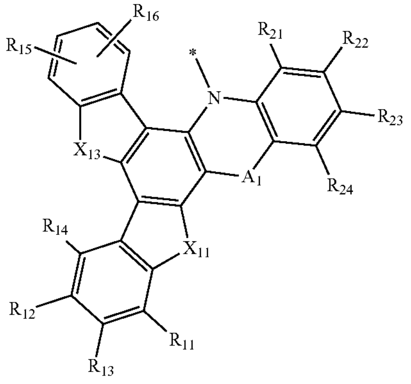
-continued
Formula 12-1
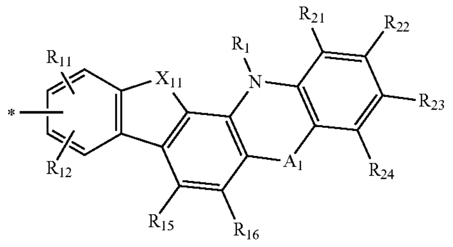
Formula 12-2
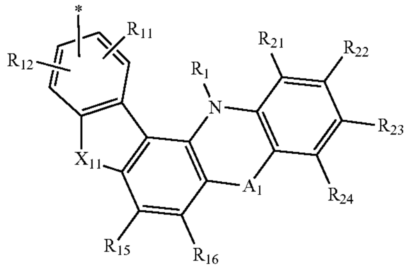
Formula 12-3
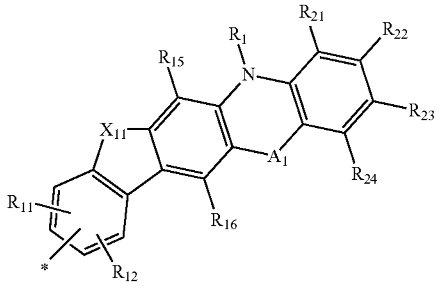
Formula 12-4
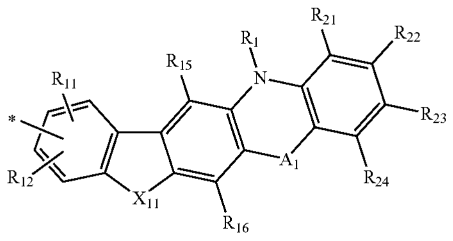
Formula 12-5
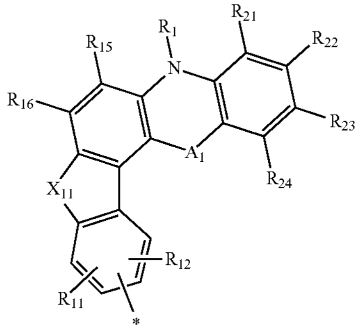

-continued
Formula 12-6
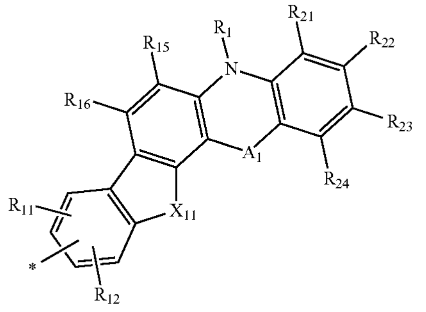
Formula 12-7
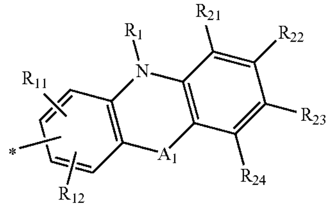
Formula 12-8
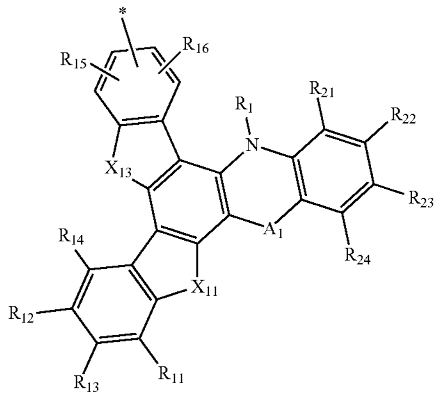
Formula 13-1
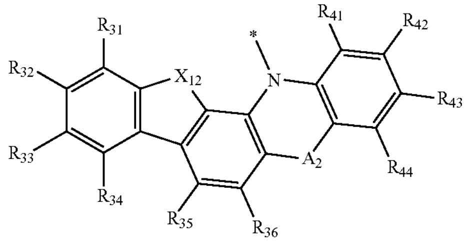
Formula 13-2
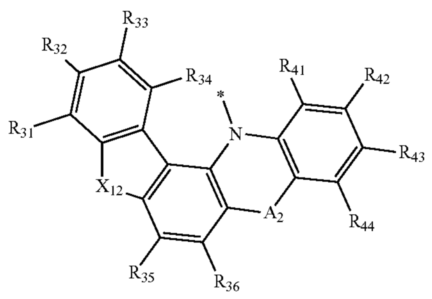
-continued
Formula 13-3
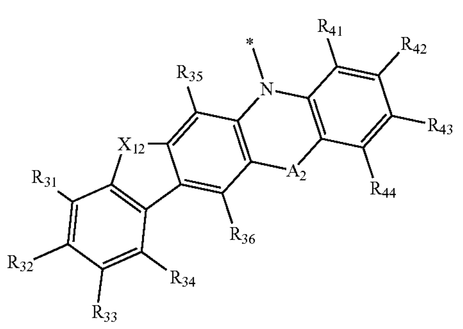
Formula 13-4
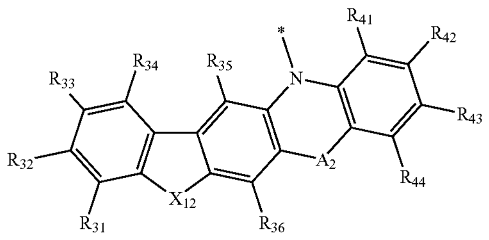
Formula 13-5
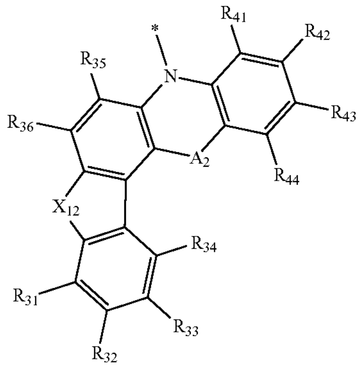
Formula 13-6
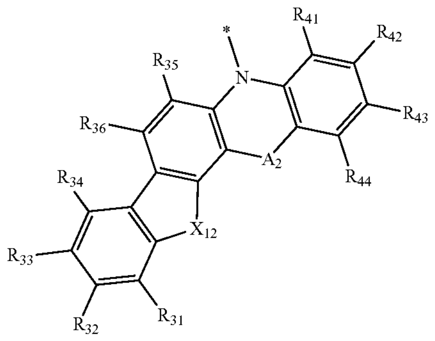
Formula 13-7
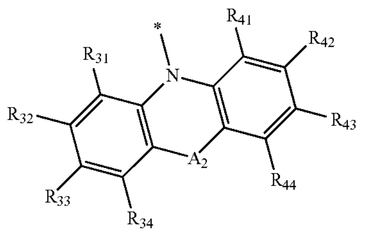

-continued

Formula 13-8

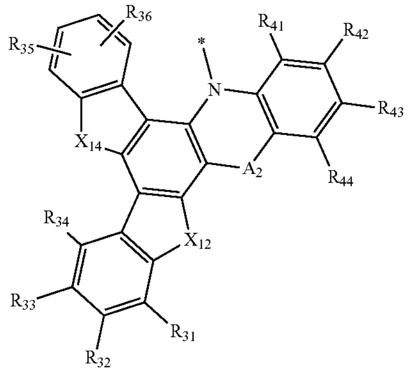

Formula 14-1

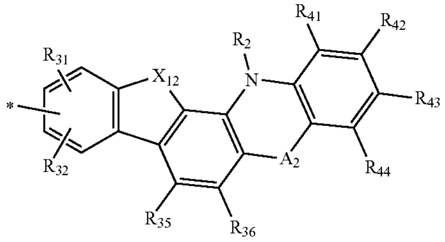

Formula 14-2

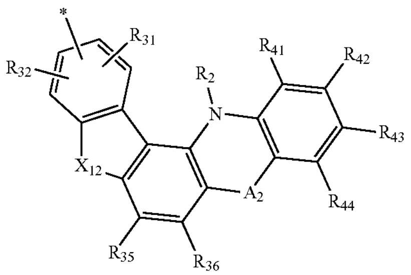

Formula 14-3

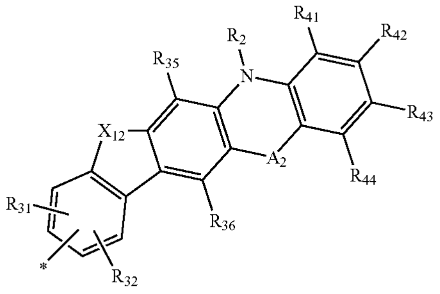

Formula 14-4

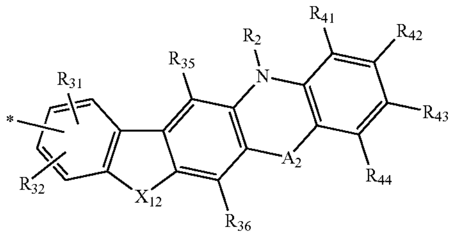

-continued

Formula 14-5

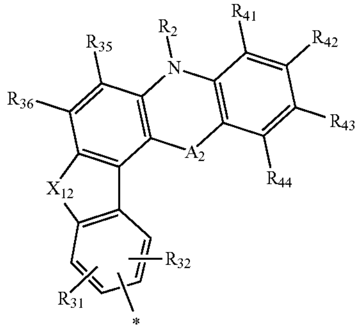

Formula 14-6

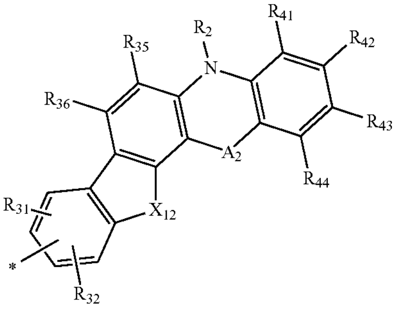

Formula 14-7

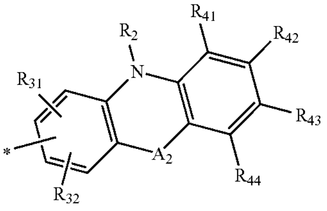

Formula 14-8

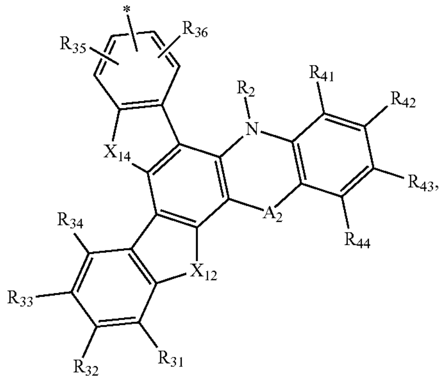

wherein, in Formulae 11-1 to 11-8, 12-1 to 12-8, 13-1 to 13-8, and 14-1 to 14-8, $X_{11}$ and $X_{13}$ are each independently $C(R_{17})(R_{18})$, $N(R_{19})$, O, or S, $X_{12}$ and $X_{14}$ are each independently $C(R_{37})(R_{38})$, $N(R_{39})$, O, or S, $R_1$, $R_2$, $A_1$, and $A_2$ are the same as in claim 6, $R_{11}$ to $R_{19}$ are each independently the same as $R_{10}$ in claim 6, $R_{21}$ to $R_{24}$ are each independently the same as $R_{20}$ in claim 6, $R_{31}$ to $R_{39}$ are each independently the same as $R_{30}$ in claim 6, $R_{41}$ to $R_{44}$ are each independently the same as $R_{40}$ in claim 6, and

* indicates a binding site to a neighboring atom.

8. The thin film of claim 6, wherein $Ar_1$ is selected from groups represented by Formulae 15-1 to 15-17 and 16-1 to 16-8, $Ar_2$ is selected from groups represented by Formulae 15-1 to 15-17 and 16-1 to 16-8, a phenyl group, a naphthyl group, and a benzimidazolyl group substituted with a phenyl group, and $Ar_{11}$ and $Ar_{12}$ are each independently selected from groups represented by Formulae 17-1 to 17-3:

Formula 15-1

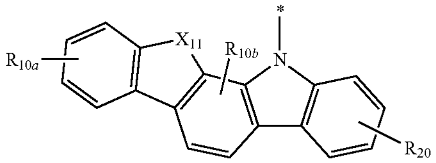

Formula 15-2

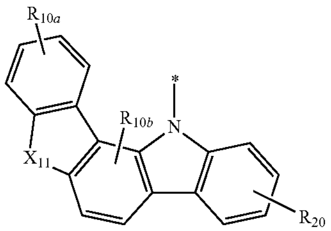

Formula 15-3

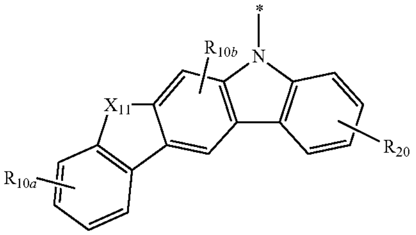

Formula 15-4

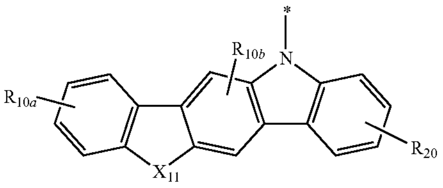

Formula 15-5

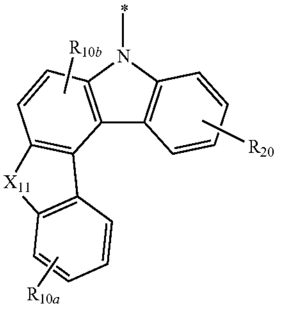

-continued

Formula 15-6

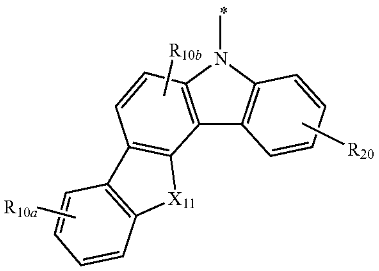

Formula 15-7

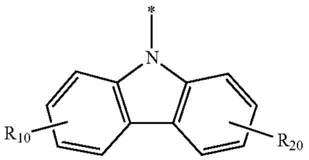

Formula 15-8

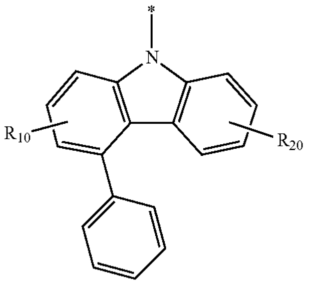

Formula 15-9

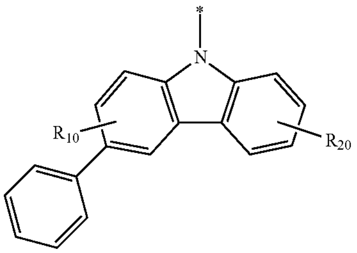

Formula 15-10

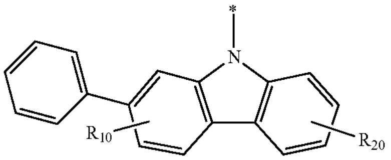

Formula 15-11

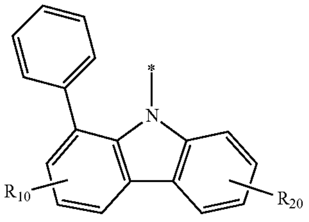

Formula 15-12

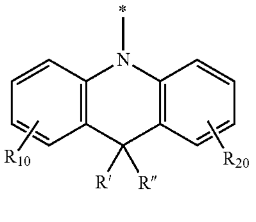

-continued
Formula 15-13
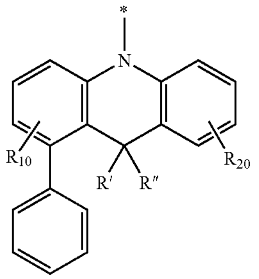
Formula 15-14
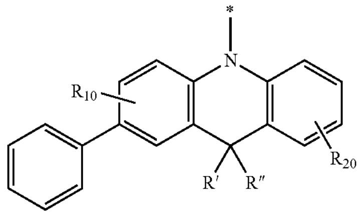
Formula 15-15
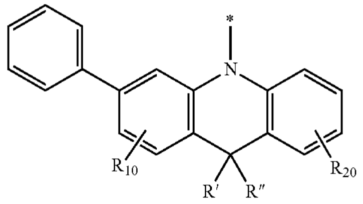
Formula 15-16
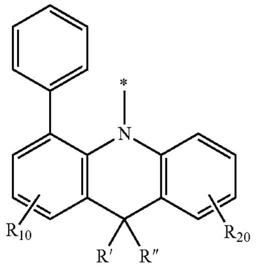
Formula 15-17
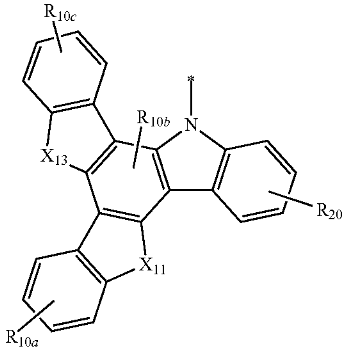
Formula 16-1
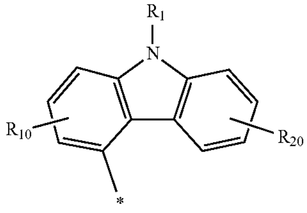
-continued
Formula 16-2
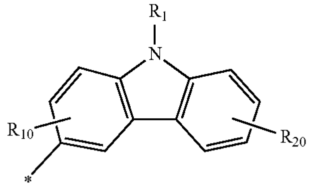
Formula 16-3
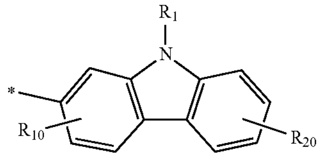
Formula 16-4
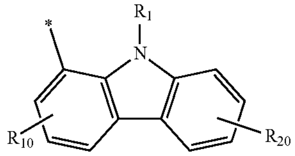
Formula 16-5
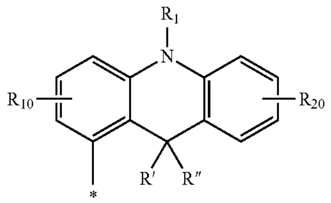
Formula 16-6
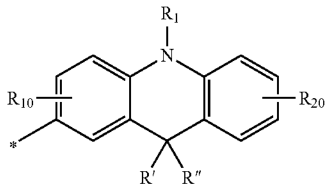
Formula 16-7
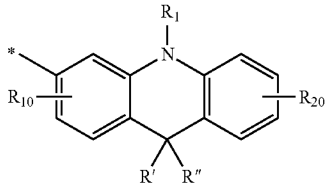
Formula 16-8
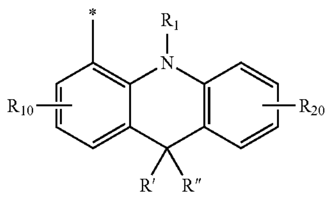
Formula 17-1
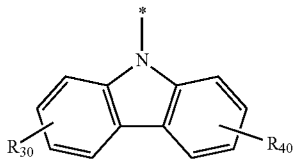

-continued

Formula 17-2

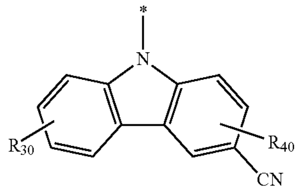

Formula 17-3

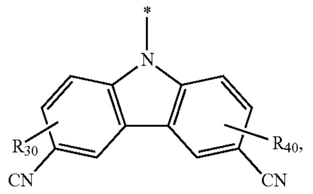

wherein, in Formulae 15-1 to 15-17, 16-1 to 16-8, and 17-1 to 17-3, $X_{11}$ and $X_{13}$ are each independently $C(R_{17})(R_{18})$, $N(R_{19})$, O, or S, R' and R" are each independently selected from hydrogen, deuterium, a $C_1$-$C_{10}$ alkyl group, a $C_1$-$C_{10}$ alkoxy group, a phenyl group, a naphthyl group, a fluorenyl group, a carbazolyl group, a dibenzofuranyl group, and a dibenzothiophenyl group, $R_1$, $R_{10}$, $R_{10a}$ to $R_{10c}$, and $R_{20}$ are each independently selected from hydrogen, deuterium, a $C_1$-$C_{10}$ alkyl group, a $C_1$-$C_{10}$ alkoxy group, a phenyl group, a naphthyl group, a fluorenyl group, a carbazolyl group, a dibenzofuranyl group, a dibenzothiophenyl group, and —$Si(Q_1)(Q_2)(Q_3)$, $R_{30}$ and $R_{40}$ are each independently selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, —$CF_3$, —$CF_2H$, and —$CFH_2$;

a phenyl group, a pyridinyl group, a pyrimidinyl group, a pyrazinyl group, a pyridazinyl group, a triazinyl group, a naphthyl group, a fluorenyl group, a carbazolyl group, a dibenzofuranyl group, and a dibenzothiophenyl group;

a phenyl group, a pyridinyl group, a pyrimidinyl group, a pyrazinyl group, a pyridazinyl group, a triazinyl group, a naphthyl group, a fluorenyl group, a carbazolyl group, a dibenzofuranyl group, and a dibenzothiophenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, —$CF_3$, —$CF_2H$ and —$CFH_2$, a phenyl group, a pyridinyl group, a pyrimidinyl group, a pyrazinyl group, a pyridazinyl group, a triazinyl group, a naphthyl group, a fluorenyl group, a carbazolyl group, a dibenzofuranyl group, and a dibenzothiophenyl group; and —$Si(Q_1)(Q_2)(Q_3)$, and $Q_1$ to $Q_3$ are each independently selected from hydrogen, a $C_1$-$C_{10}$ alkyl group, a $C_1$-$C_{10}$ alkoxy group, a phenyl group, and a naphthyl group.

9. The thin film of claim 6, wherein i) the donor compound is represented by Formula D-1, provided that the donor compound is selected from compounds in which $L_1$ in Formula D-1 is a single bond; or ii) the donor compound is selected from compounds represented by Formulae D-1(1) to D-1(52):

Formula D-1(1)

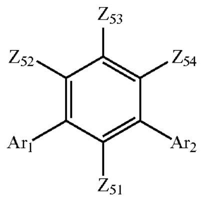

Formula D-1(2)

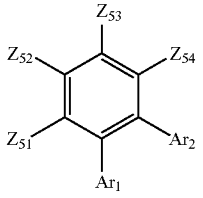

Formula D-1(3)

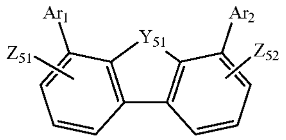

Formula D-1(4)

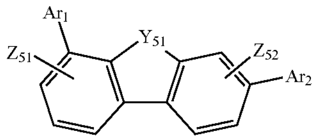

Formula D-1(5)

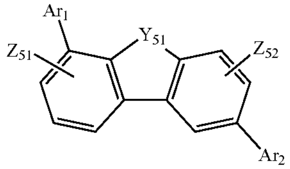

Formula D-1(6)

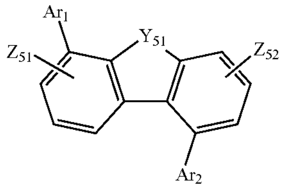

Formula D-1(7)

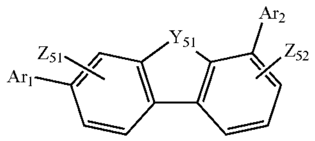

Formula D-1(8)

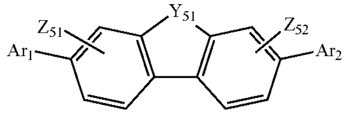

Formula D-1(9)
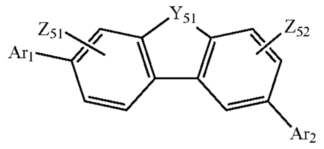
Formula D-1(10)
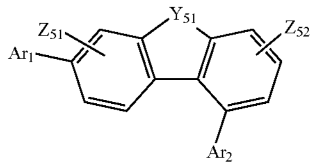
Formula D-1(11)
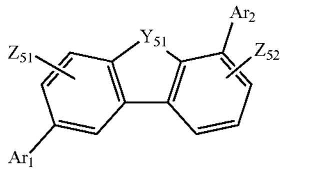
Formula D-1(12)
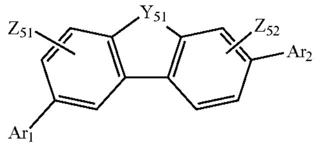
Formula D-1(13)
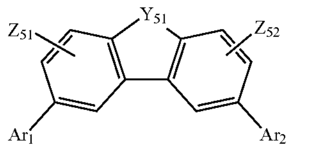
Formula D-1(14)
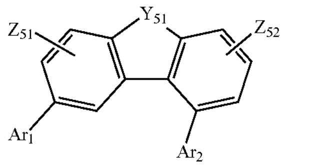
Formula D-1(15)
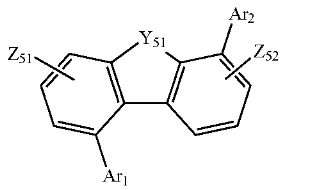
Formula D-1(16)
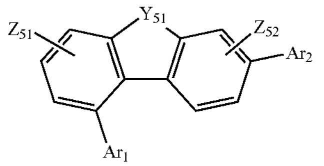
Formula D-1(17)
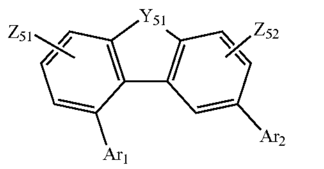
Formula D-1(18)
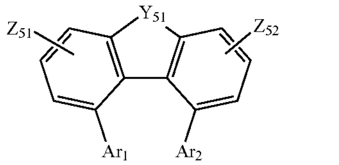
Formula D-1(19)
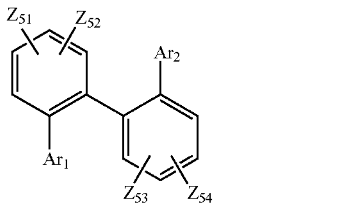
Formula D-1(20)
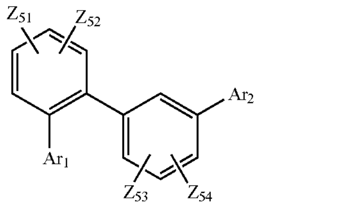
Formula D-1(21)
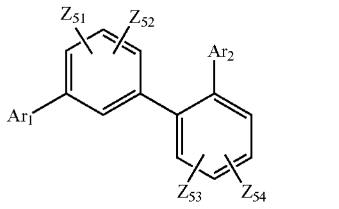
Formula D-1(22)
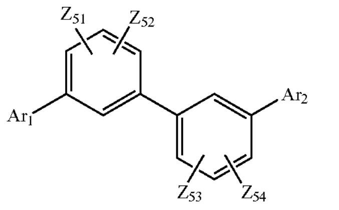
Formula D-1(23)
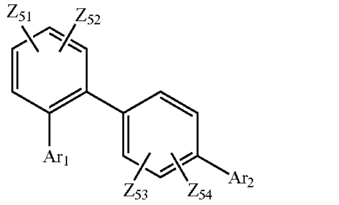
Formula D-1(24)
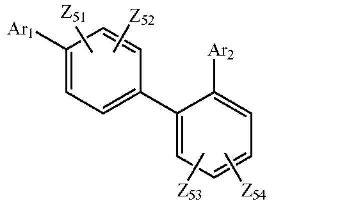

-continued
Formula D-1(25)
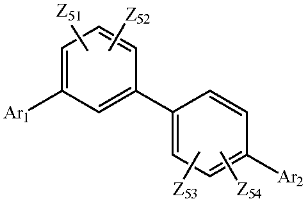
Formula D-1(26)
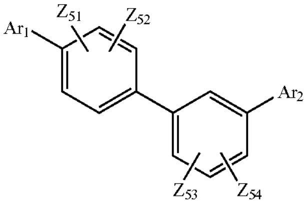
Formula D-1(27)
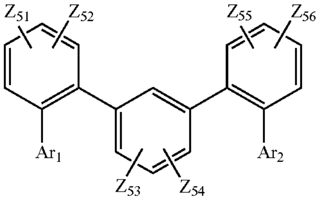
Formula D-1(28)
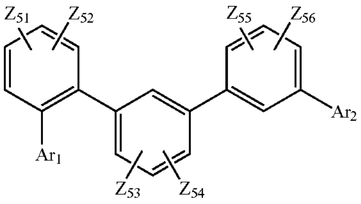
Formula D-1(29)
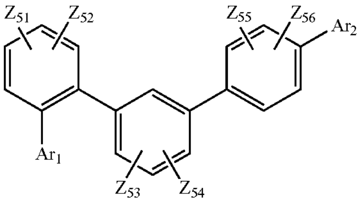
Formula D-1(30)
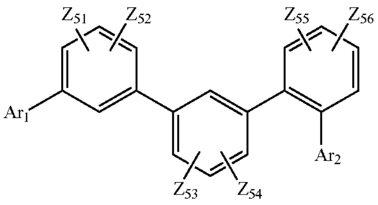
Formula D-1(31)
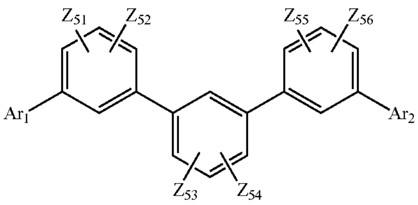
-continued
Formula D-1(32)
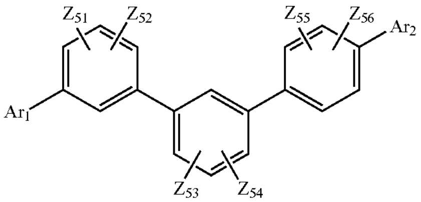
Formula D-1(33)
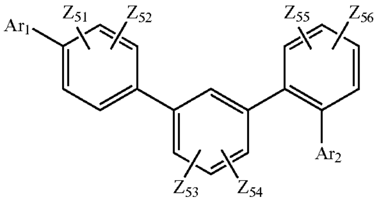
Formula D-1(34)
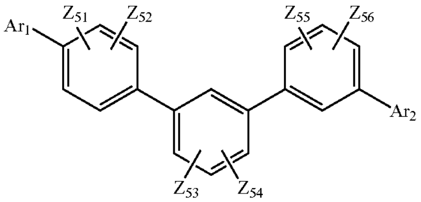
Formula D-1(35)
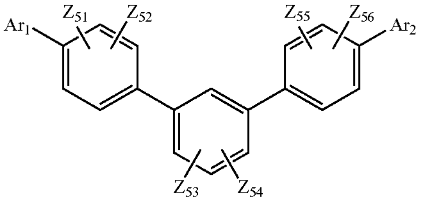
Formula D-1(36)
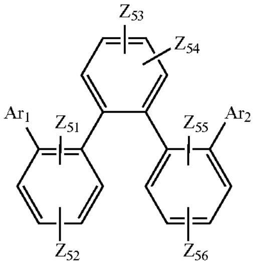
Formula D-1(37)
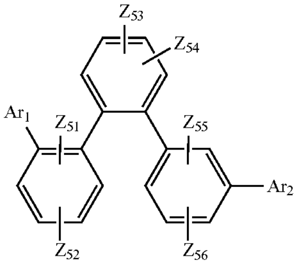

-continued
Formula D-1(38)
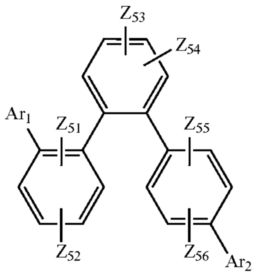
Formula D-1(39)
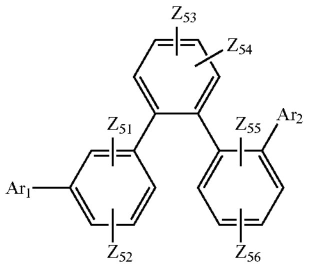
Formula D-1(40)
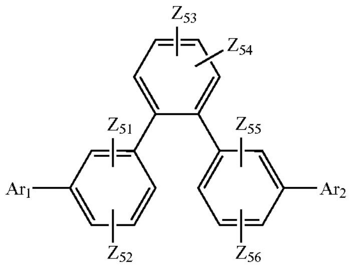
Formula D-1(41)
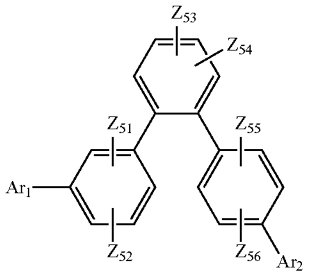
Formula D-1(42)
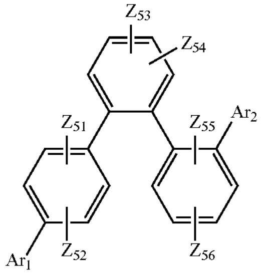
-continued
Formula D-1(43)
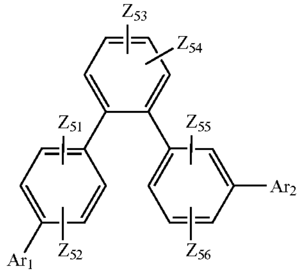
Formula D-1(44)
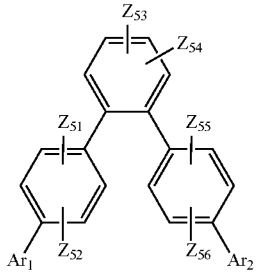
Formula D-1(45)
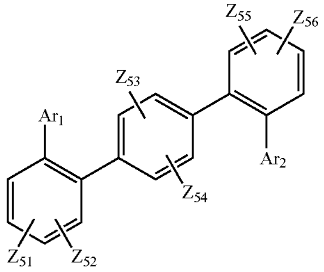
Formula D-1(46)
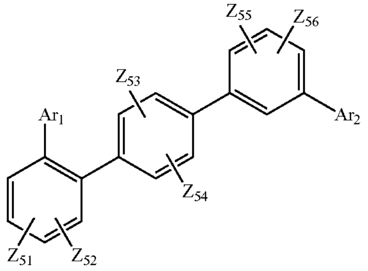
Formula D-1(47)
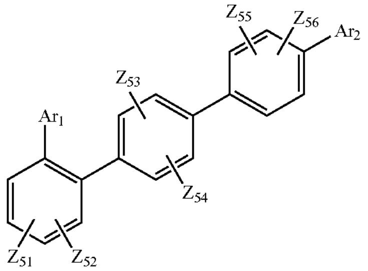

-continued

Formula D-1(48)

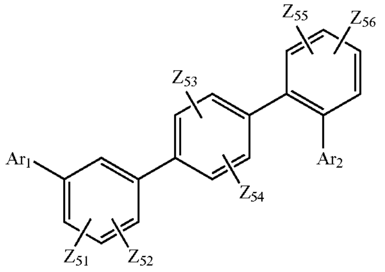

Formula D-1(49)

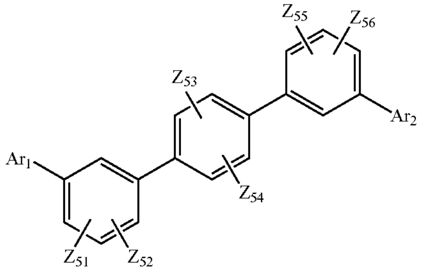

Formula D-1(50)

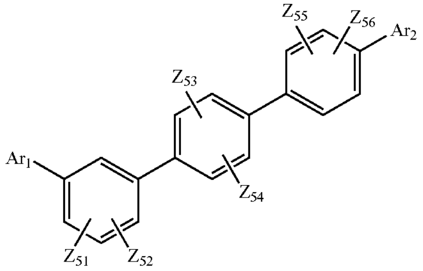

Formula D-1(51)

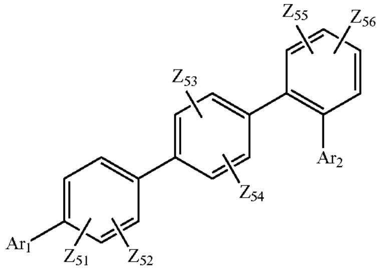

Formula D-1(52)

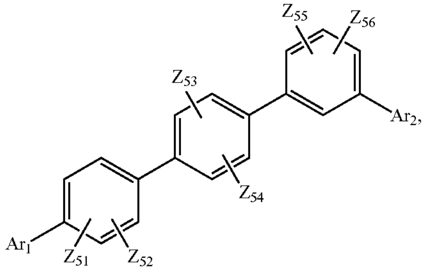

wherein, in Formulae D-1(1) to D-1(52), $Ar_1$ and $Ar_2$ are the same as in claim 6, $Y_{51}$ is $C(Z_{53})(Z_{54})$, $N(Z_{55})$, O, or S, $Z_{51}$ to $Z_{56}$ are each independently selected from hydrogen, deuterium, a $C_1$-$C_{10}$ alkyl group, a $C_1$-$C_{10}$ alkoxy group, a phenyl group, a naphthyl group, a fluorenyl group, a carbazolyl group, a dibenzofuranyl group, a dibenzothiophenyl group, and —$Si(Q_{11})(Q_{12})(Q_{13})$, and $Q_{11}$ to $Q_{13}$ are each independently selected from hydrogen, a $C_1$-$C_{10}$ alkyl group, a $C_1$-$C_{10}$ alkoxy group, a phenyl group, and a naphthyl group.

10. The thin film of claim 6, wherein $L_{11}$ to $L_{13}$ are each independently selected from groups represented by Formulae 3-1 to 3-56, wherein i) at least one $L_{11}$ in the number of a11, ii) at least one $L_{12}$ in the number of a12, and iii) at least one $L_{13}$ in the number of a13 are each independently selected from groups represented by Formulae 3-15 to 3-56:

Formula 3-1

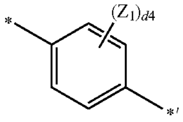

Formula 3-2

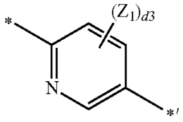

Formula 3-3

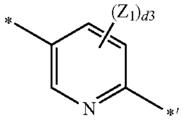

Formula 3-4

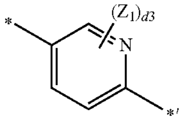

Formula 3-5

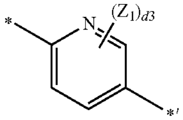

Formula 3-6

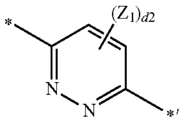

Formula 3-7

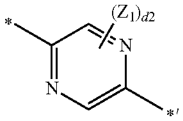

Formula 3-8

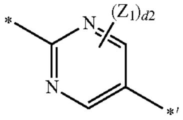

Formula 3-9

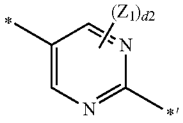

-continued
Formula 3-10
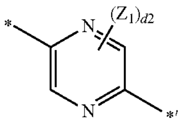
Formula 3-11
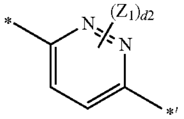
Formula 3-12
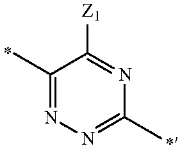
Formula 3-13
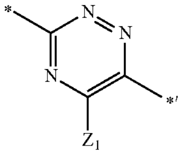
Formula 3-14
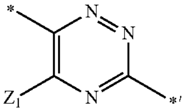
Formula 3-15
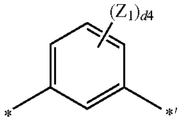
Formula 3-16
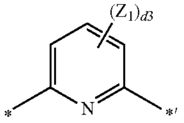
Formula 3-17
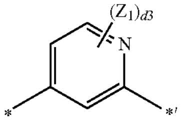
Formula 3-18
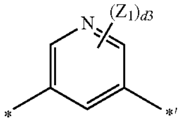
Formula 3-19
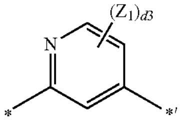
Formula 3-20
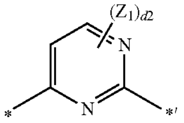
-continued
Formula 3-21
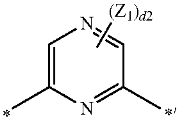
Formula 3-22
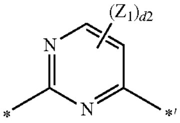
Formula 3-23
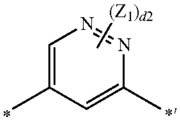
Formula 3-24
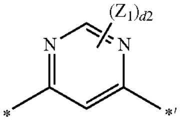
Formula 3-25
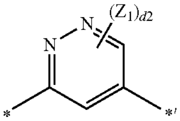
Formula 3-26
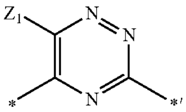
Formula 3-27
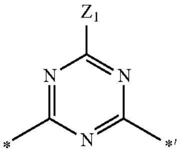
Formula 3-28
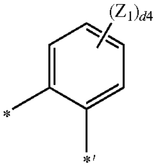
Formula 3-29
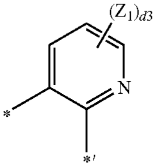
Formula 3-30
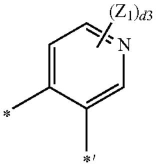

-continued
Formula 3-31
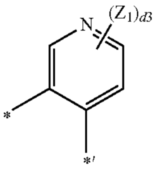
Formula 3-32
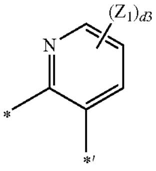
Formula 3-33
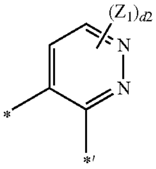
Formula 3-34
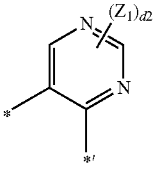
Formula 3-35
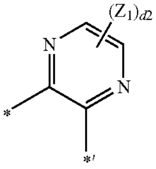
Formula 3-36
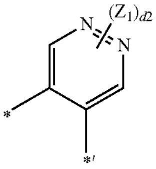
Formula 3-37
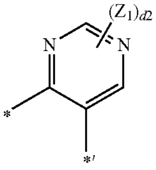
Formula 3-38
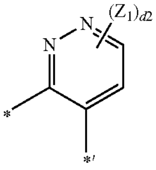
-continued
Formula 3-39
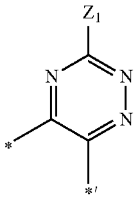
Formula 3-40
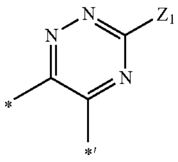
Formula 3-41
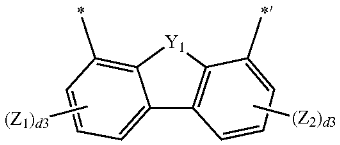
Formula 3-42
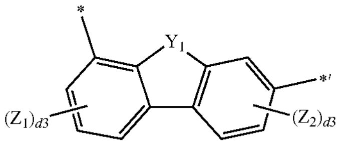
Formula 3-43
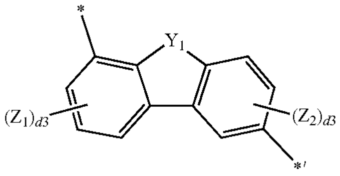
Formula 3-44
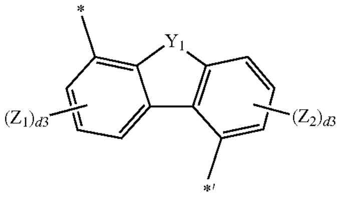
Formula 3-45
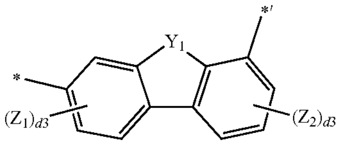
Formula 3-46
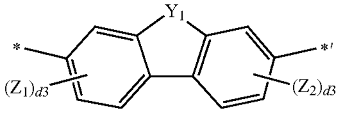
Formula 3-47
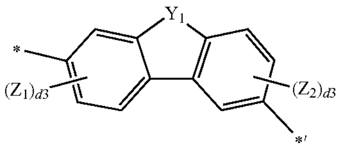

-continued

Formula 3-48

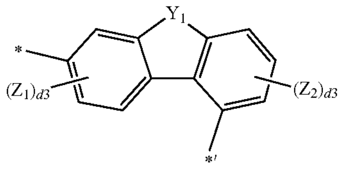

Formula 3-49

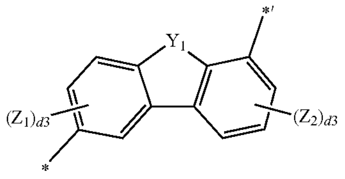

Formula 3-50

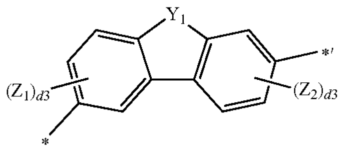

Formula 3-51

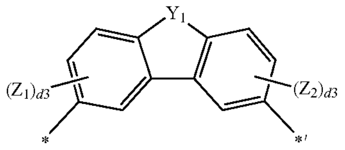

Formula 3-52

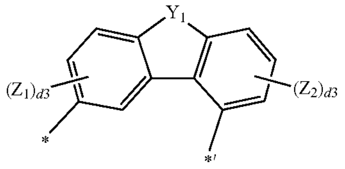

Formula 3-53

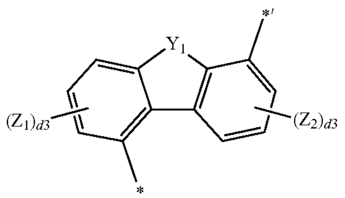

Formula 3-54

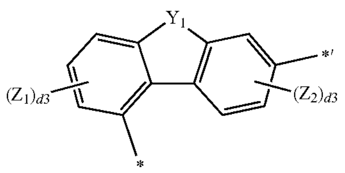

Formula 3-55

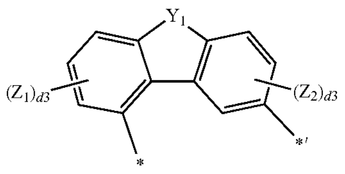

-continued

Formula 3-56

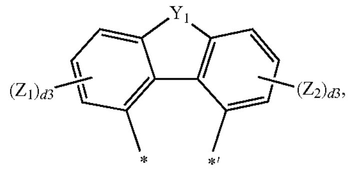

wherein, in Formulae 3-1 to 3-56, $Y_1$ is selected from O, S, $C(Z_3)(Z_4)$, and $N(Z_5)$, $Z_1$ to $Z_5$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, —$CF_3$, —$CF_2H$, —$CFH_2$, a phenyl group, a phenyl group substituted with a cyano group, a naphthyl group, a pyridinyl group, a pyrimidinyl group, a pyrazinyl group, a pyridazinyl group, a triazinyl group, a fluorenyl group, a carbazolyl group, a dibenzofuranyl group, a dibenzothiophenyl group, and —$Si(Q_{11})(Q_{12})(Q_{13})$, $Q_{11}$ to $Q_{13}$ are each independently selected from hydrogen, a $C_1$-$C_{10}$ alkyl group, a $C_1$-$C_{10}$ alkoxy group, a phenyl group, a naphthyl group, a pyridinyl group, a pyrimidinyl group, a pyrazinyl group, a pyridazinyl group, a triazinyl group, a fluorenyl group, a carbazolyl group, a dibenzofuranyl group, and a dibenzothiophenyl group, d4 is an integer selected from 0 to 4, d3 is an integer selected from 0 to 3, d2 is an integer selected from 0 to 2, and

* and *' each indicate a binding site to a neighboring atom.

11. The thin film of claim 6, wherein the groups represented by $*\text{-}(L_{11})_{a11}\text{-}*'$, $*\text{-}(L_{12})_{a12}\text{-}*'$, and $*\text{-}(L_{13})_{a13}\text{-}*'$ are each independently selected from groups represented by Formulae 4-1 to 4-39:

Formula 4-1

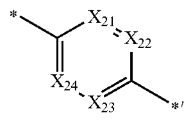

Formula 4-2

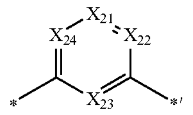

Formula 4-3

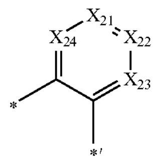

Formula 4-4

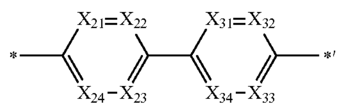

-continued
Formula 4-5
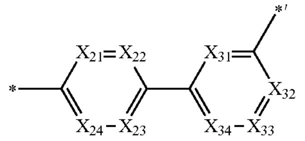
Formula 4-6
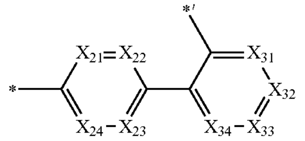
Formula 4-7
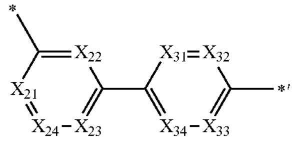
Formula 4-8
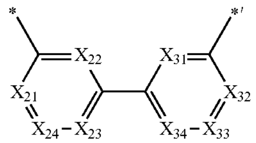
Formula 4-9
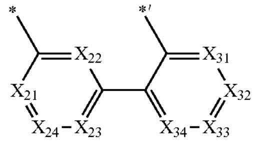
Formula 4-10
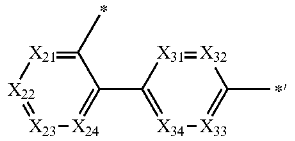
Formula 4-11
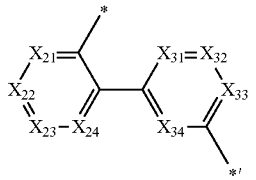
Formula 4-12
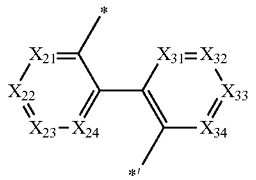
Formula 4-13
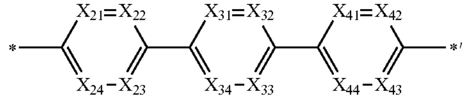
-continued
Formula 4-14
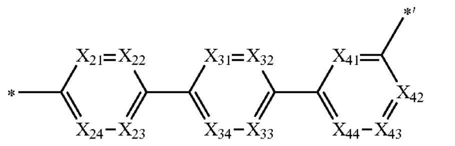
Formula 4-15
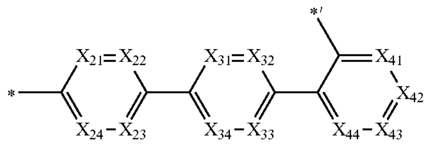
Formula 4-16
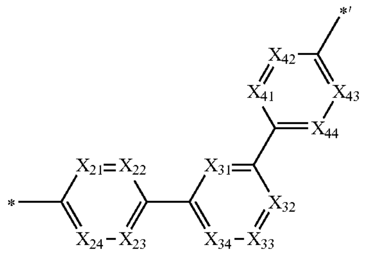
Formula 4-17
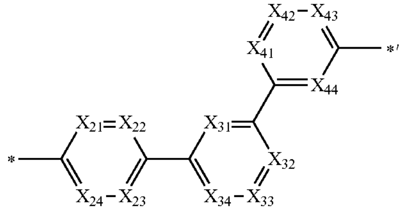
Formula 4-18
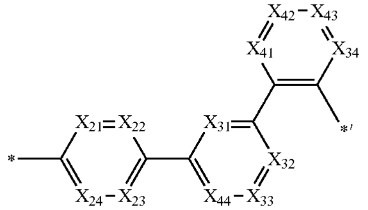
Formula 4-19
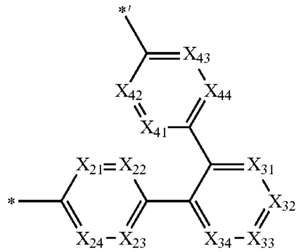
Formula 4-20
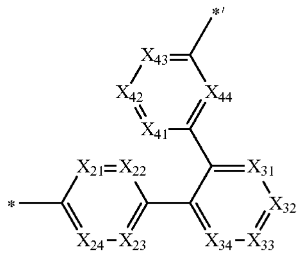

-continued
Formula 4-21
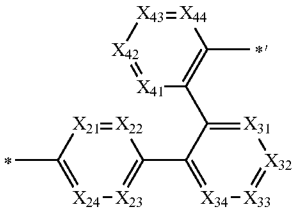
Formula 4-22
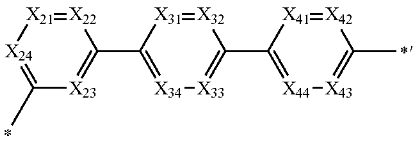
Formula 4-23
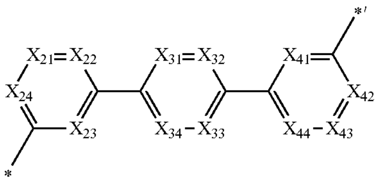
Formula 4-24
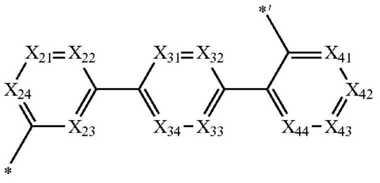
Formula 4-25
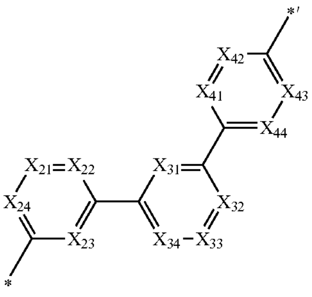
Formula 4-26
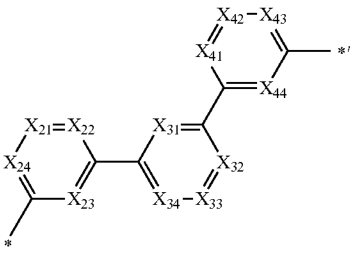
-continued
Formula 4-27
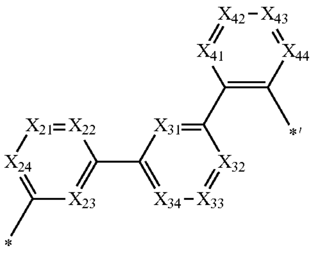
Formula 4-28
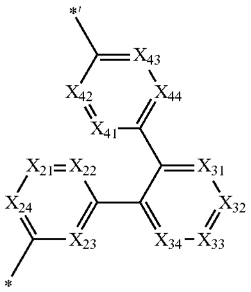
Formula 4-29
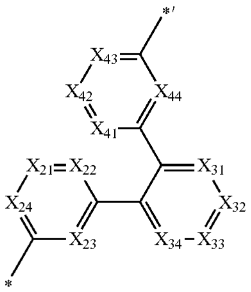
Formula 4-30
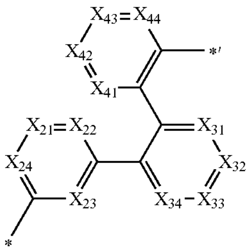
Formula 4-31
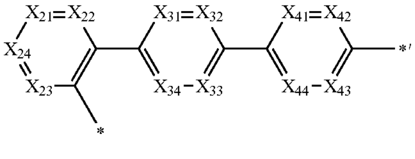
Formula 4-32
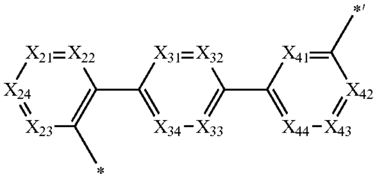

-continued

Formula 4-33

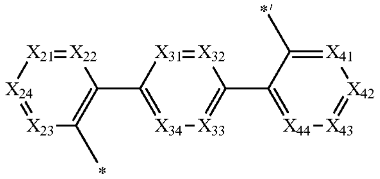

Formula 4-34

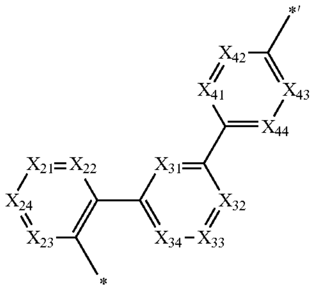

Formula 4-35

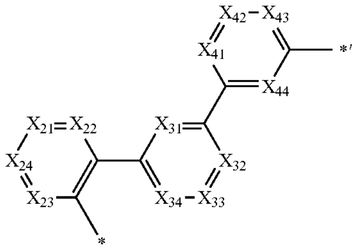

Formula 4-36

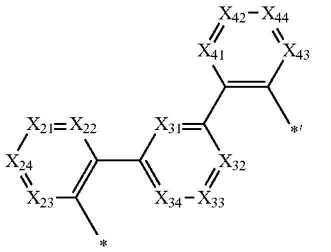

Formula 4-37

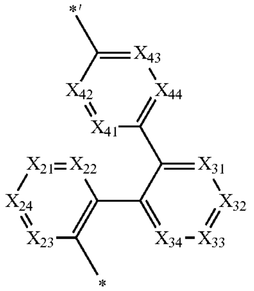

-continued

Formula 4-38

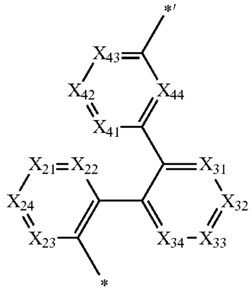

Formula 4-39

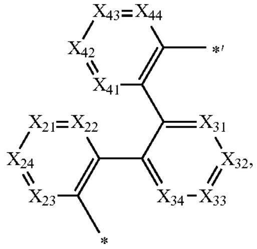

wherein, in Formulae 4-1 to 4-39, $X_{21}$ is N or $C(Z_{21})$, $X_{22}$ is N or $C(Z_{22})$, $X_{23}$ is N or $C(Z_{23})$, $X_{24}$ is N or $C(Z_{24})$, $X_{31}$ is N or $C(Z_{31})$, $X_{32}$ is N or $C(Z_{32})$, $X_{33}$ is N or $C(Z_{33})$, $X_{34}$ is N or $C(Z_{34})$, $X_{41}$ is N or $C(Z_{41})$, $X_{42}$ is N or $C(Z_{42})$, $X_{43}$ is N or $C(Z_{43})$, and $X_{44}$ is N or $C(Z_{44})$, provided that at least one of $X_{21}$ to $X_{24}$ are not N, at least one of $X_{31}$ to $X_{34}$ are not N, and at least one of $X_{41}$ to $X_{44}$ are not N, $Z_{21}$ to $Z_{24}$, $Z_{31}$ to $Z_{34}$, and $Z_{41}$ to $Z_{44}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, —$CF_3$, —$CF_2H$, —$CFH_2$, a phenyl group, a phenyl group substituted with a cyano group, a naphthyl group, a pyridinyl group, a pyrimidinyl group, a pyrazinyl group, a pyridazinyl group, a triazinyl group, a fluorenyl group, a carbazolyl group, a dibenzofuranyl group, a dibenzothiophenyl group, and —$Si(Q_{11})(Q_{12})(Q_{13})$, $Q_{11}$ to $Q_{13}$ are each independently selected from hydrogen, a $C_1$-$C_{10}$ alkyl group, a $C_1$-$C_{10}$ alkoxy group, a phenyl group, a naphthyl group, a pyridinyl group, a pyrimidinyl group, a pyrazinyl group, a pyridazinyl group, a triazinyl group, a fluorenyl group, a carbazolyl group, a dibenzofuranyl group, and a dibenzothiophenyl group, and

* and *' each indicate a binding site to a neighboring atom.

12. The thin film of claim 6, wherein i) the acceptor compound is represented by Formula A-1, provided that the acceptor compound is selected from compounds in which $Ar_{11}$ and $Ar_{12}$ in Formula A-1 are each independently selected from groups represented by Formulae 17-1 to 17-3, and at least one of $Ar_{11}$ and $Ar_{12}$ is selected from groups represented by Formulae 17-2 and 17-3;

ii) the acceptor compound is represented by Formula A-1, provided that the acceptor compound is selected from compounds in which $L_{11}$ in Formula A-1 is selected from groups represented by Formulae 3-15 and 3-28, and at least one $L_{11}$ in the number of all is selected from groups represented by Formulae 6-1 to 6-4; or iii) the acceptor compound is represented by Formula A-2, provided that the acceptor compound is selected from compounds in which $X_1$ to $X_3$ in Formula A-2 are all N:

Formula 17-1

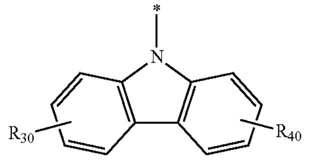

Formula 17-2

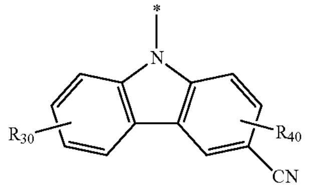

Formula 17-3

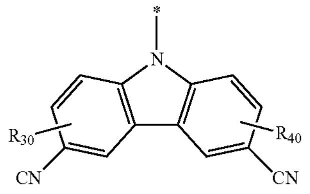

Formula 3-15

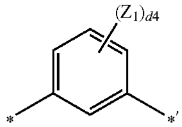

Formula 3-28

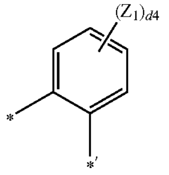

Formula 6-1

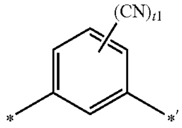

Formula 6-2

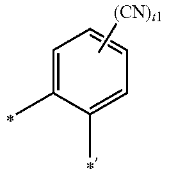

-continued

Formula 6-3

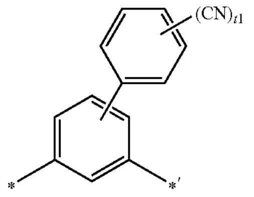

Formula 6-4

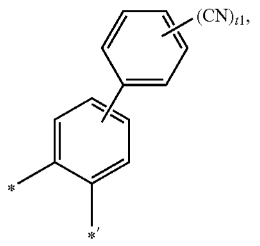

wherein, in Formulae 17-1 to 17-3, 3-15, 3-28, and 6-1 to 6-4, $R_{30}$ and $R_{40}$ are each independently selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, —$CF_3$, —$CF_2H$, and —$CFH_2$;

a phenyl group, a pyridinyl group, a pyrimidinyl group, a pyrazinyl group, a pyridazinyl group, a triazinyl group, a naphthyl group, a fluorenyl group, a carbazolyl group, a dibenzofuranyl group, and a dibenzothiophenyl group;

a phenyl group, a pyridinyl group, a pyrimidinyl group, a pyrazinyl group, a pyridazinyl group, a triazinyl group, a naphthyl group, a fluorenyl group, a carbazolyl group, a dibenzofuranyl group, and a dibenzothiophenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, —$CF_3$, —$CF_2H$, —$CFH_2$, a phenyl group, a pyridinyl group, a pyrimidinyl group, a pyrazinyl group, a pyridazinyl group, a triazinyl group, a naphthyl group, a fluorenyl group, a carbazolyl group, a dibenzofuranyl group, and a dibenzothiophenyl group; and —$Si(Q_1)(Q_2)(Q_3)$, $Z_1$ is selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, —$CF_3$, —$CF_2H$, —$CFH_2$, a phenyl group, a phenyl group substituted with a cyano group, a naphthyl group, a pyridinyl group, a pyrimidinyl group, a pyrazinyl group, a pyridazinyl group, a triazinyl group, a fluorenyl group, a carbazolyl group, a dibenzofuranyl group, a dibenzothiophenyl group, and —$Si(Q_{11})(Q_{12})(Q_{13})$, d4 is an integer selected from 0 to 4, t1 is 1 or 2, $Q_1$ to $Q_3$ and $Q_{11}$ to $Q_{13}$ are each independently selected from hydrogen, a $C_1$-$C_{10}$ alkyl group, a $C_1$-$C_{10}$ alkoxy group, a phenyl group, and a naphthyl group, and

* and *' each indicate a binding site to a neighboring atom.

13. The thin film of claim 1, wherein the donor compound is selected from Compounds D1 to D17, and the acceptor compound is selected from Compounds A1 to A11:

D1

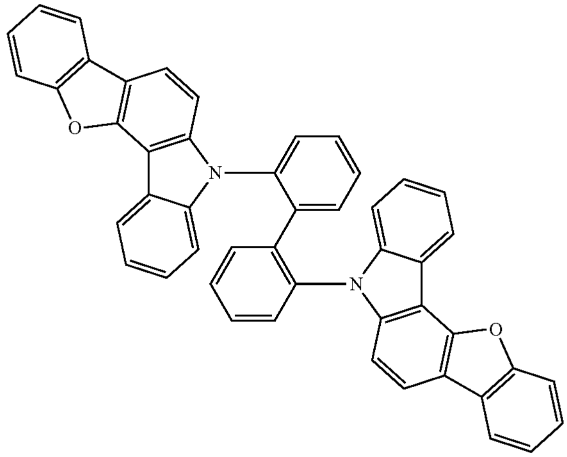

D2

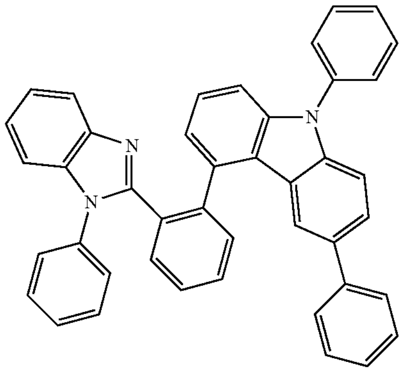

D3

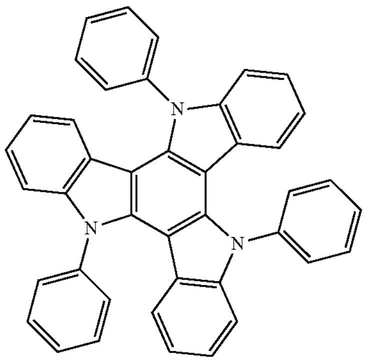

-continued

D4

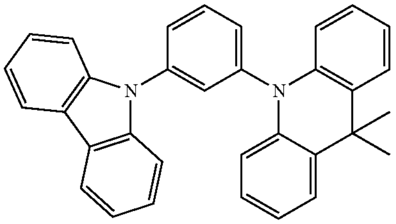

D5

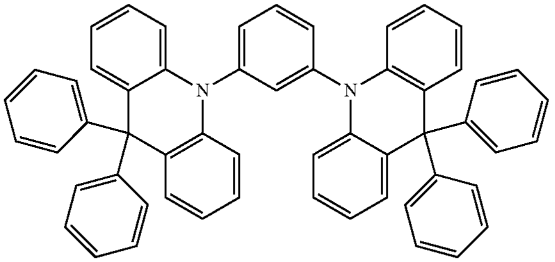

D6

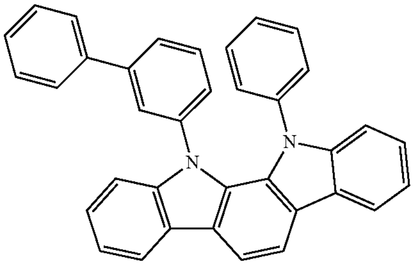

D7

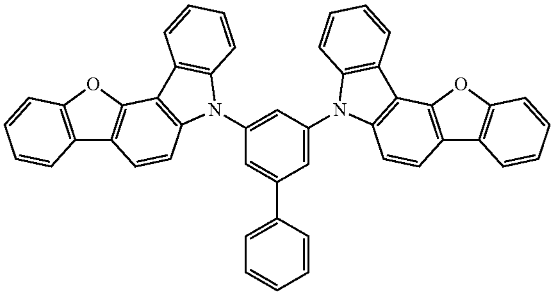

D8

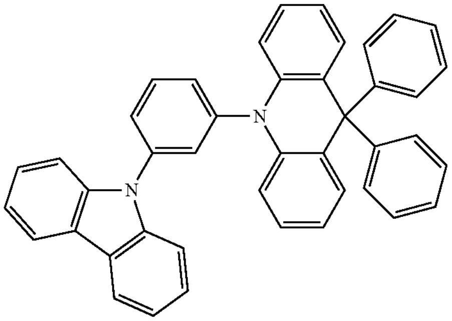

-continued
D9
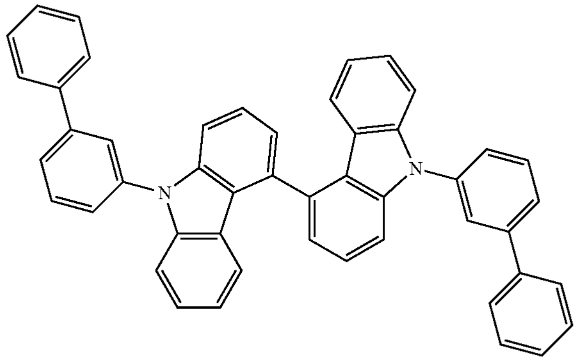
D10
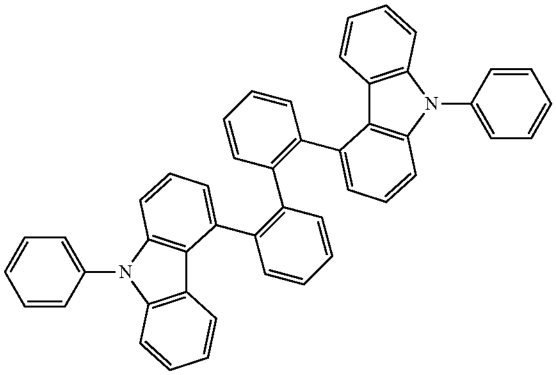
D11
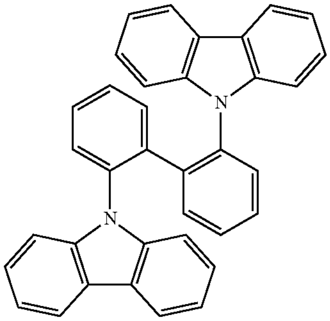
D12
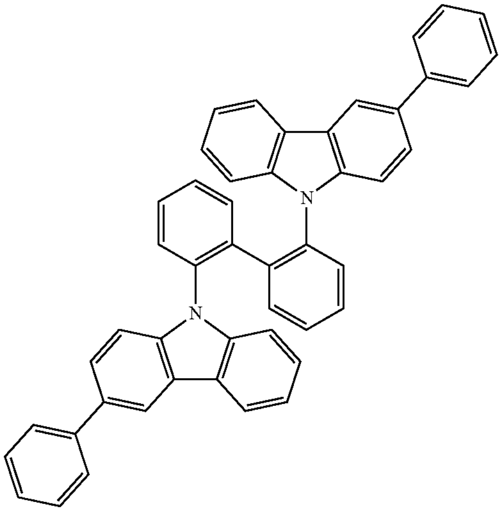
-continued
D13
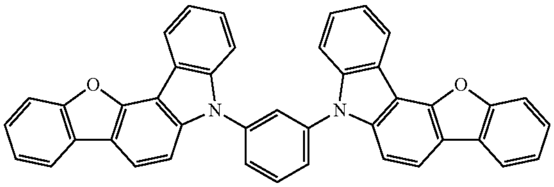
D14
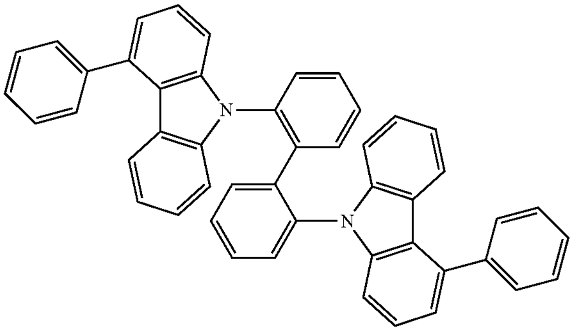
D15
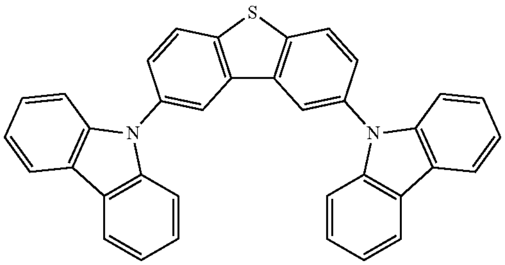
D16
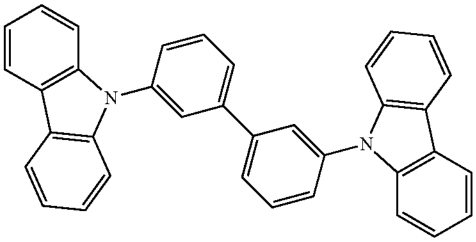
D17
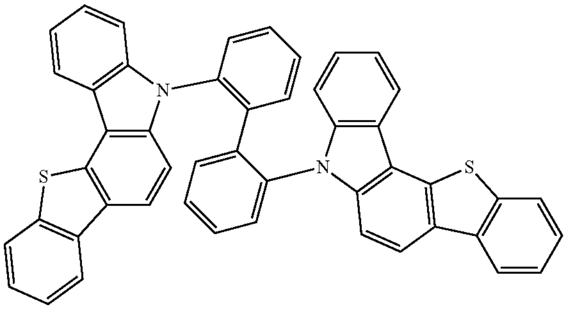

-continued
A1
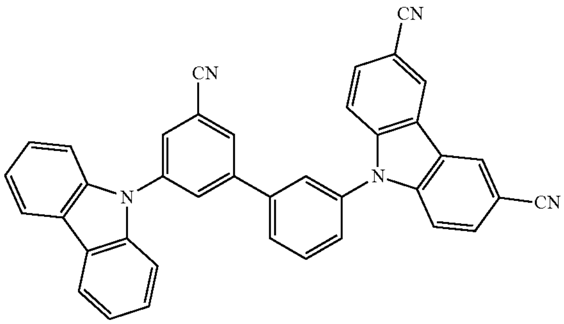
A2
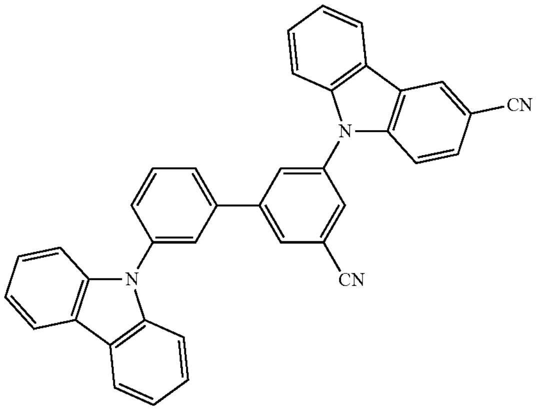
A3
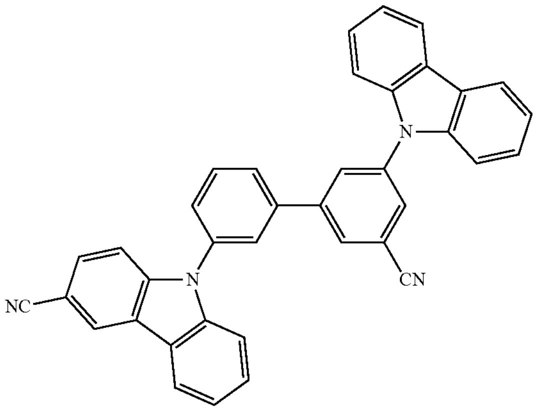
A4
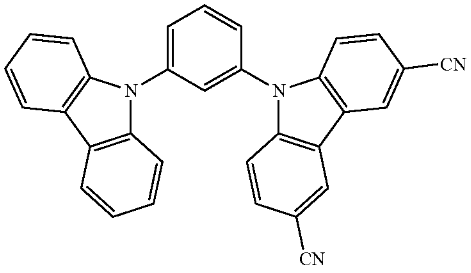
-continued
A5
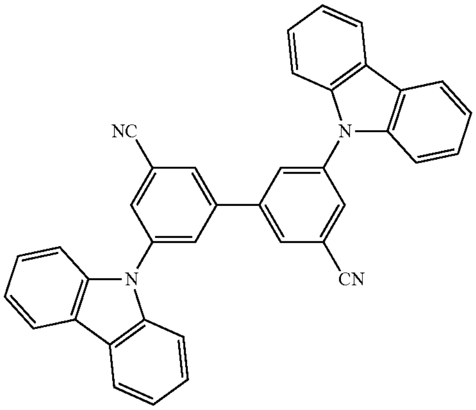
A6
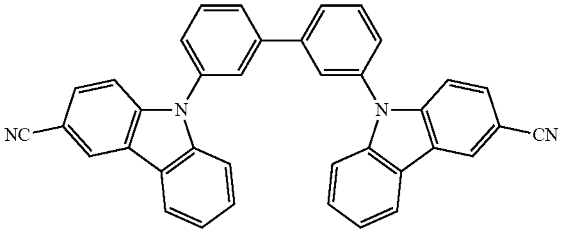
A7
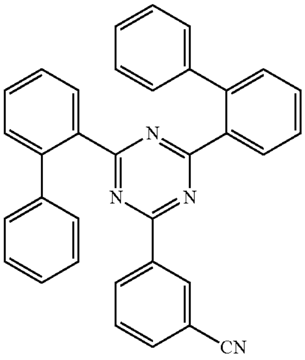
A8
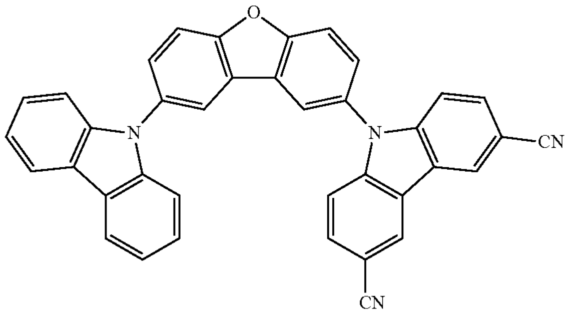
A9
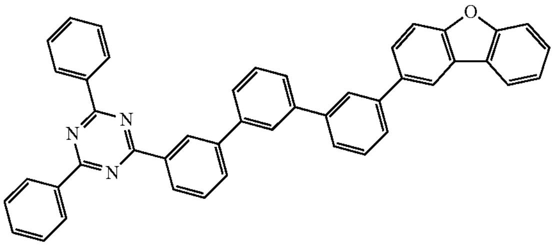

-continued

A10

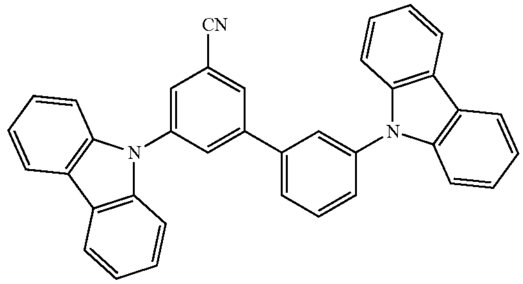

A11

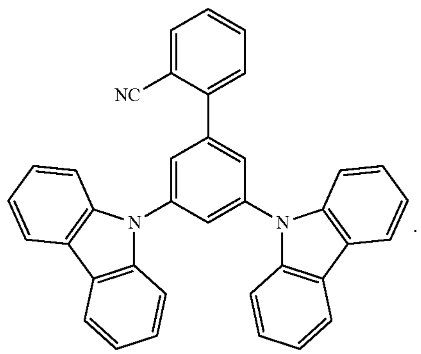

14. The thin film of claim 1, wherein the phosphorescent dopant comprises an organometallic compound represented by Formula 81:

Formula 81

$M(L_{81})_{n81}(L_{82})_{n82}$

Formula 81A

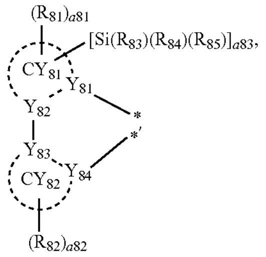

wherein, in Formulae 81 and 81A,

M is selected from iridium (Ir), platinum (Pt), osmium (Os), titanium (Ti), zirconium (Zr), hafnium (Hf), europium (Eu), terbium (Tb), thulium (Tm), and rhodium (Rh), $L_{81}$ is a ligand represented by Formula 81A and n81 is an integer selected from 1 to 3, and when n81 is 2 or greater, groups $L_{81}$ are identical to or different from each other, $L_{82}$ is an organic ligand and n82 is an integer selected from 0 to 4, and when n82 is 2 or greater, groups $L_{82}$ are identical to or different from each other, $Y_{81}$ to $Y_{84}$ are each independently C or N, $Y_{81}$ and $Y_{82}$ are connected through a single bond or a double bond, and $Y_{83}$ and $Y_{84}$ are connected through a single bond or a double bond, $CY_{81}$ and $CY_{82}$ are each independently selected from a $C_5$-$C_{30}$ carbocyclic group and a $C_1$-$C_{30}$ heterocarbocyclic group, $CY_{81}$ and $CY_{82}$ are optionally further bonded to each other through an organic linking group, $R_{81}$ to $R_{85}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, —$Si(Q_{81})(Q_{82})(Q_{83})$, —$N(C_{284})(Q_{85})$, —$B(Q_{86})(Q_{87})$, and —$P(=O)(Q_{88})(Q_{89})$, a81 to a83 are each independently an integer selected from 0 to 5, and when 81 is 2 or greater, groups $R_{81}$ are identical to or different from each other, when a82 is 2 or greater, groups $R_{82}$ are identical to or different from each other, when a81 is 2 or greater, neighboring groups $R_{81}$ are optionally bonded to each other to form a saturated or unsaturated ring, and when a82 is 2 or greater, neighboring groups $R_{82}$ are optionally bonded to each other to form a saturated or unsaturated ring,

* and *' in Formula 81A each indicate a binding site to M in Formula 81, at least one of substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_1$-$C_{60}$ heteroaryloxy group, the $C_1$-$C_{60}$ heteroarylthio group, the substituted $C_2$-$C_{60}$ heteroarylalkyl group, the substituted monovalent non-aromatic condensed polycyclic group, and the substituted monovalent non-aromatic condensed heteropolycyclic group is selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, and —Si($Q_{91}$)($Q_{92}$)($Q_{93}$), and $Q_{81}$ to $Q_{89}$ and $Q_{91}$ to $Q_{93}$ are each independently selected from hydrogen, deuterium, a $C_1$-$C_{60}$ alkyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

15. The thin film of claim 14, wherein $Y_{81}$ is N, $Y_{82}$ and $Y_{83}$ are each independently C, $Y_{84}$ is N or C, and $CY_{81}$ and $CY_{82}$ are each independently selected from a cyclopentadiene group, a benzene group, a heptalene group, an indene group, a naphthalene group, an azulene group, a heptalene group, an indacene group, an acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentaphene group, a rubicene group, a corozene group, an ovalene group, a pyrrole group, an iso-indole group, an indole group, an indazole group, a pyrazole group, an imidazole group, a triazole group, an oxazole group, an isoxazole group, an oxadiazole group, a thiazole group, an isothiazole group, a thiadiazole group, a purine group, a furan group, a thiophene group, a pyridine group, a pyrimidine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, a benzofuran group, a benzothiophene group, an iso-benzothiazole group, a benzoxazole group, an isobenzoxazole group, a benzocarbazole group, a dibenzocarbazole group, an imidazopyridine group, an imidazopyrimidine group, a dibenzofuran group, a dibenzothiophene group, a dibenzothiophene sulfone group, a carbazole group, a dibenzosilol group, and a 2,3-dihydro-1H-imidazole group.

16. The thin film of claim 14, wherein $R_{81}$ and $R_{82}$ are each independently selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, each substituted with at least one selected from deuterium, —F, —Cl, —Br, —I, —$CD_3$, —$CD_2H$,-$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group; and —B($Q_{86}$)($Q_{87}$) and —P(=O)($Q_{88}$)($Q_{89}$), $Q_{86}$ to $Q_{89}$ are each independently selected from:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, and —$CD_2CDH_2$;

an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group, each substituted with at least one selected from deuterium, a $C_1$-$C_{10}$ alkyl group, and a phenyl group.

17. The thin film of claim 14, wherein, in Formula 81A, at least one selected from $R_{81}$ in the number of a81 and $R_{82}$ in the number of a82 is a cyano group.

18. The thin film of claim 14, wherein, in Formula 81A, at least one selected from $R_{81}$ in the number of a81 and $R_{82}$ in the number of a82 is deuterium.

19. An organic light-emitting device comprising:

a first electrode;

a second electrode; and an organic layer disposed between the first electrode and second electrode, wherein the organic layer comprises the thin film of claim 1.

20. The organic light-emitting device of claim 19, wherein the thin film is an emission layer, and wherein the combination in the thin film is a host.

21. A thin film comprising:

i) a combination of a donor compound and an acceptor compound, and ii) a blue phosphorescent dopant, wherein the donor compound and the acceptor compound form an exciplex, wherein the acceptor compound comprises at least one electron-withdrawing group selected from:

—F, —$CFH_2$, —$CF_2H$, —$CF_3$, —CN, and —$NO_2$;

a $C_1$-$C_{60}$ alkyl group substituted with at least one selected from —F, —$CFH_2$, —$CF_2H$, —$CF_3$, —CN, and —$NO_2$;

a $C_1$-$C_{60}$ heteroaryl group and a divalent non-aromatic condensed polycyclic heterocyclic group, each comprising *=N—*' as a ring-forming moiety, and a $C_1$-$C_{60}$ heteroaryl group and a divalent non-aromatic condensed polycyclic heterocyclic group, each comprising *=N—*' as a ring-forming a moiety and each substituted with at least one selected from deuterium, —F, —$CFH_2$, —$CF_2H$, —$CF_3$, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phoshoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, and a substituted or unsubstituted monovalent non-aromatic condensed heteropolycyclic group, wherein a maximum emission wavelength $\Delta_{max}$ (Ex) in a photoluminescence spectrum of the exciplex is about 390 nanometers or greater and about 490 nanometers or less, wherein a decay time $T_{decay}$(Ex) of delayed fluorescence in a time-resolved photoluminescence spectrum of the exciplex is about 100 nanoseconds or greater, wherein a ratio of a delayed fluorescence portion to the overall light-emitting portions in the time-resolved photoluminescence spectrum of the exciplex is about 10% or greater, and wherein the photoluminescence spectrum and the time-resolved photoluminescence spectrum of the exciplex are each a spectrum measured at room temperature with respect to a film that is formed by co-deposition of the donor compound and the acceptor compound on a substrate.

22. The thin film of claim 21, wherein the blue phosphorescent dopant comprises an organometallic compound represented by Formula 81:

Formula 81

$M(L_{81})_{n81}(L_{82})_{n82}$

Formula 81A

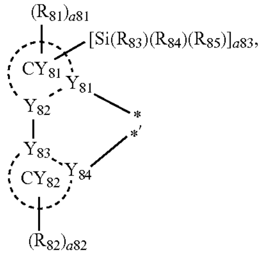

wherein, in Formulae 81 and 81A,

M is selected from iridium (Ir), platinum (Pt), osmium (Os), titanium (Ti), zirconium (Zr), hafnium (Hf), europium (Eu), terbium (Tb), thulium (Tm), and rhodium (Rh), $L_{81}$ is a ligand represented by Formula 81A and n81 is an integer selected from 1 to 3, and when n81 is 2 or greater, groups $L_{81}$ are identical to or different from each other, $L_{82}$ is an organic ligand and n82 is an integer selected from 0 to 4, and when n82 is 2 or greater, groups $L_{82}$ are identical to or different from each other, $Y_{81}$ is N, $Y_{82}$ to $Y_{84}$ are C, $Y_{81}$ and $Y_{82}$ are connected through a single bond or a double bond, and $Y_{83}$ and $Y_{84}$ are connected through a single bond or a double bond, $CY_{81}$ is selected from a pyrrole group, a pyrazole group, an imidazole group, a triazole group, an oxazole group, an isoxazole group, an oxadiazole group, a thiazole group, an isothiazole group, a thiadiazole group, a pyridine group, a pyrimidine group, a quinoline group, an isoquinoline group, a benzoquinoline group, a phthalazine group, a naphthyridine group, a quinoxaline group, a quinazoline group, a cinnoline group, a benzimidazole group, an iso-benzothiazole group, a benzoxazole group, and an isobenzoxazole group, and $CY_{82}$ is selected from a cyclopentadiene group, a benzene group, a naphthalene group, a fluorene group, a benzofluorene group, a dibenzofluorene group, a phenanthrene group, an anthracene group, a triphenylene group, a pyrene group, a chrysene group, a perylene group, a benzofuran group, a benzothiophene group, a benzocarbazole group, a dibenzocarbazole group, a dibenzofuran group, a dibenzothiophene group, a dibenzothiophene sulfone group, a carbazole group, and a dibenzosilol group, $CY_{81}$ and $CY_{82}$ are optionally further bonded to each other through an organic linking group, $R_{81}$ and $R_{82}$ are each independently be selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, $—SF_5$, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl (group, each substituted with at least one selected from deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group; and —B($Q_{86}$)($Q_{87}$) and —P(=O)($Q_{88}$)($Q_{89}$), $R_{83}$ to $R_{85}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, —Si($Q_{81}$)($Q_{82}$)($Q_{83}$), —N($Q_{84}$)($Q_{85}$), —B($Q_{86}$)($Q_{87}$), and —P(=O)($Q_{88}$)($Q_{89}$), a81 to a83 are each independently an integer selected from 0 to 5, and when 81 is 2 or greater, groups $R_{81}$ are identical to or different from each other, when a82 is 2 or greater, groups $R_{82}$ are identical to or different from each other, when a81 is 2 or greater, neighboring groups $R_{81}$ are optionally bonded to each other to form a saturated or unsaturated ring, and when a82 is 2 or greater, neighboring groups $R_{82}$ are optionally bonded to each other to form a saturated or unsaturated ring,

* and *' in Formula 81A each indicate a binding site to M in Formula 81, at least one of substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_1$-$C_{60}$ heteroaryloxy group, the $C_1$-$C_{60}$ heteroarylthio group, the substituted $C_2$-$C_{60}$ heteroarylalkyl group, the substituted monovalent non-aromatic condensed polycyclic group, and the substituted monovalent non-aromatic condensed heteropolycyclic group is selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, and —Si($Q_{91}$)($Q_{92}$)($Q_{93}$), and $Q_{81}$ to $Q_{89}$ and $Q_{91}$ to $Q_{93}$ are each independently selected from hydrogen, deuterium, a $C_1$-$C_{60}$ alkyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

* * * * *